(12) United States Patent
Nakamura et al.

(10) Patent No.: US 9,405,200 B2
(45) Date of Patent: Aug. 2, 2016

(54) RESIST COMPOSITION AND METHOD OF FORMING RESIST PATTERN

(71) Applicant: Tokyo Ohka Kogyo Co., Ltd., Kawasaki-sh (JP)

(72) Inventors: Tsuyoshi Nakamura, Kawasaki (JP); Jiro Yokoya, Kawasaki (JP); Hiroaki Shimizu, Kawasaki (JP); Hideto Nito, Kawasaki (JP)

(73) Assignee: TOYKO OHKA KOGYO CO., LTD., Kawasaki-Shi (JP)

( * ) Notice: Subject to any disclaimer, the term of this patent is extended or adjusted under 35 U.S.C. 154(b) by 0 days.

(21) Appl. No.: 13/624,639

(22) Filed: Sep. 21, 2012

(65) Prior Publication Data

US 2013/0084523 A1   Apr. 4, 2013

(30) Foreign Application Priority Data

Sep. 22, 2011 (JP) .................. 2011-207772
Sep. 22, 2011 (JP) .................. 2011-208136
Sep. 22, 2011 (JP) .................. 2011-208147

(51) Int. Cl.
*G03F 7/004* (2006.01)
*G03F 7/38* (2006.01)
*G03F 7/20* (2006.01)
*G03F 7/038* (2006.01)
*G03F 7/039* (2006.01)
*G03F 7/075* (2006.01)

(52) U.S. Cl.
CPC *G03F 7/38* (2013.01); *G03F 7/004* (2013.01); *G03F 7/0045* (2013.01); *G03F 7/0046* (2013.01); *G03F 7/0382* (2013.01); *G03F 7/0397* (2013.01); *G03F 7/0755* (2013.01); *G03F 7/0758* (2013.01); *G03F 7/20* (2013.01)

(58) Field of Classification Search
None
See application file for complete search history.

(56) References Cited

U.S. PATENT DOCUMENTS 5,326,675 A   7/1994 Niki et al.
5,429,910 A   7/1995 Hanawa
(Continued)

FOREIGN PATENT DOCUMENTS

EP   2003501 A1   12/2008
JP   A-05-055102   3/1993
(Continued)

OTHER PUBLICATIONS

Machine translation JP 2010-160447. Jul. 22, 2010.*
(Continued)

*Primary Examiner* — Cynthia H Kelly
*Assistant Examiner* — Alyssa L Cepluch
(74) *Attorney, Agent, or Firm* — Knobbe Martens Olson & Bear LLP

(57) ABSTRACT

A method of forming a resist pattern, including: a step (1) in which a resist film is formed by coating a resist composition including a base component (A) that exhibits increased solubility in an alkali developing solution, a photo-base generator component (C) that generates a base upon exposure, an acid supply component (Z) and a compound (F) containing at least one selected from the group consisting of a fluorine atom and a silicon atom and containing no acid decomposable group which exhibits increased polarity by the action of acid on a substrate; a step (2) in which the resist film is subjected to exposure; a step (3) in which baking is conducted after the step (2); and a step (4) in which the resist film is subjected to an alkali development, thereby forming a negative-tone resist pattern, and a resist composition used in the step (1).

8 Claims, 2 Drawing Sheets

(56) References Cited

U.S. PATENT DOCUMENTS

| | | | |
|---|---|---|---|
| 5,595,856 | A | 1/1997 | Mochizuki et al. |
| 5,627,010 | A | 5/1997 | Pai et al. |
| 5,645,979 | A | 7/1997 | Mochizuki et al. |
| 5,650,261 | A | 7/1997 | Winkle |
| RE35,821 | E | 6/1998 | Niki et al. |
| 5,945,517 | A | 8/1999 | Nitta et al. |
| 6,153,733 | A | 11/2000 | Yukawa et al. |
| 6,159,652 | A * | 12/2000 | Sato ............... G03F 7/0045 430/170 |
| 6,420,503 | B1 | 7/2002 | Jayaraman et al. |
| 6,653,043 | B1 | 11/2003 | Hanabata |
| 6,815,142 | B1 | 11/2004 | Kimura et al. |
| 7,625,690 | B2 | 12/2009 | Mizutani et al. |
| 7,968,276 | B2 | 6/2011 | Takeshita |
| 8,268,529 | B2 | 9/2012 | Dazai et al. |
| 8,486,605 | B2 | 7/2013 | Takeshita et al. |
| 2002/0160316 | A1 | 10/2002 | Richter et al. |
| 2002/0160318 | A1 | 10/2002 | Richter et al. |
| 2002/0187436 | A1 | 12/2002 | Richter et al. |
| 2003/0008240 | A1 | 1/2003 | Elian et al. |
| 2003/0211417 | A1 | 11/2003 | Fryd et al. |
| 2004/0110085 | A1 | 6/2004 | Iwai et al. |
| 2006/0234164 | A1 | 10/2006 | Rhodes et al. |
| 2007/0105040 | A1 | 5/2007 | Toukhy et al. |
| 2008/0153030 | A1 * | 6/2008 | Kobayashi et al. ........ 430/270.1 |
| 2008/0248420 | A1 | 10/2008 | Kanna |
| 2009/0155715 | A1 | 6/2009 | Chen et al. |
| 2009/0155718 | A1 | 6/2009 | Chen et al. |
| 2009/0197204 | A1 | 8/2009 | Shiono et al. |
| 2009/0317743 | A1 | 12/2009 | Shiono et al. |
| 2010/0035192 | A1 | 2/2010 | Ando et al. |
| 2010/0047724 | A1 | 2/2010 | Takeshita et al. |
| 2010/0143844 | A1 | 6/2010 | Takeshita et al. |
| 2010/0178618 | A1 | 7/2010 | Hatakeyama et al. |
| 2010/0304297 | A1 * | 12/2010 | Hatakeyama et al. ..... 430/270.1 |
| 2010/0310985 | A1 | 12/2010 | Mori et al. |
| 2011/0014570 | A1 * | 1/2011 | Mizutani et al. ........... 430/270.1 |
| 2011/0033803 | A1 | 2/2011 | Hatakeyama et al. |
| 2011/0091812 | A1 | 4/2011 | Hatakeyama et al. |
| 2011/0117499 | A1 | 5/2011 | Matsumiya et al. |
| 2011/0233048 | A1 | 9/2011 | Kuramoto et al. |
| 2011/0318691 | A1 | 12/2011 | Tsuchimura et al. |
| 2012/0177891 | A1 | 7/2012 | Millward et al. |
| 2012/0202158 | A1 | 8/2012 | Hatakeyama et al. |
| 2013/0017500 | A1 | 1/2013 | Yokoya et al. |
| 2013/0078572 | A1 | 3/2013 | Shimizu et al. |
| 2013/0164693 | A1 | 6/2013 | Takeshita |

FOREIGN PATENT DOCUMENTS

| | | |
|---|---|---|
| JP | A-05-216244 | 8/1993 |
| JP | A-06-186754 | 7/1994 |
| JP | A-06-194847 | 7/1994 |
| JP | A-07-253676 | 10/1995 |
| JP | A-07-261393 | 10/1995 |
| JP | A-08-095246 | 4/1996 |
| JP | A-08-220754 | 8/1996 |
| JP | A-09-208554 | 8/1997 |
| JP | A-10-077264 | 3/1998 |
| JP | A-11-035551 | 2/1999 |
| JP | A-11-035552 | 2/1999 |
| JP | A-11-035573 | 2/1999 |
| JP | A-11-322707 | 11/1999 |
| JP | 2000-010270 A | 1/2000 |
| JP | A-2000-235263 | 8/2000 |
| JP | A-2000-267298 | 9/2000 |
| JP | A-2000-330270 | 11/2000 |
| JP | A-2003-241385 | 8/2003 |
| JP | A-2006-291177 | 10/2006 |
| JP | A-2007-173274 | 7/2007 |
| JP | A-2007-279493 | 10/2007 |
| JP | A-2007-334036 | 12/2007 |
| JP | A-2008-174515 | 7/2008 |
| JP | A-2008-247747 | 10/2008 |
| JP | A-2009-002999 | 1/2009 |
| JP | A-2009-025723 | 2/2009 |
| JP | A-2009-080452 | 4/2009 |
| JP | A-2010-002870 | 1/2010 |
| JP | A-2010-032994 | 2/2010 |
| JP | A-2010-040849 | 2/2010 |
| JP | 2010152299 A * | 7/2010 |
| JP | 2010160447 A * | 7/2010 |
| JP | A-2010-217855 | 9/2010 |
| JP | A-2010-277043 | 12/2010 |
| JP | A-2011-008001 | 1/2011 |
| JP | A-2011-008237 | 1/2011 |
| JP | A-2011-013569 | 1/2011 |
| JP | A-2011-508246 | 3/2011 |
| JP | A-2011-102974 | 5/2011 |
| JP | A-2011-118198 | 6/2011 |
| JP | A-2011-128226 | 6/2011 |
| JP | A-2011-225645 | 11/2011 |
| JP | A-2012-018197 | 1/2012 |
| JP | 2012-181510 A | 9/2012 |
| JP | A-2013-114219 | 6/2013 |
| JP | A-2013-174663 | 9/2013 |
| JP | A-2014-214399 | 11/2014 |
| TW | 201027244 A1 | 7/2010 |
| WO | WO 2004/074242 A2 | 9/2004 |
| WO | WO 2009/074522 A1 | 6/2009 |
| WO | WO 2010/064631 A1 | 6/2010 |

OTHER PUBLICATIONS

Machine translation JP 2010-152299. Jul. 8, 2010.*
Ebihara, et al., Proceedings of SPIE (U.S.), vol. 5256, pp. 985-994 (2003).
Gil, et al., Proceedings of SPIE (U.S.), vol. 5754, pp. 119-128 (2005).
Borodovsky, Proceedings of SPIE (U.S.), vol. 6153, pp. 615301-1 to 615301-19 (2006).
Landie et al., "Fundamental Investigation of Negative Tone Development (NTD) for the 22nm node (and beyond)" Proceedings of SPIE, vol. 7972, pp. 797206-1-797206-12, 2011.
Office Action issued on Dec. 18, 2013 in U.S. Appl. No. 13/467,549.
Office Action issued on Aug. 23, 2013 in U.S. Appl. No. 13/667,237.
Office Action issued on Oct. 24, 2013 in U.S. Appl. No. 13/624,638.
Office Action issued in U.S. Appl. No. 13/732,632 on Jun. 5, 2014.
Office Action issued in U.S. Appl. No. 13/614,017 on Jun. 18, 2014.
Office Action issued in U.S. Appl. No. 13/718,269 on Jun. 18, 2014.
Office Action mailed Mar. 27, 2014 in U.S. Appl. No. 13/667,237.
Office Action mailed Apr. 2, 2014 in U.S. Appl. No. 13/626,549.
Notice of Allowance in U.S. Appl. No. 13/732,632, mailed Oct. 7, 2014.
Office Action in U.S. Appl. No. 13/850,685, mailed Oct. 20, 2014.
Cho et al. Polymer Bound Photobase Generators and Photoacid Generators for Pitch Division Lithography. Apr. 16, 2011. Proc. of SPIE vol. 7972 p. 797221-1 to 797221-8.
Notice of Allowance in Japanese Patent Application No. 2011-208136, mailed Feb. 17, 2015.
Office Action in U.S. Appl. No. 13/624,638, mailed Apr. 20, 2015.
Office Action in U.S. Appl. No. 13/626,549, mailed May 15, 2015.
Office Action in Japanese Application No. 2011-280211, mailed Jun. 16, 2015.
Office Action in Japanese Application No. 2012-003412, mailed Jul. 21, 2015.
Office Action in Japanese Application No. 2012-022408, mailed Aug. 18, 2015.
Yaguchi, H; "Photoinduced Depolymerization of Poly(olefin sulfone)s Possessing Photobase Generating Groups in the Side Chain" Macromolecules 2007, 40, pp. 9332-9338.
Office Action in U.S. Appl. No. 14/581,209, mailed Sep. 8, 2015.
Office Action in U.S. Appl. No. 13/624,638, mailed Oct. 26, 2015.
Office Action in Taiwanese Patent Application No. 101135300, mailed Oct. 26, 2015.
Office Action in Japanese Patent Application No. 2012-140216, mailed Jan. 5, 2016.
Office Action in Taiwanese Patent Application No. 102100415, mailed Mar. 28, 2016.

* cited by examiner

RESIST COMPOSITION AND METHOD OF FORMING RESIST PATTERN

TECHNICAL FIELD

The present invention relates to a method of forming a resist pattern in which a negative resist pattern is formed by developing with an alkali developing solution, and a resist composition used therein.

Priority is claimed on Japanese Patent Application No. 2011-207772, 2011-208136 and 2011-208147, filed Sep. 22, 2011, the contents of which are incorporated herein by reference.

BACKGROUND ART

Techniques (pattern-forming techniques) in which a fine pattern is formed on top of a substrate, and a lower layer beneath that pattern is then fabricated by conducting etching with this pattern as a mask are widely used in the production of semiconductor devices and liquid crystal display devices. These types of fine patterns are usually formed from an organic material, and are formed, for example, using a lithography method or a nanoimprint method or the like. In a lithography method, for example, a resist film is formed on a support such as a substrate using a resist material containing a base component such as a resin, and the resist film is then subjected to selective exposure of radial rays such as light or electron beam, followed by development, thereby forming a resist pattern having a predetermined shape on the resist film. Using this resist pattern as a mask, a semiconductor device or the like is produced by conducting a step in which the substrate is processed by etching.

The aforementioned resist materials can be classified into a positive type and a negative type. A resist material in which the exposed portions exhibit increased solubility in a developing solution is called a positive type, and a resist material in which the exposed portions exhibit decreased solubility in a developing solution is called a negative type.

In general, an aqueous alkali solution (alkali developing solution) such as an aqueous solution of tetramethylammonium hydroxide (TMAH) is used as the developing solution. Alternatively, organic solvents such as aromatic solvents, aliphatic hydrocarbon solvents, ether solvents, ketone solvents, ester solvents, amide solvents and alcohol solvents are used as the developing solution (for example, see Patent Documents 1 and 2).

In recent years, advances in lithography techniques have led to rapid progress in the field of pattern miniaturization.

Typically, these miniaturization techniques involve shortening the wavelength (increasing the energy) of the exposure light source. Conventionally, ultraviolet radiation typified by g-line and i-line radiation has been used, but nowadays KrF excimer lasers and ArF excimer lasers are now starting to be introduced in mass production. Furthermore, research is also being conducted into lithography techniques that use an exposure light source having a wavelength shorter (energy higher) than these excimer lasers, such as electron beam (EB), extreme ultraviolet radiation (EUV), and X ray.

As shortening of the wavelength of the exposure light source progresses, it is required to improve various lithography properties of the resist material, such as the sensitivity to the exposure light source and the resolution capable of reproducing patterns of minute dimensions. As resist materials which satisfy such requirements, chemically amplified resists are known.

As a chemically amplified resist, a composition is generally used, which includes a base component that exhibits a changed solubility in a developing solution under the action of acid and an acid generator component that generates acid upon exposure. For example, when the above developing solution is an alkali developing solution (when the process is an alkali developing process), as the base component, a base component that exhibits increased solubility in an alkali developing solution by the action of acid is used.

Conventionally, a resin (base resin) is mainly used as the base component of a chemically amplified resist composition. Currently, resins that contain structural units derived from (meth)acrylate esters within the main chain (acrylic resins) are the mainstream as base resins for chemically amplified resist compositions that use ArF excimer laser lithography, as they exhibit excellent transparency in the vicinity of 193 nm.

Here, the term "(meth)acrylic acid" is a generic term that includes either or both of acrylic acid having a hydrogen atom bonded to the α-position and methacrylic acid having a methyl group bonded to the α-position. The term "(meth)acrylate ester" is a generic term that includes either or both of the acrylate ester having a hydrogen atom bonded to the α-position and the methacrylate ester having a methyl group bonded to the α-position. The term "(meth)acrylate" is a generic term that includes either or both of the acrylate having a hydrogen atom bonded to the α-position and the methacrylate having a methyl group bonded to the α-position.

In general, the base resin contains a plurality of structural units for improving lithography properties and the like. For example, a structural unit having a lactone structure and a structural unit having a polar group such as a hydroxy group are used, as well as a structural unit having an acid decomposable group which is decomposed by the action of an acid generated from the acid generator to form an alkali soluble group (for example, see Patent Document 3). When the base resin is an acrylic resin, as the acid decomposable group, in general, resins in which the carboxy group of (meth)acrylic acid or the like is protected with an acid dissociable group such as a tertiary alkyl group or an acetal group are used.

As a technique for further improving the resolution, a lithography method called liquid immersion lithography (hereafter, frequently referred to as "immersion exposure") is known in which exposure (immersion exposure) is conducted in a state where the region between the lens and the resist layer formed on a wafer is filled with a solvent (a immersion medium) that has a larger refractive index than the refractive index of air (see for example, Non-Patent Document 1).

According to this type of immersion exposure, it is considered that higher resolutions equivalent to those obtained using a shorter wavelength light source or a larger NA lens can be obtained using the same exposure light source wavelength, with no lowering of the depth of focus. Furthermore, immersion exposure can be conducted by applying a conventional exposure apparatus. As a result, it is expected that immersion exposure will enable the formation of resist patterns of higher resolution and superior depth of focus at lower costs. Accordingly, in the production of semiconductor devices, which requires enormous capital investment, immersion exposure is attracting considerable attention as a method that offers significant potential to the semiconductor industry, both in terms of cost and in terms of lithography properties such as resolution.

Immersion exposure is effective in forming patterns having various shapes. Further, immersion exposure is expected to be capable of being used in combination with currently studied super-resolution techniques, such as phase shift method and modified illumination method. Currently, as the immersion exposure technique, technique using an ArF excimer laser as an exposure source is being actively studied. Further, water is mainly used as the immersion medium.

Because it is necessary to impart water repellency to the obtained resist film in the immersion exposure, resist compositions for immersion exposure which contain a fluorine-containing compound have been reported (see, for example, Non-Patent Document 1).

Active research and development of fluorine-containing compounds have been conducted in various fields including the resist materials for immersion exposure described above for their properties such as water repellency and transparency. For example, in the field of resist materials, fluorine-containing polymers that include a structural unit containing a fluorine atom have been used in recent years (see Patent Document 4). Examples of the Patent Document 4 show that the specific fluorine-containing compound contributes to the defect reduction in the formation of the pattern using the immersion exposure, but is not limited therein. It is known that fluorine-containing compounds contribute to improvement of lithography properties such as the defect reduction (see Patent Documents 5 and 6).

As a lithography technique which has been recently proposed, a double patterning method is known in which patterning is conducted two or more times to form a resist pattern (for example, see Non-Patent Documents 2 and 3). There are several different types of double patterning process, for example, (1) a method in which a lithography step (from application of resist compositions to exposure and developing) and an etching step are performed twice or more to form a pattern and (2) a method in which the lithography step is successively performed twice or more. According to the double patterning method, a resist pattern with a higher level of resolution can be formed, as compared to the case where a resist pattern is formed by a single lithography step (namely, a single patterning process), even when a light source with the same exposure wavelength is used, or even when the same resist composition is used. Furthermore, double patterning process can be conducted using a conventional exposure apparatus.

Moreover, a double exposure process has also been proposed in which a resist film is formed, and the resist film is subjected to exposure twice or more, followed by development to form a resist pattern (for example, see Patent Document 7). Like the double patterning process described above, this type of double exposure process is also capable of forming a resist pattern with a high level of resolution, and also has an advantage in that fewer number of steps is required than the above-mentioned double patterning process.

In a positive tone development process using a positive type, chemically amplified resist composition (i.e., a chemically amplified resist composition which exhibits increased alkali solubility in an alkali developing solution upon exposure) in combination with an alkali developing solution, as described above, the exposed portions of the resist film are dissolved and removed by an alkali developing solution to thereby form a resist pattern. The positive tone process using a combination of a positive chemically amplified resist composition and an alkali developing solution is advantageous over a negative tone development process in which a negative type, chemically amplified resist composition is used in combination with an alkali developing solution in that the structure of the photomask can be simplified, a satisfactory contrast for forming an image can be reliably obtained, and the characteristics of the formed resist pattern are excellent. For these reasons, currently, positive-tone development process using a combination of a positive chemically amplified resist composition and an alkali developing solution is mainly employed in the formation of an extremely fine resist pattern.

DOCUMENTS OF RELATED ART

Patent Documents

[Patent Document 1] Japanese Unexamined Patent Application, First Publication No. Hei 6-194847
[Patent Document 2] Japanese Unexamined Patent Application, First Publication No. 2009-025723
[Patent Document 3] Japanese Unexamined Patent Application, First Publication No. 2003-241385
[Patent Document 4] Japanese Unexamined Patent Application, First Publication No. 2010-277043
[Patent Document 5] Japanese Unexamined Patent Application, First Publication No. 2011-008001
[Patent Document 6] Japanese Unexamined Patent Application, First Publication No. 2011-128226
[Patent Document 7] Japanese Unexamined Patent Application, First Publication No. 2010-040849

Non-Patent Documents

[Non-Patent Document 1] Proceedings of SPIE (U.S.), vol. 5754, pp. 119-128 (2005)
[Non-Patent Document 2] Proceedings of SPIE (U.S.), vol. 5256, pp. 985-994 (2003)
[Non-Patent Document 3] Proceedings of SPIE (U.S.), vol. 6153, pp. 615301-1-19 (2006)

SUMMARY OF THE INVENTION

However, as further progress is made in lithography techniques and the application field for lithography techniques expands, further improvement in various lithography properties is demanded in a positive-tone developing process using a combination of a positive chemically amplified resist composition and an alkali developing solution.

For example, in the formation of an extremely small pattern (such as an isolated trench pattern, an extremely small, dense contact hole pattern, or the like), a region where the optical strength becomes weak (region where irradiation by exposure is not satisfactorily reached) is likely to be generated especially in the film thickness direction of the resist film, thereby deteriorating the resolution of the resist pattern.

In the formation of the aforementioned extremely small pattern, a method of forming a resist pattern (negative pattern) in which regions where the optical strength becomes weak are selectively dissolved and removed is useful. As a method for forming a negative pattern using a chemically amplified resist composition used in a positive-tone developing process which is the mainstream, a method in which a developing solution containing an organic solvent (organic developing solution) is used in combination with a chemically amplified resist composition is known. However, negative-tone developing process using an organic developing solution is inferior to a positive-tone developing process using an alkali developing solution in combination with a chemically amplified resist composition in terms of environment, apparatus and cost. Therefore, a novel method of forming a resist pattern is required which is capable of forming the negative pattern with high contrast image.

In addition, resist compositions are required to improve not only lithography properties but also storage stability. Specifically, the resist compositions are required which are capable of obtaining excellent lithography properties or the like, even when patterns are formed using a resist composition stored for a certain period after preparing the resist composition, similarly when patterns are formed using a resist composition, without storage, immediately after preparing the resist composition.

The present invention takes the above circumstances into consideration, with an object of providing a method of forming a resist pattern which enables the formation of the negative pattern, a novel method of forming a negative resist pattern using a resist composition having an excellent storage stability, and a resist composition which can be used therein and having an excellent storage stability.

As a result of intensive studies, the present inventors have invented a method of forming a negative pattern in which a resist film formed by a resist composition containing a base component that exhibits increased solubility in an alkali developing solution by the action of an acid has the exposed portions remaining and the unexposed portions dissolved and removed by an "alkali developing solution" (see Japanese Patent Application No. 2011-106577). Subsequently, as a result of further intensive studies, the present inventors have found a resist composition which has excellent storage stability for use of a fluorine-containing compound and which is suitable for using in a method of forming the negative pattern. The present invention has been completed based on this finding. In addition, the present inventors have found a resist composition which can be used in a method of forming the negative pattern and having excellent storage stability. The present invention has been completed based on this finding.

Specifically, a first aspect of the present invention is a resist composition including a base component (A) that exhibits increased solubility in an alkali developing solution under the action of acid, a photo-base generator component (C) that generates a base upon exposure, an acid supply component (Z) and a compound (F) containing at least one selected from the group consisting of a fluorine atom and a silicon atom, and the resist composition used in a method of forming a resist pattern which includes: a step (1) in which a resist film is formed by coating the resist composition on a substrate; a step (2) in which the resist film is subjected to exposure; a step (3) in which baking is conducted after the step (2), such that, at an exposed portion of the resist film, the base generated from the photo-base generator component (C) upon the exposure and an acid derived from the acid supply component (Z) are neutralized, and at an unexposed portion of the resist film, the solubility of the base component (A) in an alkali developing solution is increased by the action of the acid derived from the acid supply component (Z); and a step (4) in which the resist film is subjected to an alkali development, thereby forming a negative-tone resist pattern in which the unexposed portion of the resist film has been dissolved and removed, wherein the resist composition is used in the step (1) of the method of forming a resist pattern, wherein the compound (F) contains no acid decomposable group which exhibits increased polarity by the action of acid.

A second aspect of the present invention is a method of forming a resist pattern including: a step (1) in which a resist film is formed by coating a resist composition which includes a base component (A) that exhibits increased solubility in an alkali developing solution under the action of acid, a photo-base generator component (C) that generates a base upon exposure, an acid supply component (Z) and a compound (F) containing at least one selected from the group consisting of a fluorine atom and a silicon atom, and containing no acid decomposable group which exhibits increased polarity by the action of acid, on a substrate; a step (2) in which the resist film is subjected to exposure; a step (3) in which baking is conducted after the step (2), such that, at an exposed portion of the resist film, the base generated from the photo-base generator component (C) upon the exposure and an acid derived from the acid supply component (Z) are neutralized, and at an unexposed portion of the resist film, the solubility of the base component (A) in an alkali developing solution is increased by the action of the acid derived from the acid supply component (Z); and a step (4) in which the resist film is subjected to an alkali development, thereby forming a negative-tone resist pattern in which the unexposed portion of the resist film has been dissolved and removed.

A third aspect of the present invention is a resist composition including a base component (A) that exhibits increased solubility in an alkali developing solution under the action of acid, a photo-base generator component (C) that generates a base upon exposure, an acidic compound component (G) and an amine (D), and the resist composition used in a method of forming a resist pattern which includes: a step (1) in which a resist film is formed by coating the resist composition on a substrate; a step (2) in which the resist film is subjected to exposure; a step (3) in which baking is conducted after the step (2), such that, at an exposed portion of the resist film, the base generated from the photo-base generator component (C) upon the exposure and the acidic compound component (G) are neutralized, and at an unexposed portion of the resist film, the solubility of the base component (A) in an alkali developing solution is increased by the action of the acidic compound component (G); and a step (4) in which the resist film is subjected to an alkali development, thereby forming a negative-tone resist pattern in which the unexposed portion of the resist film has been dissolved and removed, wherein the resist composition is used in the step (1) of the method of forming a resist pattern, wherein the amount of the amine (D) is 1 mol or more, per 1 mol of the acidic compound component (G).

A fourth aspect of the present invention is a method of forming a resist pattern including: a step (1) in which a resist film is formed by coating a resist composition which includes a base component (A) that exhibits increased solubility in an alkali developing solution under the action of acid, a photo-base generator component (C) that generates a base upon exposure, an acidic compound component (G) and an amine (D), the amount of which is 1 mol or more, per 1 mol of the acidic compound component (G), on a substrate; a step (2) in which the resist film is subjected to exposure; a step (3) in which baking is conducted after the step (2), such that, at an exposed portion of the resist film, the base generated from the photo-base generator component (C) upon the exposure and the acidic compound component (G) are neutralized, and at an unexposed portion of the resist film, the solubility of the base component (A) in an alkali developing solution is increased by the action of the acidic compound component (G); and a step (4) in which the resist film is subjected to an alkali development, thereby forming a negative-tone resist pattern in which the unexposed portion of the resist film has been dissolved and removed.

A fifth aspect of the present invention is a resist composition including a base component (A) that exhibits increased solubility in an alkali developing solution under the action of acid, a photo-base generator component (C) that generates a base upon exposure, and an acidic compound component (G), and the resist composition used in a method of forming a resist pattern which includes: a step (1) in which a resist film is formed by coating the resist composition on a substrate; a step (2) in which the resist film is subjected to exposure; a step (3) in which baking is conducted after the step (2), such that, at an exposed portion of the resist film, the base generated from the photo-base generator component (C) upon the exposure and the acidic compound component (G) are neutralized, and at an unexposed portion of the resist film, the solubility of the base component (A) in an alkali developing solution is increased by the action of the acidic compound component (G); and a step (4) in which the resist film is subjected to an alkali development, thereby forming a negative-tone resist pattern in which the unexposed portion of the resist film has been dissolved and removed, wherein the resist composition is used in the step (1) of the method of forming a resist pattern, wherein the acidic compound component (G) includes a compound (G1C) composed of a nitrogen-containing cation having a pKa value of 7 or less and a counteranion.

A sixth aspect of the present invention is a method of forming a resist pattern including: a step (1) in which a resist film is formed by coating a resist composition which includes a base component (A) that exhibits increased solubility in an alkali developing solution under the action of acid, a photo-base generator component (C) that generates a base upon exposure, and an acidic compound component (G) including a compound (G1C) composed of a nitrogen-containing cation having a pKa value of 7 or less and a counteranion, on a substrate; a step (2) in which the resist film is subjected to exposure; a step (3) in which baking is conducted after the step (2), such that, at an exposed portion of the resist film, the base generated from the photo-base generator component (C) upon the exposure and the acidic compound component (G) are neutralized, and at an unexposed portion of the resist film, the solubility of the base component (A) in an alkali developing solution is increased by the action of the acidic compound component (G); and a step (4) in which the resist film is subjected to an alkali development, thereby forming a negative-tone resist pattern in which the unexposed portion of the resist film has been dissolved and removed.

In the present description and claims, the term "aliphatic" is a relative concept used in relation to the term "aromatic", and defines a group or compound that has no aromaticity.

The term "alkyl group" includes linear, branched or cyclic, monovalent saturated hydrocarbon groups, unless otherwise specified. The same applies for the alkyl group within an alkoxy group.

The term "alkylene group" includes linear, branched or cyclic divalent saturated hydrocarbon groups, unless otherwise specified.

A "halogenated alkyl group" is a group in which part or all of the hydrogen atoms of an alkyl group are substituted with a halogen atom, and a "halogenated alkylene group" is a group in which part or all of the hydrogen atoms of an alkylene group are substituted with a halogen atom. Examples of the halogen atom include a fluorine atom, a chlorine atom, a bromine atom and an iodine atom.

A "hydroxyalkyl group" is a group in which part or all of the hydrogen atoms within an alkyl group have been substituted with a hydroxyl group.

The term "structural unit" refers to a monomer unit that contributes to the formation of a polymeric compound (namely, a resin, polymer or copolymer).

The term "exposure" is used as a general concept that includes irradiation with any form of radiation.

According to the present invention, there is provided a method of forming a resist pattern which enable formation of the negative pattern, and a resist composition which can be used therein and having excellent storage stability.

Further, according to the present invention, there are provided a resist composition which can be used for formation of the negative pattern by using a resist composition including a base component that exhibits increased solubility in an alkali developing solution under the action of acid in an alkali developing process and which has an excellent storage stability, and a method of forming a pattern using the resist composition.

MODE FOR CARRYING OUT THE INVENTION

<<Resist Composition>>

Figure 1:
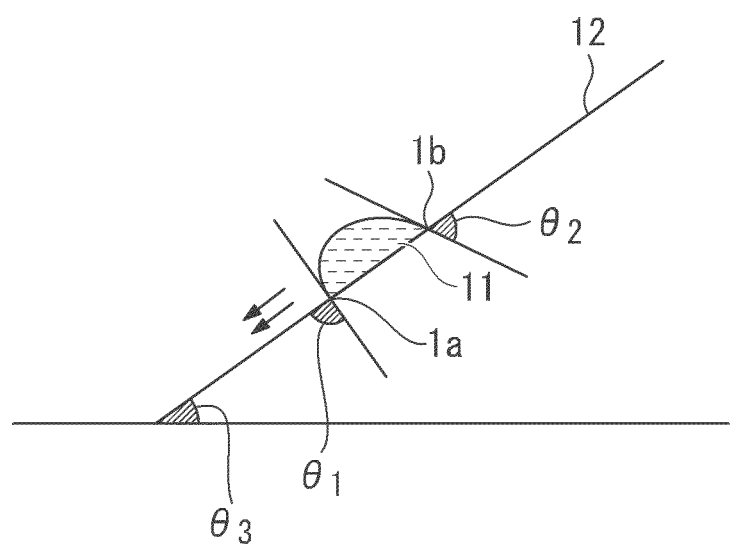
FIG. 1 is a diagram showing an advancing angle ($\theta_1$), a receding angle ($\theta_2$) and a sliding angle ($\theta_3$).

The resist composition of the first aspect of the present invention is used in a step (1) of a method of forming a resist pattern including: the step (1) in which a resist film is formed by coating a resist composition which includes a base component that exhibits increased solubility in an alkali developing solution under the action of acid, a photo-base generator component that generates a base upon exposure, an acid supply component and a compound (F) containing at least one selected from the group consisting of a fluorine atom and a silicon atom, on a substrate; a step (2) in which the resist film is subjected to exposure; a step (3) in which baking is conducted after the step (2), such that, at an exposed portion of the resist film, the base generated from the photo-base generator component upon the exposure and an acid derived from the acid supply component are neutralized, and at an unexposed portion of the resist film, the solubility of the base component in an alkali developing solution is increased by the action of the acid derived from the acid supply component; and a step (4) in which the resist film is subjected to an alkali development, thereby forming a negative-tone resist pattern in which the unexposed portion of the resist film has been dissolved and removed.

That is, the resist composition of the first aspect of the present invention includes a base component (hereafter, referred to as "component (A)") that exhibits increased solubility in an alkali developing solution under the action of acid, a photo-base generator component (hereafter, referred to as "component (C)") that generates a base upon exposure, an acid supply component (hereafter, referred to as "component (Z)") and a compound (F) (hereafter, referred to as "component (F)") containing at least one selected from the group consisting of a fluorine atom and a silicon atom, and is used in the step (1).

The method of forming a resist pattern including the steps (1) to (4) will be described in the second aspect of the present invention described later.

The resist composition of the third aspect of the present invention is used in a step (1) of a method of forming a resist pattern including: a step (1) in which a resist film is formed by coating a resist composition which includes a base component (A) that exhibits increased solubility in an alkali developing solution under the action of acid, a photo-base generator component (C) that generates a base upon exposure, an acidic compound component (G) and an amine (D), on a substrate; a step (2) in which the resist film is subjected to exposure; a step (3) in which baking is conducted after the step (2), such that, at an exposed portion of the resist film, the base generated from the photo-base generator component (C) upon the exposure and the acidic compound component (G) are neutralized, and at an unexposed portion of the resist film, the solubility of the base component (A) in an alkali developing solution is increased by the action of the acidic compound component (G); and a step (4) in which the resist film is subjected to an alkali development, thereby forming a negative-tone resist pattern in which the unexposed portion of the resist film has been dissolved and removed.

That is, the resist composition of the third aspect of the present invention includes a base component (A) that exhibits increased solubility in an alkali developing solution under the action of acid, a photo-base generator component (C) that generates a base upon exposure, an acidic compound component (G) (hereafter, referred to as "component (G)") and an amine (D) (hereafter, referred to as "component (D)"). The method of forming a resist pattern, in which the resist composition of the third aspect of the present invention can be used, including the steps (1) to (4) will be described in the fourth aspect of the present invention described later.

The resist composition of the fifth aspect of the present invention is used in a step (1) of a method of forming a resist pattern, in which a resist composition including a base component (A) that exhibits increased solubility in an alkali developing solution under the action of acid, a photo-base generator component (C) that generates a base upon exposure, and an acidic compound component (G) is used, including the steps (1) to (4) according to the fourth aspect of the present invention.

That is, the resist composition of the fifth aspect of the present invention includes a base component (A) that exhibits increased solubility in an alkali developing solution under the action of acid, a photo-base generator component (C) that generates a base upon exposure, and an acidic compound component (G). The method of forming a resist pattern, in which the resist composition of the fifth aspect of the present invention can be used, including the steps (1) to (4) will be described in the sixth aspect of the present invention described later.

In the present invention, a "negative-tone resist pattern" refers to a resist pattern in which an unexposed portion of the resist film is dissolved and removed by an alkali developing solution, and an exposed portion remains as a pattern. A resist composition which forms the negative resist pattern is frequently referred to as a "negative resist composition". In particular, the resist composition of the present invention is the negative resist composition.

Base Component; Component (A)

The component (A) is a base component which exhibits increased solubility in a developing solution under action of acid.

The term "base component" refers to an organic compound capable of forming a film, and is preferably an organic compound having a molecular weight of 500 or more. When the organic compound has a molecular weight of 500 or more, the film-forming ability is improved, and a resist pattern of nano level can be easily formed.

The organic compound used as the base component is broadly classified into non-polymers and polymers.

In general, as a non-polymer, any of those which have a molecular weight in the range of 500 to less than 4,000 is used. Hereafter, a "low molecular weight compound" refers to a non-polymer having a molecular weight in the range of 500 to less than 4,000.

As a polymer, any of those which have a molecular weight of 1,000 or more is generally used. In the present description and claims, the term "resin" refers to a polymer having a molecular weight of 1,000 or more.

As the molecular weight of the polymer, the weight average molecular weight in terms of the polystyrene equivalent value determined by gel permeation chromatography (GPC) is used.

The component (A) is preferably a base component which exhibits increased polarity by the action of acid (hereafter, referred to as "component (A0)").

In the present invention, when the component (A0) is used, since the polarity of the component (A0) changes at unexposed portions before and after the baking in the step (3), an excellent development contrast can be obtained by an alkali development.

The component (A0) may be a resin component that exhibits increased polarity under the action of acid, a low molecular weight compound that exhibits increased polarity under the action of acid, or a mixture thereof.

As the component (A0), a resin component that exhibits increased polarity under the action of acid is preferable, and a polymeric compound (A1) (hereafter, referred to as "component (A1)") containing a structural unit (a1) derived from an acrylate ester which may have the hydrogen atom bonded to the carbon atom on the α-position substituted with a substituent and contains an acid decomposable group which exhibits increased polarity by the action of acid is particularly desirable.

It is preferable that the component (A1) include, in addition to the structural unit (a1), a structural unit (a0) containing an —$SO_2$— containing cyclic group.

In addition to the structural unit (a1) or in addition to the structural unit (a1) and the structural unit (a0), it is preferable that the component (A1) further include a structural unit (a2) derived from an acrylate ester which may have the hydrogen atom bonded to the carbon atom on the α-position substituted with a substituent and contains a lactone-containing cyclic group.

In addition to the structural unit (a1) or in addition to the structural unit (a1) and at least one of the structural unit (a0) and the structural unit (a2), it is preferable that the component (A1) further include a structural unit (a3) derived from an acrylate ester containing a polar group-containing aliphatic hydrocarbon group and may have the hydrogen atom bonded to the carbon atom on the α-position substituted with a substituent.

In the present descriptions and the claims, the expression "structural unit derived from an acrylate ester" refers to a structural unit that is formed by the cleavage of the ethylenic double bond of an acrylate ester.

An "acrylate ester" refers to a compound in which the terminal hydrogen atom of the carboxy group of acrylic acid ($CH_2$=CH—COOH) has been substituted with an organic group.

The acrylate ester may have the hydrogen atom bonded to the carbon atom on the α-position substituted with a substituent. The substituent that substitutes the hydrogen atom bonded to the carbon atom on the α-position is atom other than hydrogen or a group, and examples thereof include an alkyl group of 1 to 5 carbon atoms, a halogenated alkyl group of 1 to 5 carbon atoms and a hydroxyalkyl group. A carbon atom on the α-position of an acrylate ester refers to the carbon atom bonded to the carbonyl group, unless specified otherwise.

Hereafter, an acrylic acid and an acrylate ester which have the hydrogen atom bonded to the carbon atom on the α-position substituted with a substituent is sometimes referred to as "α-substituted acrylic acid" and "α-substituted acrylate ester", respectively.

Further, the acrylic acid and α-substituted acrylic acids are collectively referred to as "(α-substituted) acrylic acid", and acrylate esters and α-substituted acrylate esters are collectively referred to as "(α-substituted) acrylate ester".

In the α-substituted acrylate ester, the alkyl group as the substituent on the α-position is preferably a linear or branched alkyl group, and specific examples thereof include a methyl group, an ethyl group, a propyl group, an isopropyl group, an n-butyl group, an isobutyl group, a tert-butyl group, a pentyl group, an isopentyl group and a neopentyl group.

Specific examples of the halogenated alkyl group of 1 to 5 carbon atoms as the substituent on the α-position include groups in which part or all of the hydrogen atoms of the aforementioned "alkyl group of 1 to 5 carbon atoms as the substituent on the α-position" are substituted with halogen atoms. Examples of the halogen atom include a fluorine atom, a chlorine atom, a bromine atom and an iodine atom, and a fluorine atom is particularly desirable.

It is preferable that a hydrogen atom, an alkyl group of 1 to 5 carbon atoms or a halogenated alkyl group of 1 to 5 carbon atoms is bonded to the α-position of the α-substituted acrylate ester, a hydrogen atom, an alkyl group of 1 to 5 carbon atoms or a fluorinated alkyl group of 1 to 5 carbon atoms is more preferable, and in terms of industrial availability, a hydrogen atom or a methyl group is the most desirable.

[Structural Unit (a1)]

The structural unit (a1) is a structural unit derived from an acrylate ester which may have the hydrogen atom bonded to the carbon atom on the α-position substituted with a substituent and contains an acid decomposable group which exhibits increased polarity by the action of acid.

The term "acid decomposable group" refers to a group in which at least a part of the bond within the structure thereof is cleaved by the action of an acid.

Examples of acid decomposable groups which exhibit increased polarity by the action of an acid include groups which are decomposed by the action of an acid to form a polar group.

Examples of the polar group include a carboxy group, a hydroxy group, an amino group and a sulfo group (—SO$_3$H). Among these, a polar group containing —OH in the structure thereof (hereafter, referred to as "OH-containing polar group") is preferable, a carboxy group or a hydroxy group is more preferable, and a carboxy group is particularly desirable.

More specifically, as an example of an acid decomposable group, a group in which the aforementioned polar group has been protected with an acid dissociable group (such as a group in which the hydrogen atom of the OH-containing polar group has been protected with an acid dissociable group) can be given.

An "acid dissociable group" is a group in which at least the bond between the acid dissociable group and the adjacent carbon atom is cleaved by the action of acid. It is necessary that the acid dissociable group that constitutes the acid decomposable group is a group which exhibits a lower polarity than the polar group generated by the dissociation of the acid dissociable group. Thus, when the acid dissociable group is dissociated by the action of acid, a polar group exhibiting a higher polarity than that of the acid dissociable group is generated, thereby increasing the polarity. As a result, the polarity of the entire component (A1) is increased. By the increase in the polarity, the solubility in an alkali developing solution changes and, the solubility in an alkali developing solution is relatively increased.

The acid dissociable group is not particularly limited, and any of the groups that have been conventionally proposed as acid dissociable groups for the base resins of chemically amplified resists can be used. Generally, groups that form either a cyclic or chain-like tertiary alkyl ester with the carboxyl group of the (meth)acrylic acid, and acetal-type acid dissociable groups such as alkoxyalkyl groups are widely known.

Here, a tertiary alkyl ester describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group (—C(=O)—O—). In this tertiary alkyl ester, the action of acid causes cleavage of the bond between the oxygen atom and the tertiary carbon atom, thereby forming a carboxy group.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid dissociable groups".

Examples of tertiary alkyl ester-type acid dissociable groups include aliphatic branched, acid dissociable groups and aliphatic cyclic group-containing acid dissociable groups.

The term "aliphatic branched" refers to a branched structure having no aromaticity. The "aliphatic branched, acid dissociable group" is not limited to be constituted of only carbon atoms and hydrogen atoms (not limited to hydrocarbon groups), but is preferably a hydrocarbon group. Further, the "hydrocarbon group" may be either saturated or unsaturated, but is preferably saturated.

As an example of the aliphatic branched, acid dissociable group, for example, a group represented by the formula —C($R^{71}$)($R^{72}$)($R^{73}$) can be given (in the formula, each of $R^{71}$ to $R^{73}$ independently represents a linear alkyl group of 1 to 5 carbon atoms). The group represented by the formula —C($R^{71}$)($R^{72}$)($R^{73}$) preferably has 4 to 8 carbon atoms, and specific examples include a tert-butyl group, a 2-methyl-2-butyl group, a 2-methyl-2-pentyl group and a 3-methyl-3-pentyl group.

Among these, a tert-butyl group is particularly desirable.

The term "aliphatic cyclic group" refers to a monocyclic group or polycyclic group that has no aromaticity.

In the "aliphatic cyclic group-containing acid dissociable group", the "aliphatic cyclic group" may or may not have a substituent. Examples of the substituent include an alkyl group of 1 to 5 carbon atoms, an alkoxy group of 1 to 5 carbon atoms, a fluorine atom, a fluorinated alkyl group of 1 to 5 carbon atoms, and an oxygen atom (=O).

The basic ring of the "aliphatic cyclic group" exclusive of substituents is not limited to be constituted from only carbon and hydrogen (not limited to hydrocarbon groups), but is preferably a hydrocarbon group. Further, the "hydrocarbon group" may be either saturated or unsaturated, but is preferably saturated.

The aliphatic cyclic group may be either a monocyclic group or a polycyclic group.

As such aliphatic cyclic groups, groups in which one or more hydrogen atoms have been removed from a monocycloalkane or a polycycloalkane such as a bicycloalkane, tricycloalkane or tetracycloalkane which may or may not be substituted with an alkyl group of 1 to 5 carbon atoms, a fluorine atom or a fluorinated alkyl group, may be used. Specific examples of aliphatic cyclic hydrocarbon groups include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane. In these aliphatic cyclic hydrocarbon groups, part of the carbon atoms constituting the ring may be replaced with an ethereal oxygen atom (—O—).

Examples of aliphatic cyclic group-containing acid dissociable groups include (i) a monovalent aliphatic cyclic group in which a substituent (a group or an atom other than hydrogen) is bonded to the carbon atom on the ring skeleton to which an atom adjacent to the acid dissociable group (e.g., "—O—" within "—C(=O)—O— group") is bonded to form a tertiary carbon atom; and (ii) a group which has a branched alkylene group containing a tertiary carbon atom, and a monovalent aliphatic cyclic group to which the tertiary carbon atom is bonded.

In the group (i), as the substituent bonded to the carbon atom to which an atom adjacent to the acid dissociable group on the ring skeleton of the aliphatic cyclic group, an alkyl group can be mentioned. Examples of the alkyl group include the same groups as those represented by $R^{14}$ in formulae (1-1) to (1-9) described later.

Specific examples of the group (i) include groups represented by general formulae (1-1) to (1-9) shown below.

Specific examples of the group (ii) include groups represented by general formulae (2-1) to (2-6) shown below.

[Chemical Formula 1]

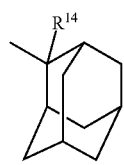

(1-1)

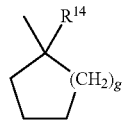

(1-2)

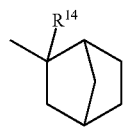

(1-3)

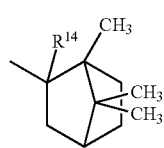

(1-4)

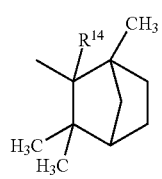

(1-5)

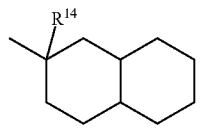

(1-6)

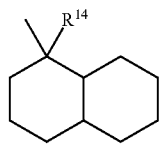

(1-7)

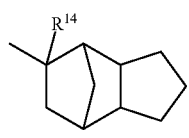

(1-8)

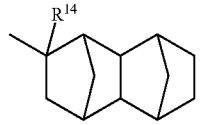

(1-9)

In the formulae above, $R^{14}$ represents an alkyl group; and g represents an integer of 0 to 8.

[Chemical Formula 2]

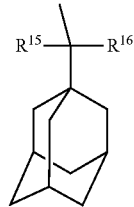

(2-1)

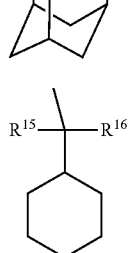

(2-2)

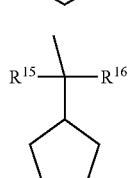

(2-3)

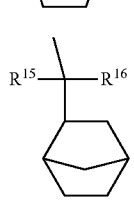

(2-4)

(2-5)

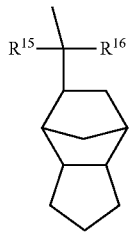

(2-6)

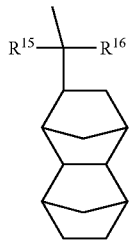

In the formula above, each of $R^{15}$ and $R^{16}$ independently represents an alkyl group.

In formulae (1-1) to (1-9), the alkyl group for $R^{14}$ may be linear, branched or cyclic, and is preferably linear or branched.

The linear alkyl group preferably has 1 to 5 carbon atoms, more preferably 1 to 4, and still more preferably 1 or 2. Specific examples include a methyl group, an ethyl group, an n-propyl group, an n-butyl group and an n-pentyl group. Among these, a methyl group, an ethyl group or an n-butyl group is preferable, and a methyl group or an ethyl group is more preferable.

The branched alkyl group preferably has 3 to 10 carbon atoms, and more preferably 3 to 5. Specific examples of such branched alkyl groups include an isopropyl group, an isobutyl group, a tert-butyl group, an isopentyl group and a neopentyl group, and an isopropyl group is particularly desirable.

g is preferably an integer of 0 to 3, more preferably 1 to 3, and still more preferably 1 or 2.

In formulae (2-1) to (2-6), as the alkyl group for $R^{15}$ and $R^{16}$, the same alkyl groups as those for $R^{14}$ can be used.

In formulae (1-1) to (1-9) and (2-1) to (2-6), part of the carbon atoms constituting the ring may be replaced with an ethereal oxygen atom (—O—).

Further, in formulae (1-1) to (1-9) and (2-1) to (2-6), one or more of the hydrogen atoms bonded to the carbon atoms constituting the ring may be substituted with a substituent. Examples of the substituent include an alkyl group of 1 to 5 carbon atoms, a fluorine atom and a fluorinated alkyl group.

An "acetal-type acid dissociable group" generally substitutes a hydrogen atom at the terminal of an OH-containing polar group such as a carboxy group or hydroxyl group, so as to be bonded with an oxygen atom. When acid acts to break the bond between the acetal-type acid dissociable group and the oxygen atom to which the acetal-type, acid dissociable group is bonded, an OH-containing polar group such as a carboxy group or a hydroxy group is formed.

Examples of acetal-type acid dissociable groups include groups represented by general formula (p1) shown below.

[Chemical Formula 3]

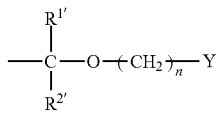

(p1)

In the formula, $R^{1\prime}$ and $R^{2\prime}$ each independently represent a hydrogen atom or an alkyl group of 1 to 5 carbon atoms; n represents an integer of 0 to 3; and Y represents an alkyl group of 1 to 5 carbon atoms or an aliphatic cyclic group.

In general formula (p1), n is preferably an integer of 0 to 2, more preferably 0 or 1, and most preferably 0.

As the lower alkyl group for $R^{1\prime}$ and $R^{2\prime}$, the same lower alkyl groups as those described above the alkyl groups as the substituent which may be bonded to the carbon atom on the α-position of the aforementioned α-substituted alkylester can be used, although a methyl group or ethyl group is preferable, and a methyl group is particularly desirable.

In the present invention, it is preferable that at least one of $R^{1\prime}$ and $R^{2\prime}$ be a hydrogen atom. That is, it is preferable that the acid dissociable group (p1) is a group represented by general formula (p1-1) shown below.

[Chemical Formula 4]

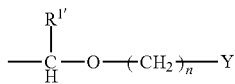

(p1-1)

In the formula, $R^{1\prime}$, n and Y are the same as defined above.

As the alkyl group for Y, the same alkyl groups as those described above the for the substituent which may be bonded to the carbon atom on the α-position of the aforementioned α-substituted alkylester can be mentioned.

As the aliphatic cyclic group for Y, any of the aliphatic monocyclic/polycyclic groups which have been proposed for conventional ArF resists and the like can be appropriately selected for use. For example, the same aliphatic cyclic groups described above in connection with the "acid dissociable group containing an aliphatic cyclic group" can be used.

Further, as the acetal-type, acid dissociable group, groups represented by general formula (p2) shown below can also be used.

[Chemical Formula 5]

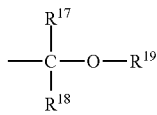

(p2)

In the formula, $R^{17}$ and $R^{18}$ each independently represent a linear or branched alkyl group or a hydrogen atom; and $R^{19}$ represents a linear, branched or cyclic alkyl group; or $R^{17}$ and $R^{19}$ each independently represents a linear or branched alkylene group, and the terminal of $R^{17}$ is bonded to the terminal of $R^{19}$ to form a ring.

The alkyl group for $R^{17}$ and $R^{18}$ preferably has 1 to 15 carbon atoms, and may be either linear or branched. As the alkyl group, an ethyl group or a methyl group is preferable, and a methyl group is most preferable.

It is particularly desirable that either one of $R^{17}$ and $R^{18}$ be a hydrogen atom, and the other be a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or methyl group, and most preferably an ethyl group.

When $R^{19}$ represents a cycloalkyl group, it preferably has 4 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane. Among these, a group in which one or more hydrogen atoms have been removed from adamantane is preferable.

In general formula (p2) above, $R^{17}$ and $R^{19}$ may each independently represent a linear or branched alkylene group (preferably an alkylene group of 1 to 5 carbon atoms), and the terminal of $R^{19}$ may be bonded to the terminal of $R^{17}$.

In such a case, a cyclic group is formed by $R^{17}$, $R^{19}$, the oxygen atom having $R^{19}$ bonded thereto, and the carbon atom having the oxygen atom and $R^{17}$ bonded thereto. Such a cyclic group is preferably a 4- to 7-membered ring, and more preferably a 4- to 6-membered ring. Specific examples of the cyclic group include tetrahydropyranyl group and tetrahydrofuranyl group.

Examples of the structural unit (a1) include a structural unit derived from an acrylate ester in which the hydrogen atom bonded to the carbon atom on the α-position may be substituted with a substituent and containing an acid-decomposable group that exhibits increased polarity under the action of acid; a structural unit derived from hydroxystyrene or a hydroxystyrene derivative in which at least part of the hydroxyl group hydrogen atoms are protected with a substituent containing an acid-decomposable group; and a structural unit derived from vinylbenzoic acid or a vinylbenzoic acid derivative in which at least part of the hydrogen atoms in the —C(=O)—OH moiety within the structural unit are protected with a substituent containing an acid-decomposable group. Preferable examples of the substituent containing an acid-decomposable group include the tertiary alkyl ester-type acid-dissociable groups and acetal-type acid-dissociable groups described above.

In the present descriptions and the claims, a "structural unit derived from hydroxystyrene or a hydroxystyrene derivative" refers to a structural unit that is formed by the cleavage of the ethylenic double bond of hydroxystyrene or a hydroxystyrene derivative.

The expression "hydroxystyrene derivative" is a generic term that includes compounds in which the hydrogen atom on the α-position of hydroxystyrene has been substituted with a substituent such as an alkyl group or a halogenated alkyl group, and derivatives thereof. Unless specified otherwise, "the α-position" ("carbon atom on the α-position") refers to the carbon atom to which the benzene group is bonded.

A "structural unit derived from vinylbenzoic acid or a vinylbenzoic acid derivative" refers to a structural unit that is formed by the cleavage of the ethylenic double bond of vinylbenzoic acid or a vinylbenzoic acid derivative.

The expression "vinylbenzoic acid derivative" is a generic term that includes compounds in which the hydrogen atom on the α-position of vinylbenzoic acid has been substituted with a substituent such as an alkyl group or a halogenated alkyl group, and derivatives thereof. Unless specified otherwise, "the α-position" ("carbon atom on the α-position") refers to the carbon atom to which the benzene group is bonded.

Among these, the structural unit (a1) is preferably a structural unit derived from an acrylate ester in which the hydrogen atom bonded to the carbon atom on the α-position may be substituted with a substituent.

Specific examples of the structural unit (a1) include a structural unit represented by general formula (a1-0-1) shown below and a structural unit represented by general formula (a1-0-2) shown below.

[Chemical Formula 6]

(a1-0-1)

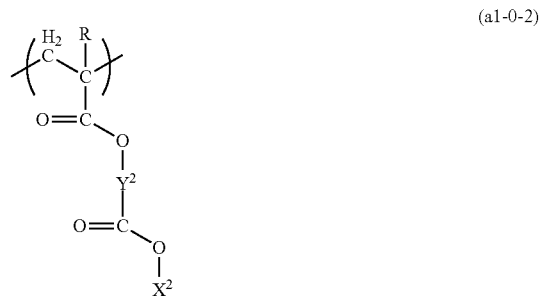

(a1-0-2)

In the formulae, R represents a hydrogen atom, an alkyl group of 1 to 5 carbon atoms or a halogenated alkyl group of 1 to 5 carbon atoms; $X^1$ represents an acid dissociable group; $Y^2$ represents a divalent linking group; and $X^2$ represents an acid dissociable group.

In general formula (a1-0-1), the alkyl group and the halogenated alkyl group for R are respectively the same as defined for the alkyl group and the halogenated alkyl group for the substituent which may be bonded to the carbon atom on the α-position of the aforementioned α-substituted acrylate ester. R is preferably a hydrogen atom, an alkyl group of 1 to 5 carbon atoms or a fluorinated alkyl group of 1 to 5 carbon atoms, and most preferably a hydrogen atom or a methyl group.

$X^1$ is not particularly limited as long as it is an acid dissociable group. Examples thereof include the aforementioned tertiary alkyl ester-type acid dissociable groups and acetal-type acid dissociable groups, and tertiary alkyl ester-type acid dissociable groups are preferable.

In general formula (a1-0-2), R is the same as defined above. $X^2$ is the same as defined for $X^1$ in general formula (a1-0-1).

The divalent linking group for $Y^2$ is not particularly limited, and preferable examples thereof include a divalent hydrocarbon group which may have a substituent and a divalent linking group containing a hetero atom.

A hydrocarbon "has a substituent" means that part or all of the hydrogen atoms within the hydrocarbon group is substituted with a substituent (a group or an atom other than hydrogen).

The hydrocarbon group may be either an aliphatic hydrocarbon group or an aromatic hydrocarbon group.

An "aliphatic hydrocarbon group" refers to a hydrocarbon group that has no aromaticity.

The divalent aliphatic hydrocarbon group as the divalent hydrocarbon group for $Y^2$ may be either saturated or unsaturated. In general, the divalent aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

The linear or branched aliphatic hydrocarbon group preferably has 1 to 10 carbon atoms, more preferably 1 to 6, still more preferably 1 to 4, and most preferably 1 to 3.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, branched alkylene groups are preferred, and specific examples include various alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group within the alkylalkylene group, a linear alkyl group of 1 to 5 carbon atoms is preferable.

The linear or branched aliphatic hydrocarbon group may or may not have a substituent. Examples of the substituent include a fluorine atom, a fluorinated alkyl group of 1 to 5 carbon atoms, and an oxygen atom (=O).

As examples of the hydrocarbon group containing a ring in the structure thereof, an alicyclic hydrocarbon group (a group in which two hydrogen atoms have been removed from an aliphatic hydrocarbon ring), a group in which the alicyclic hydrocarbon group is bonded to the terminal of the aforementioned chain-like aliphatic hydrocarbon group, and a group in which the alicyclic group is interposed within the aforementioned linear or branched aliphatic hydrocarbon group, can be given. As the linear or branched aliphatic hydrocarbon group, the same groups as those described above can be used.

The alicyclic hydrocarbon group preferably has 3 to 20 carbon atoms, and more preferably 3 to 12 carbon atoms.

The alicyclic hydrocarbon group may be either a monocyclic group or a polycyclic group. As the monocyclic aliphatic hydrocarbon group, a group in which 2 hydrogen atoms have been removed from a monocycloalkane is preferable. The monocycloalkane preferably has 3 to 6 carbon atoms, and specific examples thereof include cyclopentane and cyclohexane. As the polycyclic group, a group in which two hydrogen atoms have been removed from a polycycloalkane is preferable, and the polycyclic group preferably has 7 to 12 carbon atoms. Examples of the polycycloalkane include adamantane, norbornane, isobornane, tricyclodecane and tetracyclododecane.

The alicyclic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

The aromatic hydrocarbon group is a hydrocarbon group having an aromatic ring.

The aromatic hydrocarbon group as the divalent hydrocarbon group for $Y^2$ preferably has 5 to 30 carbon atoms, more preferably 5 to 20, still more preferably 6 to 15, and most preferably 6 to 10. Here, the number of carbon atoms within a substituent(s) is not included in the number of carbon atoms of the aromatic hydrocarbon group.

Examples of the aromatic ring contained in the aromatic hydrocarbon group include aromatic hydrocarbon rings, such as benzene, biphenyl, fluorene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom.

Specific examples of the aromatic hydrocarbon group include a group in which two hydrogen atoms have been removed from the aforementioned aromatic hydrocarbon ring (arylene group); and a group in which one hydrogen atom has been removed from the aforementioned aromatic hydrocarbon ring (aryl group) and one hydrogen atom has been substituted with an alkylene group (such as a benzyl group, a phenethyl group, a 1-naphthylmethyl group, a 2-naphthylmethyl group, a 1-naphthylethyl group, or a 2-naphthylethyl group). The alkylene group (alkyl chain within the arylalkyl group) preferably has 1 to 4 carbon atom, more preferably 1 or 2, and most preferably 1.

The aromatic hydrocarbon group may or may not have a substituent. For example, the hydrogen atom bonded to the aromatic hydrocarbon ring within the aromatic hydrocarbon group may be substituted with a substituent. Examples of substituents include an alkyl group, an alkoxy group, a halogen atom, a halogenated alkyl group, a hydroxyl group and an oxygen atom (=O).

The alkyl group as the substituent is preferably an alkyl group of 1 to 5 carbon atoms, and a methyl group, an ethyl group, a propyl group, an n-butyl group or a tert-butyl group is particularly desirable.

The alkoxy group as the substituent is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom as the substituent for the aromatic hydrocarbon group include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups has been substituted with the aforementioned halogen atoms.

With respect to a "divalent linking group containing a hetero atom" for $Y^2$, a hetero atom is an atom other than carbon and hydrogen, and examples thereof include an oxygen atom, a nitrogen atom, a sulfur atom and a halogen atom.

Examples of the divalent linking group containing a hetero atom include —O—, —C(=O)—O—, —C(=O)—, —O—C(=O)—O—, —C(=O)—NH—, —NH—, —NH—C(=O)— (H for NH may be substituted with a substituent such as an alkyl group or an acyl group), —S—, —S(=O)$_2$—, —S(=O)$_2$—O—, =N—, and a group represented by general formula —Y$^{21}$—O—Y$^{22}$—, —[Y$^{21}$—C(=O)—O]$_m$'—Y$^{22}$— or —Y$^{21}$—O—C(=O)—Y$^{22}$— [wherein Y$^{21}$ and Y$^{22}$ each independently represents a divalent hydrocarbon group which may have a substituent, O represents an oxygen atom, and m' represents an integer of 0 to 3.]

When Y$^2$ represents —NH—, H may be substituted with a substituent such as an alkyl group, an acyl group or the like. The substituent (an alkyl group, an acyl group or the like) preferably has 1 to 10 carbon atoms, more preferably 1 to 8, and most preferably 1 to 5.

In formula —Y$^{21}$—O—Y$^{22}$—, —[Y$^{21}$—C(=O)—O]$_m$'—Y$^{22}$— or —Y$^{21}$—O—C(=O)—Y$^{22}$—, Y$^{21}$ and Y$^{22}$ each independently represents a divalent hydrocarbon group which may have a substituent. As the divalent hydrocarbon group, the same groups as those described above for the "divalent hydrocarbon group which may have a substituent" for Y$^2$ can be mentioned.

As Y$^{21}$, a linear aliphatic hydrocarbon group is preferable, more preferably a linear alkylene group, still more preferably a linear alkylene group of 1 to 5 carbon atoms, and a methylene group or an ethylene group is particularly desirable.

As Y$^{22}$, a linear or branched aliphatic hydrocarbon group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

In the group represented by the formula —[Y$^{21}$—C(=O)—O]$_m$'—Y$^{22}$—, m' represents an integer of 0 to 3, preferably an integer of 0 to 2, more preferably 0 or 1, and most preferably 1. Namely, it is particularly desirable that the group represented by the formula —[Y$^{21}$—C(=O)—O]$_m$'-Y$^{22}$— is a group represented by the formula —Y$^{21}$—C(=O)—O—Y$^{22}$—. Among these, a group represented by the formula —(CH$_2$)$_a$'C(=O)—O—(CH$_2$)$_b$'— is preferable. In the formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

As the divalent linking group containing a hetero atom, a linear group containing an oxygen atom as the hetero atom e.g., a group containing an ether bond or an ester bond is preferable, and a group represented by the aforementioned formula —Y$^{21}$—O—Y$^{22}$—, —[Y$^{21}$—C(=O)—O]$_m$'—Y$^{22}$— or —Y$^{21}$—O—C(=O)—Y$^{22}$— is more preferable.

Among the aforementioned examples, as the divalent linking group for Y$^2$, an alkylene group, a divalent alicyclic hydrocarbon group or a divalent linking group containing a hetero atom is particularly desirable. Among these, an alkylene group or a divalent linking group containing a hetero atom is more preferable.

Specific examples of the structural unit (a1) include structural units represented by general formulae (a1-1) to (a1-4) shown below.

[Chemical Formula 7]

(a1-1)

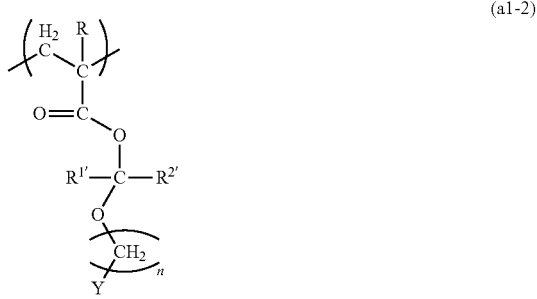
(a1-2)

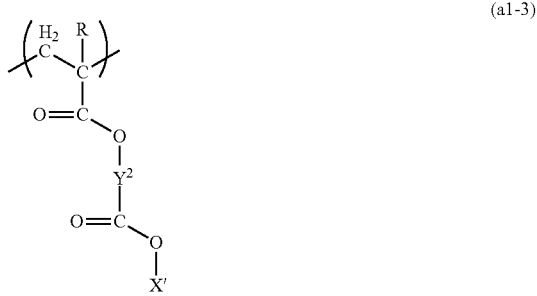
(a1-3)

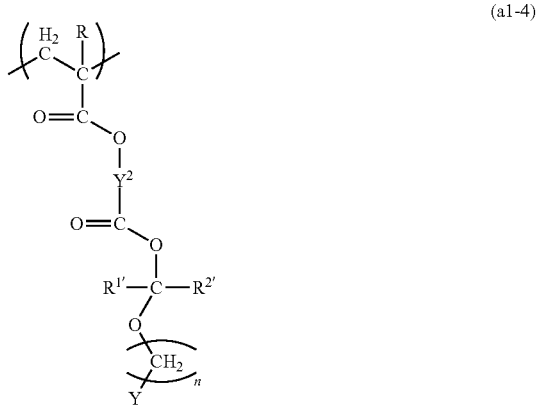
(a1-4)

In the formulae, R, R$^{1'}$, R$^{2'}$, n, Y and Y$^2$ are the same as defined above; and X' represents a tertiary alkyl ester-type acid dissociable group.

In the formulae, the tertiary alkyl ester-type acid dissociable group for X' include the same tertiary alkyl ester-type acid dissociable groups as those described above.

As R$^{1'}$ R$^{2'}$, n and Y are respectively the same as defined for R$^{1'}$ R$^{2'}$, n and Y in general formula (p1) described above in connection with the "acetal-type acid dissociable group".

As examples of Y$^2$, the same groups as those described above for Y$^2$ in general formula (a1-0-2) can be given.

Specific examples of structural units represented by general formula (a1-1) to (a1-4) are shown below.

In the formulae shown below, R$^\alpha$ represents a hydrogen atom, a methyl group or a trifluoromethyl group.

[Chemical Formula 8]
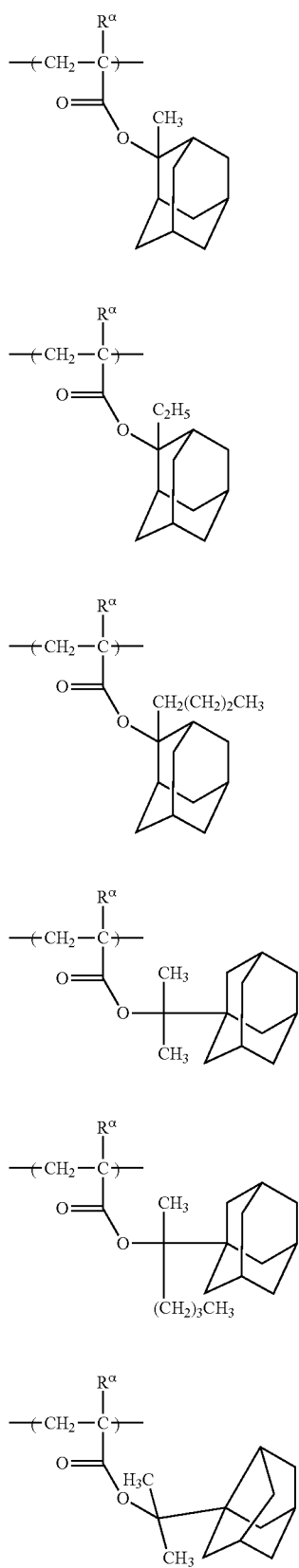
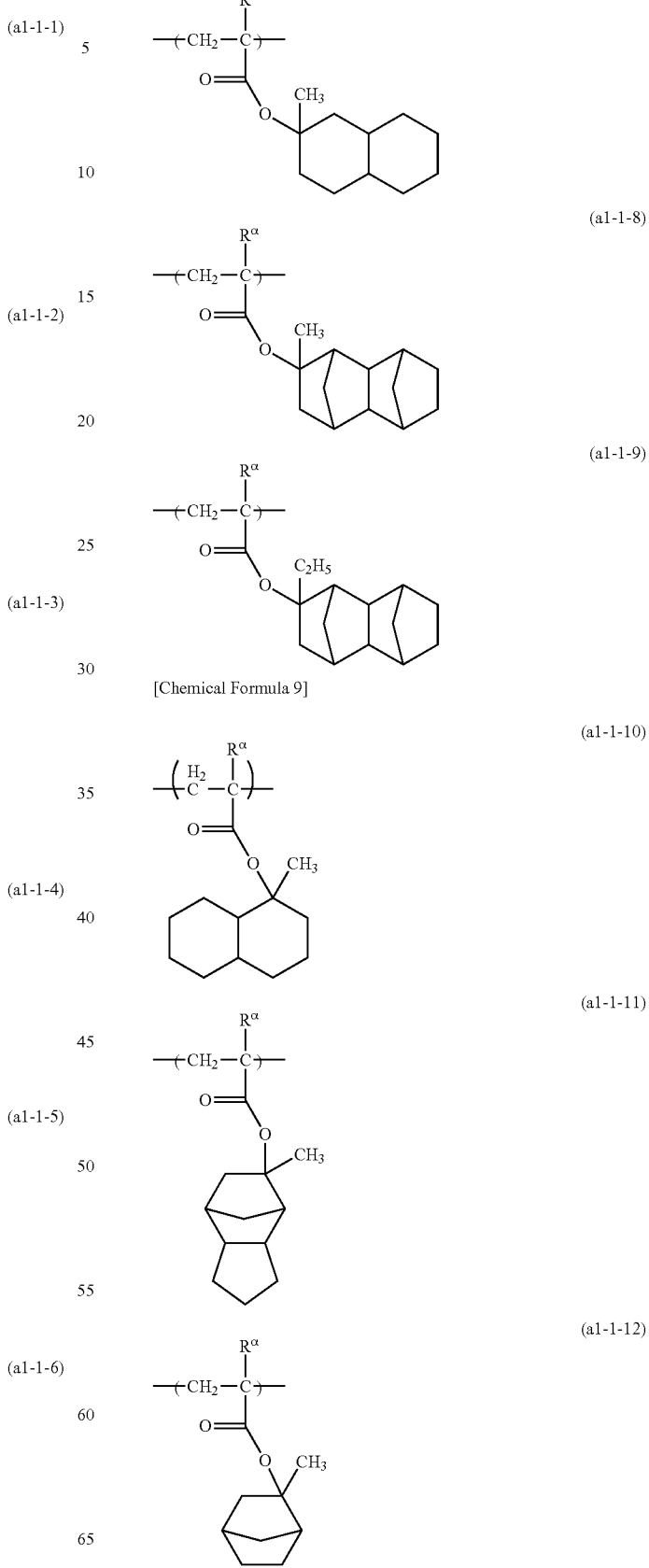

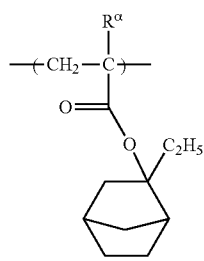 (a1-1-13)
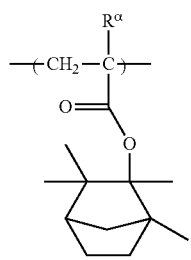 (a1-1-14)
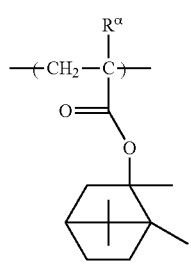 (a1-1-15)
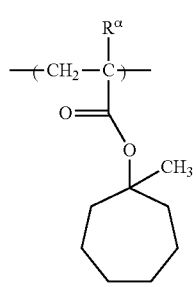 (a1-1-16)
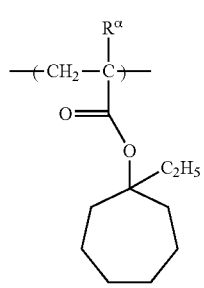 (a1-1-17)
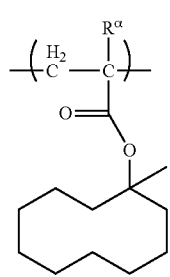 (a1-1-18)
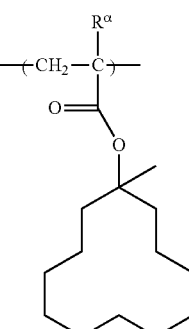 (a1-1-19)
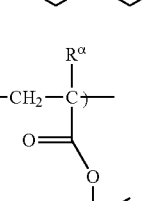 (a1-1-20)
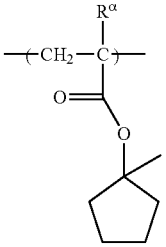 (a1-1-21)
[Chemical Formula 10]
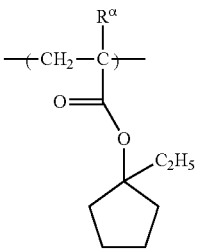 (a1-1-22)
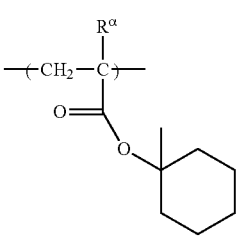 (a1-1-23)
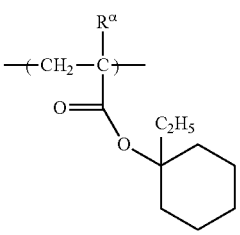 
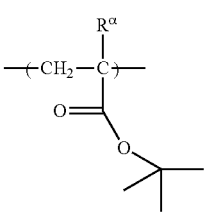 (a1-1-24)

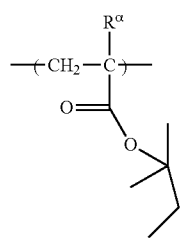 (a1-1-25)
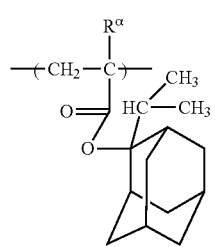 (a1-1-26)
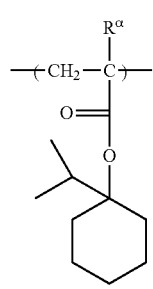 (a1-1-27)
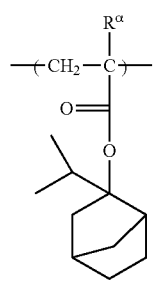 (a1-1-28)
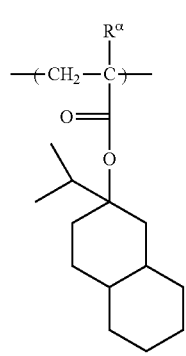 (a1-1-29)
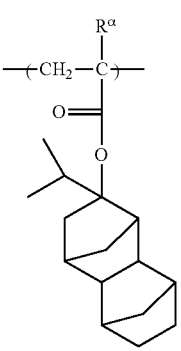 (a1-1-30)
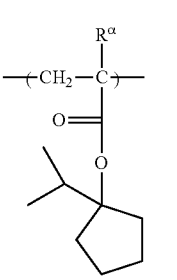 (a1-1-31)
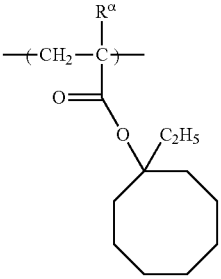 (a1-1-32)
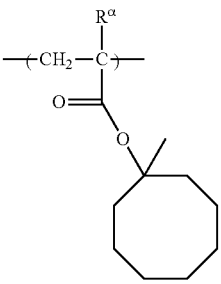 (a1-1-33)
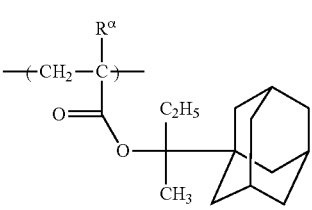 (a1-1-34)
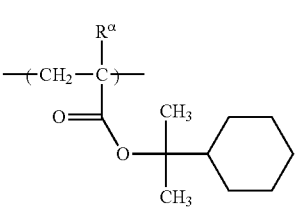 (a1-1-35)

(a1-1-36)
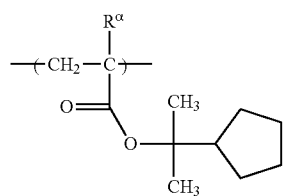
[Chemical Formula 11]
(a1-2-1)
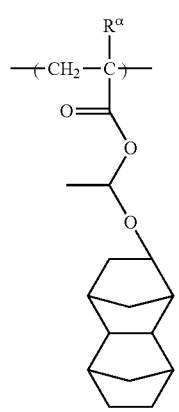
(a1-2-2)
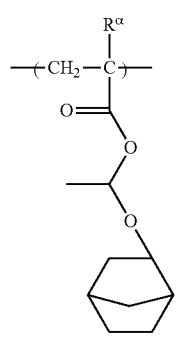
(a1-2-3)
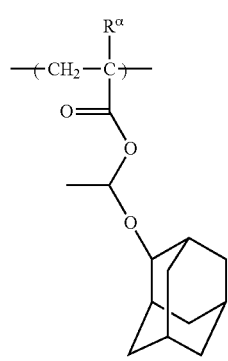
(a1-2-4)
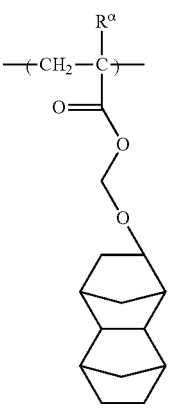
(a1-2-5)
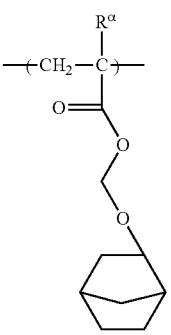
(a1-2-6)
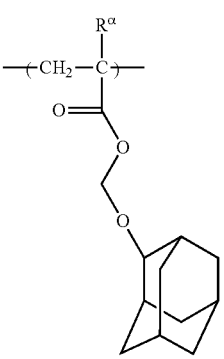
(a1-2-7)
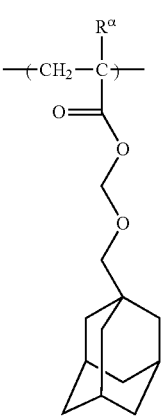

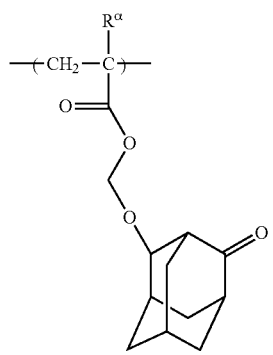
(a1-2-8)
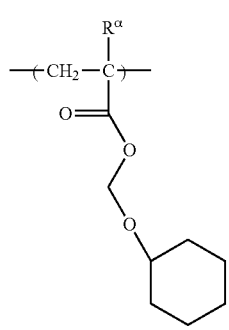
(a1-2-9)
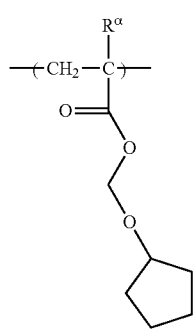
(a1-2-10)
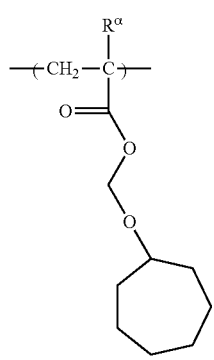
(a1-2-11)
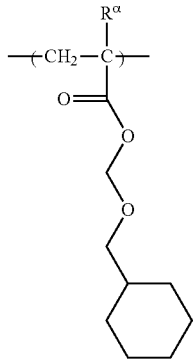
(a1-2-12)
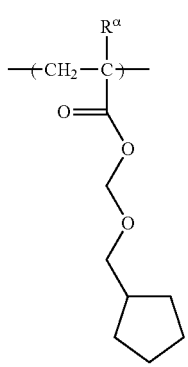
(a1-2-13)
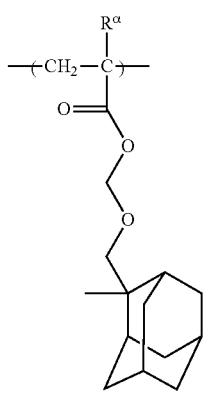
(a1-2-14)
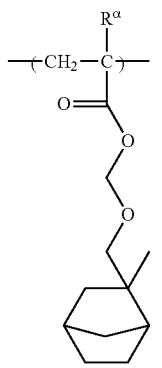
(a1-2-15)

(a1-2-16)
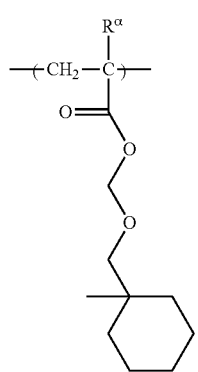
(a1-2-17)
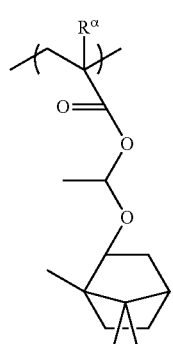
(a1-2-18)
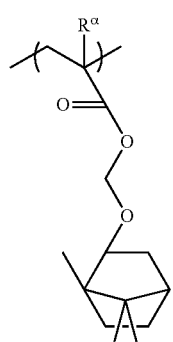
(a1-2-19)
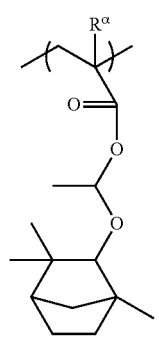
(a1-2-20)
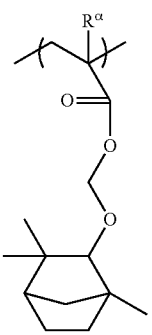
(a1-2-21)
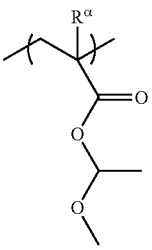
(a1-2-22)
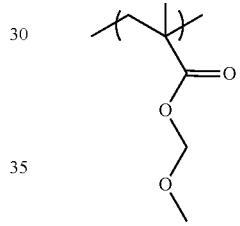
(a1-2-23)
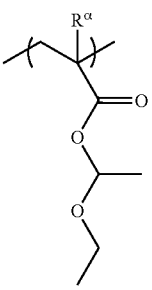
(a1-2-24)
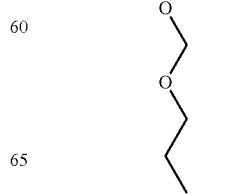

[Chemical Formula 12]
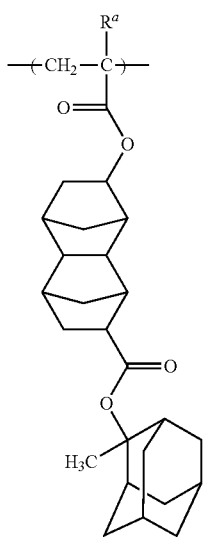
(a1-3-1)
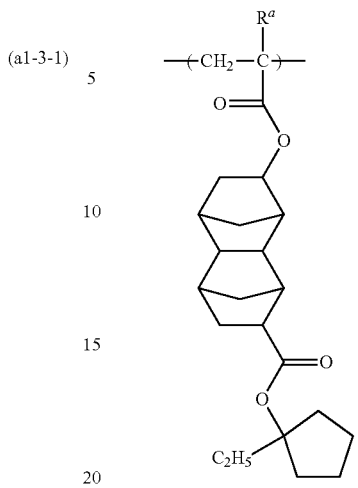
(a1-3-4)
(a1-3-2)
(a1-3-5)
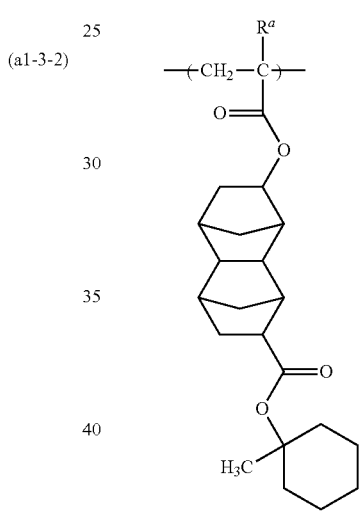
(a1-3-3)
(a1-3-6)
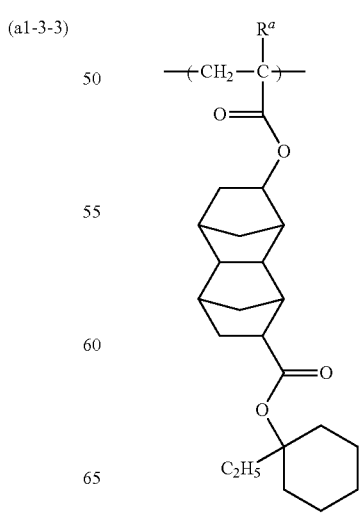

(a1-3-7)
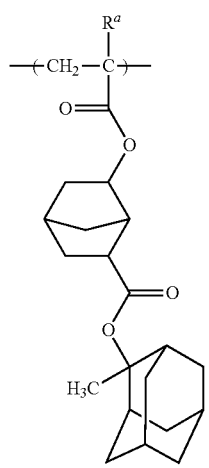
(a1-3-8)
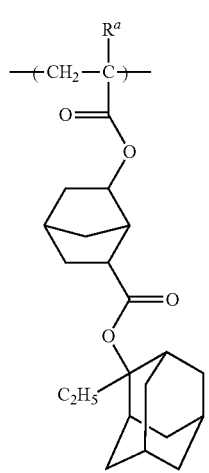
(a1-3-9)
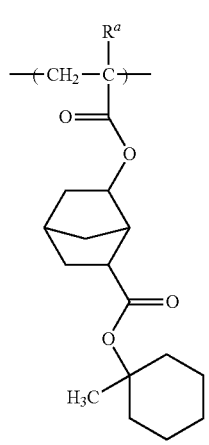
(a1-3-10)
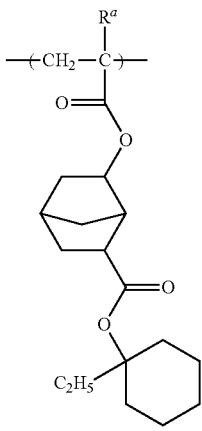
(a1-3-11)
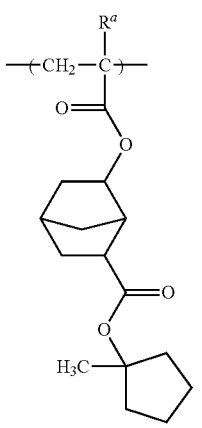
(a1-3-12)
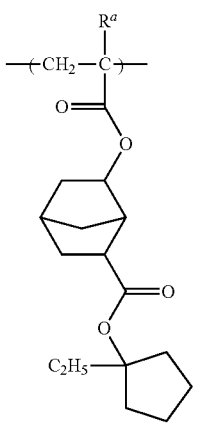
(a1-3-13)
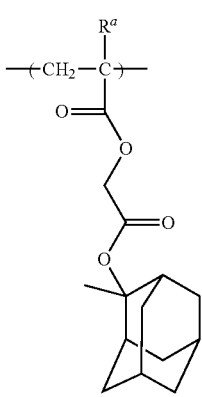

(a1-3-14)
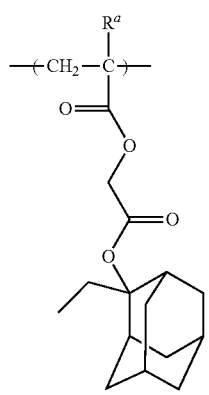
(a1-3-15)
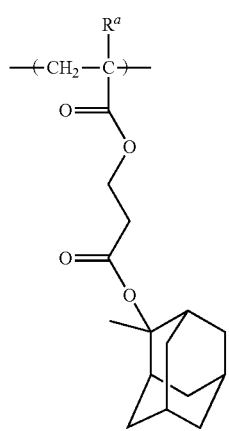
(a1-3-16)
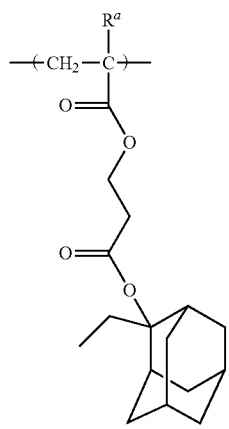
(a1-3-17)
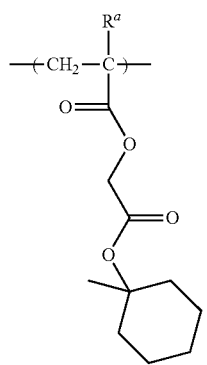
(a1-3-18)
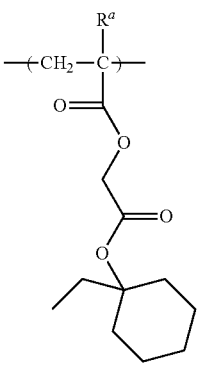
[Chemical Formula 13]
(a1-3-19)
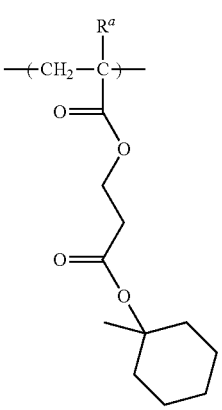
(a1-3-20)
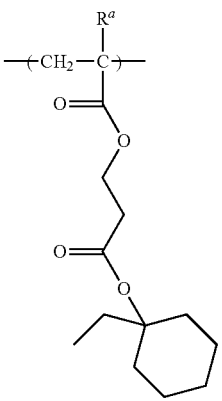
(a1-3-21)
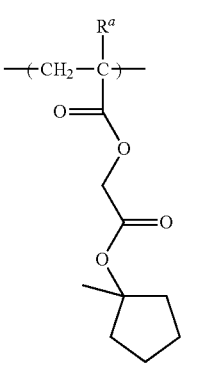

-continued
(a1-3-22)
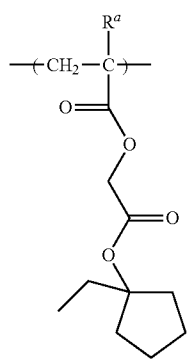
(a1-3-23)
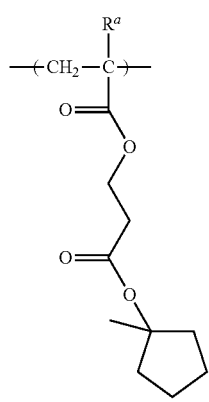
(a1-3-24)
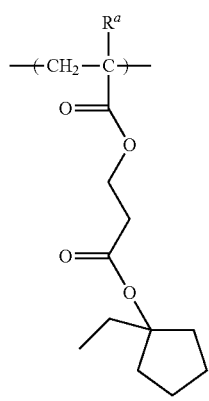
[Chemical Formula 14]
(a1-3-25)
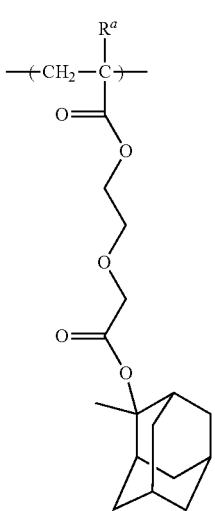
(a1-3-26)
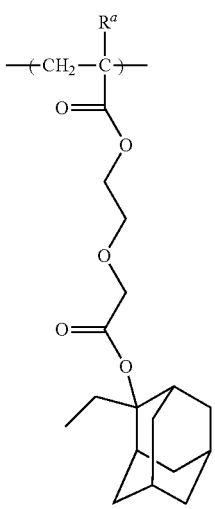
(a1-3-27)
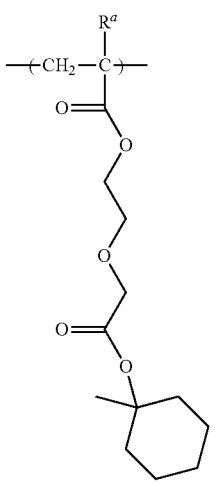

(a1-3-28)
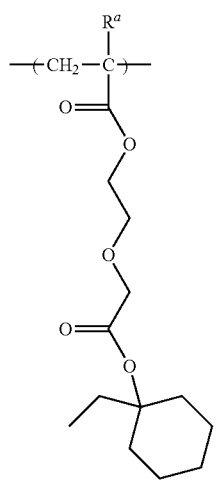
(a1-3-29)
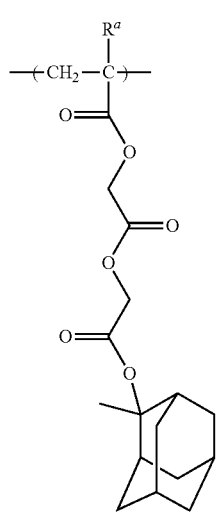
(a1-3-30)
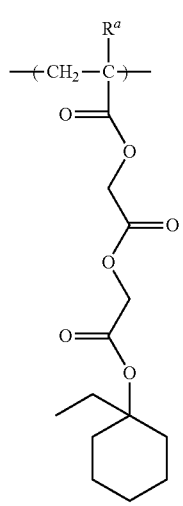
(a1-3-31)
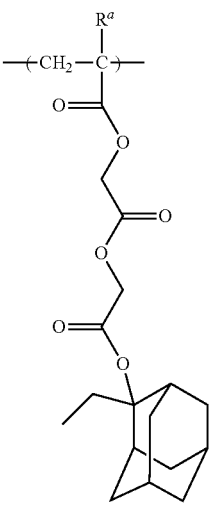
(a1-3-32)
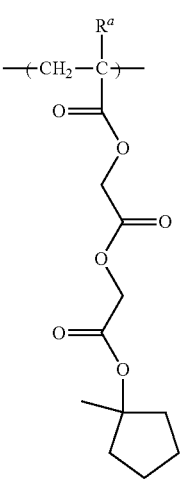
[Chemical Formula 15]
(a1-4-1)
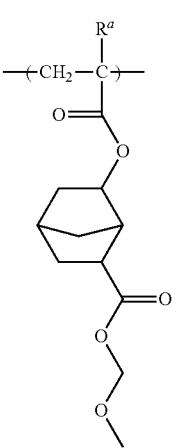

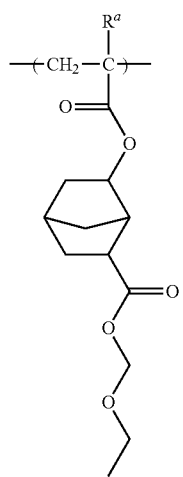
(a1-4-2)
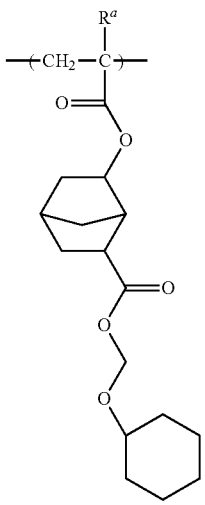
(a1-4-5)
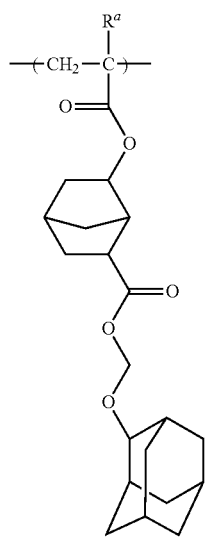
(a1-4-3)
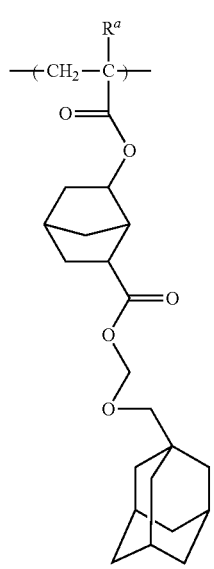
(a1-4-4)
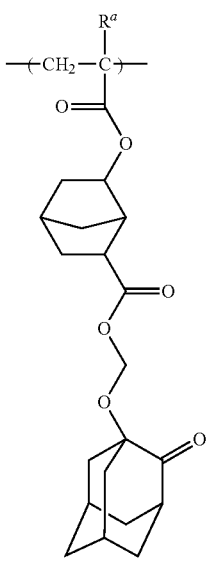
(a1-4-6)
(a1-4-7)

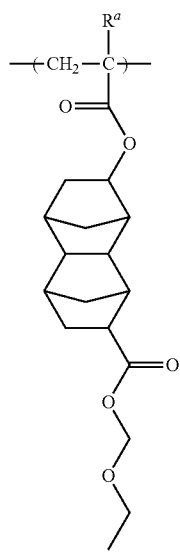
(a1-4-8)
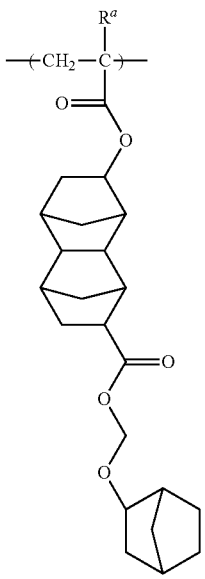
(a1-4-10)
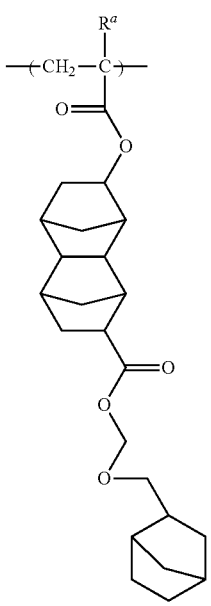
(a1-4-9)
(a1-4-11)

(a1-4-12)

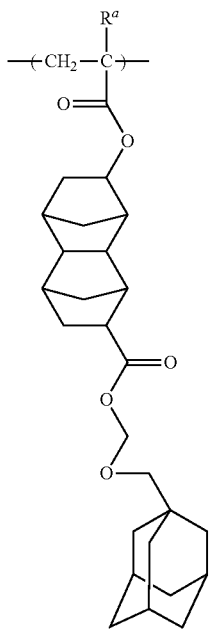

(a1-4-13)

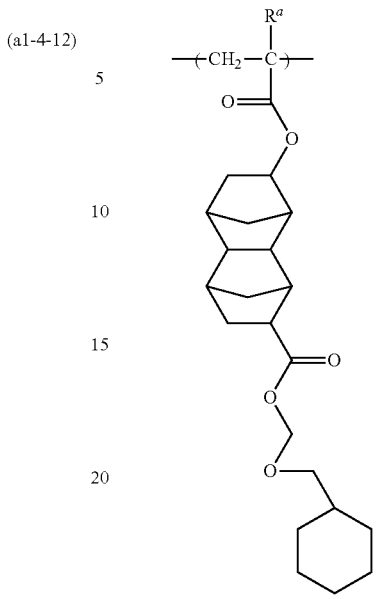

(a1-4-14)

(a1-4-15)

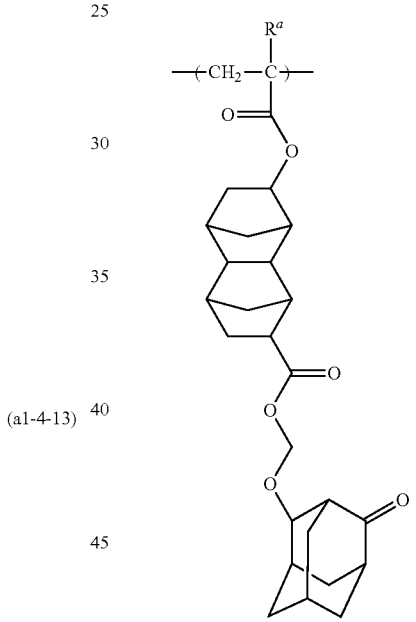

In the present invention, as the structural unit (a1), it is preferable to include at least one structural unit selected from the group consisting of a structural unit represented by general formula (a1-0-11) shown below, a structural unit represented by general formula (a1-0-12) shown below, a structural unit represented by general formula (a1-0-13) shown below, a structural unit represented by general formula (a1-0-14) shown below, a structural unit represented by general formula (a1-0-15) shown below and a structural unit represented by general formula (a1-0-2) shown below.

Among these examples, as the structural unit (a1), it is preferable to include at least one structural unit selected from the group consisting of a structural unit represented by general formula (a1-0-11) shown below, a structural unit represented by general formula (a1-0-12) shown below, a structural unit represented by general formula (a1-0-13) shown below, a structural unit represented by general formula (a1-

0-14) shown below and a structural unit represented by general formula (a1-0-15) shown below.

[Chemical Formula 16]

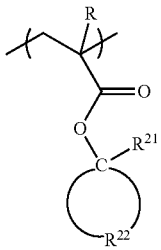

(a1-0-11)

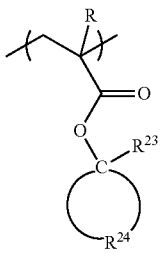

(a1-0-12)

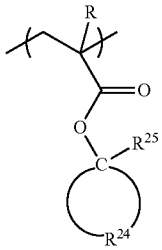

(a1-0-13)

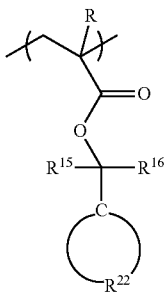

(a1-0-14)

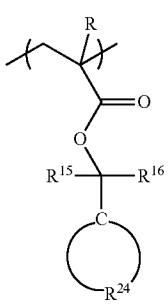

(a1-0-15)

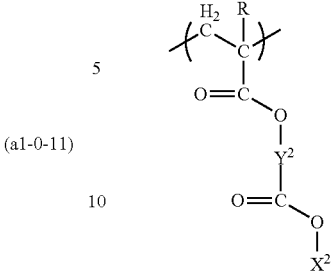

(a1-0-2)

In the formulae, R represents a hydrogen atom, an alkyl group of 1 to 5 carbon atoms or a halogenated alkyl group of 1 to 5 carbon atoms; $R^{21}$ represents an alkyl group; $R^{22}$ represents a group which forms an aliphatic monocyclic group with the carbon atom to which $R^{22}$ is bonded; $R^{23}$ represents a branched alkyl group; $R^{24}$ represents a group which forms an aliphatic polycyclic group with the carbon atom to which $R^{24}$ is bonded; $R^{25}$ represents a linear alkyl group of 1 to 5 carbon atoms; $R^{15}$ and $R^{16}$ each independently represents an alkyl group; $Y^2$ represents a divalent linking group; and $X^2$ an acid dissociable group.

In the formulae, R, $Y^2$ and $X^2$ are the same as defined above.

In general formula (a1-0-11), as the alkyl group for $R^{21}$, the same alkyl groups as those described above for $R^{14}$ in formulae (1-1) to (1-9) can be used, preferably a methyl group, an ethyl group or an isopropyl group.

As the aliphatic monocyclic group formed by $R^{22}$ and the carbon atoms to which $R^{22}$ is bonded, the same aliphatic cyclic groups as those described above for the aforementioned tertiary alkyl ester-type acid dissociable group and which are monocyclic can be used. Specific examples include groups in which one or more hydrogen atoms have been removed from a monocycloalkane. The monocycloalkane is preferably a 3- to 11-membered ring, more preferably a 3- to 8-membered ring, still more preferably a 4- to 6-membered ring, and most preferably a 5- or 6-membered ring.

The monocycloalkane may or may not have part of the carbon atoms constituting the ring replaced with an ether bond (—O—).

Further, the monocycloalkane may have a substituent such as an alkyl group of 1 to 5 carbon atoms, a fluorine atom or a fluorinated alkyl group of 1 to 5 carbon atoms.

As an examples of $R^{22}$ constituting such an aliphatic cyclic group, an alkylene group which may have an ether bond (—O—) interposed between the carbon atoms can be given.

Specific examples of structural units represented by general formula (a1-0-11) include structural units represented by the aforementioned formulae (a1-1-16) to (a1-1-23), (a1-1-27) and (a1-1-31). Among these, a structural unit represented by general formula (a1-1-02) shown below which includes the structural units represented by the aforementioned formulae (a1-1-16), (a1-1-17), (a1-1-20) to (a1-1-23), (a1-1-27), (a1-1-31), (a1-1-32) and (a1-1-33) is preferable. Further, a structural unit represented by general formula (a1-1-02') shown below is also preferable.

In the formulae, h represents an integer of 1 to 4, and preferably 1 or 2.

[Chemical Formula 17]

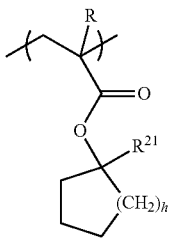

(a1-1-02)

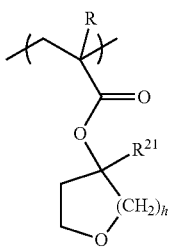

(a1-1-02')

In the formulae, R and $R^{21}$ are the same as defined above; and h represents an integer of 1 to 4.

In general formula (a1-0-12), as the branched alkyl group for $R^{23}$, the same alkyl groups as those described above for $R^{14}$ which are branched can be used, and an isopropyl group is particularly desirable.

As the aliphatic polycyclic group formed by $R^{24}$ and the carbon atoms to which $R^{24}$ is bonded, the same aliphatic cyclic groups as those described above for the aforementioned tertiary alkyl ester-type acid dissociable group and which are polycyclic can be used.

Specific examples of structural units represented by general formula (a1-0-12) include structural units represented by the aforementioned formulae (a1-1-26) and (a1-1-28) to (a1-1-30).

As the structural unit (a1-0-12), a structural unit in which the aliphatic polycyclic group formed by $R^{24}$ and the carbon atom to which $R^{24}$ is bonded is a 2-adamantyl group is preferable, and a structural unit represented by the aforementioned formula (a1-1-26) is particularly desirable.

In general formula (a1-0-13), R and $R^{24}$ are the same as defined above.

As the linear alkyl group for $R^{25}$, the same linear alkyl groups as those described above for $R^{14}$ in the aforementioned formulae (1-1) to (1-9) can be mentioned, and a methyl group or an ethyl group is particularly desirable.

Specific examples of structural units represented by general formula (a1-0-13) include structural units represented by the aforementioned formulae (a1-1-1), (a1-1-2) and (a1-1-7) to (a1-1-15) which were described above as specific examples of the structural unit represented by general formula (a1-1).

As the structural unit (a1-0-13), a structural unit in which the aliphatic polycyclic group formed by $R^{24}$ and the carbon atom to which $R^{24}$ is bonded is a 2-adamantyl group is preferable, and a structural unit represented by the aforementioned formula (a1-1-1) or (a1-1-2) is particularly desirable.

In general formula (a1-0-14), R and $R^{22}$ are the same as defined above. $R^{15}$ and $R^{16}$ are the same as $R^{15}$ and $R^{16}$ in the aforementioned general formulae (2-1) to (2-6), respectively.

Specific examples of structural units represented by general formula (a1-0-14) include structural units represented by the aforementioned formulae (a1-1-35) and (a1-1-36) which were described above as specific examples of the structural unit represented by general formula (a1-1).

In general formula (a1-0-15), R and $R^{24}$ are the same as defined above. $R^{15}$ and $R^{16}$ are the same as $R^{15}$ and $R^{16}$ in the aforementioned general formulae (2-1) to (2-6), respectively.

Specific examples of structural units represented by general formula (a1-0-15) include structural units represented by the aforementioned formulae (a1-1-4) to (a1-1-6) and (a1-1-34) which were described above as specific examples of the structural unit represented by general formula (a1-1).

Examples of structural units represented by general formula (a1-0-2) include structural units represented by the aforementioned formulae (a1-3) and (a1-4). The structural unit represented by formula (a1-3) is particularly desirable.

As a structural unit represented by general formula (a1-0-2), those in which $Y^2$ is a group represented by the aforementioned formula $—Y^{21}—O—Y^{22}—$ or $—Y^{21}—C(=O)—O—Y^{22}—$ is particularly desirable.

Preferable examples of such structural units include a structural unit represented by general formula (a1-3-01) shown below, a structural unit represented by general formula (a1-3-02) shown below, and a structural unit represented by general formula (a1-3-03) shown below.

[Chemical Formula 18]

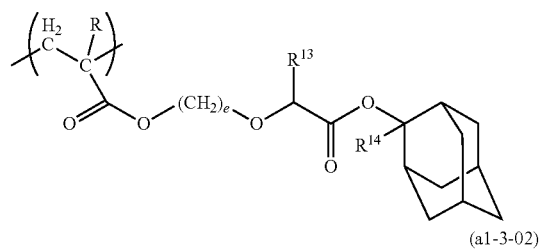

(a1-3-01)

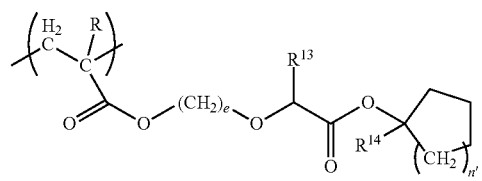

(a1-3-02)

In the formulae, R is the same as defined above; $R^{13}$ represents a hydrogen atom or a methyl group; $R^{14}$ represents an alkyl group; e represents an integer of 1 to 10; and n' represents an integer of 0 to 3.

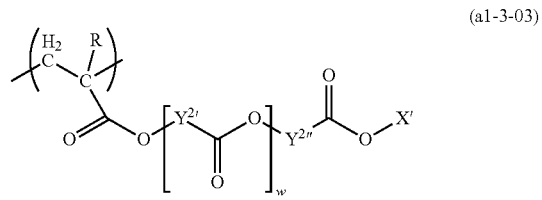

(a1-3-03)

In the formula, R is as defined above; each of $Y^{2'}$ and $Y^{2''}$ independently represents a divalent linking group; X' represents an acid dissociable group; and w represents an integer of 0 to 3.

In general formulae (a1-3-01) and (a1-3-02), $R^{13}$ is preferably a hydrogen atom.

$R^{14}$ is the same as defined for $R^{14}$ in the aforementioned formulae (1-1) to (1-9).

e is preferably an integer of 1 to 8, more preferably an integer of 1 to 5, and most preferably 1 or 2.

n' is preferably 1 or 2, and most preferably 2.

Specific examples of structural units represented by general formula (a1-3-01) include structural units represented by the aforementioned formulae (a1-3-25) and (a1-3-26).

Specific examples of structural units represented by general formula (a1-3-02) include structural units represented by the aforementioned formulae (a1-3-27) and (a1-3-28).

In general formula (a1-3-03), as the divalent linking group for $Y^{2'}$ and $Y^{2''}$, the same groups as those described above for $Y^2$ in general formula (a1-3) can be used.

As $Y^{2'}$, a divalent hydrocarbon group which may have a substituent is preferable, a linear aliphatic hydrocarbon group is more preferable, and a linear alkylene group is still more preferable. Among linear alkylene groups, a linear alkylene group of 1 to 5 carbon atoms is preferable, and a methylene group or an ethylene group is particularly desirable.

As $Y^{2''}$, a divalent hydrocarbon group which may have a substituent is preferable, a linear aliphatic hydrocarbon group is more preferable, and a linear alkylene group is still more preferable. Among linear alkylene groups, a linear alkylene group of 1 to 5 carbon atoms is preferable, and a methylene group or an ethylene group is particularly desirable.

As the acid dissociable group for X', the same groups as those described above can be used. X' is preferably a tertiary alkyl ester-type acid dissociable group, more preferably the aforementioned group (i) in which a substituent is bonded to the carbon atom to which a substituent is bonded to on the ring skeleton to form a tertiary carbon atom. Among these, a group represented by the aforementioned general formula (1-1) is particularly desirable.

w represents an integer of 0 to 3, preferably an integer of 0 to 2, more preferably 0 or 1, and most preferably 1.

As the structural unit represented by general formula (a1-3-03), a structural unit represented by general formula (a1-3-03-1) or (a1-3-03-2) shown below is preferable, and a structural unit represented by general formula (a1-3-03-1) is particularly desirable.

[Chemical Formula 20]

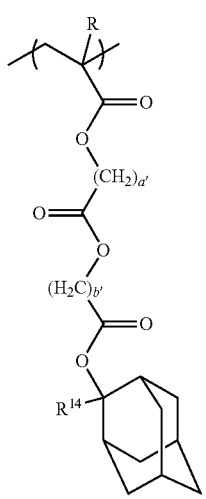

(a1-3-03-1)

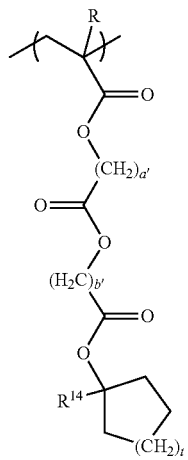

(a1-3-03-2)

In the formulae, R and $R^{14}$ are the same as defined above; a' represents an integer of 1 to 10; b' represents an integer of 1 to 10; and t represents an integer of 0 to 3.

In general formulae (a1-3-03-1) and (a1-3-03-2), a' is the same as defined above, preferably an integer of 1 to 8, more preferably 1 to 5, and most preferably 1 or 2.

b' is the same as defined above, preferably an integer of 1 to 8, more preferably 1 to 5, and most preferably 1 or 2.

t is preferably an integer of 1 to 3, and most preferably 1 or 2.

Specific examples of structural units represented by general formula (a1-3-03-1) or (a1-3-03-2) include structural units represented by the aforementioned formulae (a1-3-29) to (a1-3-32).

As the structural unit (a1) contained in the component (A1), 1 type of structural unit may be used, or 2 or more types may be used.

In the component (A1), the amount of the structural unit (a1) based on the combined total of all structural units constituting the component (A1) is preferably 15 to 70 mol %, more preferably 15 to 60 mol %, and still more preferably 20 to 55 mol %.

When the amount of the structural unit (a1) is at least as large as the lower limit of the above-mentioned range, a pattern can be easily formed using a resist composition prepared from the component (A1), and various lithography properties such as sensitivity, resolution, LWR and the like are improved. On the other hand, when the amount of the structural unit (a1) is no more than the upper limit of the above-mentioned range, a good balance can be reliably achieved with the other structural units.

[Structural Unit (a0)]

The structural unit (a0) is a structural unit containing an —$SO_2$— containing cyclic group.

By virtue of the structural unit (a0) containing a —$SO_2$— containing cyclic group, a resist composition containing the component (A1) including the structural unit (a0) is capable of improving the adhesion of a resist film to a substrate. Further, the structural unit (a0) contributes to improvement in various lithography properties such as sensitivity, resolution, exposure latitude (EL margin), line width roughness (LWR), line edge roughness (LER) and mask reproducibility.

Here, an "—$SO_2$— containing cyclic group" refers to a cyclic group having a ring containing —$SO_2$— within the ring structure thereof, i.e., a cyclic group in which the sulfur atom (S) within —$SO_2$— forms part of the ring skeleton of the cyclic group.

In the —$SO_2$— containing cyclic group, the ring containing —$SO_2$— within the ring skeleton thereof is counted as the first ring. A cyclic group in which the only ring structure is the ring that contains —$SO_2$— in the ring skeleton thereof is referred to as a monocyclic group, and a group containing other ring structures is described as a polycyclic group regardless of the structure of the other rings.

The —$SO_2$— containing cyclic group may be either a monocyclic group or a polycyclic group.

As the —$SO_2$— containing cyclic group, a cyclic group containing —O—$SO_2$— within the ring skeleton thereof, i.e., a cyclic group containing a sultone ring in which —O—S— within the —O—$SO_2$— group forms part of the ring skeleton thereof is particularly desirable.

The —$SO_2$— containing cyclic group preferably has 3 to 30 carbon atoms, more preferably 4 to 20, still more preferably 4 to 15, and most preferably 4 to 12. Herein, the number of carbon atoms refers to the number of carbon atoms constituting the ring skeleton, excluding the number of carbon atoms within a substituent.

The —$SO_2$— containing cyclic group may be either a —$SO_2$— containing aliphatic cyclic group or a —$SO_2$— containing aromatic cyclic group. A —$SO_2$— containing aliphatic cyclic group is preferable.

Examples of the —$SO_2$— containing aliphatic cyclic group include aliphatic cyclic groups in which part of the carbon atoms constituting the ring skeleton has been substituted with a —$SO_2$— group or a —O—$SO_2$— group and has at least one hydrogen atom removed from the aliphatic hydrocarbon ring. Specific examples include an aliphatic hydrocarbon ring in which a —$CH_2$— group constituting the ring skeleton thereof has been substituted with a —$SO_2$— group and has at least one hydrogen atom removed therefrom; and an aliphatic hydrocarbon ring in which a —$CH_2$—$CH_2$— group constituting the ring skeleton has been substituted with a —O—$SO_2$— group and has at least one hydrogen atom removed therefrom.

The alicyclic hydrocarbon group preferably has 3 to 20 carbon atoms, and more preferably 3 to 12 carbon atoms.

The alicyclic hydrocarbon group may be either a monocyclic group or a polycyclic group. As the monocyclic group, a group in which two hydrogen atoms have been removed from a monocycloalkane of 3 to 6 carbon atoms is preferable. Examples of the monocycloalkane include cyclopentane and cyclohexane. As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The —$SO_2$— containing cyclic group may have a substituent. Examples of the substituent include an alkyl group, an alkoxy group, a halogen atom, a halogenated alkyl group, a hydroxy group, an oxygen atom (=O), —COOR", —OC(=O)R", a hydroxyalkyl group and a cyano group (wherein R" represents a hydrogen atom or an alkyl group).

The alkyl group for the substituent is preferably an alkyl group of 1 to 6 carbon atoms. Further, the alkyl group is preferably a linear alkyl group or a branched alkyl group. Specific examples include a methyl group, an ethyl group, a propyl group, an isopropyl group, an n-butyl group, an isobutyl group, a tert-butyl group, a pentyl group, an isopentyl group, a neopentyl group and a hexyl group. Among these, a methyl group or ethyl group is preferable, and a methyl group is particularly desirable.

The alkoxy group for the substituent is preferably an alkoxy group of 1 to 6 carbon atoms. The alkoxy group is preferably a linear or branched group. Specific examples include groups in which an oxygen atom (—O—) is bonded to any of the alkyl groups described above as the substituent.

Examples of the halogen atom for the substituent include a fluorine atom, a chlorine atom, a bromine atom and an iodine atom, and a fluorine atom is preferable.

As examples of the halogenated lower alkyl group for the substituent, groups in which part or all of the hydrogen atoms of the aforementioned alkyl groups for the substituent have been substituted with the aforementioned halogen atoms can be given. As the halogenated alkyl group, a fluorinated alkyl group is preferable, and a perfluoroalkyl group is particularly desirable.

In the —COOR" group and the —OC(=O)R" group, R" preferably represents a hydrogen atom or a linear, branched or cyclic alkyl group of 1 to 15 carbon atoms.

When R" represents a linear or branched alkyl group, it is preferably an alkyl group of 1 to 10 carbon atoms, more preferably an alkyl group of 1 to 5 carbon atoms, and most preferably a methyl group or an ethyl group.

When R" is a cyclic alkyl group (cycloalkyl group), it preferably has 3 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

The hydroxyalkyl group for the substituent preferably has 1 to 6 carbon atoms, and specific examples thereof include the aforementioned alkyl groups for the substituent in which at least one hydrogen atom has been substituted with a hydroxy group.

More specific examples of the —$SO_2$— containing cyclic group include groups represented by general formulae (3-1) to (3-4) shown below.

[Chemical Formula 21]

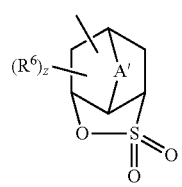

(3-1)

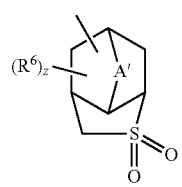

(3-2)

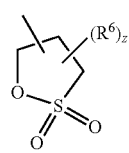

(3-3)

(3-4)

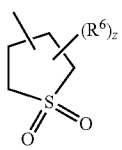

In the formulae, A' represents an oxygen atom, a sulfur atom or an alkylene group of 1 to 5 carbon atoms which may contain an oxygen atom or a sulfur atom; z represents an integer of 0 to 2; and $R^6$ represents an alkyl group, an alkoxy group, a halogenated alkyl group, a hydroxyl group, —COOR", —OC(=O)R", a hydroxyalkyl group or a cyano group, wherein R" represents a hydrogen atom or an alkyl group.

In general formulae (3-1) to (3-4) above, A' represents an oxygen atom (—O—), a sulfur atom (—S—) or an alkylene group of 1 to 5 carbon atoms which may contain an oxygen atom or a sulfur atom.

As the alkylene group of 1 to 5 carbon atoms represented by A', a linear or branched alkylene group is preferable, and examples thereof include a methylene group, an ethylene group, an n-propylene group and an isopropylene group.

Examples of alkylene groups that contain an oxygen atom or a sulfur atom include the aforementioned alkylene groups in which —O— or —S— is bonded to the terminal of the alkylene group or present between the carbon atoms of the alkylene group. Specific examples of such alkylene groups include —O—CH$_2$—, —CH$_2$—O—CH$_2$—, —S—CH$_2$—, —CH$_2$—S—CH$_2$—.

As A', an alkylene group of 1 to 5 carbon atoms or —O— is preferable, more preferably an alkylene group of 1 to 5 carbon atoms, and most preferably a methylene group.

z represents an integer of 0 to 2, and is most preferably 0.
When z is 2, the plurality of $R^6$ may be the same or different from each other.

As the alkyl group, alkoxy group, halogenated alkyl group, —COOR", —OC(=O)R" and hydroxyalkyl group for $R^6$, the same alkyl groups, alkoxy groups, halogenated alkyl groups, —COOR", —OC(=O)R" and hydroxyalkyl groups as those described above as the substituent for the —SO$_2$— containing cyclic group can be mentioned.

Specific examples of the cyclic groups represented by general formulae (3-1) to (3-4) are shown below. In the formulae shown below, "Ac" represents an acetyl group.

[Chemical Formula 22]

(3-1-1)

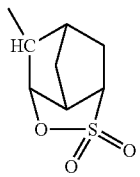

(3-1-2)

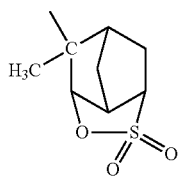

(3-1-3)

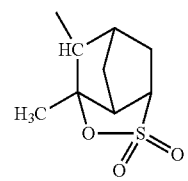

(3-1-4)

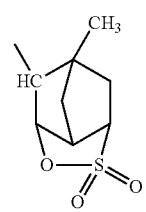

(3-1-5)

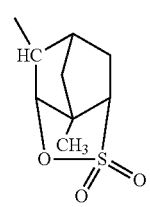

(3-1-6)

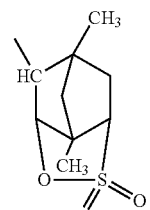

(3-1-7)

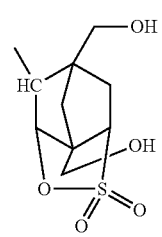

(3-1-8)

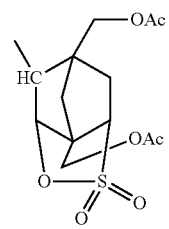

(3-1-9)

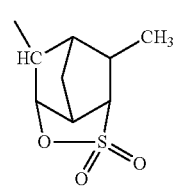

-continued
(3-1-10)
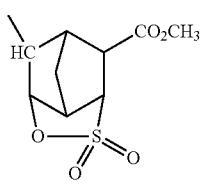
(3-1-11)
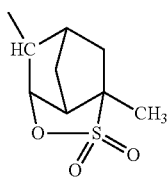
(3-1-12)
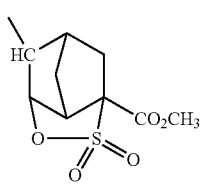
(3-1-13)
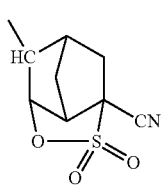
(3-1-14)
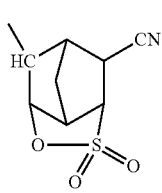
(3-1-15)
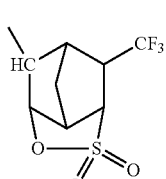
(3-1-16)
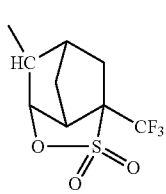
(3-1-17)
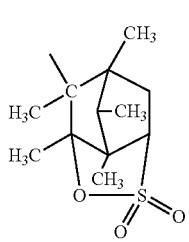
-continued
(3-1-18)
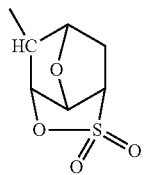
(3-1-19)
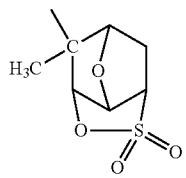
(3-1-20)
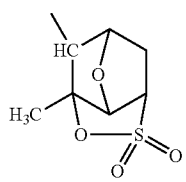
(3-1-21)
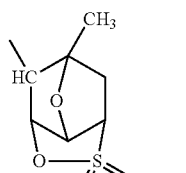
[Chemical Formula 23]
(3-1-22)
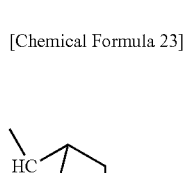
(3-1-23)
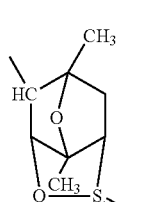
(3-1-24)
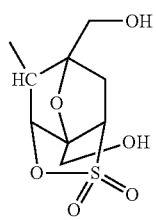

(3-1-25) 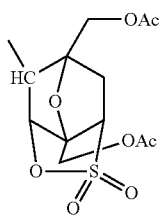

(3-1-26) 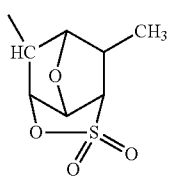

(3-1-27) 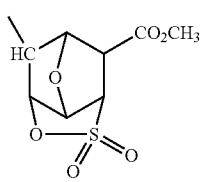

(3-1-28) 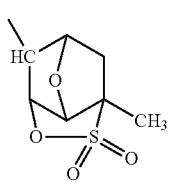

(3-1-29) 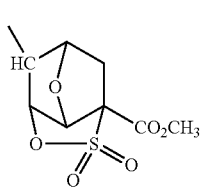

(3-1-30) 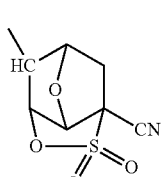

(3-1-31) 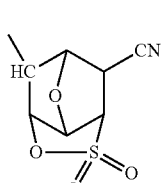

(3-1-32) 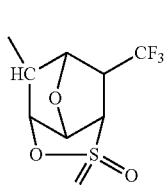

(3-1-33) 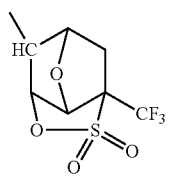

[Chemical Formula 24]

(3-2-1) 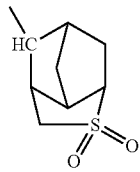

(3-2-2) 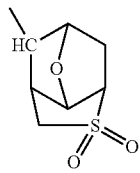

(3-3-1) 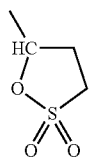

(3-4-1) 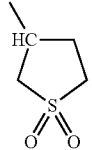

Of the groups shown above, the —$SO_2$-containing cyclic group is preferably a group represented by the general formula (3-1), (3-3) or (3-4), more preferably at least one group selected from the group consisting of groups represented by the above chemical formulas (3-1-1), (3-1-18), (3-3-1) and (3-4-1), and most preferably a group represented by the chemical formula (3-1-1).

More specifically, examples of the structural unit (a0) include structural units represented by general formula (a0-0) shown below.

[Chemical Formula 25]

(a0-0)

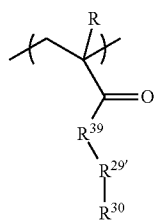

In the formula, R represents a hydrogen atom, an alkyl group of 1 to 5 carbon atoms or a halogenated alkyl group of 1 to 5 carbon atoms, $R^{39}$ represents —O— or —NH—, $R^{30}$ represents an —$SO_2$-containing cyclic group, and $R^{29'}$ represents a single bond or a divalent linking group.

In general formula (a0-0), R represents a hydrogen atom, an alkyl group of 1 to 5 carbon atoms or a halogenated alkyl group of 1 to 5 carbon atoms.

As the alkyl group of 1 to 5 carbon atoms for R, a linear or branched alkyl group of 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group and a neopentyl group.

The halogenated alkyl group for R is a group in which part or all of the hydrogen atoms of the aforementioned alkyl group of 1 to 5 carbon atoms has been substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

In formula (a0-0), $R^{39}$ represents —O— or —NH—.

In formula (a0-0), $R^{30}$ is the same as defined for the aforementioned —$SO_2$— containing group.

In formula (a0-0), $R^{29'}$ may be a single bond or a divalent linking group. In terms of the effects of the present invention, lithography properties and the like, a divalent linking group is preferable.

As the divalent linking group for $R^{29'}$, for example, the same divalent linking groups as those described for $Y^2$ in general formula (a1-0-2) explained above in relation to the structural unit (a1) can be mentioned.

As the divalent linking group for $R^{29'}$, an alkylene group, a divalent alicyclic hydrocarbon group or a divalent linking group containing a hetero atom is preferable. Among these, an alkylene group or a divalent linking group containing an ester bond (—C(=O)—O—) is preferable.

As the alkylene group, a linear or branched alkylene group is preferable. Specific examples include the same linear alkylene groups and branched alkylene groups as those described above for the aliphatic hydrocarbon group represented by $Y^2$.

As the divalent linking group containing an ester bond, a group represented by general formula: —$R^{20}$—C(=O)—O— (in the formula, $R^{20}$ represents a divalent linking group) is particularly desirable. Namely, the structural unit (a0) is preferably a structural unit represented by general formula (a0-0-1) shown below.

In the formula, R represents a hydrogen atom, an alkyl group of 1 to 5 carbon atoms or a halogenated alkyl group of 1 to 5 carbon atoms, $R^{39}$ represents —O— or —NH—, $R^{20}$ represents a divalent linking group, and $R^{39}$ represents an —$SO_2$-containing cyclic group.

$R^{20}$ is not particularly limited. For example, the same divalent linking groups as those described for $R^{29'}$ in general formula (a0-0) can be mentioned.

As the divalent linking group for $R^{20}$, an alkylene group, a divalent alicyclic hydrocarbon group or a divalent linking group containing a hetero atom is preferable.

As the linear or branched alkylene group, the divalent alicyclic hydrocarbon group and the divalent linking group containing a hetero atom, the same linear or branched alkylene group, divalent alicyclic hydrocarbon group and divalent linking group containing a hetero atom as those described above as preferable examples of $R^{29'}$ can be mentioned.

Among these, a linear or branched alkylene group, or a divalent linking group containing an oxygen atom as a hetero atom is more preferable.

As the linear alkylene group, a methylene group or an ethylene group is preferable, and a methylene group is particularly desirable.

As the branched alkylene group, an alkylmethylene group or an alkylethylene group is preferable, and —CH($CH_3$)—, —C($CH_3$)$_2$— or —C($CH_3$)$_2$$CH_2$— is particularly desirable.

As the divalent linking group containing a hetero atom, a divalent linking group containing an ether bond or an ester bond is preferable, and a group represented by the aforementioned formula —$Y^{21}$—O—$Y^{22}$—, —[$Y^{21}$—C(=)—O]$_{m'}$—$Y^{22}$— or —$Y^{21}$—O—C(=O)—$Y^{22}$— is more preferable. $Y^{21}$, $Y^{22}$ and m' are the same as defined above.

Among these, a group represented by the formula —$Y^{21}$—O—C(=O)—$Y^{22}$—, and a group represented by the formula —($CH_2$)$_c$—O—C(=O)—($CH_2$)$_d$— is particularly desirable. c represents an integer of 1 to 5, preferably an integer of 1 to 3, and more preferably 1 or 2. d represents an integer of 1 to 5, preferably an integer of 1 to 3, and more preferably 1 or 2.

In particular, as the structural unit (a0), a structural unit represented by general formula (a0-0-11) or (a0-0-12) shown below is preferable, and a structural unit represented by general formula (a0-0-12) is more preferable.

[Chemical Formula 26]

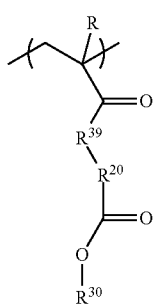

(a0-0-1)

[Chemical Formula 27]

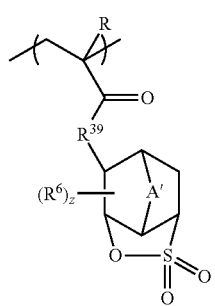

(a0-0-11)

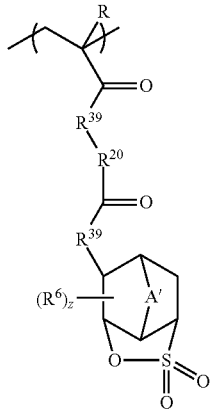

(a0-0-12)

In the formulae, R, A', $R^6$, z, $R^{39}$ and $R^{20}$ are the same as defined above.

In general formula (a0-0-11), A' is preferably a methylene group, an ethylene group, an oxygen atom (—O—) or a sulfur atom (—S—).

In general formula (a0-0-12), $R^{20}$ is preferably a linear or branched alkylene group or a divalent linking group containing an oxygen atom. As the linear or branched alkylene group and the divalent linking group containing an oxygen atom represented by $R^{20}$, the same linear or branched alkylene groups and the divalent linking groups containing an oxygen atom as those described above can be mentioned.

As the structural unit represented by general formula (a0-0-12), a structural unit represented by general formula (a0-0-12a) or (a0-0-12b) shown below is particularly desirable.

[Chemical Formula 28]

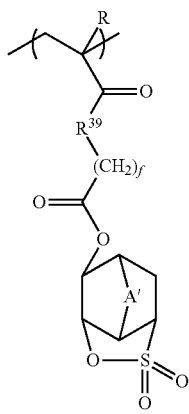

(a0-0-12a)

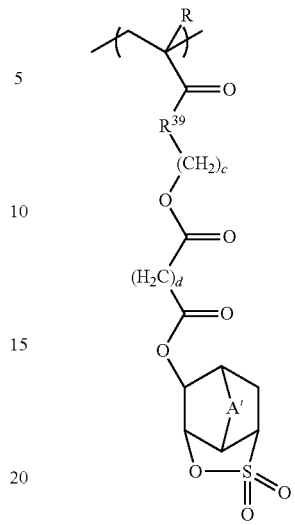

(a0-0-12b)

In the formulae, R, $R^{39}$ and A' are the same as defined above; c and f are the same as defined above; and f represents an integer of 1 to 5 (preferably an integer of 1 to 3).

As the structural unit (a0) contained in the component (A1), 1 type of structural unit may be used, or 2 or more types may be used.

In terms of achieving an excellent shape for a resist pattern formed using a positive resist composition containing the component (A1) and excellent lithography properties such as EL margin, LWR and mask reproducibility, the amount of the structural unit (a0) within the component (A1), based on the combined total of all structural units constituting the component (A1) is preferably 1 to 60 mol %, more preferably 5 to 55 mol %, still more preferably 10 to 50 mol %, and most preferably 15 to 45 mol %.

[Structural Unit (a2)]

The structural unit (a2) is a structural unit derived from an acrylate ester which may have the hydrogen atom bonded to the carbon atom on the α-position substituted with a substituent and contains a lactone-containing cyclic group.

The term "lactone-containing cyclic group" refers to a cyclic group including one ring containing a —O—C(=O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings.

When the component (A1) is used for forming a resist film, the lactone-containing cyclic group of the structural unit (a2) is effective in improving the adhesion between the resist film and the substrate, and increasing the compatibility with the developing solution containing water (especially in an alkali developing process).

As the structural unit (a2), there is no particular limitation, and an arbitrary structural unit may be used.

Specific examples of lactone-containing monocyclic groups include groups in which one hydrogen atom has been removed from a 4- to 6-membered lactone ring, including a group in which one hydrogen atom has been removed from β-propiolactone, a group in which one hydrogen atom has been removed from γ-butyrolactone, and a group in which one hydrogen atom has been removed from δ-valerolactone.

Further, specific examples of lactone-containing polycyclic groups include groups in which one hydrogen atom has been removed from a lactone ring-containing bicycloalkane, tricycloalkane or tetracycloalkane.

More specifically, examples of the structural unit (a2) include structural units represented by general formulae (a2-1) to (a2-5) shown below.

[Chemical Formula 29]

(a2-1)
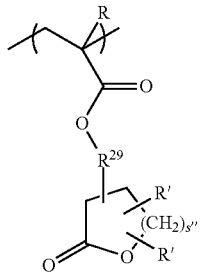

(a2-2)
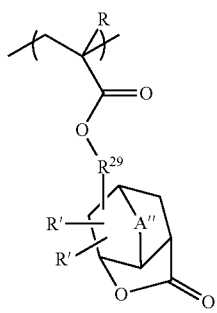

(a2-3)
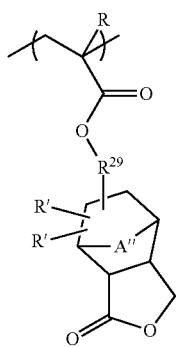

(a2-4)
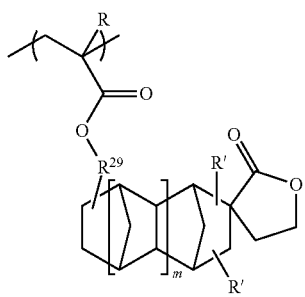

(a2-5)
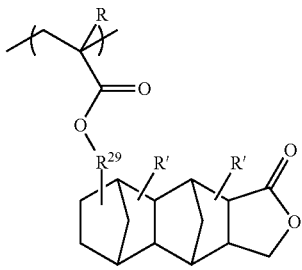

In the formulae, R represents a hydrogen atom, an alkyl group of 1 to 5 carbon atoms or a halogenated alkyl group of 1 to 5 carbon atoms; each R' independently represents a hydrogen atom, an alkyl group, an alkoxy group, a halogen atom, a halogenated alkyl group, a hydroxy group, an oxygen atom (=O), —COOR" —OC(=O)R", a hydroxyalkyl group or a cyano group, wherein R" represents a hydrogen atom or an alkyl group; $R^{29}$ represents a single bond or a divalent linking group; s" represents an integer of 0 or 1 to 2; A" represents an oxygen atom, a sulfur atom or an alkylene group of 1 to 5 carbon atoms which may contain an oxygen atom or a sulfur atom; and m represents 0 or 1.

In general formulae a2-1) to (a2-5), R is the same as defined for R in the structural unit (a1).

As the alkyl group, alkoxy group, halogen atom, halogenated alkyl group, —COOR", —OC(=O)R" and hydroxyalkyl group for R', the same alkyl groups, alkoxy groups, halogen atoms, halogenated alkyl groups, —COOR", —OC(=O)R"(R" is the same as defined above) and hydroxyalkyl groups as those described above as the substituent for the —SO$_2$— containing cyclic group can be mentioned.

As A", an alkylene group of 1 to 5 carbon atoms or —O— is preferable, more preferably an alkylene group of 1 to 5 carbon atoms, and most preferably a methylene group.

$R^{29}$ represents a single bond or a divalent linking group. Examples of divalent linking groups include the same divalent linking groups as those described above for $Y^2$ in general formula (a1-0-2). Among these, an alkylene group, an ester bond (—C(=O)—O—) or a combination thereof is preferable. The alkylene group as a divalent linking group for $R^{29}$ is preferably a linear or branched alkylene group. Specific examples include the same linear alkylene groups and branched alkylene groups as those described above for the aliphatic hydrocarbon group represented by $Y^2$.

s" is preferably 1 or 2.

Specific examples of structural units represented by general formulae (a2-1) to (a2-5) are shown below.

In the formulae shown below, $R^\alpha$ represents a hydrogen atom, a methyl group or a trifluoromethyl group.

[Chemical Formula 30]
(a2-1-1) 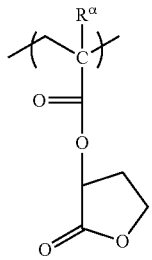
(a2-1-2) 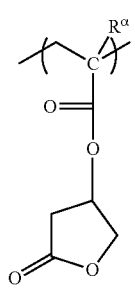
(a2-1-3) 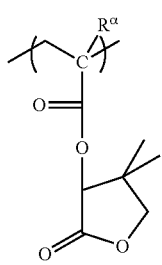
(a2-1-4) 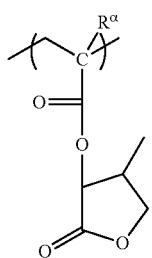
(a2-1-5) 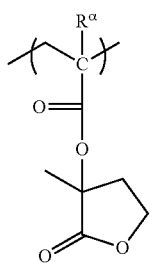
(a2-1-6) 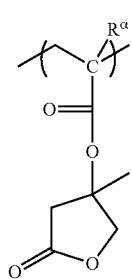
-continued
(a2-1-7) 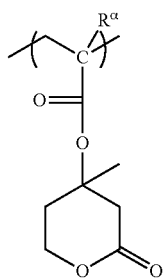
(a2-1-8)
(a2-1-9)
(a2-1-10)
(a2-1-11)

(a2-1-12)
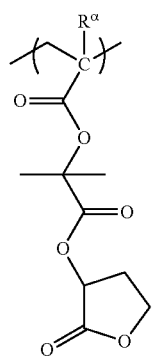
(a2-1-13)
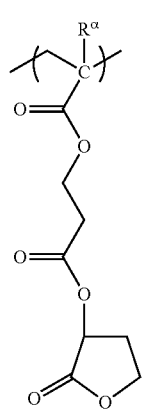
[Chemical Formula31]
(a2-2-1)
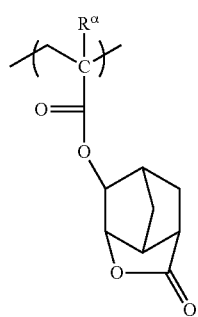
(a2-2-2)
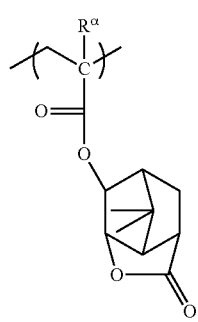
(a2-2-3)
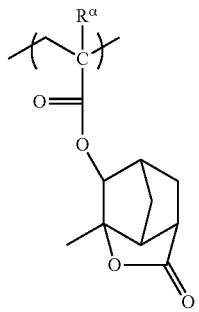
(a2-2-4)
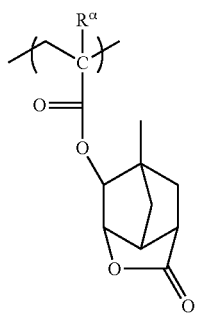
(a2-2-5)
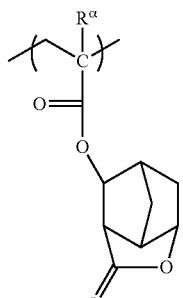
(a2-2-6)
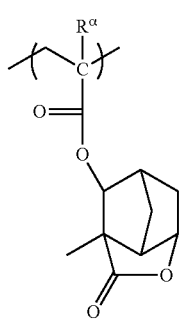
(a2-2-7)
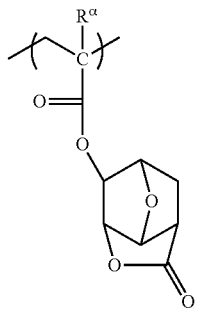

(a2-2-8)
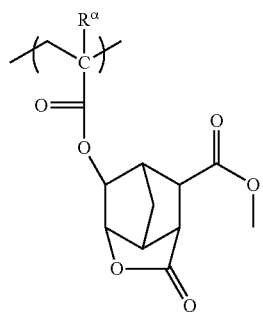
(a2-2-9)
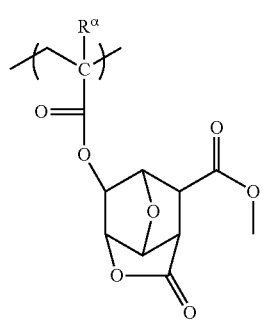
(a2-2-10)
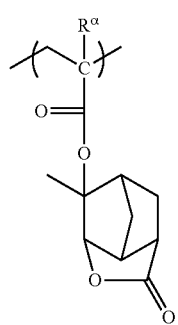
(a2-2-11)
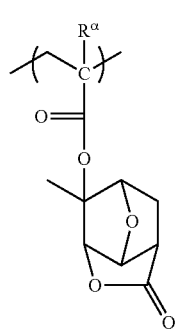
(a2-2-12)
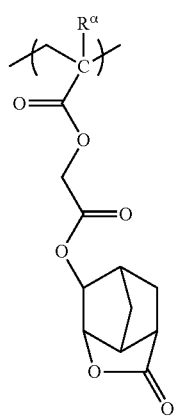
(a2-2-13)
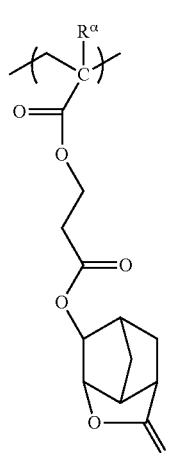
(a2-2-14)
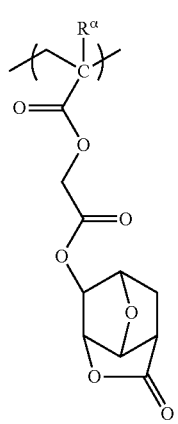

(a2-2-15)
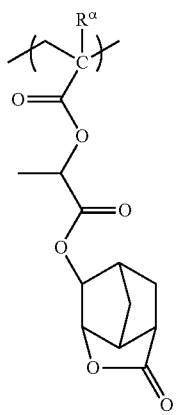
(a2-2-16)
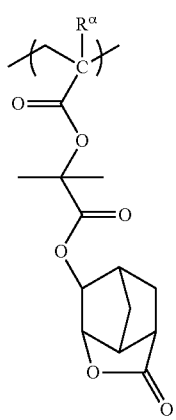
(a2-2-17)
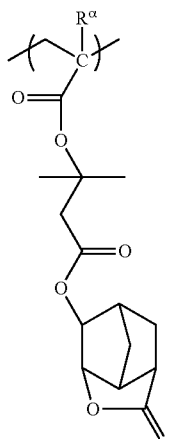
[Chemical Formula 32]
(a2-3-1)
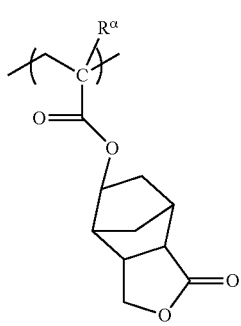
(a2-3-2)
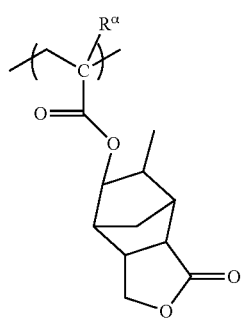
(a2-3-3)
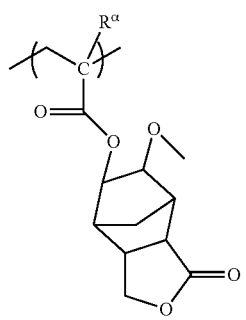
(a2-3-4)
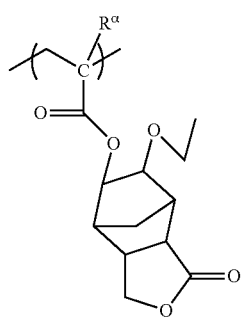
(a2-3-5)
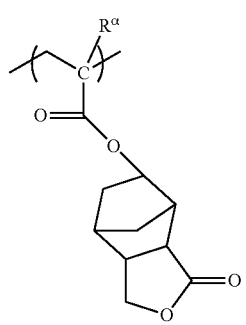
[Chemical Formula 33]
(a2-4-1)
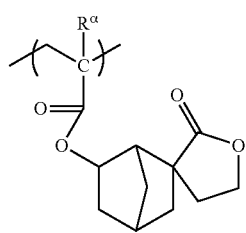

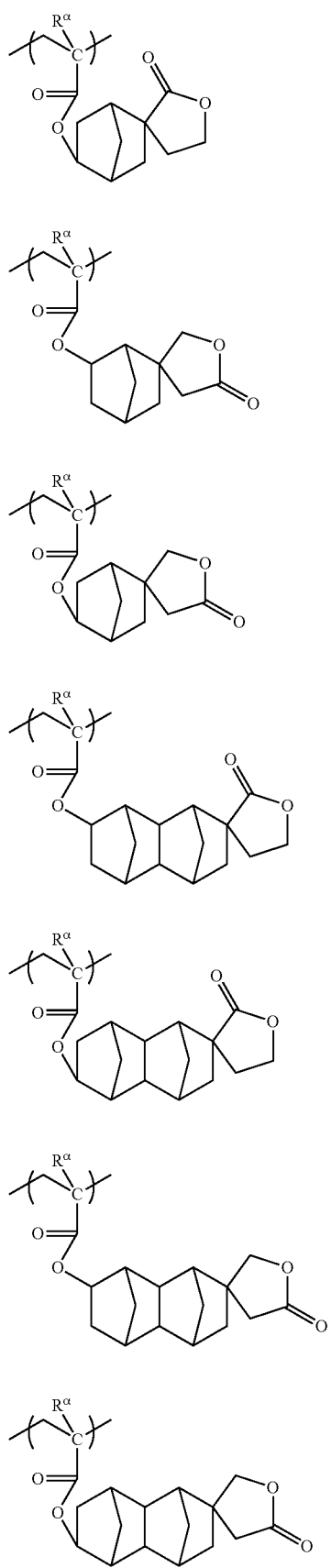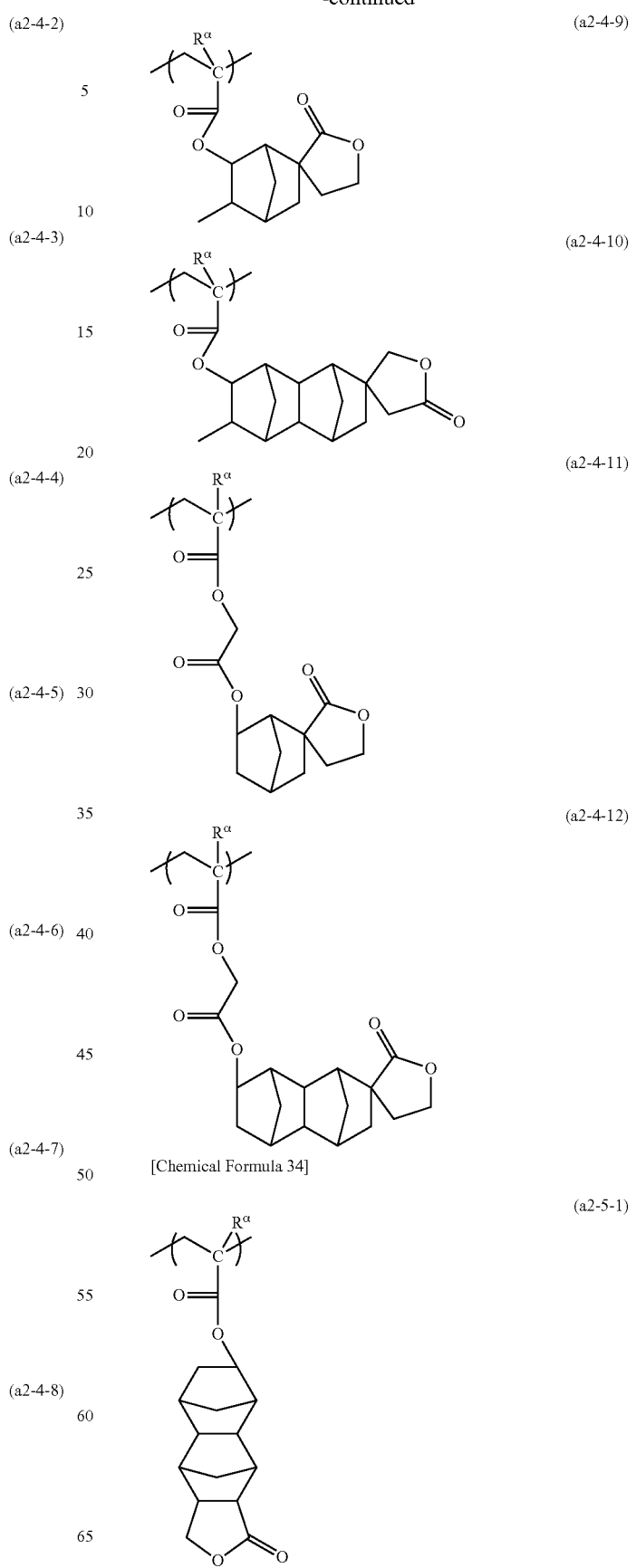

-continued (a2-5-2)
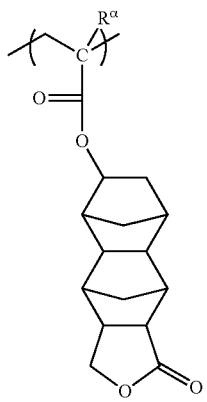

(a2-5-3)
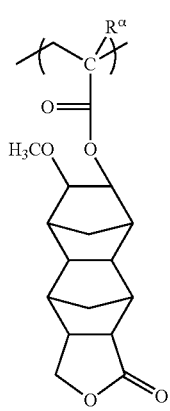

(a2-5-4)
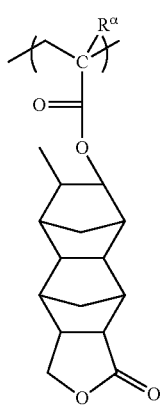

-continued (a2-5-5)
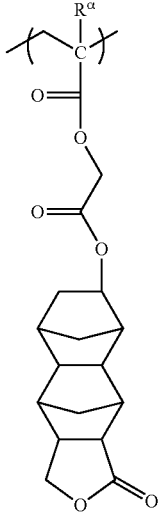

(a2-5-6)
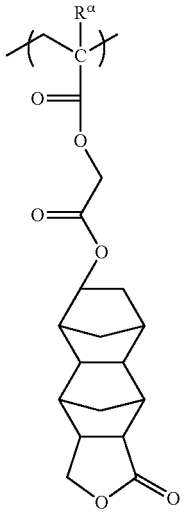

As the structural unit (a2) contained in the component (A1), 1 type of structural unit may be used, or 2 or more types may be used.

As the structural unit (a2), at least one structural unit selected from the group consisting of formulae (a2-1) to (a2-5) is preferable, and at least one structural unit selected from the group consisting of formulae (a2-1) to (a2-3) is more preferable. Of these, it is preferable to use at least one structural unit selected from the group consisting of structural units represented by formulae (a2-1-1), (a2-1-2), (a2-2-1), (a2-2-7), (a2-3-1) and (a2-3-5).

In the component (A1), the amount of the structural unit (a2) based on the combined total of all structural units constituting the component (A1) is preferably 5 to 60 mol %, more preferably 10 to 55 mol %, still more preferably 10 to 50 mol %, and most preferably 10 to 45 mol %.

When the amount of the structural unit (a2) is at least as large as the lower limit of the above-mentioned range, the effect of using the structural unit (a2) can be satisfactorily achieved. On the other hand, when the amount of the structural unit (a2) is no more than the upper limit of the above-mentioned range, a good balance can be achieved with the other structural units.

[Structural Unit (a3)]

The structural unit (a3) is a structural unit derived from an acrylate ester which may have the hydrogen atom bonded to the carbon atom on the α-position substituted with a substituent and contains a polar group-containing aliphatic hydrocarbon group (provided that the aforementioned structural units (a1), (a0) and (a2) are excluded from the structural unit (a3)).

When the component (A1) includes the structural unit (a3), the hydrophilicity of the component (A1) is enhanced, thereby contributing to improvement in resolution.

Examples of the polar group include a hydroxyl group, cyano group, carboxyl group, or hydroxyalkyl group in which part of the hydrogen atoms of the alkyl group have been substituted with fluorine atoms, although a hydroxyl group is particularly desirable.

Examples of the aliphatic hydrocarbon group include linear or branched hydrocarbon groups (preferably alkylene groups) of 1 to 10 carbon atoms, and cyclic aliphatic hydrocarbon groups (cyclic groups). These cyclic groups can be selected appropriately from the multitude of groups that have been proposed for the resins of resist compositions designed for use with ArF excimer lasers. The cyclic group is preferably a polycyclic group, more preferably a polycyclic group of 7 to 30 carbon atoms.

Of the various possibilities, structural units derived from an acrylate ester that include an aliphatic polycyclic group that contains a hydroxyl group, cyano group, carboxyl group or a hydroxyalkyl group in which part of the hydrogen atoms of the alkyl group have been substituted with fluorine atoms are particularly desirable. Examples of the polycyclic group include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulae (a3-1), (a3-2) and (a3-3) shown below are preferable.

[Chemical Formula 35]

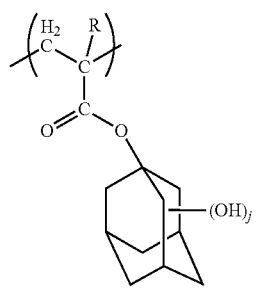

(a3-1)

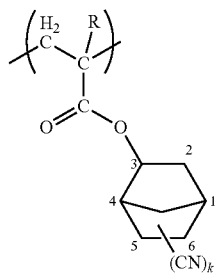

(a3-2)

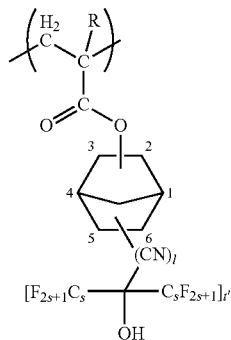

(a3-3)

In the formulae, R is the same as defined above; j is an integer of 1 to 3; k is an integer of 1 to 3; t' is an integer of 1 to 3; l is an integer of 1 to 5; and s is an integer of 1 to 3.

In formula (a3-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group.

j is preferably 1, and it is particularly desirable that the hydroxyl group be bonded to the 3rd position of the adamantyl group.

In formula (a3-2), k is preferably 1. The cyano group is preferably bonded to the 5th or 6th position of the norbornyl group.

In formula (a3-3), t' is preferably 1. l is preferably 1. s is preferably 1. Further, it is preferable that a 2-norbornyl group or 3-norbornyl group be bonded to the terminal of the carboxy group of the acrylic acid. The fluorinated alkyl alcohol is preferably bonded to the 5th or 6th position of the norbornyl group.

As the structural unit (a3) contained in the component (A1), 1 type of structural unit may be used, or 2 or more types may be used.

The amount of the structural unit (a3) within the component (A1) based on the combined total of all structural units constituting the component (A1) is preferably 5 to 50 mol %, more preferably 5 to 40 mol %, and still more preferably 5 to 25 mol %.

When the amount of the structural unit (a3) is at least as large as the lower limit of the above-mentioned range, the effect of using the structural unit (a3) can be satisfactorily achieved. On the other hand, when the amount of the structural unit (a3) is no more than the upper limit of the above-mentioned range, a good balance can be achieved with the other structural units.

[Other Structural Unit]

The component (A1) may also have a structural unit other than the above-mentioned structural units (a1), (a0), (a2) and (a3), as long as the effects of the present invention are not impaired.

As such a structural unit, any other structural unit which cannot be classified as the aforementioned structural units can be used without any particular limitation, and any of the multitude of conventional structural units used within resist resins for ArF excimer lasers or KrF excimer lasers (and particularly for ArF excimer lasers) can be used.

Examples of the other structural unit include a structural unit (a4) derived from an acrylate ester which may have the hydrogen atom bonded to the carbon atom on the α-position substituted with a substituent and contains an acid non-dissociable aliphatic polycyclic group, a structural unit (a5) derived from hydroxystyrene and a structural unit (a6) derived from styrene.

A "structural unit derived from a hydroxystyrene" refers to a structural unit that is formed by the cleavage of the ethylenic double bond of a hydroxystyrene.

The term "hydroxystyrene" is a generic term that includes hydroxystyrene having a hydrogen atom bonded to the carbon atom on the α-position (the carbon atom to which the phenyl group is bonded), hydroxystyrene having a substituent (an atom other than a hydrogen atom or a group) bonded to the carbon atom on the α-position, and derivatives thereof. Specifically, at least the benzene ring and the hydroxy group bonded to the benzene ring are maintained, and examples thereof include those in which the hydrogen atom bonded to the α-position of hydroxystyrene has been substituted with an alkyl group of 1 to 5 carbon atoms, a halogenated alkyl group of 1 to 5 carbon atoms, a hydroxyalkyl group or the like, and those in which the benzene ring having a hydroxy group bonded thereto further has an alkyl group of 1 to 5 carbon atoms, or those in which the benzene ring having a hydroxy group bonded thereto further has one or two hydroxy groups (the total number of hydroxy groups being two or three).

A "structural unit derived from styrene" refers to a structural unit that is formed by the cleavage of the ethylenic double bond of styrene.

The term "styrene" includes styrene, compounds in which the hydrogen atom at the α-position has been substituted with a substituent (an atom other than hydrogen or a group), and derivatives thereof (provided that the aforementioned hydroxystyrene is excluded). Further, those in which a hydrogen atom of the phenyl group has been substituted with a substituent such as an alkyl group of 1 to 5 carbon atoms are also included.

In the aforementioned hydroxystyrene or styrene, the alkyl group as the substituent on the α-position is preferably a linear or branched alkyl group, and specific examples thereof include a methyl group, an ethyl group, a propyl group, an isopropyl group, an n-butyl group, an isobutyl group, a tert-butyl group, a pentyl group, an isopentyl group and a neopentyl group.

Specific examples of the halogenated alkyl group of 1 to 5 carbon atoms as the substituent on the α-position include groups in which part or all of the hydrogen atoms of the aforementioned "alkyl group of 1 to 5 carbon atoms as the substituent on the α-position" are substituted with halogen atoms. Examples of the halogen atom include a fluorine atom, a chlorine atom, a bromine atom and an iodine atom, and a fluorine atom is particularly desirable.

Specific examples of the hydroxyalkyl group of 1 to 5 carbon atoms as the substituent on the α-position include groups in which part or all of the hydrogen atoms of the aforementioned "alkyl group of 1 to 5 carbon atoms as the substituent on the α-position" are substituted with a hydroxy group. The number of hydroxy groups within the hydroxyalkyl group is preferably 1 to 5, and most preferably 1.

(Structural Unit (a4))

The structural unit (a4) is a structural unit derived from an acrylate ester which may have the hydrogen atom bonded to the carbon atom on the α-position substituted with a substituent and contains an acid non-dissociable aliphatic polycyclic group.

In the structural unit (a4), examples of this polycyclic group include the same polycyclic groups as those described above in relation to the aforementioned structural unit (a1), and any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecyl group, adamantyl group, tetracyclododecyl group, isobornyl group, and norbornyl group is particularly desirable. These polycyclic groups may be substituted with a linear or branched alkyl group of 1 to 5 carbon atoms.

Specific examples of the structural unit (a4) include units with structures represented by general formulae (a4-1) to (a4-5) shown below.

[Chemical Formula 36]

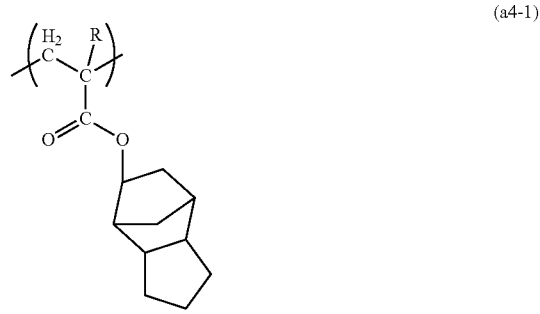

(a4-1)

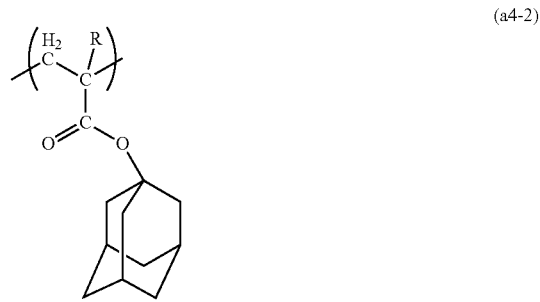

(a4-2)

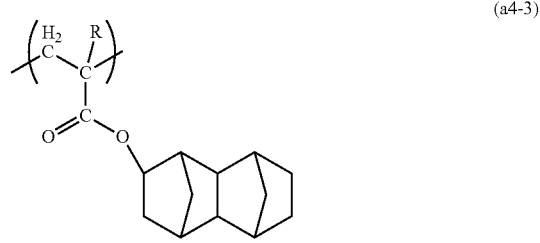

(a4-3)

-continued

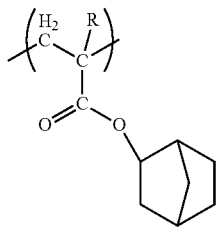
(a4-4)

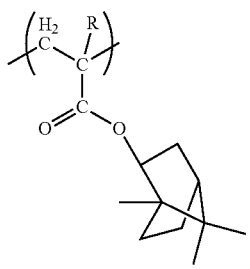
(a4-5)

In the formulae, R is the same as defined above.

When the structural unit (a4) is included in the component (A1), the amount of the structural unit (a4) based on the combined total of all the structural units that constitute the component (A1) is preferably within the range from 1 to 30 mol %, and more preferably from 10 to 20 mol %.

(Structural Unit (a5))

As the structural unit (a5), a structural unit represented by general formula (a5-1) shown below is preferable because the solubility in an organic solvent becomes excellent, the solubility in an alkali developing solution is increased, and the etching resistance becomes excellent.

[Chemical Formula 37]

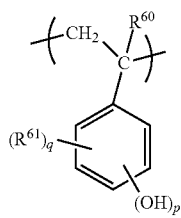
(a5-1)

In the formula, $R^{60}$ represents a hydrogen atom or an alkyl group of 1 to 5 carbon atoms; $R^{61}$ represents an alkyl group of 1 to 5 carbon atoms; p represents an integer of 1 to 3; and q represents an integer of 0 to 2.

In the formula (a5-1), specific examples of the alkyl group of 1 to 5 carbon atoms for $R^{60}$ include linear or branched alkyl groups such as a methyl group, an ethyl group, a propyl group, an isopropyl group, an n-butyl group, an isobutyl group, a tert-butyl group, a pentyl group, an isopentyl group and a neopentyl group. As $R^{60}$, a hydrogen atom or a methyl group is preferable.

p represents an integer of 1 to 3, and is preferably 1.

The bonding position of the hydroxy group may be any of the o-position, m-position and p-position of the phenyl group. When p is 1, the p-position is preferable in terms of availability and low cost. When p is 2 or 3, a desired combination of the bonding positions can be used.

q represents an integer of 0 to 2. q is preferably 0 or 1, and most preferably 0 from industrial viewpoint.

As the alkyl group for $R^{61}$, the same alkyl groups as those for $R^{60}$ can be mentioned.

When q is 1, the bonding position of $R^{61}$ may be any of the o-position, the m-position and the p-position.

When q is 2, a desired combination of the bonding positions can be used. Here, the plurality of the $R^{61}$ group may be the same or different from each other.

When the structural unit (a5) is included in the component (A1), the amount of the structural unit (a5) based on the combined total of all the structural units that constitute the component (A1) is preferably within the range from 50 to 90 mol %, more preferably from 55 to 85 mol %, and still more preferably 60 to 80 mol %.

(Structural Unit (a6))

As the structural unit (a6), a structural unit represented by general formula (a6-1) shown below is preferable because the solubility in an alkali developing solution can be adjusted, and heat resistance and dry etching resistance are improved.

[Chemical Formula 38]

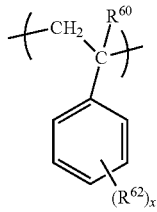
(a6-1)

In the formula, $R^{60}$ represents a hydrogen atom or an alkyl group of 1 to 5 carbon atoms; $R^{\beta}$ represents an alkyl group of 1 to 5 carbon atoms; and x represents an integer of 0 to 3.

In general formula (a6-1) $R^{60}$ is the same as defined above for $R^{60}$ in the aforementioned general formula (a5-1).

In the formula (a6-1), as the alkyl group for $R^{62}$, the same alkyl groups as those for $R^{61}$ in the aforementioned formula (a5-1) can be mentioned.

x represents an integer of 0 to 3, preferably 0 or 1, and most preferably 0 in terms of industry.

When x represents 1, the substitution position of $R^{62}$ may be any of o-position, m-position or p-position of the phenyl group. When x is 2 or 3, a desired combination of the bonding positions can be used. Here, the plurality of the $R^{62}$ group may be the same or different from each other.

When the structural unit (a6) is included in the component (A1), the amount of the structural unit (a6) based on the combined total of all the structural units that constitute the component (A1) is preferably within the range from 10 to 50 mol %, more preferably from 15 to 45 mol %, and still more preferably 20 to 40 mol %.

In the resist composition of the present invention, the component (A) preferably contains a polymeric compound (A1) having a structural unit (a1).

Specific examples of the component (A1) include a polymeric compound consisting of the repeated structure of a structural unit (a1) and a structural unit (a2); a polymeric compound consisting of the repeated structure of a structural unit (a1) and a structural unit (a0); a polymeric compound consisting of the repeated structure of a structural unit (a1), a structural unit (a2) and a structural unit (a3); a polymeric compound consisting of the repeated structure of a structural unit (a1), a structural unit (a0) and a structural unit (a3); and a polymeric compound consisting of the repeated structure of a structural unit (a1), a structural unit (a0), a structural unit (a2) and a structural unit (a3).

Among these, preferable examples of the component (A1) include a polymeric compound consisting of structural units (a1), (a2) and (a3); and a polymeric compound consisting of structural units (a1), (a0), (a2) and (a3).

More specifically, preferable examples thereof include a polymeric compound having the combination of the structural unit represented by the aforementioned formula (a1-0-12) or (a1-0-13), the structural unit represented by the aforementioned formula (a2-1) and the structural unit represented by the aforementioned formula (a3-1), and a polymeric compound having the combination of the structural unit represented by the aforementioned formula (a1-0-11), the structural unit represented by the aforementioned formula (a1-0-12), the structural unit represented by the aforementioned formula (a0-0-12), the structural unit represented by the aforementioned formula (a2-1) and the structural unit represented by the aforementioned formula (a3-1).

A polymeric compound having the combination of the structural unit represented by the aforementioned formula (a1-1-1) or (a1-1-26), the structural unit represented by the aforementioned formula (a2-1-1) and the structural unit represented by the aforementioned formula (a3-1), or a polymeric compound having the combination of the structural unit represented by the aforementioned formula (a1-1-26), the structural unit represented by the aforementioned formula (a1-1-20), the structural unit represented by the aforementioned formula (a0-0-12a), the structural unit represented by the aforementioned formula (a2-1-1) and the structural unit represented by the aforementioned formula (a3-1) is particularly desirable.

The weight average molecular weight (Mw) (the polystyrene equivalent value determined by gel permeation chromatography) of the component (A1) is not particularly limited, but is preferably 1,000 to 50,000, more preferably 1,500 to 30,000, and most preferably 2,000 to 20,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory.

Further, the dispersity (Mw/Mn) is not particularly limited, but is preferably 1.0 to 5.0, more preferably 1.0 to 3.0, and most preferably 1.0 to 2.5. Here, Mn is the number average molecular weight.

The component (A1) can be obtained, for example, by a conventional radical polymerization or the like of the monomers corresponding with each of the structural units, using a radical polymerization initiator such as azobisisobutyronitrile (AIBN).

Furthermore, in the component (A1), by using a chain transfer agent such as HS—$CH_2$—$CH_2$—$CH_2$—$C(CF_3)_2$—OH, a —$C(CF_3)_2$—OH group can be introduced at the terminals of the component (A1). Such a copolymer having introduced a hydroxyalkyl group in which some of the hydrogen atoms of the alkyl group are substituted with fluorine atoms is effective in reducing developing defects and LER (line edge roughness: unevenness of the side walls of a line pattern).

As the monomers for deriving the corresponding structural units, commercially available monomers may be used, or the monomers may be synthesized by a conventional method.

In the component (A), as the component (A1), one type may be used alone, or two or more types may be used in combination.

In the component (A), the amount of the component (A1) based on the total weight of the component (A) is preferably 25% by weight or more, more preferably 50% by weight or more, still more preferably 75% by weight or more, and may be even 100% by weight. When the amount of the component (A1) is 25% by weight or more, various lithography properties are improved, such as improvement in MEF and circularity, and reduction of roughness.

The component (A) may contain "a base component which exhibits increased polarity under action of acid" other than the component (A1) (hereafter, referred to as "component (A2)"), as long as the effects of the present invention are not impaired.

Examples of the component (A2) include low molecular weight compounds that have a molecular weight of at least 500 and less than 4,000, contains a hydrophilic group, and also contains an acid dissociable group described above in connection with the component (A1). The component (A2) preferably has a molecular weight of at least 500 and less than 2,500. Specific examples include compounds containing a plurality of phenol skeletons in which part or all of the hydrogen atoms within hydroxyl groups have been substituted with the aforementioned acid dissociable groups.

Examples of the low-molecular weight compound include low molecular weight phenolic compounds in which a portion of the hydroxyl group hydrogen atoms have been substituted with an aforementioned acid dissociable group, and these types of compounds are known, for example, as sensitizers or heat resistance improvers for use in non-chemically amplified g-line or i-line resists.

Examples of these low molecular weight phenol compounds include bis(4-hydroxyphenyl)methane, bis(2,3,4-trihydroxyphenyl)methane, 2-(4-hydroxyphenyl)-2-(4'-hydroxyphenyl)propane, 2-(2,3,4-trihydroxyphenyl)-2-(2',3',4'-trihydroxyphenyl)propane, tris(4-hydroxyphenyl)methane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, 1-[1-(4-hydroxyphenyl)isopropyl]-4-[1,1-bis(4-hydroxyphenyl)ethyl]benzene, and dimers, trimers, tetramers, pentamers and hexamers of formalin condensation products of phenols such as phenol, m-cresol, p-cresol and xylenol. Needless to say, the low molecular weight phenol compound is not limited to these examples. In particular, a phenol compound having 2 to 6 triphenylmethane skeletons is preferable in terms of resolution and line width roughness (LER). Also, there are no particular limitations on the acid dissociable group, and suitable examples include the groups described above.

In the resist composition of the present invention, the amount of the component (A) can be appropriately adjusted depending on the thickness of the resist film to be formed, and the like.

Photo-Base Generator Component; Component (C)

In the method of forming a resist pattern of the present invention, by virtue of the component (C) being decomposed in step (2) by the exposure energy to generate a base, an excellent dissolution contrast can be obtained.

The component (C) may be any compound capable of being decomposed by irradiation of radiation to generate a base, and examples thereof include a compound containing a carbamate group (a urethane bond), a compound containing an acyloxyimino group, an ionic compound (an anion-cation complex), and a compound containing a carbamoyloxyimino group. Among these, a compound containing a carbamate group (a urethane bond), a compound containing an acyloxyimino group, and an ionic compound (an anion-cation complex) are preferable.

Further, compounds having a ring structure within a molecule thereof are preferable, and examples thereof include compounds having a ring skeleton such as benzene, naphthalene, anthracene, xanthone, thioxanthone, anthraquinone or fluorene.

Among these, as the component (C), in terms of photodegradability, a compound represented by general formula (C1) shown below (hereafter, referred to as "component (C1)") is particularly desirable. When the compound is irradiated by radiation, at least the bond between the nitrogen atom in the formula (C1) and the carbon atom of the carbonyl group adjacent to the nitrogen atom is cleaved, thereby generating an amine or ammonia and carbon dioxide. At this time, after the decomposition, since the product contains —N($R^1$)($R^2$), which has a high boiling point, the product can be prevented from vaporizing by the baking (PEB) in the step (3). Accordingly, since the degree of freedom in selecting the baking temperature is enhanced, it is preferable that the product containing —N($R^1$)($R^2$) have a high boiling point. Further, in terms of suppressing diffusion of a base during PEB, it is preferable that the product containing —N($R^1$)($R^2$) has a large molecular weight or a highly bulky skeleton.

[Chemical Formula 39]

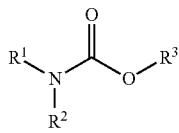

(C1)

In the formula, $R^1$ and $R^2$ each independently represents a hydrogen atom or a monovalent hydrocarbon group which may contain a hetero atom, provided that $R^1$ and $R^2$ may be mutually bonded to form a cyclic group with the adjacent nitrogen atom; and $R^3$ represents a monovalent photoactive group.

In formula (C1), the hetero atom which may be contained in the hydrocarbon group for $R^1$ and $R^2$ is an atom other than hydrogen and carbon, and examples thereof include an oxygen atom, a nitrogen atom, a sulfur atom and a halogen atom. Examples of the halogen atom include a fluorine atom, a chlorine atom, a bromine atom and an iodine atom.

The hydrocarbon group may be either an aromatic hydrocarbon group or an aliphatic hydrocarbon group, and is preferably an aliphatic hydrocarbon group.

In formula (C1), the aromatic hydrocarbon group for $R^1$ and $R^2$ is a hydrocarbon group having an aromatic ring.

The aromatic hydrocarbon group for $R^1$ and $R^2$ preferably has 5 to 30 carbon atoms, more preferably 5 to 20, still more preferably 6 to 15, and most preferably 6 to 12. Here, the number of carbon atoms within a substituent(s) is not included in the number of carbon atoms of the aromatic hydrocarbon group.

Specific examples of the aromatic hydrocarbon group include an aryl group which is an aromatic hydrocarbon ring having one hydrogen atom removed therefrom, such as a phenyl group, a biphenyl group, a fluorenyl group, a naphthyl group, an anthryl group or a phenanthryl group; and an alkylaryl group such as a benzyl group, a phenethyl group, a 1-naphthylmethyl group, a 2-naphthylmethyl group, a 1-naphthylethyl group, or a 2-naphthylethyl group. The alkyl chain within the arylalkyl group preferably has 1 to 4 carbon atom, more preferably 1 or 2, and most preferably 1.

The aromatic hydrocarbon group may have a substituent. For example, part of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

Further, when the aromatic hydrocarbon group has an aliphatic hydrocarbon group bonded to the aromatic ring, part of the carbon atoms constituting the aliphatic hydrocarbon group may be substituted with a divalent linking group containing a hetero atom, or part or all of the hydrogen atoms constituting the aliphatic hydrocarbon group may be substituted with a substituent group. As examples of the "aliphatic hydrocarbon group" and the "divalent linking group containing a hetero atom", the same aliphatic hydrocarbon groups and divalent linking groups containing a hetero atom as those described later for $R^1$ and $R^2$ can be mentioned.

Examples of the aromatic hydrocarbon group in which part of the carbon atoms constituting the aromatic ring has been substituted with a hetero atom include a heteroaryl group in which part of the carbon atoms constituting the ring within the aforementioned aryl group has been substituted with a hetero atom such as an oxygen atom, a sulfur atom or a nitrogen atom, and a heteroarylalkyl group in which part of the carbon atoms constituting the aromatic hydrocarbon ring within the aforementioned arylalkyl group has been substituted with the aforementioned heteroatom.

Examples of the substituent group which substitutes the hydrogen atom bonded to the aromatic ring of the aforementioned aromatic hydrocarbon group include an alkyl group, an alkoxy group, a halogen atom, a halogenated alkyl group, a hydroxyalkyl group, a hydroxy group, an oxygen atom (=O), —COOR", —OC(=O)R", a cyano group, a nitro group, —NR"$_2$, —R$^{9'}$—N(R$^{10'}$)—C(=O)—O—R$^{5'}$, and a nitrogen-containing heterocyclic group.

The alkyl group for the substituent is preferably an alkyl group of 1 to 6 carbon atoms. Further, the alkyl group is preferably a linear alkyl group or a branched alkyl group. Specific examples include a methyl group, an ethyl group, a propyl group, an isopropyl group, an n-butyl group, an isobutyl group, a tert-butyl group, a pentyl group, an isopentyl group, a neopentyl group and a hexyl group. Among these, a methyl group or ethyl group is preferable, and a methyl group is particularly desirable.

The alkoxy group for the substituent is preferably an alkoxy group of 1 to 6 carbon atoms. The alkoxy group is preferably a linear or branched group. Specific examples include groups in which an oxygen atom (—O—) is bonded to any of the alkyl groups described above as the substituent.

Examples of the halogen atom for the substituent include a fluorine atom, a chlorine atom, a bromine atom and an iodine atom, and a fluorine atom is preferable.

As examples of the halogenated alkyl group for the substituent, groups in which part or all of the hydrogen atoms of the aforementioned alkyl groups for the substituent have been substituted with the aforementioned halogen atoms can be given. As the halogenated alkyl group, a fluorinated alkyl group is preferable, and a perfluoroalkyl group is particularly desirable.

The hydroxyalkyl group for the substituent preferably has 1 to 6 carbon atoms, and specific examples thereof include the aforementioned alkyl groups for the substituent in which at least one hydrogen atom has been substituted with a hydroxy group.

In the —COOR" group, the —OC(=O)R" group and the —NR"$_2$ group, R" represents a hydrogen atom or a linear, branched or cyclic alkyl group of 1 to 15 carbon atoms.

When R" represents a linear or branched alkyl group, it is preferably an alkyl group of 1 to 10 carbon atoms, more preferably an alkyl group of 1 to 5 carbon atoms, and most preferably a methyl group or an ethyl group.

When R" is a cyclic alkyl group (cycloalkyl group), it preferably has 3 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

The two R" groups within the —NR"$_2$ group may be the same or different from each other.

In formula —R$^{9'}$—N(R$^{10'}$)—C(=O)—O—R$^{5'}$, R$^{9'}$ represents a divalent hydrocarbon group which may contain a hetero atom, R$^{10'}$ represents a hydrogen atom or a monovalent hydrocarbon group which may contain a hetero atom, and R$^{5'}$ represents a monovalent organic group which has an aliphatic ring or an aromatic ring.

Examples of the hydrocarbon group for R$^{9'}$ include groups in which one hydrogen atom has been removed from the hydrocarbon group for R$^1$ in the aforementioned formula (C1).

As examples of R$^{10'}$ and R$^{5'}$, the same groups as those described above for R$^2$ and R$^3$ in formula (C1) can be given, respectively.

With respect to R$^1$ and R$^2$ in formula (C1), when R' has —R$^{9'}$—N(R$^{10'}$)—C(=O)—O—R$^{5'}$ as a substituent, R$^{10'}$ may be bonded to R$^2$ in formula (C1) to form a ring.

With respect to R$^1$ and R$^2$ in formula (C1), when R$^1$ has —R$^{9'}$—N(R$^{10'}$)—C(=O)—O—R$^{5'}$ as a substituent, the compound represented by formula (C1) is preferably a compound represented by the following general formula: R$^{5'}$—O—C(=O)—N(R$^{10'}$)—R$^4$—N(R$^2$)—C(=O)—O—R$^3$ [in the formula, R$^2$, R$^3$, R$^{10'}$ and R$^{5'}$ are the same as defined above; and R$^4$ represents a divalent aliphatic hydrocarbon group].

Examples of the divalent aliphatic hydrocarbon group for R$^4$ include groups in which one hydrogen atom has been removed from the aliphatic hydrocarbon groups for R$^1$ and R$^2$ described later.

The "nitrogen-containing heterocyclic group" as the aforementioned substituent is a group in which one or more hydrogen atoms have been removed from a nitrogen-containing heterocyclic compound containing a nitrogen atom in the ring skeleton thereof. The nitrogen-containing heterocyclic compound may have a carbon atom or a hetero atom other than nitrogen (e.g., an oxygen atom, a sulfur atom or the like) within the ring skeleton thereof.

The nitrogen-containing heterocyclic compound may be either aromatic or aliphatic. When the nitrogen-containing heterocyclic compound is aliphatic, it may be either saturated or unsaturated. Further, the nitrogen-containing heterocyclic compound may be either monocyclic or polycyclic.

The nitrogen-containing heterocyclic compound preferably has 3 to 30 carbon atoms, more preferably 5 to 30, and still more preferably 5 to 20.

Specific examples of monocyclic nitrogen-containing heterocycle compound include pyrrole, pyridine, imidazole, pyrazole, 1,2,3-triazole, 1,2,4-triazole, pyrimidine, pyrazine, 1,3,5-triazine, tetrazole, piperidine, piperazine, pyrrolidine and morpholine.

Specific examples of polycyclic nitrogen-containing heterocyclic compound include quinoline, isoquinoline, indole, pyrrolo[2,3-b]pyridine, indazole, benzimidazole, benzotriazole, carbazole, acridine, 1,5-diazabicyclo [4.3.0]-5-nonene, 1,8-diazabicyclo [5.4.0]-7-undecene, hexamethylenetetramine and 1,4-diazabicyclo[2.2.2]octane.

The nitrogen-containing heterocyclic compound may have a substituent. Examples of the substituent include the same groups as those described above for the substituent group which substitutes a hydrogen atom bonded to the aromatic ring contained in the aforementioned aromatic hydrocarbon group.

In formula (C1), the aliphatic hydrocarbon group for R$^1$ and R$^2$ refers to a hydrocarbon group that has no aromaticity.

The aliphatic hydrocarbon group for R$^1$ and R$^2$ may be either saturated (an alkyl group) or unsaturated. In general, the aliphatic hydrocarbon group is preferably saturated. Further, the aliphatic hydrocarbon group may be linear, branched or cyclic, or a combination thereof. Examples of the combination include a group in which a cyclic aliphatic hydrocarbon group is bonded to a terminal of a linear or branched aliphatic hydrocarbon group, and a group in which a cyclic aliphatic hydrocarbon group is interposed within a linear or branched aliphatic hydrocarbon group.

The linear or branched alkyl group preferably has 1 to 20 carbon atoms, more preferably 1 to 15, and still more preferably 1 to 10.

Specific examples of linear alkyl groups include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

Specific examples of branched alkyl groups include a 1-methylethyl group (an isopropyl group), a 1-methylpropyl group, a 2-methylpropyl group, a 1-methylbutyl group, a 2-methylbutyl group, a 3-methylbutyl group, a 1-ethylbutyl group, a 2-ethylbutyl group, a tert-butyl group, a 1-methylpentyl group, a 2-methylpentyl group, a 3-methylpentyl group and a 4-methylpentyl group.

The cyclic alkyl group may be either a monocyclic group or a polycyclic group. The aliphatic cyclic group preferably has 3 to 30 carbon atoms, more preferably 5 to 30, still more preferably 5 to 20, still more preferably 6 to 15, and most preferably 6 to 12. As the aliphatic cyclic group, a group in which one hydrogen atom has been removed from a monocycloalkane or a polycycloalkane such as a bicycloalkane, tricycloalkane or tetracycloalkane can be used. Specific examples of the group in which one hydrogen atom has been removed from a monocycloalkane include a cyclopentyl group and a cyclohexyl group. Examples of the group in which one hydrogen atom has been removed from a polycycloalkane include an adamantyl group, a norbornyl group, an isobornyl group, a tricyclodecyl group and a tetracyclododecyl group.

The aliphatic hydrocarbon group may have a substituent. For example, part of the carbon atoms constituting the aliphatic hydrocarbon group may be replaced by a divalent linking group containing a hetero atom, and part or all of the hydrogen atoms constituting the aliphatic hydrocarbon group may be substituted with a substituent.

With respect to the divalent linking group containing a hetero atom, examples of hetero atoms include the same hetero atoms as those described above which replaces part of the carbon atoms constituting the aromatic ring contained in the aforementioned aromatic hydrocarbon group. Examples of the divalent linking group containing a hetero atom include divalent non-hydrocarbon groups containing a hetero atom, such as —O—, —C(=O)—, —C(=O)—O—, a carbonate bond (—O—C(=O)—O—), —S—, —S(=O)$_2$, —S(=O)$_2$—O—, —NH—, —NR$^{04}$—(R$^{04}$ represents a substituent such as an alkyl group or an acyl group), —NH—C(=O)— and =N—. Further, a combination of any one of these "divalent non-hydrocarbon groups containing a hetero atom" with a divalent aliphatic hydrocarbon group can also be used. Examples of the divalent aliphatic hydrocarbon group include groups in which one hydrogen atom has been removed from the aforementioned aliphatic hydrocarbon group, and a linear or branched aliphatic hydrocarbon group is preferable.

As the substituent for the aliphatic hydrocarbon group in the latter example, the same groups as those described above for the substituent group which substitutes a hydrogen atom bonded to the aromatic ring contained in the aforementioned aromatic hydrocarbon group can be mentioned.

In the aforementioned general formula (C1), R$^1$ and R$^2$ may be mutually bonded to form a cyclic group with the adjacent nitrogen atom.

The cyclic group may be either an aromatic cyclic group or an aliphatic cyclic group. When the cyclic group is an aliphatic cyclic group, it may be either saturated or unsaturated. In general, the aliphatic cyclic group is preferably saturated.

The cyclic group may have a nitrogen atom other than the nitrogen atom bonded to R$^1$ and R$^2$ within the ring skeleton thereof. Further, the cyclic group may have a carbon atom or a hetero atom other than nitrogen (e.g., an oxygen atom, a sulfur atom or the like) within the ring skeleton thereof.

The cyclic group may be either a monocyclic group or a polycyclic group.

When the cyclic group is monocyclic, the number of atoms constituting the skeleton of the cyclic group is preferably from 4 to 7, and more preferably 5 or 6. That is, the cyclic group is preferably a 4- to 7-membered ring, and more preferably a 5- or 6-membered ring. Specific examples of monocyclic groups include groups in which the hydrogen atom of —NH— has been removed from a heteromonocyclic group containing —NH— in the ring structure thereof, such as piperidine, pyrrolidine, morpholine, pyrrole, imidazole, pyrazole, 1,2,3-triazole, 1,2,4-triazole, tetrazole or piperazine.

When the cyclic group is polycyclic, the cyclic group is preferably bicyclic, tricyclic or tetracyclic. Further, the number of atoms constituting the skeleton of the cyclic group is preferably from 7 to 12, and more preferably from 7 to 10. Specific examples of polycyclic nitrogen-containing heterocyclic groups include groups in which the hydrogen atom of —NH— has been removed from a heteropolycyclic group containing —NH— in the ring structure thereof, such as indole, isoindole, carbazole, benzimidazole, indazole or benzotriazole.

The cyclic group may have a substituent. Examples of the substituent include the same groups as those described above for the substituent group which substitutes a hydrogen atom bonded to the aromatic ring contained in the aforementioned aromatic hydrocarbon group.

As a cyclic group formed by R$^1$ and R$^2$ mutually bonded with the adjacent nitrogen atom, a group represented by general formula (II) shown below is particularly desirable.

[Chemical Formula 40]

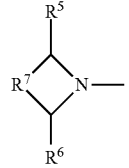

(II)

In the formula, R$^5$ and R$^6$ each independently represents a hydrogen atom or an alkyl group; R$^7$ represents a linear alkylene group of 1 to 3 carbon atoms which may have a carbon atom substituted with an oxygen atom or a nitrogen atom and may have a hydrogen atom substituted with a substituent.

In formula (II), as the alkyl group for R$^5$ and R$^6$, the same alkyl groups as those described above as the aliphatic hydrocarbon group for R$^1$ and R$^2$ can be mentioned, a linear or branched alkyl group is preferable, and a methyl group is particularly desirable.

Examples of the alkylene group for R$^7$ which may have a carbon atom substituted with an oxygen atom or a nitrogen atom include —CH$_2$—, —CH$_2$—O—, —CH$_2$—NH—, —CH$_2$—CH$_2$—, —CH$_2$—O—CH$_2$—, —CH$_2$—NH—CH$_2$—, —CH$_2$—CH$_2$—CH$_2$—, —CH$_2$—CH$_2$—O—CH$_2$—, and —CH$_2$—CH$_2$—NH—CH$_2$—.

As the substituent which substitutes a hydrogen atom in the alkylene group, the same groups as those described above for the substituent group which substitutes a hydrogen atom bonded to the aromatic ring contained in the aforementioned aromatic hydrocarbon group can be mentioned. The hydrogen atom to be substituted with a substituent may be a hydrogen atom bonded to a carbon atom, or a hydrogen atom bonded to a nitrogen atom.

In formula (C1), R$^3$ represents a monovalent photoactive group.

The term "photoactive group" refers to a group which absorbs the exposure energy of the exposure conducted in step (2).

As the photoactive group, a ring-containing group is preferable, and may be either a hydrocarbon ring or a hetero ring. Preferable examples thereof include groups having a ring structure described above for R$^1$ and R$^2$, and groups having an aromatic ring. Specific examples of preferable ring skeletons for the ring-containing group include benzene, biphenyl, indene, naphthalene, fluorene, anthracene, phenanthrene, xanthone, thioxanthone and anthraquinone.

Further, these ring skeletons may have a substituent. In terms of efficiency in the generation of a base, as the substituent, a nitro group is particularly desirable.

As the component (C1), a compound represented by general formula (C1-11) or (C1-12) shown below is particularly desirable.

[Chemical Formula 41]

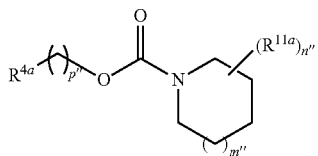
(C1-11)

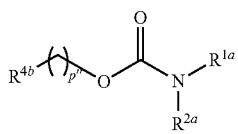
(C1-12)

In the formulae, $R^{4a}$ and $R^{4b}$ each independently represents a ring skeleton selected from benzene, biphenyl, indene, naphthalene, fluorene, anthracene, phenanthrene, xanthone, thioxanthone and anthraquinone which may have a substituent; $R^{1a}$ and $R^{2a}$ each independently represents an alkyl group of 1 to 15 carbon atoms or a cycloalkyl group; $R^{11a}$ represents an alkyl group of 1 to 5 carbon atoms; m" represents 0 or 1; n" represents 0 to 3; and each p" independently represents 0 to 3.

In formulae (C1-11) and (C1-12), in terms of efficiency in generation of a base, it is preferable that $R^{4a}$ and $R^{4b}$ has a nitro group as a substituent, and it is particularly desirable that the ortho position is substituted.

In terms of suppressing the diffusion length of the generated base, it is preferable that each of $R^{1a}$ and $R^{2a}$ is a cycloalkyl group of 5 to 10 carbon atoms.

m" is preferably 1. n" is preferably 0 to 2. p" is preferably 0 or 1.

Specific examples of the component (C1) are shown below.

[Chemical Formula 42]

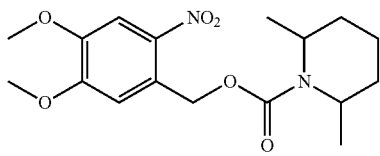
(C1-11-1)

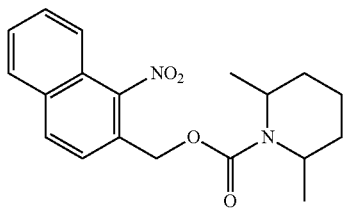
(C1-11-2)

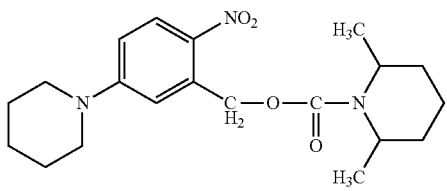
(C1-11-3)

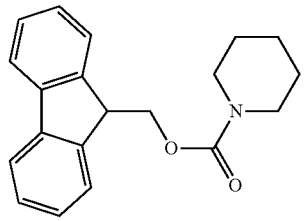
(C1-11-4)

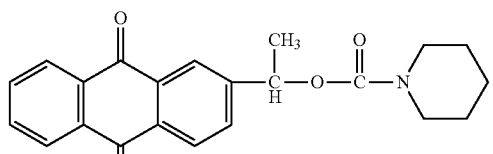
(C1-11-5)

[Chemical Formula 43]

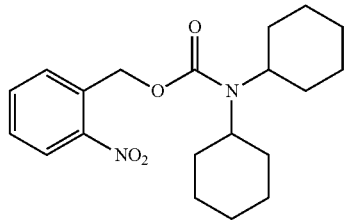
(C1-12-1)

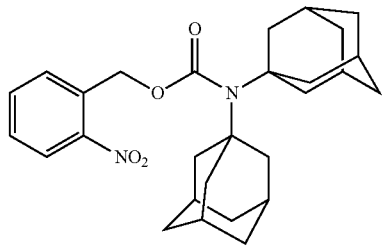
(C1-12-2)

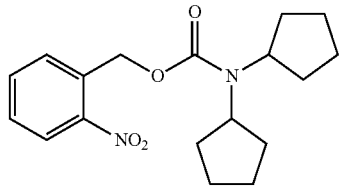
(C1-12-3)

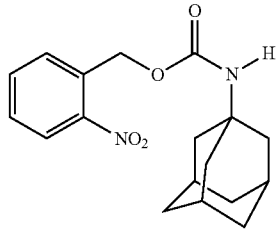
(C1-12-4)

Further, as a preferable example of the component (C), a compound represented by general formula (C2) shown below (hereafter, referred to as "component (C2)") can also be mentioned.

After absorbing the exposure energy by the exposure conducted in step (2), the component (C2) has the (—CH=CH—C(=O)—) portion isomerized to a cis isomer, and is further cyclized by heating, thereby generating a base (NHR$^1$R$^2$).

The component (C2) is preferable in that, not only a base can be generated, but also the effect of rendering the resist composition hardly soluble in an alkali developing solution in step (4) can be obtained.

[Chemical Formula 44]

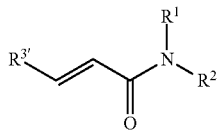

(C2)

In formula (C2), $R^1$ and $R^2$ are respectively the same as defined for $R^1$ and $R^2$ in the aforementioned formula (C1); and $R^{3'}$ represents an aromatic cyclic group having a hydroxy group on the ortho position.

In the aforementioned formula (C2), it is preferable that $R^1$ and $R^2$ are mutually bonded together with the adjacent nitrogen atom to form a cyclic group represented by the aforementioned formula (II). Further, $R^1$ and $R^2$ are preferably the same as defined for $R^{1a}$ and $R^{2a}$ in the aforementioned formula (C1-12).

As the aromatic cyclic group for $R^{3'}$, the same groups having an aromatic ring as those described above for $R^3$ in the aforementioned formula (C1) can be mentioned. As the ring skeleton, benzene, biphenyl, indene, naphthalene, fluorene, anthracene and phenanthrene are preferable, and a benzene ring is more preferable.

The aromatic cyclic group for $R^{3'}$ may have a substituent other than the hydroxy group on the ortho position. Examples of the substituent include a halogen atom, a hydroxy group, a mercapto group, a sulfide group, a silyl group, a silanol group, a nitro group, a nitroso group, a sulfino group, a sulfo group, a sulfonate group, a phosphino group, a phosphinyl group, a phosphono group, a phosphonate group, an amino group, an ammonio group, and a monovalent organic group such as an alkyl group.

Specific examples of the component (C2) are shown below.

[Chemical Formula 45]

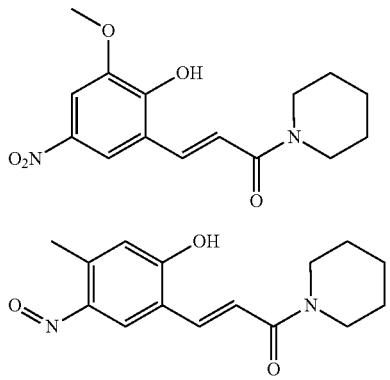

Further, as a preferable example of the component (C), a compound represented by general formula (C3) shown below (hereafter, referred to as "component (C3)") can also be mentioned.

After absorbing the exposure energy by the exposure conducted in step (2), the component (C3) undergoes decarboxylation, and then reacts with water to generate amine (base).

[Chemical Formula 46]

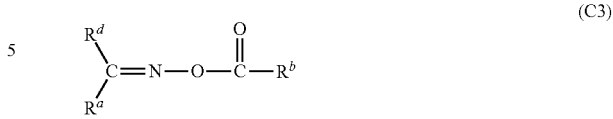

(C3)

In the formula, $R^a$ and $R^d$ each independently represents a hydrogen atom or a hydrocarbon group of 1 to 30 carbon atoms which may have a substituent (provided that, when both $R^a$ and $R^d$ represent a hydrocarbon group of 1 to 30 carbon atoms which may have a substituent, $R^a$ and $R^d$ are mutually bonded to form a ring); and $R^b$ represents an aryl group which may have a substituent or an aliphatic cyclic group which may have a substituent.

In the aforementioned formula (C3), $R^a$ represents a hydrogen atom or a hydrocarbon group of 1 to 30 carbon atoms which may have a substituent.

The hydrocarbon group of 1 to 30 carbon atoms for $R^a$ which may have a substituent may be either an aromatic hydrocarbon group or an aliphatic hydrocarbon group.

The aromatic hydrocarbon group is a hydrocarbon group having an aromatic ring. The aromatic hydrocarbon group preferably has 5 to 30 carbon atoms, more preferably 5 to 20 carbon atoms, still more preferably 6 to 15 carbon atoms, and most preferably 6 to 12 carbon atoms. Here, the number of carbon atoms within a substituent(s) is not included in the number of carbon atoms of the aromatic hydrocarbon group.

Specific examples of aromatic hydrocarbon groups include an aryl group which is an aromatic hydrocarbon ring having one hydrogen atom removed therefrom, such as a phenyl group, a biphenyl group, a fluorenyl group, a naphthyl group, an anthryl group or a phenanthryl group; and an alkylaryl group such as a benzyl group, a phenethyl group, a 1-naphthylmethyl group, a 2-naphthylmethyl group, a 1-naphthylethyl group, or a 2-naphthylethyl group. The alkyl chain within the arylalkyl group preferably has 1 to 4 carbon atom, more preferably 1 to 3, and most preferably 1 or 2.

The aromatic hydrocarbon group may have a substituent. For example, part of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

In the former example, a heteroaryl group in which part of the carbon atoms constituting the ring within the aforementioned aryl group has been substituted with a hetero atom such as an oxygen atom, a sulfur atom or a nitrogen atom, and a heteroarylalkyl group in which part of the carbon atoms constituting the aromatic hydrocarbon ring within the aforementioned arylalkyl group has been substituted with the aforementioned heteroatom can be used.

In the latter example, as the substituent for the aromatic hydrocarbon group, an alkyl group, an alkoxy group, a halogen atom, a halogenated alkyl group, a hydroxyl group, an oxygen atom (=O) or the like can be used.

The alkyl group as the substituent for the aromatic hydrocarbon group is preferably an alkyl group of 1 to 5 carbon atoms, and a methyl group, an ethyl group, a propyl group, an n-butyl group or a tert-butyl group is particularly desirable.

The alkoxy group as the substituent for the aromatic hydrocarbon group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom as the substituent for the aromatic hydrocarbon group include a fluorine atom, a chlorine atom, a bromine atom and an iodine atom, and a fluorine atom is preferable.

Example of the halogenated alkyl group as the substituent for the aforementioned aromatic hydrocarbon group include groups in which part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

The aliphatic hydrocarbon group for $R^a$ in the aforementioned formula (C3) may be either a saturated aliphatic hydrocarbon group, or an unsaturated aliphatic hydrocarbon group. Further, the aliphatic hydrocarbon group may be linear, branched or cyclic.

In the aliphatic hydrocarbon group for $R^a$ in the aforementioned formula (C3), part of the carbon atoms constituting the aliphatic hydrocarbon group may be substituted with a substituent group containing a hetero atom, or part or all of the hydrogen atoms constituting the aliphatic hydrocarbon group may be substituted with a substituent group containing a hetero atom.

As the "hetero atom" for $R^a$ in the aforementioned formula (C3), there is no particular limitation as long as it is an atom other than carbon and hydrogen. Examples of the halogen atom include a fluorine atom, a chlorine atom, an iodine atom and a bromine atom.

The substituent group containing a hetero atom may consist of a hetero atom, or may be a group containing a group or atom other than a hetero atom.

Specific examples of the substituent group for substituting part of the carbon atoms include —O—, —C(=O)—O—, —C(=O)—, —O—C(=O)—O—, —C(=O)—NH—, —NH— (the H may be replaced with a substituent such as an alkyl group or an acyl group), —S—, —S(=O)$_2$— and —S(=O)$_2$—O—. When the aliphatic hydrocarbon group is cyclic, the aliphatic hydrocarbon group may contain any of these substituent groups in the ring structure.

Examples of the substituent group for substituting part or all of the hydrogen atoms include an alkoxy group, a halogen atom, a halogenated alkyl group, a hydroxyl group, an oxygen atom (=O) and a cyano group.

The aforementioned alkoxy group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the aforementioned halogen atom include a fluorine atom, a chlorine atom, a bromine atom and an iodine atom, and a fluorine atom is preferable.

Example of the aforementioned halogenated alkyl group includes a group in which part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

As the aliphatic hydrocarbon group, a linear or branched saturated hydrocarbon group, a linear or branched monovalent unsaturated hydrocarbon group, or a cyclic aliphatic hydrocarbon group (aliphatic cyclic group) is preferable.

The linear saturated hydrocarbon group (alkyl group) preferably has 1 to 20 carbon atoms, more preferably 1 to 15, and most preferably 1 to 10. Specific examples include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched saturated hydrocarbon group (alkyl group) preferably has 3 to 20 carbon atoms, more preferably 3 to 15, and most preferably 3 to 10. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

The unsaturated hydrocarbon group preferably has 2 to 10 carbon atoms, more preferably 2 to 5, still more preferably 2 to 4, and most preferably 3. Examples of linear monovalent unsaturated hydrocarbon groups include a vinyl group, a propenyl group (an allyl group) and a butynyl group. Examples of branched monovalent unsaturated hydrocarbon groups include a 1-methylpropenyl group and a 2-methylpropenyl group.

Among the above-mentioned examples, as the unsaturated hydrocarbon group, a propenyl group is particularly desirable.

The cyclic aliphatic hydrocarbon group (aliphatic cyclic group) for $R^a$ in the aforementioned formula (C3) is an aliphatic cyclic group of 3 to 30 carbon atoms which may have a substituent.

In the aliphatic cyclic group for $R^a$ in the aforementioned formula (C3), part of the carbon atoms constituting the aliphatic cyclic group may be substituted with a substituent group containing a hetero atom, or part or all of the hydrogen atoms constituting the aliphatic cyclic group may be substituted with a substituent group containing a hetero atom.

As the "hetero atom" for $R^a$ in the aforementioned formula (C3), there is no particular limitation as long as it is an atom other than carbon and hydrogen, and examples thereof include a halogen atom, an oxygen atom, a sulfur atom and a nitrogen atom. Examples of the halogen atom include a fluorine atom, a chlorine atom, an iodine atom and a bromine atom.

The substituent group containing a hetero atom may consist of a hetero atom, or may be a group containing a group or atom other than a hetero atom.

Specific examples of the substituent group for substituting part of the carbon atoms include —O—, —C(=O)—O—, —C(=O)—, —O—C(=O)—O—, —C(=O)—NH—, —NH— (the H may be replaced with a substituent such as an alkyl group or an acyl group), —S—, —S(=O)$_2$— and —S(=O)$_2$—O—. These substituents may be contained in the ring structure.

Examples of the substituent group for substituting part or all of the hydrogen atoms include an alkoxy group, a halogen atom, a halogenated alkyl group, a hydroxyl group, an oxygen atom (=O) and a cyano group.

The aforementioned alkoxy group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the aforementioned halogen atom include a fluorine atom, a chlorine atom, a bromine atom and an iodine atom, and a fluorine atom is preferable.

Example of the aforementioned halogenated alkyl group includes a group in which part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

The aliphatic cyclic group may be either a monocyclic group or a polycyclic group. The aliphatic cyclic group has 3 to 30 carbon atoms, preferably 5 to 30, more preferably 5 to 20, still more preferably 6 to 15, and most preferably 6 to 12.

As the aliphatic cyclic group, a group in which one or more hydrogen atoms have been removed from a monocycloalkane or a polycycloalkane such as a bicycloalkane, tricycloalkane or tetracycloalkane can be used. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

When the aliphatic cyclic group does not contain a hetero atom-containing substituent group in the ring structure thereof, the aliphatic cyclic group is preferably a polycyclic group, more preferably a group in which one or more hydrogen atoms have been removed from a polycycloalkane, and a group in which one or more hydrogen atoms have been removed from adamantane is particularly desirable.

When the aliphatic cyclic group contains a hetero atom-containing substituent group in the ring structure thereof, the hetero atom-containing substituent group is preferably —O—, —C(=O)—O—, —S—, —S(=O)$_2$— or —S(=O)$_2$—O—. Specific examples of such aliphatic cyclic groups include groups represented by formulae (L1) to (L6) and (S1) to (S4) shown below.

[Chemical Formula 47]

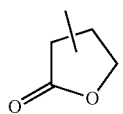

(L1)

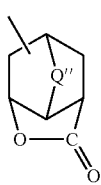

(L2)

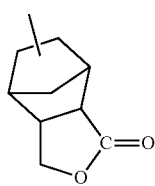

(L3)

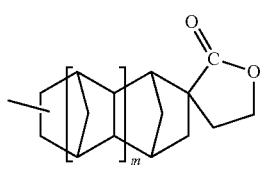

(L4)

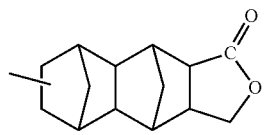

(L5)

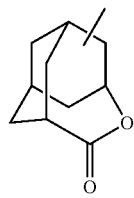

(L6)

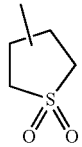

(S1)

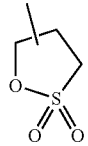

(S2)

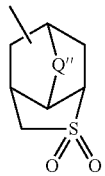

(S3)

(S4)

In the formula, Q″ represents an alkylene group of 1 to 5 carbon atoms, —O—, —S—, —O—R$^{94}$— or —S—R$^{95}$— (wherein each of R$^{94}$ and R$^{95}$ independently represents an alkylene group of 1 to 5 carbon atoms); and m represents 0 or 1.

In the formulae, the alkylene group for Q″ and R$^{94}$ to R$^{95}$ is preferably a linear or branched alkylene group, and has 1 to 5 carbon atoms, preferably 1 to 3.

Specific examples of alkylene groups include a methylene group [—CH$_2$—]; alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—; an ethylene group [—CH$_2$CH$_2$—]; alkylethylene groups such as —CH(CH$_3$)CH$_2$—, —CH(CH$_3$)CH(CH$_3$) —, —C(CH$_3$)$_2$CH$_2$— and —CH(CH$_2$CH$_3$)CH$_2$—, and —CH(CH$_2$CH$_3$)CH$_2$—; a trimethylene group (n-propylene group) [—CH$_2$CH$_2$CH$_2$—]; alkyltrimethylene groups such as —CH(CH$_3$)CH$_2$CH$_2$— and —CH$_2$CH(CH$_3$)CH$_2$—; a tetramethylene group [—CH$_2$CH$_2$CH$_2$CH$_2$—]; alkyltetramethylene groups such as —CH(CH$_3$)CH$_2$CH$_2$CH$_2$— and —CH$_2$CH(CH$_3$)CH$_2$CH$_2$—; and a pentamethylene group [—CH$_2$CH$_2$CH$_2$CH$_2$CH$_2$—].

In these aliphatic cyclic groups, part of the hydrogen atoms bonded to the carbon atoms constituting the ring structure may be substituted with a substituent. Examples of substituents include an alkyl group, an alkoxy group, a halogen atom, a halogenated alkyl group, a hydroxyl group and an oxygen atom (=O).

As the alkyl group, an alkyl group of 1 to 5 carbon atoms is preferable, and a methyl group, an ethyl group, a propyl group, an n-butyl group or a tert-butyl group is particularly desirable.

Examples of the alkoxy group and the halogen atom include the same groups and atoms as those listed above for the substituent used for substituting part or all of the hydrogen atoms of the aliphatic cyclic group for $R^a$.

As the aliphatic cyclic group for $R^a$ which may have a substituent, an aliphatic polycyclic group which may have a substituent is preferable. As the aliphatic polycyclic group, the aforementioned group in which one or more hydrogen atoms have been removed from a polycycloalkane, and groups represented by formulae (L2) to (L6), (S3) and (S4) are preferable.

When $R^a$ in the aforementioned formula (C3) represents a hydrocarbon group of 1 to 30 carbon atoms which may have a substituent, $R^a$ may form a ring with the adjacent carbon atom. The formed ring may be either monocyclic or polycyclic. The number of carbon atoms (including the carbon atom bonded thereto) is preferably 5 to 30, and more preferably 5 to 20.

Specifically, among the cyclic aliphatic hydrocarbon groups (aliphatic cyclic groups) for $R^a$ described above, aliphatic cyclic groups of 5 to 30 carbon atoms can be given as examples (provided that the carbon atom bonded thereto is regarded as part of the ring).

It is preferable that $R^a$ in the aforementioned formula (C3) is a hydrogen atom or a cyclic group which may have a substituent. The cyclic group may be either an aromatic hydrocarbon group which may have a substituent, or an aliphatic cyclic group which may have a substituent.

As the aliphatic cyclic group which may have a substituent, an aliphatic polycyclic group which may have a substituent is preferable. As the aliphatic polycyclic group, the aforementioned group in which one or more hydrogen atoms have been removed from a polycycloalkane, and groups represented by formulae (L2) to (L6), (S3) and (S4) are preferable.

As the aromatic hydrocarbon group which may have a substituent, a naphthyl group which may have a substituent, or a phenyl group which may have a substituent is preferable.

Examples of the aryl group for $R^b$ in the aforementioned formula (C3) include the aromatic hydrocarbon groups described above for $R^a$, excluding arylalkyl groups. As the aryl group for $R^b$, a phenyl group is more preferable.

The aliphatic cyclic group for $R^b$ in the aforementioned formula (C3) is the same as defined for the aliphatic cyclic group for $R^a$ in the aforementioned formula (C3). The aliphatic cyclic group for $R^b$ is preferably an aliphatic polycyclic group, more preferably a group in which one or more hydrogen atoms have been removed from a polycycloalkane, and most preferably a group in which one or more hydrogen atoms have been removed from adamantane.

As the substituent which the aromatic hydrocarbon group or the aliphatic cyclic group for $R^b$ may have, the same substituents as those described above for $R^a$ in the aforementioned formula (C3) can be mentioned.

$R^d$ in the aforementioned formula (C3) is the same as defined for $R^a$ in the aforementioned formula (C3).

It is preferable that $R^d$ in the aforementioned formula (C3) is a cyclic group which may have a substituent.

The cyclic group may be either an aromatic hydrocarbon group which may have a substituent, or an aliphatic cyclic group which may have a substituent, and an aromatic cyclic group which may have a substituent is preferable.

As the aliphatic cyclic group which may have a substituent, an aliphatic polycyclic group which may have a substituent is preferable. As the aliphatic polycyclic group, the aforementioned group in which one or more hydrogen atoms have been removed from a polycycloalkane, and groups represented by formulae (L2) to (L6), (S3) and (S4) are preferable.

$R^d$ in the aforementioned formula (C3) is more preferably a naphthyl group which may have a substituent, or a phenyl group which may have a substituent, and most preferably a phenyl group which may have a substituent.

When both $R^a$ and $R^d$ in the aforementioned formula (C3) represent a hydrocarbon group of 1 to 30 carbon atoms which may have a substituent, $R^a$ and $R^d$ are mutually bonded to form a ring. The formed ring may be either monocyclic or polycyclic. The number of carbon atoms (including the carbon atom bonded to $R^a$ and $R^d$ in the aforementioned formula (C3) is preferably 5 to 30, and more preferably 5 to 20.

Specifically, among the cyclic aliphatic hydrocarbon groups (aliphatic cyclic groups) for $R^a$ described above, aliphatic cyclic groups of 5 to 30 carbon atoms can be given as examples, provided that the carbon atom bonded to $R^a$ and $R^d$ in the aforementioned formula (C3) is regarded as part of the ring.

Specific examples of the component (C3) are shown below.

[Chemical Formula 48]

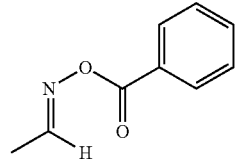

(C3-1)

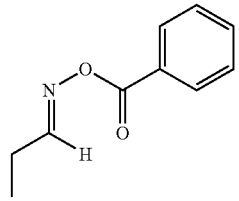

(C3-2)

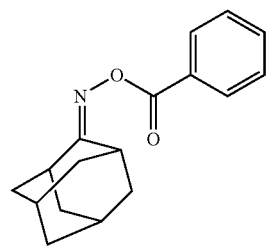

(C3-3)

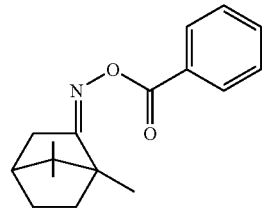

(C3-4)

(C3-5)
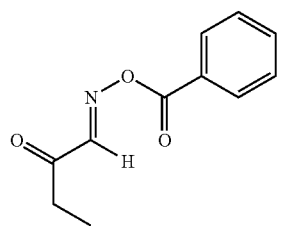
(C3-6)
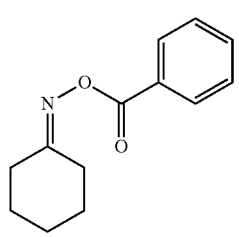
(C3-7)
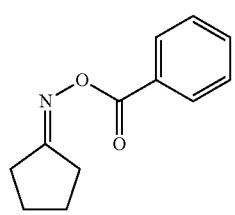
(C3-8)
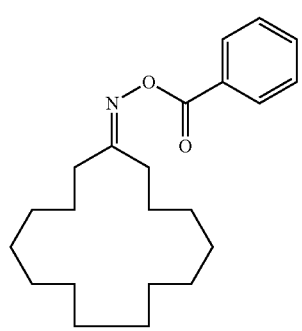
(C3-9)
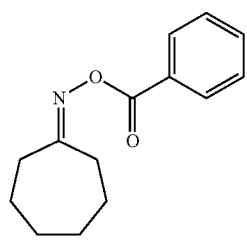
(C3-10)
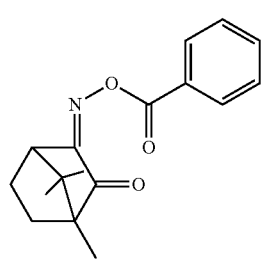
[Chemical Formula 49]
(C3-11)
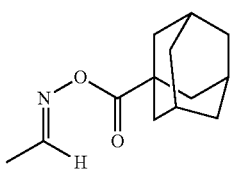
(C3-12)
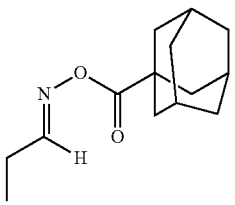
(C3-13)
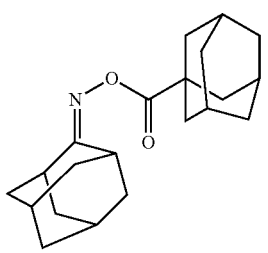
(C3-14)
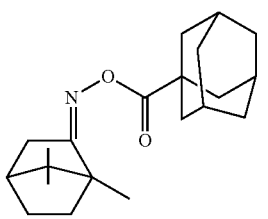
(C3-15)
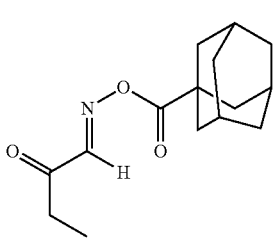
(C3-16)
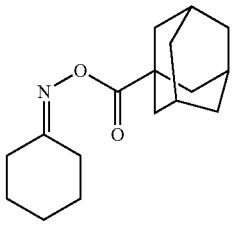
(C3-17)
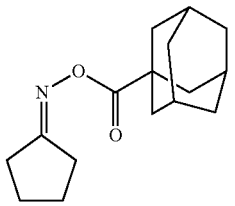

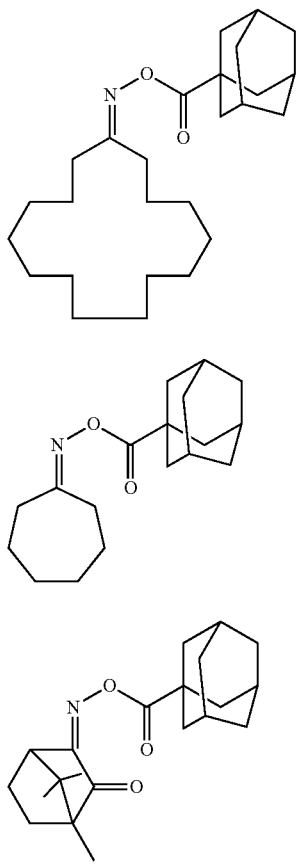

(C3-18)

(C3-19)

(C3-20)

Further, as a preferable example of the component (C), the following acyloxyimino group-containing compounds (C4) can also be mentioned.

[Chemical Formula 50]

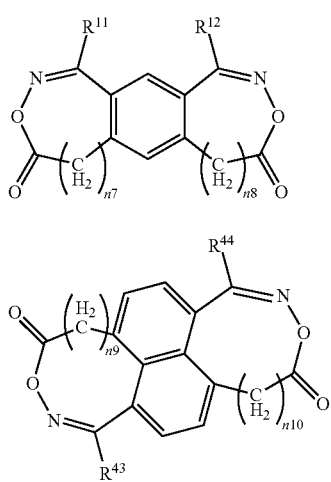

(C4-1)

(C4-2)

In the formulae, $R^{11}$, $R^{12}$, $R^{43}$ and $R^{44}$ each independently represents a hydrogen atom or an alkyl group of 1 to 5 carbon atoms; and n7 to n10 each independently represents 0 to 3.

Furthermore, as the component (C), other than the above examples, any of the known photo-base generators used in conventional chemically amplified resist compositions can be used.

Examples of such photo-base generators include ion-type photo-base generators (anion-cation complexes); triphenylsulfonium compounds; triphenylmethanol; photoactive carbamates, such as benzylcarbamate and benzoin carbamate; amides, such as o-carbamoylhydroxylamide, o-carbamoyloxime, aromatic sulfoneamide, alphalactum and N-(2-allylethynyl)amide; oximeesters; α-aminoacetophenone; cobalt complexes; and those exemplified in Japanese Unexamined Patent Application, First Publication No. 2007-279493.

As the component (C), one type of organic compound may be used alone, or two or more types of organic compounds may be used in combination.

Among these, as the component (C), the component (C1) is preferable, more preferably at least one compound selected from a compound represented by any one of general formulas (C1-11) and (C1-12). The compound represented by general formula (C1-12) is particularly desirable.

In the resist composition, the amount of the component (C), relative to 100 parts by weight of the component (A) is preferably from 0.05 to 50 parts by weight, more preferably from 1 to 30 parts by weight, and still more preferably from 5 to 20 parts by weight, and most preferably from 2 to 20 parts by weight.

When the amount of the component (C) is at least as large as the lower limit of the above-mentioned range, the film retentiveness of the resist film at exposed portions becomes excellent, and the resolution of the formed resist pattern is enhanced. On the other hand, when the amount of the component (C) is no more than the upper limit of the above-mentioned range, the transparency of the resist film can be maintained.

Acid Supply Component; Component (Z)

In the step (1) of the method of forming a resist pattern according to the present invention, the resist composition including an "acid supply component" which supplies an acid which is provided to the resist film is used.

In the present invention, the "acid supply component" includes a component that exhibits acidity by itself, that is, a component acting as a proton donor (hereafter, referred to as "acidic compound component" or "component (G)"); and a component which is decomposed by heat or light to act as an acid (hereafter, referred to as "acid generator component" or "component (B)").

Acidic Compound Component; Component (G)

In the present invention, as the component (G), an acid salt (hereafter, referred to as "component (G1)") having an acid strength capable of increasing the solubility of the base component (A) in an alkali developing solution, or an acid (an acid not forming a salt, and an acid not being ionic; hereafter, referred to as "component (G2)") other than the acid salt can be used.

An acid "has an acid strength sufficient for increasing the solubility of the base component (A) in an alkali developing solution" includes acid, for example, when a polymeric compound (A1) having a structural unit (a1) is used, by conducting baking (PEB) in the aforementioned step (3), the acid is capable of causing cleavage of at least part of the bond within the structure of the acid decomposable group in the structural unit (a1).

As another aspect of the component (G) according to the present invention, the component (G) includes a compound (G1C) (hereafter, referred to as "component (G1C)") composed of a nitrogen-containing cation having a pKa value of 7 or less and a counteranion.

[Component (G1)]

Examples of the component (G1) include an ionic compound (salt compound) composed of a nitrogen-containing cation and a counteranion. Even if forming a salt, the component (G1) exhibits acidity by itself, and acts as a proton donor.

Hereafter, each of the cation moiety and the anion moiety in the component (G1) will be described.

(Cation Moiety of Component (G1))

The structure of the cation moiety in the component (G1) is not particularly limited as long as it contains a nitrogen atom. As specific examples of the cation moiety in the component (G1), a cation represented by general formula (G1c-1) shown below is particularly used.

[Chemical Formula 51]

(G1c-1)

In the formula, $R^{101d}$, $R^{101e}$, $R^{101f}$ and $R^{101g}$ each independently represents a hydrogen atom, a linear, branched or cyclic alkyl group, an alkenyl group, an oxoalkyl group or an oxoalkenyl group of 1 to 12 carbon atoms, an aryl group or an arylalkyl group of 6 to 20 carbon atoms, an aralkyl group of 7 to 12 carbon atoms or an aryloxoalkyl group, and part or all of the hydrogen atoms of these groups may be substituted with a halogen atom, an alkoxy group or a sulfur atom. $R^{101d}$ and $R^{101e}$, or $R^{101d}$, $R^{101e}$ and $R^{101f}$ may be mutually bonded with the nitrogen atom to form a ring, provided that, when a ring is formed, each of $R^{101d}$ and $R^{101e}$, or each of $R^{101d}$, $R^{101e}$ and $R^{101f}$ independently represents an alkylene group of 3 to 10 carbon atoms, or forms a heteroaromatic ring containing the nitrogen atom in the ring thereof In formula (G1c-1), $R^{101d}$, $R^{101e}$, $R^{101f}$ and $R^{101g}$ independently represents a hydrogen atom, a linear, branched or cyclic alkyl group, an alkenyl group, an oxoalkyl group or an oxoalkenyl group of 1 to 12 carbon atoms, an aryl group or an arylalkyl group of 6 to 20 carbon atoms, an aralkyl group of 7 to 12 carbon atoms or an aryloxoalkyl group.

The alkyl group for $R^{101d}$ to $R^{101g}$ includes the same alkyl groups as those described for the aforementioned $R^1$ and $R^2$, although the alkyl group for $R^{101d}$ to $R^{101g}$ preferably has 1 to 10 carbon atoms, and a methyl group, an ethyl group, a propyl group or a butyl group is particularly desirable.

The alkenyl group for $R^{101d}$ to $R^{101g}$ preferably has 2 to 10 carbon atoms, more preferably 2 to 5, and still more preferably 2 to 4. Specific examples thereof include a vinyl group, a propenyl group (an allyl group), a butynyl group, a 1-methylpropenyl group and a 2-methylpropenyl group.

The oxoalkyl group for $R^{101d}$ to $R^{101g}$ preferably has 2 to 10 carbon atoms, and examples thereof include a 2-oxoethyl group, a 2-oxopropyl group, a 2-oxocyclopentyl group and a 2-oxocyclohexyl group.

Examples of the oxoalkenyl group for $R^{101d}$ to $R^{101g}$ include an oxo-4-cyclohexenyl group and a 2-oxo-4-propenyl group.

As examples of the aryl group for $R^{101d}$ to $R^{101g}$, the same aryl groups as those described above in the aromatic hydrocarbon groups for $R^1$ and $R^2$ can be mentioned, and a phenyl group or a naphthyl group is preferable. Examples of the arylalkyl group include aryl groups in which one or more hydrogen atoms have been substituted with an alkyl group (preferably an alkyl group of 1 to 5 carbon atoms).

Examples of the aralkyl group and aryloxoalkyl group for $R^{101d}$ to $R^{101g}$ include a benzyl group, a phenylethyl group, a phenethyl group, a 2-phenyl-2-oxoethyl group, a 2-(1-naphthyl)-2-oxoethyl group and a 2-(2-naphthyl)-2-oxoethyl group.

The hydrogen atoms within the alkyl group, the alkenyl group, the oxoalkyl group, the oxoalkenyl group, the aryl group, the arylalkyl group, the aralkyl group and the aryloxoalkyl group for $R^{101d}$ to $R^{101g}$ may or may not be substituted with a halogen atom such as a fluorine atom, an alkoxy group or a sulfur atom.

When $R^{101d}$ to $R^{101g}$ are constituted of only a combination of alkyl groups and hydrogen atoms, in terms of storage stability and lithography properties, it is preferable that part of the hydrogen atoms of the alkyl group is substituted with a halogen atom such as a fluorine atom, an alkoxy group or a sulfur atom.

Further, $R^{101d}$ and $R^{101e}$, or $R^{101d}$, $R^{101e}$ and $R^{101f}$ may be mutually bonded to form a ring with the nitrogen atom. Examples of the formed ring include a piperidine ring, a hexamethylene imine ring, an azole ring, a pyridine ring, a pyrimidine ring, an azepine ring, a pyrazine ring, a quinoline ring and a benzoquinoline ring.

Further, the ring may contain an oxygen atom in the ring skeleton thereof, and specific examples of preferable rings which contain an oxygen atom include an oxazole ring and an isooxazole ring.

Among these examples, as the cation moiety represented by the aforementioned formula (G1c-1), a nitrogen-containing cation having a pKa of 7 or less is preferable.

In the present invention, pKa refers to an acid dissociation constant which is generally used as a parameter which shows the acid strength of an objective substance. The pKa value of the cation of the component (G1) can be determined by a conventional method. Alternatively, the pKa value can be estimated by calculation using a conventional software such as "ACD/Labs" (trade name; manufactured by Advanced Chemistry Development, Inc.).

The pKa of the component (G1) is preferably 7 or less, and the component (G1) can be appropriately selected depending on the type and pKa of the counteranion, so that is becomes a weak base relative to the counteranion. Specifically, the pKa of the component (G1) is preferably from −2 to 7, more preferably from −1 to 6.5, and still more preferably 0 to 6. When the pKa is no more than the upper limit of the above-mentioned range, the basicity of the cation can be rendered satisfactorily weak, and the component (G1) itself becomes an acidic compound. Further, when the pKa is at least as large as the lower limit of the above-mentioned range, a salt can be more reliably formed with the counteranion, and it becomes possible to appropriately control the acidity of the component (G1), thereby preventing deterioration of the storage stability caused by the component (G1) being excessively acidic.

As a cation which satisfies the above pKa, a cation represented by any one of the following general formulae (G1c-11) to (G1c-13) is particularly desirable.

[Chemical Formula 52]

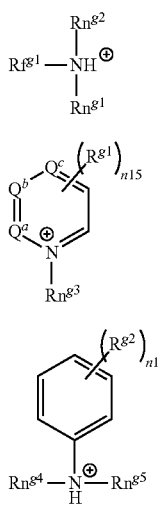

(G1c-11)

(G1c-12)

(G1c-13)

In the formulae, $Rf^{g1}$ represents a fluorinated alkyl group of 1 to 12 carbon atoms; $Rn^{g1}$ and $Rn^{g2}$ each independently represents a hydrogen atom or an alkyl group of 1 to 5 carbon atoms, provided that $Rn^{g1}$ and $R^{g2}$ may be mutually bonded to form a ring; $Q^a$ to $Q^c$ each independently represents a carbon atom or a nitrogen atom; $Rn^{g3}$ represents a hydrogen atom or a methyl group; $Rn^{g4}$ and $Rn^{g5}$ each independently represents an alkyl group of 1 to 5 carbon atoms or an aromatic hydrocarbon group; $R^{g1}$ and $R^{g2}$ each independently represents a hydrocarbon group; and n15 and n16 each independently represents an integer of 0 to 4, provided that, when n15 and n16 is 2 or more, the plurality of $R^{g1}$ and $R^{g2}$ which substitute the hydrogen atoms of the adjacent carbon atom may be bonded to form a ring.

In formula (G1c-11), $Rf^{g1}$ represents a fluorinated alkyl group of 1 to 12 carbon atoms, and is preferably a fluorinated alkyl group of 1 to 5 carbon atoms in which 50% or more of the hydrogen atoms of the alkyl group have been fluorinated.

In formula (G1c-11), each of $Rn^{g1}$ and $Rn^{g2}$ independently represents a hydrogen atom or an alkyl group of 1 to 5 carbon atoms. As the alkyl group, the same alkyl groups of 1 to 5 carbon atoms as those described above in formula (G1c-1) can be mentioned. In addition, when both of $Rn^{g1}$ and $Rn^{g2}$ represent alkyl groups, alkyl groups for $Rn^{g1}$ and $Rn^{g2}$ may be mutually bonded to form a ring together with NH$^+$ in the formula.

In formula (G1c-13), $Rn^{g4}$ and $Rn^{g5}$ each independently represents an alkyl group of 1 to 5 carbon atoms or an aromatic hydrocarbon group, and is the same as defined for the alkyl group of 1 to 5 carbon atoms and aryl groups as those described above in the explanation of $R^{101d}$, $R^{101e}$, $R^{101f}$ and $R^{101g}$ in formula (G1c-1).

In formulae (G1c-12) and (G1c-13), n15 and n16 each independently represents an integer of 0 to 4, preferably an integer of 0 to 2, and more preferably 0.

In formulae (G1c-12) and (G1c-13), $R^{g1}$ and $R^{g2}$ each independently represents a hydrocarbon group, and is preferably an alkyl group or alkenyl group of 1 to 12 carbon atoms. The alkyl group and the alkenyl group are the same as defined for those described in the explanation of formula (G1c-1).

When n15 and n16 are 2 or more, the plurality of $R^{g1}$ and $R^{g2}$ may be the same or different from each other. Further, when n15 and n16 is 2 or more, the plurality of $R^{g1}$ and $R^{g2}$ which substitute the hydrogen atoms of the adjacent carbon atom may be bonded to form a ring. Examples of the formed ring include a benzene ring and a naphthalene ring. That is, the compound represented by formula (G1c-12) or (G1c-13) may be a condensed ring compound formed by condensation of 2 or more rings.

Specific examples of compounds represented by any one of the aforementioned formulae (G1c-11) to (G1c-13) are shown below.

[Chemical Formula 53]

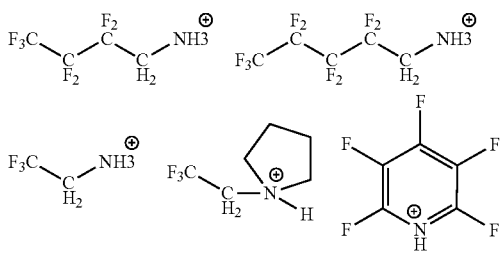

[Chemical Formula 54]

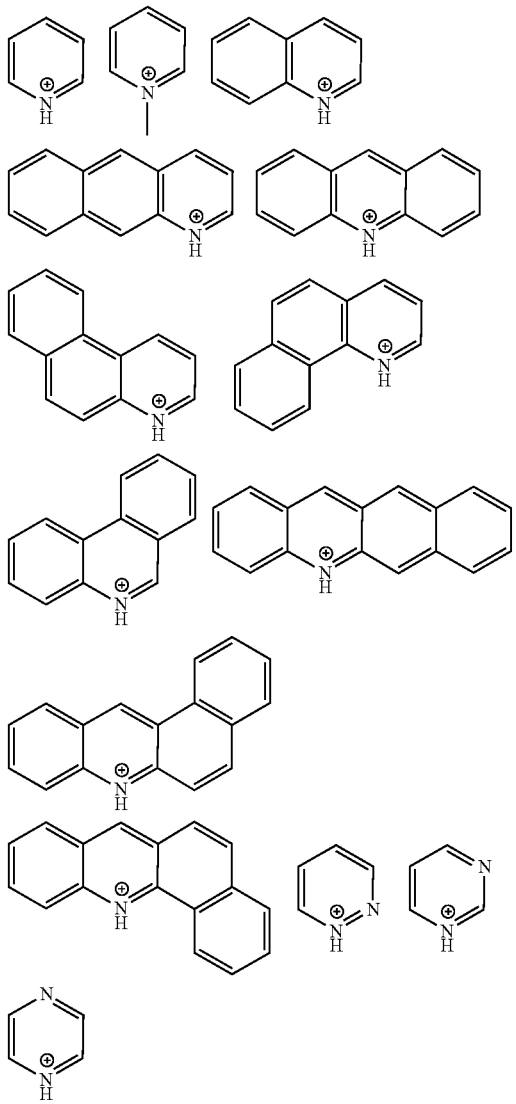

-continued

[Chemical Formula 55]

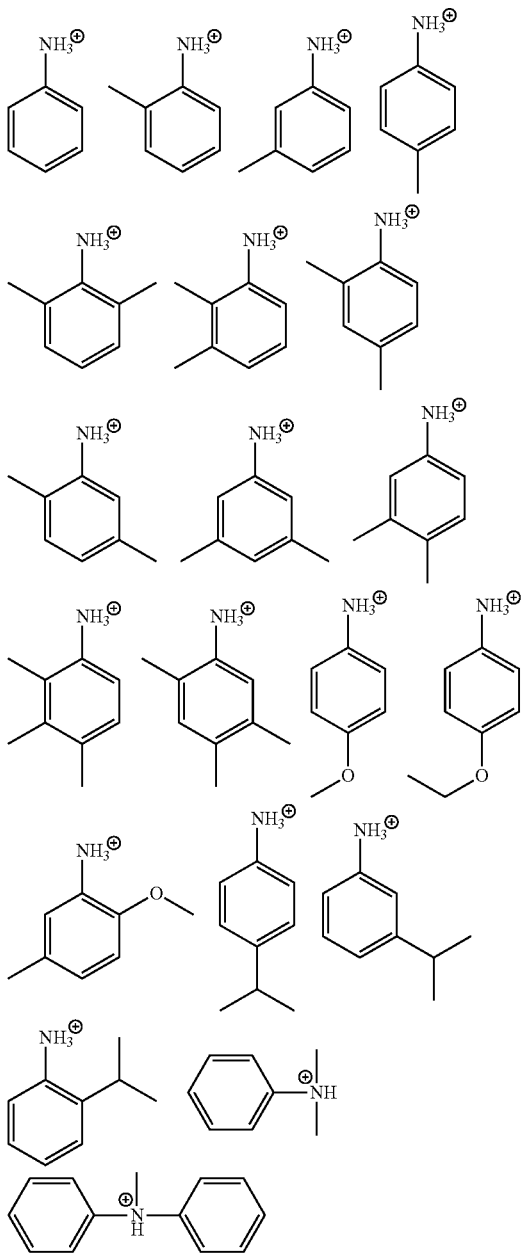

(Anion Moiety of Component (G1))

The anion moiety of the component (G1) is not particularly limited, and any of those generally used the anion moiety of a salt used in a resist composition may be appropriately selected for use.

Among these, as the anion moiety of the component (G1), those which forms a salt with the aforementioned cation moiety for the component (G1) to form a component (G1) that is capable of increasing the solubility of the component (A) in an alkali developing solution is preferable.

The component (G1) "capable of increasing the solubility of the component (A) in an alkali developing solution" refers to a component (G1), for example, when a component (A1) having a structural unit (a1) is used, by conducting baking in the aforementioned step (3), the component (G1) is capable of causing cleavage of at least part of the bond within the structure of the acid decomposable group in the structural unit (a1).

That is, the anion moiety of the component (G1) preferably has a strong acidity. Specifically, the pKa of the anion moiety is more preferably 0 or less, still more preferably −15 to −1, and most preferably −13 to −3. When the pKa of the anion moiety is no more than 0, the acidity of the anion can be rendered satisfactorily strong relative to a cation having a pKa of 7 or less, and the component (G1) itself becomes an acidic compound. On the other hand, when the pKa of the anion moiety is −15 or more, deterioration of the storage stability caused by the component (G1) being excessively acidic can be prevented.

As the anion moiety of the component (G1), an anion moiety having at least one anion group selected from a sulfonate anion, a carboxylate anion, a sulfonylimide anion, a bis(alkylsulfonyl)imide anion and a tris(alkylsulfonyl)methide anion is preferable.

Specific examples include anions represented by general formula: "$R^{4'''}SO_3^-$ ($R^{4'''}$ represents a linear, branched or cyclic alkyl group which may have a substituent, a halogenated alkyl group, an aryl group or an alkenyl group)".

In the aforementioned general formula "$R^{4'''}SO_3^-$", $R^{4'''}$ represents a linear, branched or cyclic alkyl group which may have a substituent, a halogenated alkyl group, an aryl group or an alkenyl group.

The linear or branched alkyl group for the aforementioned $R^{4'''}$ preferably has 1 to 10 carbon atoms, more preferably 1 to 8, and most preferably 1 to 4.

The cyclic alkyl group for the aforementioned $R^{4'''}$ preferably has 4 to 15 carbon atoms, more preferably 4 to 10 carbon atoms, and most preferably 6 to 10 carbon atoms.

When $R^{4'''}$ represents an alkyl group, examples of "$R^{4'''}SO_3^-$" include alkylsulfonates, such as methanesulfonate, n-propanesulfonate, n-butanesulfonate, n-octanesulfonate, 1-adamantane sulfonate, 2-norbornanesulfonate and d-camphor-10-sulfonate.

The halogenated alkyl group for the aforementioned $R^{4'''}$ is an alkyl group in which part or all of the hydrogen atoms thereof have been substituted with a halogen atom. The alkyl group preferably has 1 to 5 carbon atoms, and is preferably a linear or branched alkyl group, and more preferably a methyl group, an ethyl group, a propyl group, an isopropyl group, an n-butyl group, a tert-butyl group, a tert-pentyl group or an isopentyl group. Examples of the halogen atom which substitutes the hydrogen atoms include a fluorine atom, a chlorine atom, an iodine atom and a bromine atom.

In the halogenated alkyl group, it is preferable that 50 to 100% of all hydrogen atoms within the alkyl group (prior to halogenation) have been substituted with a halogen atom, and it is preferable that all hydrogen atoms have been substituted with a halogen atom.

As the halogenated alkyl group, a fluorinated alkyl group is preferable. The fluorinated alkyl group preferably has 1 to 10 carbon atoms, more preferably 1 to 8 carbon atoms, and most preferably 1 to 4 carbon atoms.

Further, the fluorination ratio of the fluorinated alkyl group is preferably from 10 to 100%, more preferably from 50 to 100%, and it is most preferable that all hydrogen atoms are substituted with fluorine atoms because the acid strength increases.

Specific examples of such fluorinated alkyl groups include a trifluoromethyl group, a heptafluoro-n-propyl group and a nonafluoro-n-butyl group.

The aryl group for $R^{4'''}$ is preferably an aryl group of 6 to 20 carbon atoms.

The alkenyl group for $R^{4'''}$ is preferably an alkenyl group of 2 to 10 carbon atoms.

With respect to $R^{4'''}$, the expression "may have a substituent" means that part of or all of the hydrogen atoms within the aforementioned linear, branched or cyclic alkyl group, halogenated alkyl group, aryl group or alkenyl group may be substituted with substituents (atoms other than hydrogen atoms, or groups).

$R^{4'''}$ may have one substituent, or two or more substituents.

Examples of the substituent include a halogen atom, a hetero atom, an alkyl group, and a group represented by the formula $X^3$-Q'- (in the formula, Q' represents a divalent linking group containing an oxygen atom; and $X^3$ represents a hydrocarbon group of 3 to 30 carbon atoms which may have a substituent).

Examples of halogen atoms and alkyl groups include the same halogen atoms and alkyl groups as those described above with respect to the halogenated alkyl group for $R^{4'''}$.

Examples of hetero atoms include an oxygen atom, a nitrogen atom, and a sulfur atom.

In the group represented by formula $X^3$-Q'-, Q' represents a divalent linking group containing an oxygen atom.

Q' may contain an atom other than an oxygen atom. Examples of atoms other than oxygen include a carbon atom, a hydrogen atom, a sulfur atom and a nitrogen atom.

Examples of divalent linking groups containing an oxygen atom include non-hydrocarbon, oxygen atom-containing linking groups such as an oxygen atom (an ether bond; —O—), an ester bond (—C(=O)—O—), an amido bond (—C(=O)—NH—), a carbonyl bond (—C(=O)—) and a carbonate bond (—O—C(=O)—O—); and combinations of the aforementioned non-hydrocarbon, hetero atom-containing linking groups with an alkylene group. Furthermore, the combinations may have a sulfonyl group (—SO$_2$—) bonded thereto.

Specific examples of such combinations include —R$^{91}$—O—, —R$^{92}$—O—C(=O)—, —C(=O)—O—R$^{93}$—O—C(=O)—, —SO$_2$—O—R$^{94}$—O—C(=O)—, and —R$^{95}$—SO$_2$—O—R$^{94}$—O—C(=O)— (in the formula, R$^{91}$ to R$^{95}$ independently represents an alkylene group).

The alkylene group for R$^{91}$ to R$^{95}$ is preferably a linear or branched alkylene group, and preferably has 1 to 12 carbon atoms, more preferably 1 to 5, and most preferably 1 to 3.

Specific examples of alkylene groups include a methylene group [—CH$_2$—]; alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—; an ethylene group [—CH$_2$CH$_2$—]; alkylethylene groups such as —CH(CH$_3$)CH$_2$—, —CH(CH$_3$)CH(CH$_3$)—, —C(CH$_3$)$_2$CH$_2$— and —CH(CH$_2$CH$_3$)CH$_2$—; a trimethylene group (n-propylene group) [—CH$_2$CH$_2$CH$_2$—]; alkyltrimethylene groups such as —CH(CH$_3$)CH$_2$CH$_2$— and —CH$_2$CH(CH$_3$)CH$_2$—; a tetramethylene group [—CH$_2$CH$_2$CH$_2$CH$_2$—]; alkyltetramethylene groups such as —CH(CH$_3$)CH$_2$CH$_2$CH$_2$— and —CH$_2$CH(CH$_3$)CH$_2$CH$_2$—; and a pentamethylene group [—CH$_2$CH$_2$CH$_2$CH$_2$CH$_2$—].

As Q', a divalent linking group containing an ester bond or an ether bond is preferable, and —R$^{91}$—O—, —R$^{92}$—O—C(=O)— or —C(=O)—O—R$^{93}$—O—C(=O)— is more preferable.

In the group represented by the formula $X^3$-Q'-, as the hydrocarbon group for $X^3$, the same hydrocarbon groups of 1 to 30 carbon atoms as those described for R$^a$ in the aforementioned formula (C3).

Among these, as $X^3$, a linear alkyl group which may have a substituent, or a cyclic group which may have a substituent is preferable. The cyclic group may be either an aromatic hydrocarbon group which may have a substituent, or an aliphatic cyclic group which may have a substituent, and an aliphatic cyclic group which may have a substituent is preferable.

As the aromatic hydrocarbon group, a naphthyl group which may have a substituent, or a phenyl group which may have a substituent is preferable.

As the aliphatic cyclic group which may have a substituent, an aliphatic polycyclic group which may have a substituent is preferable. As the aliphatic polycyclic group, the aforementioned group in which one or more hydrogen atoms have been removed from a polycycloalkane, or any one of groups represented by the aforementioned formulae (L2) to (L6), (S3) and (S4) are preferable.

Among these examples, as the aforementioned $R^{4'''}$, a halogenated alkyl group or a group having $X^3$-Q'- as a substituent is preferable.

When the $R^{4'''}$ group has $X^3$-Q'- as a substituent, as $R^{4'''}$, a group represented by the formula: $X^3$-Q'-$Y^3$— (in the formula, Q' and $X^3$ are the same as defined above, and $Y^3$ represents an alkylene group of 1 to 4 carbon atoms which may have a substituent or a fluorinated alkylene group of 1 to 4 carbon atoms which may have a substituent is preferable.

In the group represented by the formula $X^3$-Q'-$Y^3$—, as the alkylene group for $Y^3$, the same alkylene group as those described above for Q' in which the number of carbon atoms is 1 to 4 can be used.

As the fluorinated alkylene group, the aforementioned alkylene group in which part or all of the hydrogen atoms has been substituted with fluorine atoms can be used.

Specific examples of $Y^3$ include —CF$_2$—, —CF$_2$CF$_2$—, —CF$_2$CF$_2$CF$_2$—, —CF(CF$_3$)CF$_2$—, —CF(CF$_2$CF$_3$)—, —C(CF$_3$)$_2$—, —CF$_2$CF$_2$CF$_2$CF$_2$—, —CF(CF$_3$)CF$_2$CF$_2$—, —CF$_2$CF(CF$_3$)CF$_2$—, —CF(CF$_3$)CF(CF$_3$)—, —C(CF$_3$)$_2$CF$_2$—, —CF(CF$_2$CF$_3$)CF$_2$—, —CF(CF$_2$CF$_2$CF$_3$)—, —C(CF$_3$)(CF$_2$CF$_3$)—; —CHF—, —CH$_2$CF$_2$—, —CH$_2$CH$_2$CF$_2$—, —CH$_2$CF$_2$CF$_2$—, —CH(CF$_3$)CH$_2$—, —CH(CF$_2$CF$_3$)—, —C(CH$_3$)(CF$_3$)—, —CH$_2$CH$_2$CH$_2$CF$_2$—, —CH$_2$CH$_2$CF$_2$CF$_2$—, —CH(CF$_3$)CH$_2$CH$_2$—, —CH$_2$CH(CF$_3$)CH$_2$—, —CH(CF$_3$)CH(CF$_3$)—, —C(CF$_3$)$_2$CH$_2$—; —CH$_2$—, —CH$_2$CH$_2$—, —CH$_2$CH$_2$CH$_2$—, —CH(CH$_3$)CH$_2$—, —CH(CH$_2$CH$_3$)—, —C(CH$_3$)$_2$—, —CH$_2$CH$_2$CH$_2$CH$_2$—, —CH(CH$_3$)—, —CH$_2$CH(CH$_3$)CH$_2$—, —CH(CH$_3$)CH(CH$_3$)—, —C(CH$_3$)$_2$CH$_2$—, —CH(CH$_2$CH$_3$)CH$_2$—, —CH(CH$_2$CH$_2$CH$_3$)—, and —C(CH$_3$)(CH$_2$CH$_3$)—.

$Y^3$ is preferably a fluorinated alkylene group, and most preferably a fluorinated alkylene group in which the carbon atom bonded to the adjacent sulfur atom is fluorinated. Examples of such fluorinated alkylene groups include —CF$_2$—, —CF$_2$CF$_2$—, —CF$_2$CF$_2$CF$_2$—, —CF(CF$_3$)CF$_2$—, —CF$_2$CF$_2$CF$_2$CF$_2$—, —CF(CF$_3$)CF$_2$CF$_2$—, —CF$_2$CF(CF$_3$)CF$_2$—, —CF(CF$_3$)CF(CF$_3$)—, —C(CF$_3$)$_2$CF$_2$—, —CF(CF$_2$CF$_3$)CF$_2$—; —CH$_2$CF$_2$—, —CH$_2$CH$_2$CF$_2$—, —CH$_2$CF$_2$CF$_2$—; —CH$_2$CH$_2$CH$_2$CF$_2$—, —CH$_2$CH$_2$CF$_2$CF$_2$—, and —CH$_2$CF$_2$CF$_2$CF$_2$—.

Of these, —CF$_2$—, —CF$_2$CF$_2$—, —CF$_2$CF$_2$CF$_2$— or CH$_2$CF$_2$CF$_2$— is preferable, —CF$_2$—, —CF$_2$CF$_2$— or —CF$_2$CF$_2$CF$_2$— is more preferable, and —CF$_2$— is particularly desirable.

The alkylene group or fluorinated alkylene group may have a substituent. The alkylene group or fluorinated alkylene group "has a substituent" means that part or all of the hydrogen atoms or fluorine atoms in the alkylene group or fluorinated alkylene group has been substituted with groups other than hydrogen atoms and fluorine atoms.

Examples of substituents which the alkylene group or fluorinated alkylene group may have include an alkyl group of 1 to 4 carbon atoms, an alkoxy group of 1 to 4 carbon atoms, and a hydroxyl group.

Specific examples of groups represented by formula $R^{4\prime\prime}SO_3^-$ in which $R^{4\prime\prime}$ represents $X^3\text{-}Q'\text{-}Y^3-$ include anions represented by the following formulae (b1) to (b9).

[Chemical Formula 56]

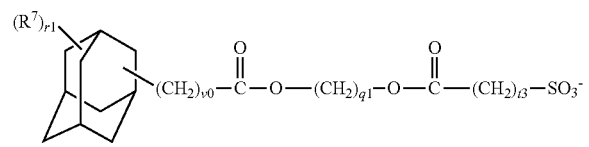
(b1)

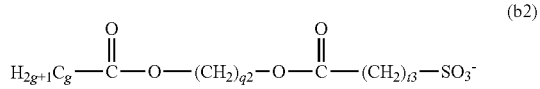
(b2)

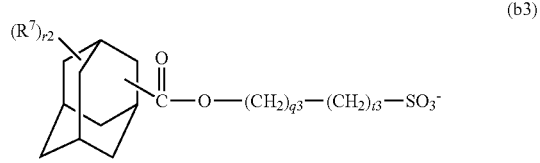
(b3)

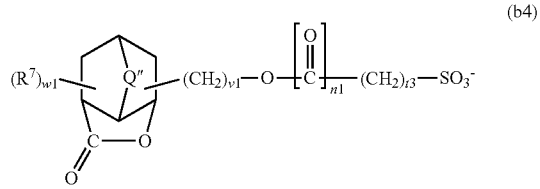
(b4)

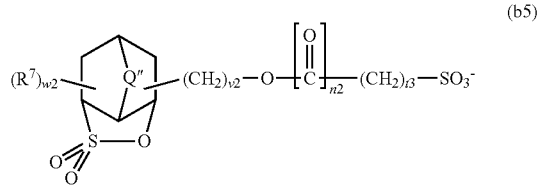
(b5)

[Chemical Formula 57]

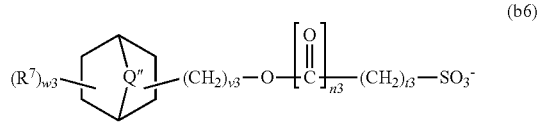
(b6)

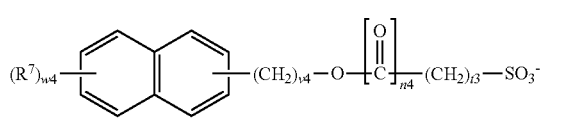
(b7)

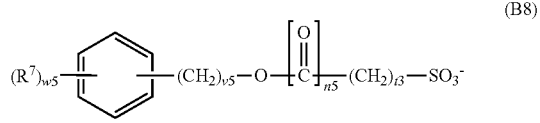
(B8)

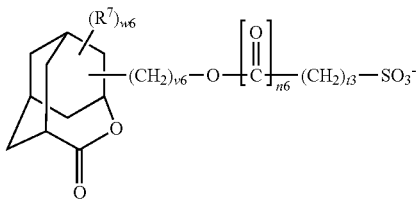
(b9)

In the formulae, q1 and q2 each independently represents an integer of 1 to 5; q3 represents an integer of 1 to 12; t3 represents an integer of 1 to 3; r1 and r2 each independently represents an integer of 0 to 3; g represents an integer of 1 to 20; $R^7$ represents a substituent; n1 to n6 each independently represents 0 or 1; v0 to v6 each independently represents an integer of 0 to 3; w1 to w6 each independently represents an integer of 0 to 3; and Q" is the same as defined above.

As the substituent for $R^7$, the same groups as those which the aforementioned aliphatic hydrocarbon group or aromatic hydrocarbon group for $R^a$ in the aforementioned formula (C3) may have as a substituent can be used.

If there are two or more of the $R^7$ group, as indicated by the values r1, r2, and w1 to w6, then the two or more of the $R^7$ groups may be the same or different from each other.

Further, as preferable examples of the anion moiety of the component (G1), an anion represented by general formula (G1a-3) shown below and an anion moiety represented by general formula (G1a-4) shown below can also be mentioned.

[Chemical Formula 58]

(G1a-3)

(G1a-4)

In the formulae, X" represents an alkylene group of 2 to 6 carbon atoms in which at least one hydrogen atom has been substituted with a fluorine atom; and each of Y" and Z" independently represents an alkyl group of 1 to 10 carbon atoms in which at least one hydrogen atom has been substituted with a fluorine atom.

In formula (G1a-3), X" represents a linear or branched alkylene group in which at least one hydrogen atom has been substituted with a fluorine atom, and the alkylene group preferably has 2 to 6 carbon atoms, more preferably 3 to 5 carbon atoms, and most preferably 3 carbon atoms.

In formula (G1a-4), each of Y" and Z" independently represents a linear or branched alkyl group in which at least one hydrogen atom has been substituted with a fluorine atom, and the alkyl group preferably has 1 to 10 carbon atoms, more preferably 1 to 7 carbon atoms, and most preferably 1 to 3 carbon atoms.

The smaller the number of carbon atoms of the alkylene group for X" or those of the alkyl group for Y" and Z" within the above-mentioned range of the number of carbon atoms, the more the solubility in a resist solvent is improved.

Further, in the alkylene group for X" or the alkyl group for Y" and Z", it is preferable that the number of hydrogen atoms substituted with fluorine atoms is as large as possible because the acid strength increases and the transparency to high energy radiation of 200 nm or less or electron beam is improved.

The amount of fluorine atoms within the alkylene group or alkyl group, i.e., fluorination ratio, is preferably from 70 to 100%, more preferably from 90 to 100%, and it is particularly desirable that the alkylene group or alkyl group be a perfluoroalkylene or perfluoroalkyl group in which all hydrogen atoms are substituted with fluorine atoms.

As the anion moiety of the component (G1), an anion represented by the aforementioned formula "R$^{4''}$SO$_3^-$" (in particular, any one of anions represented by the aforementioned formulae (b1) to (b9) which is a group in which R$^{4''}$ is "X$^3$-Q'-Y$^3$-") or an anion represented by the aforementioned formula (G1a-3) is most preferable.

As the component (G1), one type of compound may be used alone, or two or more types of compounds may be used in combination.

In the resist composition, the amount of the component (G1) within the component (G) is preferably 40% by weight or more, still more preferably 70% by weight or more, and may be even 100% by weight. When the amount of the component (G1) is at least as large as the lower limit of the above-mentioned range, the storage stability and the lithography properties become excellent.

Further, in the case where the component (G) includes the component (G1), the amount of the component (G1) within the resist composition, relative to 100 parts by weight of the component (A) is preferably from 0.5 to 30 parts by weight, more preferably from 1 to 20 parts by weight, and still more preferably from 2 to 15 parts by weight. When the amount of the component (G1) is within the above-mentioned range, the lithography properties become excellent.

[Component (G1C)]

In the present invention, the component (G1C) is an ionic compound (salt compound) composed of a nitrogen-containing cation having a pKa value of 7 or less and a counteranion. The component (G1C) contains the cation having a pKa value of 7 or less which has a relatively low pKa value, that is, a cation having low basicity. Therefore, even if forming a salt, the component (G1C) exhibits acidity by itself, and acts as a proton donor.

Hereafter, each of the cation moiety and the anion moiety in the component (G1C) will be described.

(Cation Moiety of Component (G1C))

The cation moiety in the component (G1C) is composed of a nitrogen-containing cation having a pKa value of 7 or less. In the present invention, pKa is the above-described acid dissociation constant.

The pKa of the component (G1C) according to the present invention is not particularly limited as long as it is 7 or less, and the component (G1C) can be appropriately selected depending on the type and pKa of the counteranion, so that is becomes a weak base relative to the counteranion, although the pKa of the cation of the component (G1C) is preferably from −2 to 7.0, more preferably from −1 to 6.5, and still more preferably 0 to 6.0.

The structure of the cation moiety in the component (G1C) is not particularly limited as long as it satisfies the above-mentioned pKa value and contains a nitrogen atom. Examples thereof include the cation represented by following general formula (G1c-1C).

[Chemical Formula 59]

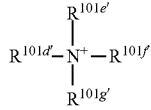

(G1c-1C)

In the formula, R$^{101d'}$, R$^{101e'}$, R$^{101f'}$, and R$^{101g'}$ each independently represents a hydrogen atom, a linear, branched or cyclic alkyl group, an alkenyl group, an oxoalkyl group or an oxoalkenyl group of 1 to 12 carbon atoms, an aryl group of 6 to 20 carbon atoms, an aralkyl group of 7 to 12 carbon atoms or an aryloxoalkyl group, and part or all of the hydrogen atoms of these groups may be substituted with a fluorine atom or an alkoxy group. R$^{101d'}$ and R$^{101c'}$, or R$^{101d'}$, R$^{101c'}$ and R$^{101f'}$ may be mutually bonded with the nitrogen atom to form a ring, provided that, when a ring is formed, each of R$^{101d'}$ and R$^{101e'}$, or each of R$^{101d'}$, R$^{101e'}$, and R$^{101f'}$ independently represents an alkylene group of 3 to 10 carbon atoms, or forms a heteroaromatic ring containing the nitrogen atom in the ring thereof. When R$^{101d'}$, R$^{101e'}$, R$^{101f'}$, and R$^{101f'}$ are composed of only an alkyl group and/or a hydrogen atom, at least one atom of the hydrogen atoms and the carbon atoms is substituted with a halogen atom such as a fluorine atom, an alkoxy group or a sulfur atom.

In formula (G1c-1C), R$^{101d'}$, R$^{101e'}$, R$^{101f'}$ and R$^{101g'}$ independently represents a hydrogen atom, a linear, branched or cyclic alkyl group, an alkenyl group, an oxoalkyl group or an oxoalkenyl group of 1 to 12 carbon atoms, an aryl group or an arylalkyl group of 6 to 20 carbon atoms, an aralkyl group of 7 to 12 carbon atoms or an aryl oxoalkyl group.

The alkyl group for R$^{101d'}$ to R$^{101g'}$ includes the same alkyl groups as those described for the aforementioned R$^1$ and R$^2$, although the alkyl group for R$^{101d}$ to R$^{101g}$ preferably has 1 to 10 carbon atoms, and a methyl group, an ethyl group, a propyl group or a butyl group is particularly desirable.

The alkenyl group for R$^{101d'}$ to R$^{101g'}$ preferably has 2 to 10 carbon atoms, more preferably 2 to 5, and still more preferably 2 to 4. Specific examples thereof include a vinyl group, a propenyl group (an allyl group), a butynyl group, a 1-methylpropenyl group and a 2-methylpropenyl group.

The oxoalkyl group for R$^{101d'}$ to R$^{101g'}$ preferably has 2 to 10 carbon atoms, and examples thereof include a 2-oxoethyl group, a 2-oxopropyl group, a 2-oxocyclopentyl group and a 2-oxocyclohexyl group.

Examples of the oxoalkenyl group for R$^{101d'}$ to R$^{101g'}$ include an oxo-4-cyclohexenyl group and a 2-oxo-4-propenyl group.

As examples of the aryl group for R$^{101d'}$ to R$^{101g'}$, the same aryl groups as those described above in the aromatic hydrocarbon groups for R$^1$ and R$^2$ can be mentioned, and a phenyl group or a naphthyl group is preferable.

Examples of the aralkyl group and aryloxoalkyl group for R$^{101d'}$ to R$^{101g'}$ include a benzyl group, a phenylethyl group, a phenethyl group; a 2-phenyl-2-oxoethyl group, a 2-(1-naphthyl)-2-oxoethyl group and a 2-(2-naphthyl)-2-oxoethyl group.

When R$^{101d'}$ to R$^{101g'}$ are composed of only an alkyl group and/or a hydrogen atom, at least one atom of the hydrogen atoms and the carbon atoms is substituted with a halogen atom such as a fluorine atom, an alkoxy group or a sulfur atom. It is preferable that a hydrogen atom in the alkyl group is substituted with a fluorine atom.

Further, R$^{101d'}$ and R$^{101e'}$, or R$^{101d'}$, R$^{101e'}$ and R$^{101f'}$ may be mutually bonded to form a ring with the nitrogen atom.

Examples of the formed ring include a pyrrolidine ring, a piperidine ring, a hexamethylene imine ring, an azole ring, a pyridine ring, a pyrimidine ring, an azepine ring, a pyrazine ring, a quinoline ring and a benzoquinoline ring.

Further, the ring may contain an oxygen atom in the ring skeleton thereof, and examples of preferable rings which contain an oxygen atom include an oxazole ring and an isooxazole ring.

In particular, the cation moiety represented by the formula (G1c-1C) is preferably cation moieties represented by the above-described general formulae (G1c-11) to (G1c-13).

(Anion Moiety of Component (G1C))

As examples of the anion moiety of the component (G1C), the same as those described for the anion moiety of the aforementioned component (G1) can be given.

As the component (G1C), one type of compound may be used alone, or two or more types of compounds may be used in combination.

Further, in the resist composition of the present invention, the amount of the component (G1C) within the component (G) is preferably 40% by weight or more, still more preferably 70% by weight or more, and may be even 100% by weight. When the amount of the component (G1C) is at least as large as the lower limit of the above-mentioned range, the storage stability and the lithography properties become excellent.

Furthermore, in the resist composition, the amount of the component (G1C), relative to 100 parts by weight of the component (A) is preferably from 0.5 to 30 parts by weight, more preferably from 1 to 20 parts by weight, and still more preferably from 2 to 15 parts by weight. When the amount of the component (G1C) is within the above-mentioned range, the storage stability and the lithography properties become excellent.

In addition of the aforementioned component (G1C), the resist composition of the present invention may also include an acidic compound component (G2) other than the component (G1C) as the component (G), as long as the effects of the present invention are not impaired.

[Component (G2)]

The component (G2) does not fall under the definition of the component (G1) and the component (G1C), and exhibits acidity by itself, and acts as a proton donor. As the component (G2), a non-ionic acid which does not form a salt can be mentioned.

The component (G2) is not particularly limited, as long as it has an acid strength capable of increasing the solubility of the base component (A) in the alkali developing solution. In terms of the reactivity with the acid dissociable group of the base component and ease in increasing the solubility of the resist film in an alkali developing solution, the component (G2) preferably has a strong acidity. Specifically, the pKa of the component (G2) is more preferably 0 or less, still more preferably −15 to −1, and most preferably −13 to −3. When the pKa of the component (G2) is no more than 0, the component (G2) can satisfactorily have a strong acidity in increasing the solubility of the component (A) in an alkali developing solution. On the other hand, when the pKa of the component (G2) is −15 or more, deterioration of the storage stability caused by the component (G2) being excessively acidic can be prevented.

As the component (G2), a carboxylic acid, an imine acid or a sulfonic acid compound is preferable, and more preferably at least one acid selected from a sulfonylimide, a bis(alkylsulfonyl)imide, a tris(alkylsulfonyl)methide and a compound having a fluorine atom within these compounds. Among these acids, the compound having a fluorine atom within these compounds as a substituent is particularly desirable.

In particular, a compound represented by any one of general formulae (G2-1) to (G2-3) shown below (preferably a compound represented by general formula (G2-2)), a compound in which an anion represented by any one of general formulae (b1) to (b9) described above has "—SO$_3$⁻" replaced by "—SO$_3$H", a compound in which an anion represented by general formula (G1a-3) or (G1a-4) described above has "N⁻" replaced by "NH", and camphorsulfonic acid are preferable. Other examples include acid components such as a fluorinated alkyl group-containing carboxylic acid, a higher fatty acid, a higher alkylsulfonic acid, and a higher alkylarylsulfonic acid.

[Chemical Formula 60]

(G2-1)

(G2-2)

(G2-3)

In formula (G2-1), w' represents an integer of 1 to 5. In formula (G2-2), $R^f$ represents a hydrogen atom or an alkyl group (provided that part or all of the hydrogen atoms within the alkyl group may be substituted with a fluorine atom, a hydroxy group, an alkoxy group, a carboxy group or an amino group); and y' represents 2 or 3. In formula (G2-3), $R^f$ is the same as defined above; and z' represents 2 or 3.

Examples of compounds represented by the aforementioned formula (G2-1) include $(C_4F_9SO_2)_2NH$ and $(C_3F_7SO_2)_2NH$.

In the aforementioned formula (G2-2), the alkyl group for $R^f$ preferably has 1 or 2 carbon atoms, and more preferably 1.

Examples of the alkoxy group which may substitute the hydrogen atom(s) within the alkyl group include a methoxy group and an ethoxy group.

An example of a compound represented by the aforementioned formula (G2-2) includes a compound represented by a chemical formula (G2-21) shown below.

[Chemical Formula 61]

(G2-21)

In the aforementioned formula (G2-3), $R^f$ is the same as defined for $R^f$ in formula (G2-2).

An example of a compound represented by the aforementioned formula (G2-3) includes a compound represented by a chemical formula (G2-31) shown below.

[Chemical Formula 62]

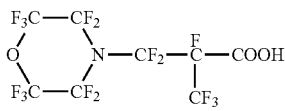

(G2-31)

As the fluorinated alkyl group-containing carboxylic group, for example, $C_{10}F_{21}COOH$ can be mentioned.

Examples of the higher fatty acid include higher fatty acids having an alkyl group of 8 to 20 carbon atoms, and specific examples thereof include dodecanoic acid, tetradecanoic acid, and stearic acid.

The alkyl group of 8 to 20 carbon atoms may be either linear or branched. Further, the alkyl group of 8 to 20 carbon atoms may have a phenylene group, an oxygen atom or the like interposed within the chain thereof. Furthermore, the alkyl group of 8 to 20 carbon atoms may have part of the hydrogen atoms substituted with a hydroxy group or a carboxy group.

Examples of the higher alkylsulfonic acid include sulfonic acids having an alkyl group preferably with an average of 9 to 21 carbon atoms, more preferably 12 to 18 carbon atoms, and specific examples thereof include decanesulfonic acid, dodecanesulfonic acid, tetradecanesulfonic acid, tetradecanesulfonic acid, pentadecanesulfonic acid and octadecanesulfonic acid.

Examples of the higher alkylarylsulfonic acid include alkylbenzenesulfonic acids and alkylnaphthalenesulfonic acids having an alkyl group preferably with an average of 6 to 18 carbon atoms, more preferably 9 to 15 carbon atoms, and specific examples thereof include dodecylbenzenesulfonic acid and decylnaphthalenesulfonic acid.

Examples of the acid components include alkyldiphenyletherdisulfonic acids preferably with an average of 6 to 18 carbon atoms, more preferably 9 to 15, and preferable examples thereof include dodecyldiphenyletherdisulfonic acid.

Examples of the component (G2) other than those described above include organic carboxylic acid, a phosphorus oxo acid or derivative thereof.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid and phosphinic acid. Among these, phosphonic acid is particularly desirable.

Examples of oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonate esters such as dimethyl phosphonate, di-n-butyl phosphonate, phenyl phosphonate, diphenyl phosphonate and dibenzyl phosphonate.

Examples of phosphinic acid derivatives include phosphinate esters and phenylphosphinic acid.

When the component (G) includes the component (G2), as the component (G2), one type may be used, or two or more types may be used in combination. Among these, as the component (G2), one or more compounds selected from the group consisting of a sulfonylimide, a bis(alkylsulfonyl)imide, a tris(alkylsulfonyl)methide, an alkylsulfonic acid and a compound having a fluorine atom within these compounds are preferably used, and one or more compounds having a fluorine atom within these compounds are particularly preferably used.

In the present invention, when the component (G) includes the component (G2), the pKa value of the component (G2) is preferably equal to or more than that of the anion moiety of the component (G1C). That is, the pKa value of the component (G2) is more preferably 0 or less, still more preferably −15 to −1, and most preferably −13 to −3.

When the pKa value of the component (G2) is greater than or equal to that of the anion moiety of the component (G1C) (i.e., when the anion moiety of the component (G1C) has most strong acidity), cations of the component (G1C) and the component (G2) can be prevented from being exchanged.

When the component (G) includes the component (G2), the amount of the component (G2) within the component (G) is preferably 50% by weight or less, more preferably 20% by weight or less.

In addition, when the resist composition includes the component (G2), the amount of the component (G2) in the resist composition, relative to 100 parts by weight of the component (A) is preferably from 0.5 to 25 parts by weight, more preferably from 1 to 20 parts by weight, still more preferably from 0.5 to 20 parts by weight, particularly preferably from 1 to 15 parts by weight, and most preferably from 3 to 15 parts by weight or from 1 to 10 parts by weight. When the amount of the component (G2) is at least as large as the lower limit of the above-mentioned range, the solubility of the resist film in an alkali developing solution is likely to be increased. On the other hand, when the amount of the component (G2) is no more than the upper limit of the above-mentioned range, an excellent sensitivity can be obtained.

In the present invention, the component (G) may include either the component (G1) or the component (G2), but the component (G) consisting of a single component is preferably used.

Acid Generator Component; Component (G)

In the present invention, as the acid supply component (Z), an acid generator component which is decomposed by heat or light to act as an acid (hereafter, referred to as "component (B)") can be used.

The component (B) is different from the compound (G), and generates an acid upon exposure in the step (2) or by baking (PEB) in the step (3). It is not necessary that the component (B) itself exhibits acidity.

When a prebake (PAB) is conducted after the step (1) and before the exposure in the step (2), the component (B) may generate an acid by the prebake. The prebake which is an arbitrary step will be described later.

As the component (B), there is no particular limitation, and any of the known acid generators for use in conventional chemically amplified resist compositions can be used.

As the acid generators, a thermal-acid generator which generates an acid by heating, and a photo-acid generator which generates an acid upon exposure can be mentioned. Examples of these acid generators are numerous, and include onium salt acid generators such as iodonium salts and sulfonium salts; oximesulfonate acid generators; diazomethane-based acid generators such as bisalkyl or bisaryl sulfonyl diazomethanes and poly(bis-sulfonyl)diazomethanes; nitrobenzylsulfonate acid generators; iminosulfonate acid generators; and disulfone acid generators.

These acid generator components are known as photo-acid generators (PAG), but also have a function as thermal-acid generators (TAG). Therefore, as the acid generator component capable of using in the present invention, any acid generator can be appropriately selected from those which have been conventionally known as acid generators for use in a chemically amplified resist.

The "thermal-acid generator component which generates acid by heating" is a component which generates an acid by heating at a temperature preferably lower than a PEB temperature in the step (3), specifically, at a temperature of 200° C. or lower, preferably at a temperature of 50 to 150° C. By virtue of using the thermal-acid generator which generates an acid at a heating temperature equal to or lower than the PEB temperature, the operation becomes easy. Moreover, it becomes easy to control the generation of acid from the thermal-acid generator and the deprotection reaction of the base component at different temperatures. By virtue of using a thermal-acid generator which preferably generates acid at 50° C. or higher, the stability thereof in the resist composition becomes excellent.

As the onium salt acid generators of the component (B), an anion moiety preferably has at least one anion group selected from the group consisting of a sulfonate anion, a carboxylate anion, a sulfonylimide anion, a bis(alkylsulfonyl)imide anion and a tris(alkylsulfonyl)methide anion is preferable. Further, specific examples of the anion moiety include the same anion moiety as those described above for the aforementioned component (G1).

In addition, as the cation moiety, the cation moiety represented by general formula (b-c1) or (b-c2) shown below can be mentioned.

[Chemical Formula 63]

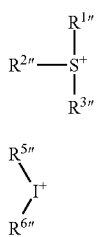

(b-c1)

(b-c2)

In the formulas, each of $R^{1\prime\prime}$ to $R^{3\prime\prime}$ and $R^{5\prime\prime}$ to $R^{6\prime\prime}$ independently represents an aryl group which may have a substituent, an alkyl group or an alkenyl group, wherein two of $R^{1\prime\prime}$ to $R^{3\prime\prime}$ in formula (b-c1) may be bonded to each other to form a ring with the sulfur atom in the formula.

In formula (b-c1), each of $R^{1\prime\prime}$ to $R^{3\prime\prime}$ independently represents an aryl group which may have a substituent, an alkyl group or an alkenyl group. Two of $R^{1\prime\prime}$ to $R^{3\prime\prime}$ may be mutually bonded to form a ring with the sulfur atom in the formula.

Examples of the aryl groups for $R^{1\prime\prime}$ to $R^{3\prime\prime}$ include an unsubstituted aryl group having 6 to 20 carbon atoms; and a substituted aryl group in which a part or all of the hydrogen atoms of the aforementioned unsubstituted aryl group has been substituted with alkyl groups, alkoxy groups, halogen atoms, hydroxyl groups, oxo groups (=O), aryl groups, alkoxyalkyloxy groups, alkoxycarbonylalkyloxy groups, —C(=O)—O—$R^{6\prime}$, —O—C(=O)—$R^{7\prime}$, —O—$R^{8\prime}$ or the like. Each of $R^{6\prime}$, $R^{7\prime}$ and $R^{8\prime}$ represents a linear or branched saturated hydrocarbon group of 1 to 25 carbon atoms, a cyclic saturated hydrocarbon group of 3 to 20 carbon atoms, or a linear or branched, aliphatic unsaturated hydrocarbon group of 2 to 5 carbon atoms.

The unsubstituted aryl group for $R^{1\prime\prime}$ to $R^{3\prime\prime}$ is preferably an aryl group having 6 to 10 carbon atoms because it can be synthesized at a low cost. Specific examples thereof include a phenyl group and a naphthyl group.

The alkyl group as the substituent for the substituted aryl group represented by $R^{1\prime\prime}$ to $R^{3\prime\prime}$ is preferably an alkyl group having 1 to 5 carbon atoms, and a methyl group, an ethyl group, a propyl group, an n-butyl group, or a tert-butyl group is particularly desirable.

The alkoxy group as the substituent for the substituted aryl group is preferably an alkoxy group having 1 to 5 carbon atoms, and a methoxy group, an ethoxy group, an n-propoxy group, an iso-propoxy group, an n-butoxy group or a tert-butoxy group is particularly desirable.

The halogen atom as the substituent for the substituted aryl group is preferably a fluorine atom.

As the aryl group as the substituent for the substituted aryl group, the same aryl groups as those described above for $R^{1\prime\prime}$ to $R^{3\prime\prime}$ can be mentioned.

Examples of alkoxyalkyloxy groups as the substituent for the substituted aryl group include groups represented by a general formula shown below:

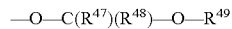

In the formula, $R^{47}$ and $R^{48}$ each independently represents a hydrogen atom or a linear or branched alkyl group; and $R^{49}$ represents an alkyl group.

The alkyl group for $R^{47}$ and $R^{48}$ preferably has 1 to 5 carbon atoms, and may be either linear or branched. As the alkyl group, an ethyl group or a methyl group is preferable, and a methyl group is most preferable.

It is preferable that at least one of $R^{47}$ and $R^{48}$ be a hydrogen atom. It is particularly desirable that at least one of $R^{47}$ and $R^{48}$ be a hydrogen atom, and the other be a hydrogen atom or a methyl group.

The alkyl group for $R^{49}$ preferably has 1 to 15 carbon atoms, and may be linear, branched or cyclic.

The linear or branched alkyl group for $R^{49}$ preferably has 1 to 5 carbon atoms. Examples thereof include a methyl group, an ethyl group, a propyl group, an n-butyl group and a tert-butyl group.

The cyclic alkyl group for $R^{49}$ preferably has 4 to 15 carbon atoms, more preferably 4 to 12 carbon atoms, and most preferably 5 to 10 carbon atoms. Specific examples thereof include groups in which one or more hydrogen atoms have been removed from a monocycloalkane or a polycycloalkane such as a bicycloalkane, tricycloalkane or tetracycloalkane, and which may or may not be substituted with an alkyl group of 1 to 5 carbon atoms, a fluorine atom or a fluorinated alkyl group. Examples of the monocycloalkane include cyclopentane and cyclohexane. Examples of polycycloalkanes include adamantane, norbornane, isobornane, tricyclodecane and tetracyclododecane. Among these, a group in which one or more hydrogen atoms have been removed from adamantane is preferable.

Examples of the alkoxycarbonylalkyloxy group as the substituent for the substituted aryl group include groups represented by a general formula shown below:

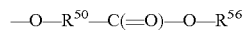

In the formula, $R^{50}$ represents a linear or branched alkylene group, and $R^{56}$ represents a tertiary alkyl group.

The linear or branched alkylene group for $R^{50}$ preferably has 1 to 5 carbon atoms, and examples thereof include a methylene group, an ethylene group, a trimethylene group, a tetramethylene group and a 1,1-dimethylethylene group.

Examples of the tertiary alkyl group for $R^{56}$ include a 2-methyl-2-adamantyl group, a 2-ethyl-2-adamantyl group, a 1-methyl-1-cyclopentyl group, a 1-ethyl-1-cyclopentyl group, a 1-methyl-1-cyclohexyl group, a 1-ethyl-1-cyclohexyl group, a 1-(1-adamantyl)-1-methylethyl group, a 1-(1-adamantyl)-1-methyl propyl group, a 1-(1-adamantyl)-1-methylbutyl group, a 1-(1-adamantyl)-1-methylpentyl group, a 1-(1-cyclopentyl)-1-methylethyl group, a 1-(1-cyclopentyl)-1-methylpropyl group, a 1-(1-cyclopentyl)-1-methylbutyl group, a 1-(1-cyclopentyl)-1-methylpentyl group, a 1-(1-cyclohexyl)-1-methylethyl group, a 1-(1-cyclohexyl)-1-methylpropyl group, a 1-(1-cyclohexyl)-1-methylbutyl group, a 1-(1-cyclohexyl)-1-methylpentyl group, a tert-butyl group, a tert-pentyl group and a tert-hexyl group.

Further, a group in which $R^{56}$ in the group represented by the aforementioned general formula: —O—R=—C(=O)—O—$R^{56}$ has been substituted with $R^{56'}$ can also be mentioned. $R^{56'}$ represents a hydrogen atom, an alkyl group, a fluorinated alkyl group or an aliphatic cyclic group which may contain a hetero atom.

The alkyl group for $R^{56'}$ is the same as defined for the alkyl group for the aforementioned $R^{49}$.

Examples of the fluorinated alkyl group for $R^{56'}$ include groups in which part or all of the hydrogen atoms within the alkyl group for $R^{49}$ has been substituted with a fluorine atom.

Examples of the aliphatic cyclic group for $R^{56'}$ which may contain a hetero atom include an aliphatic cyclic group which does not contain a hetero atom, an aliphatic cyclic group containing a hetero atom in the ring structure, and an aliphatic cyclic group in which a hydrogen atom has been substituted with a hetero atom.

As an aliphatic cyclic group for $R^{56'}$ which does not contain a hetero atom, a group in which one or more hydrogen atoms have been removed from a monocycloalkane or a polycycloalkane such as a bicycloalkane, a tricycloalkane or a tetracycloalkane can be mentioned. Examples of the monocycloalkane include cyclopentane and cyclohexane. Examples of polycycloalkanes include adamantane, norbornane, isobornane, tricyclodecane and tetracyclododecane. Among these, a group in which one or more hydrogen atoms have been removed from adamantane is preferable.

Specific examples of the aliphatic cyclic group for $R^{56'}$ containing a hetero atom in the ring structure include groups represented by formulas (L1) to (L6) and (S1) to (S4) described above.

As the aliphatic cyclic group for $R^{56'}$ in which a hydrogen atom has been substituted with a hetero atom, an aliphatic cyclic group in which a hydrogen atom has been substituted with an oxygen atom (=O) can be mentioned.

Each of $R^{6'}$, $R^{7'}$ and $R^{8'}$ in —C(=O)—O—$R^{6'}$, —O—C(=O)—$R^{7'}$, —O—$R^{8'}$ represents a linear or branched saturated hydrocarbon group of 1 to 25 carbon atoms, a cyclic saturated hydrocarbon group of 3 to 20 carbon atoms, or a linear or branched, aliphatic unsaturated hydrocarbon group of 2 to 5 carbon atoms.

The linear or branched, saturated hydrocarbon group has 1 to 25 carbon atoms, preferably 1 to 15 carbon atoms, and more preferably 4 to 10 carbon atoms.

Examples of the linear, saturated hydrocarbon group include a methyl group, an ethyl group, a propyl group, a butyl group, a pentyl group, a hexyl group, a heptyl group, an octyl group, a nonyl group and a decyl group.

Examples of the branched saturated hydrocarbon group include a 1-methylethyl group, 1-methylpropyl group, 2-methylpropyl group, 1-methylbutyl group, 2-methylbutyl group, 3-methylbutyl group, 1-ethylbutyl group, 2-ethylbutyl group, 1-methylpentyl group, 2-methylpentyl group, 3-methylpentyl group, 4-methylpentyl group, tert-butyl group, tert-pentyl group and tert-hexyl group.

The linear or branched, saturated hydrocarbon group may have a substituent. Examples of the substituent include an alkoxy group, a halogen atom, a halogenated alkyl group, a hydroxyl group, an oxygen atom (=O), a cyano group and a carboxy group.

The alkoxy group as the substituent for the linear or branched saturated hydrocarbon group is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the halogen atom as the substituent for the linear or branched, saturated alkyl group include a fluorine atom, a chlorine atom, a bromine atom and an iodine atom, and a fluorine atom is preferable.

Examples of the halogenated alkyl group as the substituent for the linear or branched, saturated hydrocarbon group include a group in which part or all of the hydrogen atoms within the aforementioned linear or branched, saturated hydrocarbon group have been substituted with the aforementioned halogen atoms.

The cyclic saturated hydrocarbon group of 3 to 20 carbon atoms for $R^{6'}$, $R^{7'}$ and $R^{8'}$ may be either a polycyclic group or a monocyclic group, and examples thereof include groups in which one hydrogen atom has been removed from a monocycloalkane, and groups in which one hydrogen atom has been removed from a polycycloalkane (e.g., a bicycloalkane, a tricycloalkane or a tetracycloalkane). More specific examples include groups in which one hydrogen atom has been removed from a monocycloalkane such as cyclopentane, cyclohexane, cycloheptane or cyclooctane; and groups in which one or more hydrogen atoms have been removed from a polycycloalkane such as adamantane, norbornane, isobornane, tricyclodecane or tetracyclododecane.

Further, examples of the cyclic saturated hydrocarbon group of 3 to 20 carbon atoms include the same cyclic saturated hydrocarbon groups as those described above for the aforementioned tertiary alkyl groups of $R^{56}$.

The cyclic, saturated hydrocarbon group may have a substituent. For example, part of the carbon atoms constituting the ring within the cyclic alkyl group may be substituted with a hetero atom, or a hydrogen atom bonded to the ring within the cyclic alkyl group may be substituted with a substituent.

In the former example, a heterocycloalkane in which part of the carbon atoms constituting the ring within the aforementioned monocycloalkane or polycycloalkane has been substituted with a hetero atom such as an oxygen atom, a sulfur atom or a nitrogen atom, and one or more hydrogen atoms have been removed therefrom, can be used. Further, the ring may contain an ester bond (—C(=O)—O—). More specific examples include a lactone-containing monocyclic group, such as a group in which one hydrogen atom has been removed from γ-butyrolactone; and a lactone-containing polycyclic group, such as a group in which one hydrogen atom has been removed from a bicycloalkane, tricycloalkane or tetracycloalkane containing a lactone ring.

In the latter example, as the substituent, the same substituent groups as those for the aforementioned linear or branched alkyl group, or a lower (1 to 5 carbon atoms) alkyl group can be used.

Alternatively, $R^{6'}$, $R^{7'}$ and $R^{8'}$ may be a combination of a linear or branched alkyl group and a cyclic group.

Examples of the combination of a linear or branched alkyl group with a cyclic alkyl group include groups in which a cyclic alkyl group as a substituent is bonded to a linear or branched alkyl group, and groups in which a linear or branched alkyl group as a substituent is bonded to a cyclic alkyl group.

Examples of the linear aliphatic unsaturated hydrocarbon group for $R^{6\prime}$, $R^{7\prime}$ and $R^{8\prime}$ include a vinyl group, a propenyl group (an allyl group) and a butynyl group.

Examples of the branched aliphatic unsaturated hydrocarbon group for $R^{6\prime}$, $R^{7\prime}$ and $R^{8\prime}$ include a 1-methylpropenyl group and a 2-methylpropenyl group.

The aforementioned linear or branched, aliphatic unsaturated hydrocarbon group may have a substituent. Examples of the substituents include the same substituents as those which the aforementioned linear or branched alkyl group may have.

Among the aforementioned examples, as $R^{7\prime}$ and $R^{8\prime}$, in terms of improvement in lithography properties and shape of the resist pattern, a linear or branched, saturated hydrocarbon group of 1 to 15 carbon atoms or a cyclic saturated hydrocarbon group of 3 to 20 carbon atoms is preferable.

Examples of the alkyl group for $R^{1\prime\prime}$ to $R^{3\prime\prime}$ include linear, branched or cyclic alkyl groups of 1 to 10 carbon atoms. Among these, alkyl groups of 1 to 5 carbon atoms are preferable as the resolution becomes excellent. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decyl group, and a methyl group is most preferable because it is excellent in resolution and can be synthesized at a low cost.

The alkenyl group for $R^{1\prime\prime}$ to $R^{3\prime\prime}$ preferably has 2 to 10 carbon atoms, more preferably 2 to 5 carbon atoms, and still more preferably 2 to 4 carbon atoms. Specific examples thereof include a vinyl group, a propenyl group (an allyl group), a butynyl group, a 1-methylpropenyl group and a 2-methylpropenyl group.

When two of $R^{1\prime\prime}$ to $R^{3\prime\prime}$ are bonded to each other to form a ring with the sulfur atom in the formula, it is preferable that the two of $R^{1\prime\prime}$ to $R^{3\prime\prime}$ form a 3 to 10-membered ring including the sulfur atom, and it is particularly desirable that the two of $R^{1\prime\prime}$ to $R^{3\prime\prime}$ form a 5 to 7-membered ring including the sulfur atom.

Specific examples of the preferred cation moiety for the compound represented by the above formula (b-c1) include cation moieties shown below.

[Chemical Formula 64]

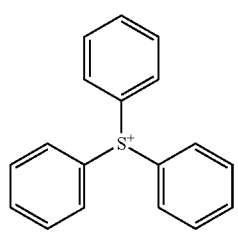

(b-1-1)

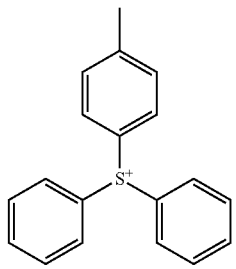

(b-1-2)

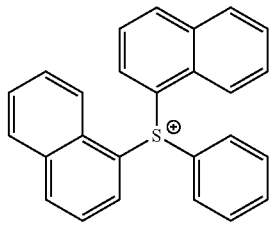

(b-1-3)

[Chemical Formula 65]

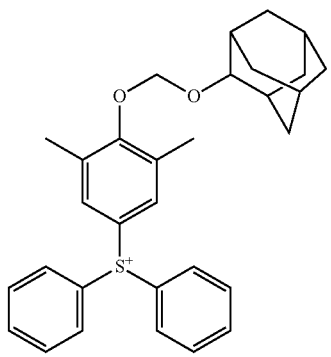

(b-1-4)

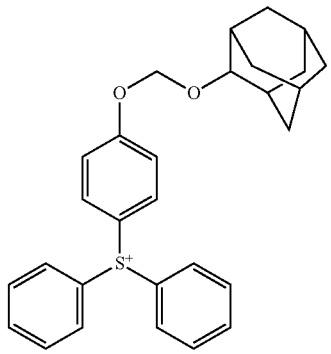

(b-1-5)

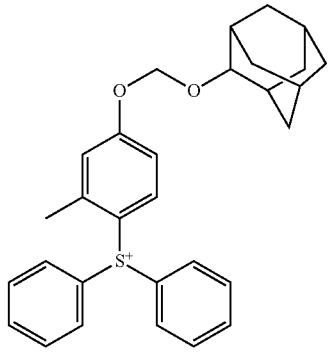

(b-1-6)

[Chemical Formula 66]

(b-1-7)

(b-1-8)

(b-1-9)

[Chemical Formula 67]

(b-1-10)

(b-1-11)

(b-1-12)

(b-1-13)

[Chemical Formula 68]

(b-1-14)

(b-1-15)
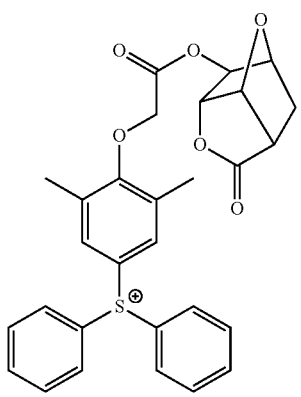
(b-1-16)
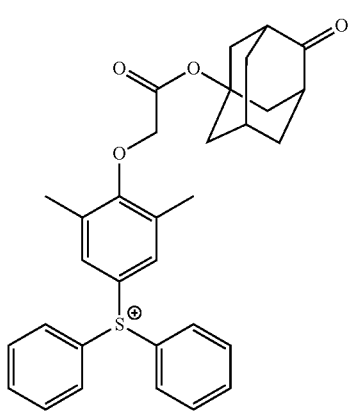
[Chemical Formula 69]
(b-1-17)
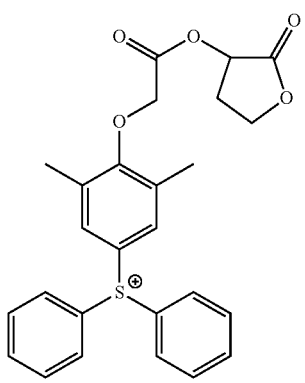
(b-1-18)
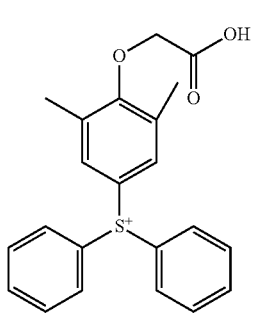
(b-1-19)
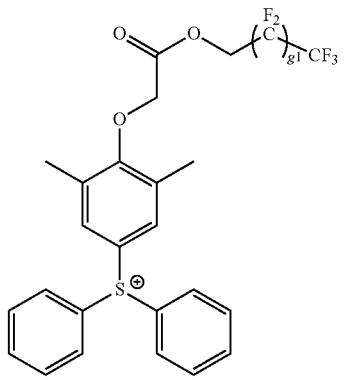
In the formula, g1 represents a recurring number, and is an integer of 1 to 5.
[Chemical Formula 70]
(b-1-20)
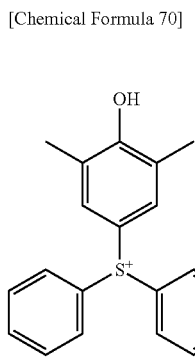
(b-1-21)
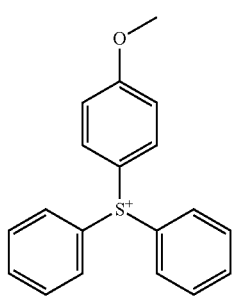
(b-1-22)
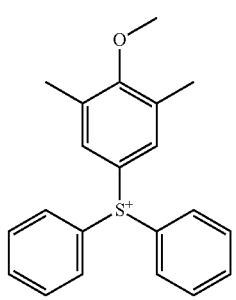

[Chemical Formula 71]
(b-1-23)
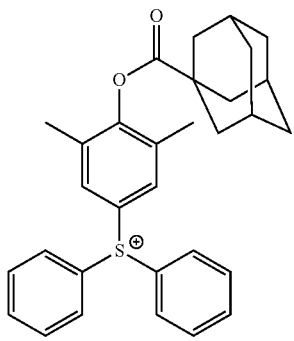
(b-1-24)
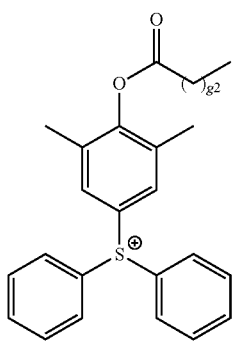
(b-1-25)
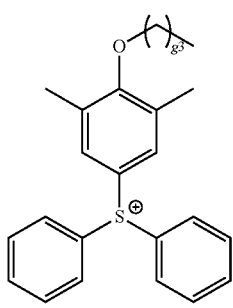
In the formula, g2 and g3 represent recurring numbers, wherein g2 is an integer of 0 to 20, and g3 is an integer of 0 to 20.
[Chemical Formula 72]
(b-1-26)
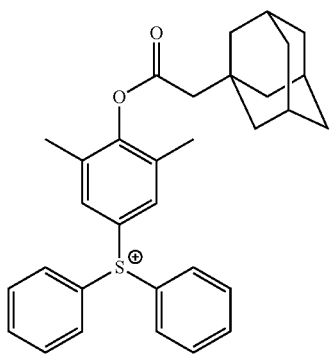
(b-1-27)
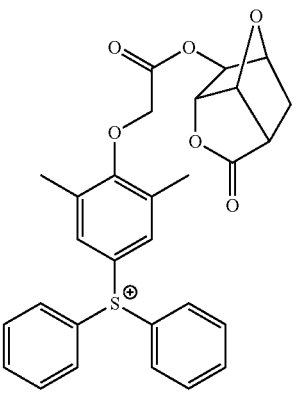
(b-1-28)
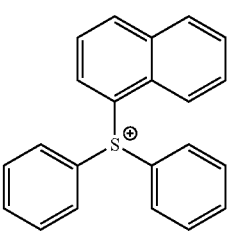
[Chemical Formula 73]
(b-1-29)
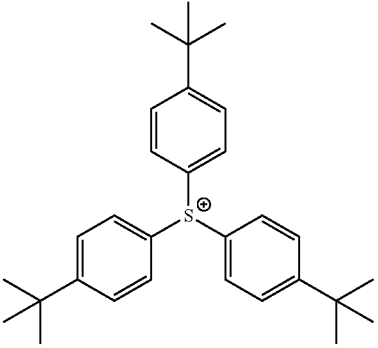
(b-1-30)
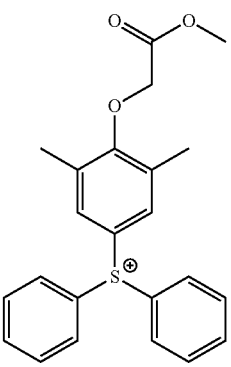

(b-1-31)
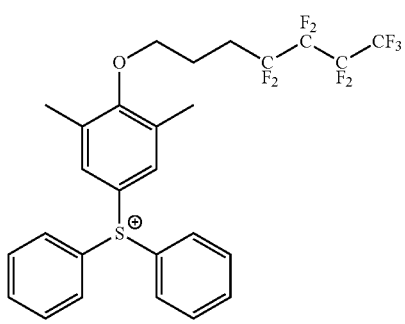
[Chemical Formula 74]
(b-1-32)
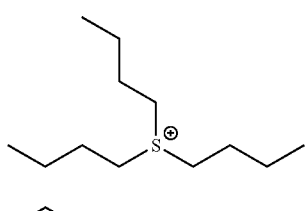
(b-1-33)
[Chemical Formula 75]
(b-1-34)
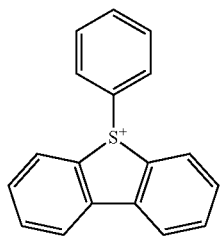
(b-1-35)
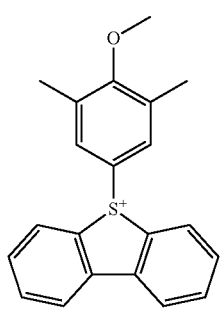
(b-1-36)
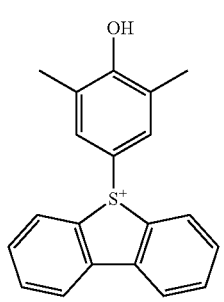
(b-1-37)
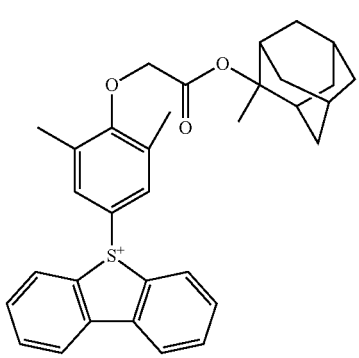
(b-1-38)
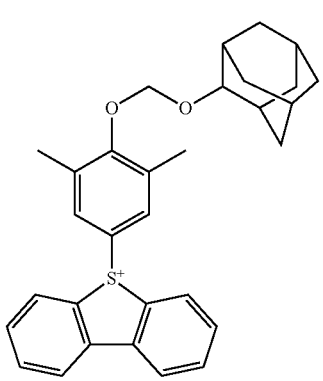
(b-1-39)
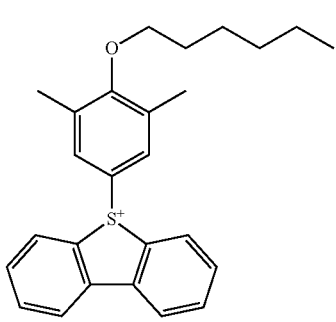
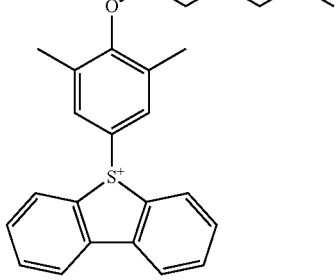
(b-1-40)
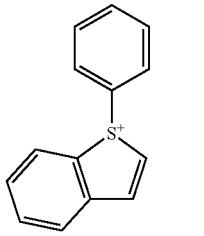
(b-1-41)
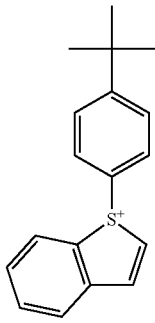

[Chemical Formula 76]

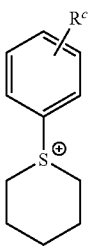 (b-1-42)

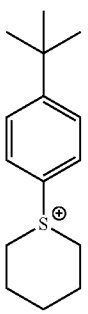 (b-1-43)

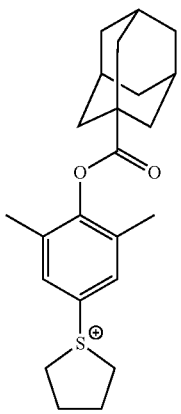 (b-1-44)

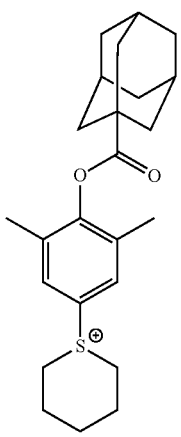 (b-1-45)

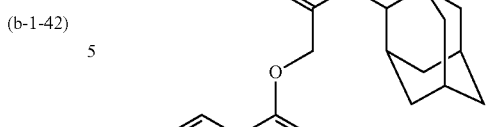 (b-1-46)

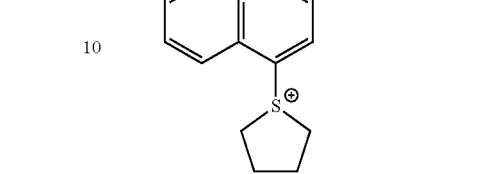 (b-1-47)

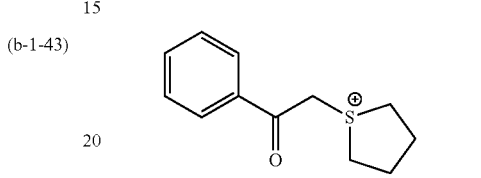 (b-1-48)

In the formulas, $R^c$ is the same as the substituents described above in relation to the substituted aryl group (i.e., an alkyl group, an alkoxy group, an alkoxyalkyloxy group, an alkoxycarbonylalkyloxy group, a halogen atom, a hydroxyl group, an oxo group (=O), an aryl group, —C(=O)—O—R$^{6\prime}$, —O—C(=O)—R$^{7\prime}$ and —O—R$^{8\prime}$).

In formula (b-c2) above, each of $R^{5\prime\prime\prime}$ and $R^{6\prime\prime\prime}$ independently represents an aryl group which may have a substituent, an alkyl group or an alkenyl group.

As the aryl group for $R^{5\prime\prime\prime}$ and $R^{6\prime\prime\prime}$, the same aryl groups as those described above for $R^{1\prime\prime\prime}$ to $R^{3\prime\prime\prime}$ can be used.

As the alkyl group for $R^{5\prime\prime\prime}$ and $R^{6\prime\prime\prime}$, the same alkyl groups as those described above for $R^{1\prime\prime\prime}$ to $R^{3\prime\prime\prime}$ can be used.

As the alkenyl group for $R^{5\prime\prime\prime}$ and $R^{6\prime\prime\prime}$, the same alkenyl groups as those described above for $R^{1\prime\prime\prime}$ to $R^{3\prime\prime\prime}$ can be used.

Specific examples of the cation moiety of the compound represented by the above general formula (b-c2) include diphenyliodonium and bis(4-tert-butylphenyl)iodonium.

In the present description, an oxime sulfonate-based acid generator is a compound having at least one group represented by general formula (B-1) shown below, and has a feature of generating acid by irradiation (exposure). Such oxime sulfonate-based acid generators are widely used for a chemically amplified resist composition, and can be appropriately selected.

[Chemical Formula 77]

 (B-1)

In the formula, each of $R^{31}$ and $R^{32}$ independently represents an organic group.

The organic group for $R^{31}$ and $R^{32}$ refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The alkyl group or the aryl group "has a substituent" means that part or all of the hydrogen atoms of the alkyl group or the aryl group is substituted with a substituent.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which part of the hydrogen atoms are substituted with halogen atoms and the "completely halogenated alkyl group" refers to an alkyl group in which all of the hydrogen atoms are substituted with halogen atoms. Examples of the halogen atom include a fluorine atom, a chlorine atom, a bromine atom and an iodine atom, and a fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, a partially or completely halogenated aryl group is particularly desirable. The "partially halogenated aryl group" refers to an aryl group in which some of the hydrogen atoms are substituted with halogen atoms and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, an aryl group, or a cyano group is preferable. Examples of the alkyl group and the aryl group for $R^{32}$ include the same alkyl groups and aryl groups as those described above for $R^{31}$.

As $R^{32}$, a cyano group, an alkyl group of 1 to 8 carbon atoms having no substituent or a fluorinated alkyl group of 1 to 8 carbon atoms is particularly desirable.

Preferred examples of the oxime sulfonate-based acid generator include compounds represented by general formula (B-2) or (B-3) shown below.

[Chemical Formula 78]

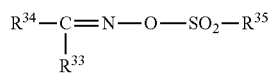

(B-2)

In the formula, $R^{33}$ represents a cyano group, an alkyl group having no substituent or a halogenated alkyl group; $R^{34}$ represents an aryl group; and $R^{35}$ represents an alkyl group having no substituent or a halogenated alkyl group.

[Chemical Formula 79]

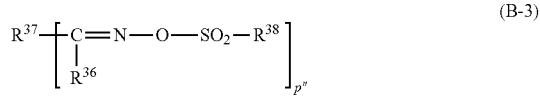

(B-3)

In the formula, $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more, and most preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group, and a phenanthryl group, and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. Further, the halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more, still more preferably 90% or more. A completely fluorinated alkyl group in which 100% of the hydrogen atoms are substituted with fluorine atoms is particularly desirable.

In general formula (B-3), as the alkyl group having no substituent and the halogenated alkyl group for $R^{36}$, the same alkyl group having no substituent and the halogenated alkyl group described above for $R^{33}$ can be used.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same one as the alkyl group having no substituent or the halogenated alkyl group for $R^{35}$ can be used.

p" is preferably 2.

Specific examples of suitable oxime sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propyl sulfonyl oxyimino)-propyl acetonitrile, α-(cyclohexyl sulfonyl oxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butyl sulfonyl oxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butyl sulfonyl oxyimino)-1-cyclohexenyl acetonitrile, α-(methyl sulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate-based acid generators disclosed in WO 2004/074242A2 (Examples 1 to 40 described at pages 65 to 85) may be preferably used.

Furthermore, as preferable examples, the following can be used.

[Chemical Formula 80]

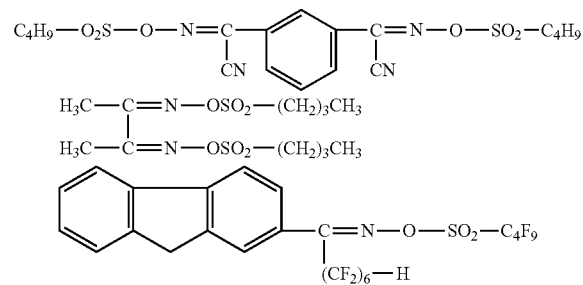

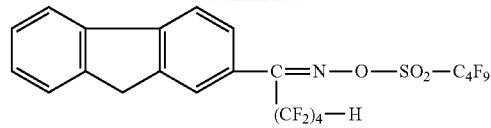

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may also be used favorably.

Furthermore, as examples of poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, may be given.

When the resist composition of the present invention includes the component (B), as the component (B), one type of the aforementioned acid generator may be used, or two or more types may be used in combination.

In the case where the resist composition of the present invention contains the component (B), when the component (B) is a thermal-acid generator, the amount of the component (B) relative to 100 parts by weight of the component (A) is preferably 0.5 to 30 parts by weight, and more preferably 1 to 20 parts by weight. When the component (B) is a photo-acid generator, the amount of the component (B) relative to 100 parts by weight of the component (A) is preferably 0.5 to 30 parts by weight, and more preferably 1 to 20 parts by weight. When the amount of the component (B) is within the above-mentioned range, formation of a resist pattern can be satisfactorily performed. In addition, when the amount of the component (B) is at least as large as the lower limit of the above-mentioned range, solubility of the resist film in the developing solution is likely to increase and resolution is enhanced. On the other hand, when the amount is no more than the upper limit of the above-mentioned range, sensitivity becomes excellent. In addition, in the case of the photo-acid generator, when the amount is no more than the upper limit of the above-mentioned range, the transparency of the resist film becomes excellent.

In the case where the resist composition of the present invention contains the component (B), the amount of the component (B) relative to the combined total amount of the component (G) and component (B) is preferably 50% by weight or less, and more preferably 20% by weight or less.

Compound (F); Component (F)

In the present invention, a compound (F) is a compound containing at least one selected from the group consisting of a fluorine atom and a silicon atom and containing no acid decomposable group which exhibits increased polarity by the action of acid.

Examples of the "acid decomposable group which exhibits increased polarity by the action of acid" includes the same as those described above for the "acid decomposable groups which exhibit increased polarity by the action of an acid" of the aforementioned structural unit (a1).

The component (F) may be a low molecular weight compound, polymer or mixture thereof. Similarly to the description of the aforementioned component (A), the "low molecular weight compound" refers to a non-polymer having a molecular weight in the range of 500 to less than 4,000. The "polymer" in the component (F) refers to a product generated by bonding 2 or more single unit compound molecules to each other. As the molecular weight of the polymer, the weight average molecular weight in terms of the polystyrene equivalent value determined by gel permeation chromatography (GPC) is used.

When the component (F) is the polymer, a structural unit constituting the component (F) is not particularly limited, and a structural unit derived from a compound having the ethylenic double bond.

A "structural unit derived from a compound having the ethylenic double bond" refers to a structural unit having a structure in which a single bond is formed by the cleavage of the ethylenic double bond in the compound containing the ethylenic double bond.

Examples of the compound containing the ethylenic double bond include an acrylic acid which may have the hydrogen atom bonded to the carbon atom on the α-position substituted with a substituent, or an ester thereof, an acrylamide which may have the hydrogen atom bonded to the carbon atom on the α-position substituted with a substituent, or derivative thereof, a vinyl cyclic compound which may have the hydrogen atom bonded to the carbon atom on the α-position substituted with a substituent, a cycloolefin or derivative thereof, and a vinyl sulfonate ester.

Of these, an acrylic acid which may have the hydrogen atom bonded to the carbon atom on the α-position substituted with a substituent, or an acrylate ester, and a vinyl cyclic compound which may have the hydrogen atom bonded to the carbon atom on the α-position substituted with a substituent are preferable.

Each of an "acrylate ester" and a substituent bonded to the carbon atom on the α-position is the same as described above.

In the component (F), it is preferable that a hydrogen atom, an alkyl group of 1 to 5 carbon atoms or a halogenated alkyl group of 1 to 5 carbon atoms is bonded to the carbon atom on the α-position of the (α-substituted) acrylic acid or ester thereof, a hydrogen atom, an alkyl group of 1 to 5 carbon atoms or a fluorinated alkyl group of 1 to 5 carbon atoms is more preferable, and in terms of industrial availability, a hydrogen atom or a methyl group is the most desirable.

An "organic group" refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

The organic group contained in the (α-substituted) acrylate ester is not particularly limited, and an example thereof includes a characteristic group such as an aromatic group (a group in which one or more hydrogen atoms have been removed from an aromatic compound), a polarity conversion group (a group decomposed by the action of a base and generating a polar group; examples of the polar group include a carboxy group, a hydroxy group and an amino group) and the aforementioned acid decomposable group, and a characteristic group-containing group containing any one of these characteristic groups in the structure thereof. An example of the characteristic group-containing group includes a group in which a divalent linking group is bonded to the characteristic group. As the divalent linking group, the same divalent linking groups as those described for $Y^2$ in the aforementioned general formula (a1-0-2) can be mentioned.

Examples of the "acrylamide or derivative thereof" include an acrylamide (hereinafter, sometimes referred to as a "(α-substituted) acrylamide") which may have the hydrogen atom bonded to the carbon atom on the α-position substituted with a substituent, and a compound in which either or both of the terminal hydrogen atoms of an amino group of the (α-substituted) acrylamide has been substituted with a substituent.

Examples of the substituent which may be bonded to the carbon atom on the α-position of the acrylamide or derivative thereof include the same as those described above for the substituent bonded to the carbon atom on the α-position of the (α-substituted) acrylate ester.

As the substituent for substituting either or both of the terminal hydrogen atoms of an amino group of the (α-substituted) acrylamide, an organic group is preferable. The organic group is not particularly limited, and examples thereof include the same organic group as those described above for the organic group contained in the aforementioned (α-substituted) acrylate ester.

As examples of the compound in which either or both of the terminal hydrogen atoms of an amino group of the (α-substituted) acrylamide has been substituted with a substituent, a compound in which —C(=O)—O— bonded to the carbon atom on the α-position of the (α-substituted) acrylate ester is substituted with —C(=O)—N($R^b$)—[wherein $R^b$ represents a hydrogen atom or an alkyl group of 1 to 5 carbon atoms] can be mentioned.

In the formula, the alkyl group for $R^b$ is preferably linear or branched.

A "vinyl cyclic compound" refers to a compound having a ring structure of an aromatic compound or an alicyclic compound, and one or more vinyl groups bonded directly or via a divalent linking group to the ring structure.

Examples of the aromatic compound include benzene and naphthalene.

The alicyclic compound may be either a monocyclic compound or a polycyclic compound. The monocyclic compound is preferably monocycloalkane, and examples thereof include cyclopentane and cyclohexane. The polycyclic compound is preferably polycycloalkane, and examples thereof include adamantane, norbornane, isobornane, tricyclodecane and tetracyclododecane.

Examples of the divalent linking group include —O—, —N— and —S—.

Examples of the substituent which may be bonded to the carbon atom (a carbon atom bonded to the ring structure or the linking group within the carbon atoms of the vinyl group) on the α-position of the vinyl cyclic compound include the same as those described above for the substituent bonded to the carbon atom on the α-position of the (α-substituted) acrylate ester.

Hereafter, the vinyl cyclic compound which may have the hydrogen atom bonded to the carbon atom on the α-position substituted with a substituent is sometimes referred to as a "(α-substituted) vinyl cyclic compound".

Specific examples of the structural unit derived from the (α-substituted) acrylic acid or ester thereof include a structural unit represented by general formula (U-1) shown below.

Specific examples of the structural unit derived from the (α-substituted) acrylamide or derivative thereof include a structural unit represented by general formula (U-2) shown below.

Specific examples of the structural unit derived from the (α-substituted) vinyl cyclic compound include a structural unit represented by any one of general formulas (U-3) to (U-5) shown below.

[Chemical Formula 81]

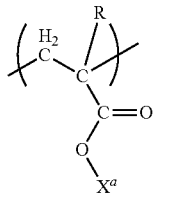
(U-1)

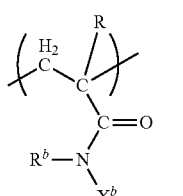
(U-2)

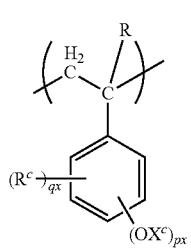
(U-3)

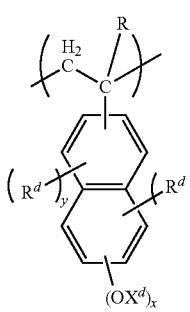
(U-4)

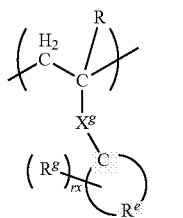
(U-5)

In the formulas, R represents a hydrogen atom, an alkyl group of 1 to 5 carbon atoms or a halogenated alkyl group of 1 to 5 carbon atoms; $X^a$ to $X^d$ each independently represents a hydrogen atom or an organic group; $R^b$ represents a hydrogen atom or an alkyl group of 1 to 5 carbon atoms; $R^e$, $R^d$ and $R^g$ each independently represents a halogen atom, —COOX$^e$ (wherein, $X^e$ represents a hydrogen atom or an organic group), an alkyl group of 1 to 5 carbon atoms or a halogenated alkyl group of 1 to 5 carbon atoms; $R^g$ represents a divalent linking group; $R^e$ represents a group which forms an aliphatic monocyclic group with the carbon atom to which $R^c$ is bonded; px represents an integer of 0 to 3, and qx represents an integer of 0 to 5, provided that px+qx =0 to 5; when qx is an integer of 2 or more, the plurality of $R^e$ may be the same or different from each other; x represents an integer of 0 to 3; y represents an integer of 0 to 3; and z represents an integer of 0 to 4, provide that x+y+z=0 to 7; when y+z is an integer of 2 or more, the plurality of $R^d$ may be the same or different from each other; and rx represents an integer of 0 to 5, when rx is an integer of 2 or more, the plurality of $R^g$ may be the same or different from each other.

When the component (F) is the low molecular weight compound, the component (F) is preferably a compound having a polymerizable group. A "polymerizable group" refers to a group enabling the compound having the polymerizable group to polymerize by radical polymerization or the like, and refers to a group including a multiple bond among carbon atoms, for example, such as an ethylenic double bond.

The compound having a polymerizable group is preferably the low molecular weight compound having an ethylenic double bond, and most preferably an acrylic acid which may have the hydrogen atom bonded to the carbon atom on the α-position substituted with a substituent, or an ester thereof. Specifically, preferable examples thereof include monomers providing structural units represented by the aforementioned general formulas (U-1) to (U-5), respectively.

Preferable example of the component (F) according to the present invention include a polymer having a structural unit containing at least one selected from the group consisting of a fluorine atom and a silicon atom and containing no acid decomposable group which exhibits increased polarity by the action of acid within the structural unit represented by any one of general formulas (U-1) to (U-5), or a monomer providing the structural unit.

In the resist composition of the present invention, the component (F) is preferably a polymer (hereafter, referred to as "polymer (F1)" or "component (F1)") having a structural unit (hereafter, referred to as "structural unit (f1)") represented by general formula (f1-1) described later.

Further, the component (F) is also preferably a compound (hereafter, referred to as "compound (F11)" or "component (F11)") represented by general formula (f11-1) described later.

Here, any of the component (F) contains no acid decomposable group which exhibits increased polarity by the action of acid.

Polymer (F1)

The component (F1) is a polymer containing the structural unit (f1) and containing no acid decomposable group which exhibits increased polarity by the action of acid.

[Structural Unit (F1)]

The structural unit (f1) is a structural unit represented by general formula (f1-1) shown below.

[Chemical Formula 82]

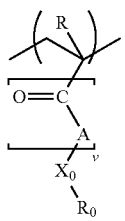

(f1-1)

In the formula, R represents a hydrogen atom, an alkyl group of 1 to 5 carbon atoms or a halogenated alkyl group of 1 to 5 carbon atoms; A represents —O— or —NH—; $X_0$ represents a single bond or a divalent linking group; $R_0$ represents an organic group; at least one of $X_0$ and $R_0$ contains a fluorine atom or a silicon atom; and v is 0 or 1.

In general formula (f1-1), R represents a hydrogen atom, an alkyl group of 1 to 5 carbon atoms or a halogenated alkyl group of 1 to 5 carbon atoms. As the alkyl group of 1 to 5 carbon atoms or the halogenated alkyl group of 1 to 5 carbon atoms for R, the same as those described above for the alkyl group of 1 to 5 carbon atoms or the halogenated alkyl group of 1 to 5 carbon atoms in the aforementioned substituent bonded to the carbon atom on the α-position. Of these, R is preferably a hydrogen atom or a methyl group.

In general formula (f1-1), A represents O (oxygen atom) or NH, and is preferably O (oxygen atom).

In general formula (f1-1), v represents 0 or 1. "v is 0" means that —C(=O)-A- in the formula is replaced with a single bond.

In general formula (f1-1), $X_0$ represents a single bond or a divalent linking group.

Examples of the divalent linking group for $X_0$ include divalent hydrocarbon groups which may have a substituent and divalent linking groups containing a hetero atom, and the same divalent hydrocarbon groups which may have a substituent and divalent linking groups containing a hetero atom as those defined above for $Y^2$ in general formula (a1-0-2) can be used, provided that the divalent linking group for $X_0$ includes no acid decomposable group in the structure thereof. As an example of the acid decomposable group, the same as those described above for "acid decomposable groups which exhibit increased polarity by the action of an acid" of the aforementioned structural unit (a1) can be mentioned.

As $X_0$, a single bond or a divalent linking group containing a hetero atom is preferable, and more preferably a single bond, a divalent linking group containing —C(=O)—O— or a divalent linking group containing —O—.

When v represents 0, preferable examples of the divalent linking group for $X_0$ include a divalent aromatic hydrocarbon group which may have a substituent, a combination of a divalent aromatic hydrocarbon group which may have a substituent with a divalent linking group containing —O—C(=O)—, a divalent alicyclic group which may have a substituent and a combination of a divalent alicyclic group which may have a substituent with a divalent linking group containing —O—.

Specifically, a group in which an additional one hydrogen atom has been removed from a phenyl group or a naphthyl group which may have a substituent, a combination of a group in which an additional one hydrogen atom has been removed from a phenyl group or a naphthyl group which may have a substituent with —O—C(=O)—, a combination of a group in which an additional one hydrogen atom has been removed from a phenyl group or a naphthyl group which may have a substituent, —O—C(=O)— and a linear alkylene group, a group in which two hydrogen atoms have been removed from a cycloalkane which may have a substituent, and a combination of a group in which two hydrogen atoms have been removed from a cycloalkane which may have a substituent with —O— are particularly desirable.

Further, when v represents 1, as the divalent linking group for $X_0$, a combination of a divalent hydrocarbon group which may have a substituent with a divalent linking group containing —C(=O)—O—, a combination of a divalent aromatic hydrocarbon group which may have a substituent with a divalent linking group containing —O—, and a combination of a divalent chain-like hydrocarbon group which may have a substituent with a divalent linking group containing —O—C(=O)— are preferable, and more preferably a combination of a divalent chain-like hydrocarbon group or a divalent aromatic hydrocarbon group which may have a substituent with —C(=O)—O—, a combination of a divalent chain-like hydrocarbon group or a divalent aromatic hydrocarbon group which may have a substituent with —O—C(=O)—, a combination of a divalent aromatic hydrocarbon group which may have a substituent, —O— and a divalent chain-like hydrocarbon group which may have a substituent, and a combination of a divalent chain-like hydrocarbon group which may have a substituent, —O—C(=O)— and a divalent chain-like hydrocarbon group which may have a substituent.

When $X_0$ is a divalent linking group, $X_0$ may or may not have a fluorine atom or a silicon atom. When $X_0$ is a single bond, or when the divalent linking group for $X_0$ has no fluorine atom nor a silicon atom, an organic group for $R_0$ described later has a fluorine atom or a silicon atom.

In general formula (f1-1), $R_0$ represents an organic group.

The organic group for $R_0$ may be an organic group which has a fluorine atom or a silicon atom, or an organic group which has no fluorine atom nor a silicon atom, but when $X_0$ is a single bond, or when the divalent linking group for $X_0$ has no fluorine atom nor a silicon atom, the organic group for $R_0$ has a fluorine atom or a silicon atom.

Here, an "organic group which has a fluorine atom or a silicon atom" refers to a group in which part or all of the hydrogen atoms of the organic group has been substituted with a fluorine atom or a silicon atom.

Preferable examples of the organic group for $R_0$ include a hydrocarbon group which may have a fluorine atom or a silicon atom. The hydrocarbon group which may have a fluorine atom or a silicon atom may be either an aliphatic hydrocarbon group or an aromatic hydrocarbon group.

As the aliphatic hydrocarbon group for $R_0$, a linear, branched or cyclic alkyl group can be used.

The linear or branched alkyl group preferably has 1 to 15 carbon atoms, more preferably 1 to 10, still more preferably 1 to 8, and most preferably 1 to 5.

The cyclic alkyl group (alicyclic group) preferably has 4 to 15 carbon atoms, more preferably 4 to 10 carbon atoms, still more preferably 6 to 10 carbon atoms, and most preferably 5 to 7 carbon atoms.

The aromatic hydrocarbon group for $R_0$ preferably has 5 to 30 carbon atoms, more preferably 5 to 20, still more preferably 6 to 15, and most preferably 6 to 12. It is particularly desirable that the aromatic hydrocarbon group for $R_0$ be a phenyl group or a naphthyl group.

In these alkyl groups and aromatic hydrocarbon groups, it is preferable that a hydrogen atom therein be substituted with a fluorine atom or a silicon atom, 25% or more hydrogen atoms within the alkyl group and the aromatic hydrocarbon group are preferably substituted with a fluorine atom or a silicon atom, more preferably 50% or more hydrogen atoms therein are substituted with a fluorine atom or a silicon atom. All hydrogen atoms therein may be substituted with a fluorine atom or a silicon atom.

Further, in these alkyl groups and aromatic hydrocarbon groups, a hydrogen atom therein may be substituted with a substituent other than a fluorine atom or a silicon atom. Examples of the substituent other than a fluorine atom or a silicon atom include a hydroxyl group, a chlorine atom, a bromine atom, an iodine atom, an alkoxy group having 1 to 5 carbon atoms, and a fluorinated alkoxy group having 1 to 5 carbon atoms. Furthermore, in the cyclic alkyl group and the aromatic hydrocarbon group, a hydrogen atom therein may be substituted with an alkyl group of 1 to 5 carbon atoms. The alkyl group of 1 to 5 carbon atoms may be linear or branched, and is the same alkyl group of 1 to 5 carbon atoms as described above for the substituent on the α-position.

Specific examples of preferred structural unit (f1) represented by general formula (f1-1) and containing a fluorine atom include structural units represented by general formulas (f1-11) to (f1-15) shown below.

[Chemical Formula 83]

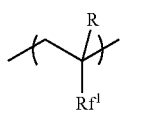 (f1-11)

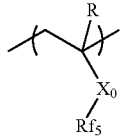 (f1-12)

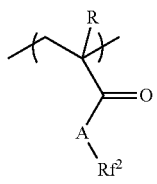 (f1-13)

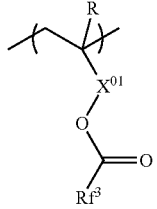 (f1-14)

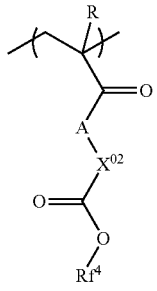 (f1-15)

In the formulas, each of $Rf^1$, $Rf^2$ and $Rf^5$ represents an organic group containing a fluorine atom; $X_0$ represents a single bond or a divalent linking group; A is the same as defined above; each of $X^{01}$ to $X^{02}$ represents a divalent linking group; each of $Rf^3$ to $Rf^4$ represents an organic group which may contain a fluorine atom; and at least one of $X^{01}$ and $Rf^3$, and at least one of $X^{02}$ and $Rf^4$ contains a fluorine atom.

In general formula (f1-11), $Rf^1$ represents an organic group containing a fluorine atom, and is preferably an aromatic hydrocarbon group containing a fluorine atom, a combination of an alkyl group in which hydrogen atoms therein are substituted with a fluorine atom and a hydroxyl group, and an aromatic hydrocarbon group which may contain a fluorine atom, and a combination of an alkyl group in which hydrogen atoms therein are substituted with a fluorine atom and a fluorinated alkoxy group having 1 to 5 carbon atoms, and an aromatic hydrocarbon group.

Examples of the aromatic hydrocarbon group containing a fluorine atom include an aromatic hydrocarbon group in which part or all of the hydrogen atoms thereof are substituted with fluorine atoms among the aromatic hydrocarbon group for aforementioned $R_0$.

In general formula (f1-12), $X_0$ represents a single bond or a divalent linking group, and is the same as the aforementioned $X_0$.

$Rf^5$ represents an organic group containing a fluorine atom, and is preferably a chain-like alkyl group in which hydrogen atoms therein are substituted with a fluorine atom and a hydroxyl group, and a combination of an alkyl group in which hydrogen atoms therein are substituted with a fluorine atom and a hydroxyl group, with a cyclic alkyl group.

As the chain-like alkyl group and the cyclic alkyl group, the same as those described above for the aliphatic hydrocarbon group (linear, branched, or cyclic alkyl group) in the aforementioned $R_0$ can be given.

In general formula (f1-13), A is the same as defined above. $Rf^2$ represents an organic group containing a fluorine atom, and is preferably a chain-like alkyl group containing a fluorine atom, a cyclic alkyl group containing a fluorine atom, an aromatic hydrocarbon group containing a fluorine atom, a chain-like alkyl group in which hydrogen atoms therein are substituted with a fluorine atom and a hydroxyl group, an aromatic hydrocarbon group in which hydrogen atoms therein are substituted with a fluorine atom and a hydroxyl group, or a combination of an alkyl group in which hydrogen atoms therein are substituted with a fluorine atom with a cyclic alkyl group.

As the cyclic alkyl group containing a fluorine atom and the aromatic hydrocarbon group containing a fluorine atom, a cyclic alkyl group and a aromatic hydrocarbon group in which part or all of the hydrogen atoms thereof have been substituted with a fluorine atom among the cyclic alkyl group and the aromatic hydrocarbon group in the aforementioned $R_0$ can be mentioned.

In general formula (f1-14), $X^{01}$ represents a divalent linking group. As an example thereof, the same as those described above for the divalent linking group in the aforementioned $X_0$ can be mentioned.

Among these, $X^{01}$ is preferably a divalent aromatic hydrocarbon group which may have a substituent, and most preferably a group in which an additional one hydrogen atom has been removed from a phenyl group or a naphthyl group which may have a substituent.

The substituent is preferably a fluorine atom or an alkoxy group having 1 to 5 carbon atoms. When $X^{01}$ has no fluorine atom, $Rf^3$ has a fluorine atom.

In general formula (f1-14), $Rf^3$ represents an organic group which may contain a fluorine atom. As an example thereof, the same organic group as those described above for the aforementioned $R_0$ can be used. $Rf^3$ is preferably a linear or branched alkyl group which may contain a fluorine atom, and the linear or branched alkyl group which may contain a fluorine atom preferably has 1 to 5 carbon atoms.

In general formula (f1-15), A is the same as defined above.

$X^{02}$ represents a divalent linking group. As an example thereof, the same as those described above for the divalent linking group in the aforementioned $X_0$ can be mentioned.

Among these, $X^{02}$ is preferably a divalent aliphatic hydrocarbon group which may have a substituent, a divalent aromatic hydrocarbon group which may have a substituent, an ether bond (—O—), an ester bond (—C(=O)—O—, —O—C(=O)—), or a combination thereof.

The substituent is preferably a fluorine atom or an alkoxy group having 1 to 5 carbon atoms.

Each of the divalent aliphatic hydrocarbon group and the divalent aromatic hydrocarbon group for $X^{02}$ may have a carbon atom constituting the hydrocarbon group substituted with an oxygen atom or a nitrogen atom.

When $X^{02}$ has no fluorine atom, $Rf^4$ has a fluorine atom.

In general formula (f1-15), $Rf^4$ represents an organic group which may contain a fluorine atom, and is the same as the aforementioned $Rf^3$.

In the present invention, if resist patterns are formed by an alkali development using the resist composition including the polymer (F1), $Rf^4$ in general formula (f1-15) is preferably a base dissociable group. It is preferable that $Rf^4$ be a base dissociable group, because the base dissociable group for $Rf^4$ is decomposed by the alkali development in the step (4) to enhance the hydrophilicity of the resist film. $Rf^4$ which is the base dissociable group is not particularly limited as long as $Rf^4$ is a hydrocarbon group or a hydrocarbon group which may have a substituent. It is preferable that $Rf^4$ have a fluorine atom.

The term "base dissociable group" describes a group that dissociates (i.e., —O-$Rf^4$ is dissociated) under the action of an alkali developing solution. The expression "dissociate in an alkali developing solution" means that the group is dissociated under the action of an alkali developing solution (and is preferably dissociated under the action of a 2.38% by weight aqueous solution of tetramethylammonium hydroxide (TMAH) at 23° C.), and exhibits increased solubility in an alkali developing solution. This is because under the action of a base (an alkali developing solution), an ester bond [—C(=O)—O—$Rf^4$] dissociates (hydrolyzes), thereby forming a hydrophilic group [—C(=O)—OH] (i.e., —O—$Rf^4$ is dissociated).

In this manner, since a terminal of the structural unit in the polymer (F1) changes from being hydrophobic before to hydrophilic after the development, hydrophilicity of the component (F1) is enhanced in the alkali development. Therefore, the effect of improving development defects becomes excellent. Further, in the immersion exposure, scan tracking ability is enhanced during the immersion exposure and defects or the like after exposure is reduced. Accordingly, the polymer (F1) having the structural unit containing the base dissociable group is useful not only in a resist composition for a dry exposure but also in a resist composition for an immersion exposure.

Specific examples of structural units represented by general formulas (f1-11) to (f1-15) are shown below. In the formulas, $R^\beta$ represents a hydrogen atom or a methyl group.

[Chemical Formula 84]

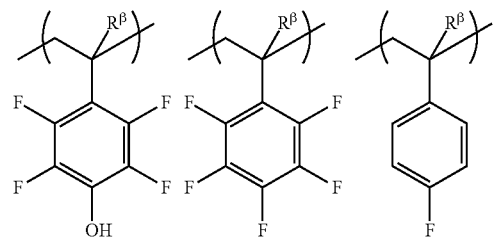

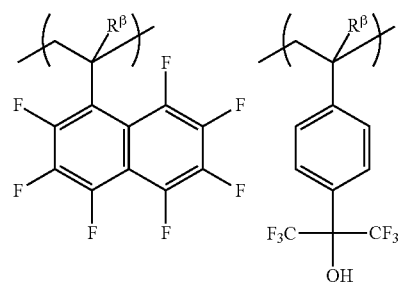

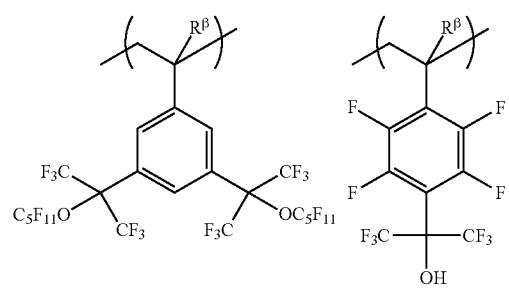

[Chemical Formula 85]

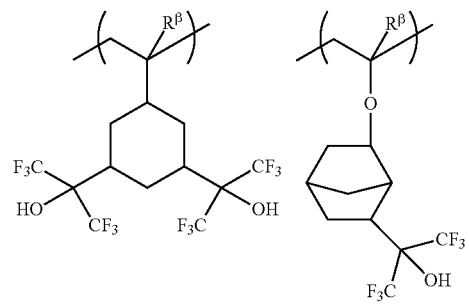

[Chemical Formula 86]

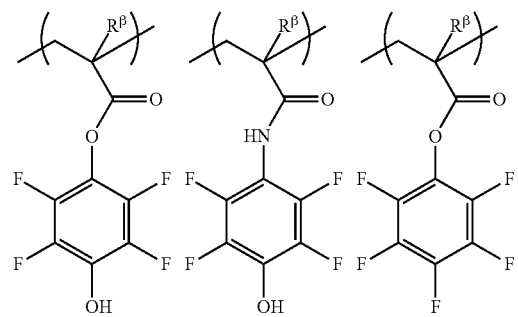

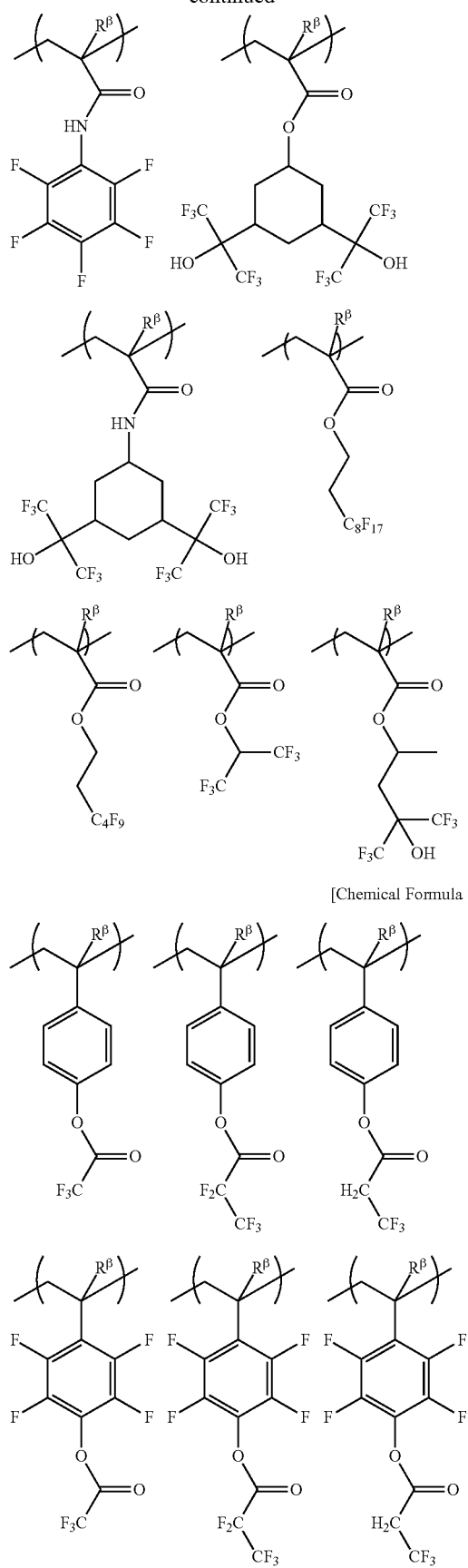
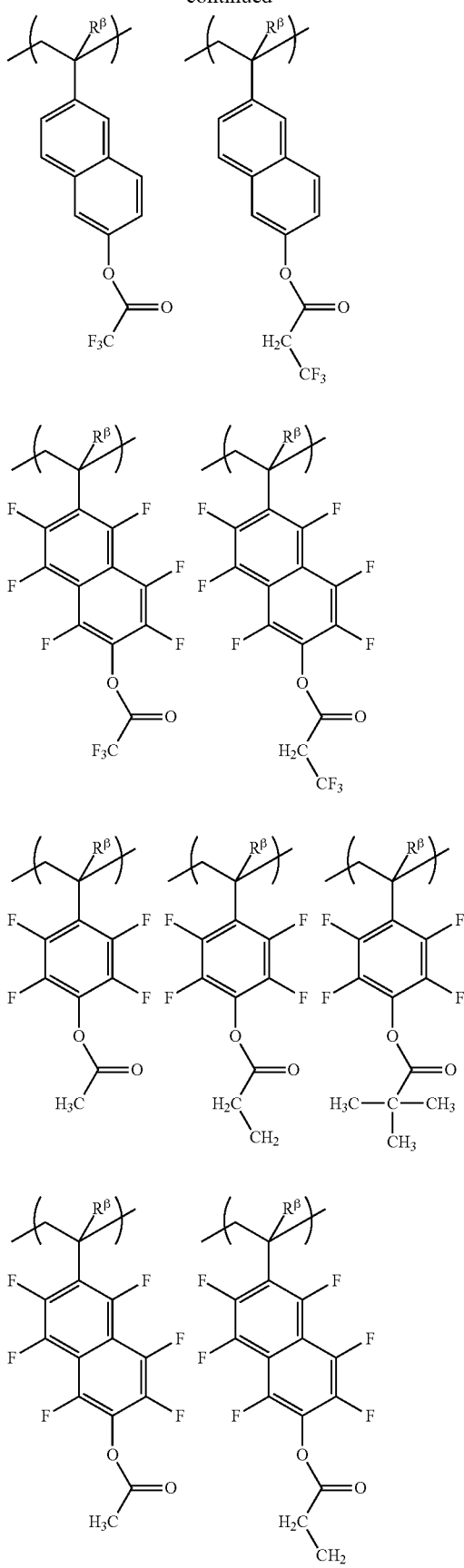
[Chemical Formula 87]

[Chemical Formula 88]
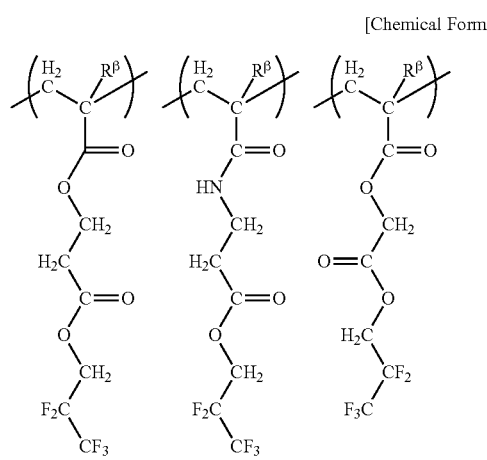
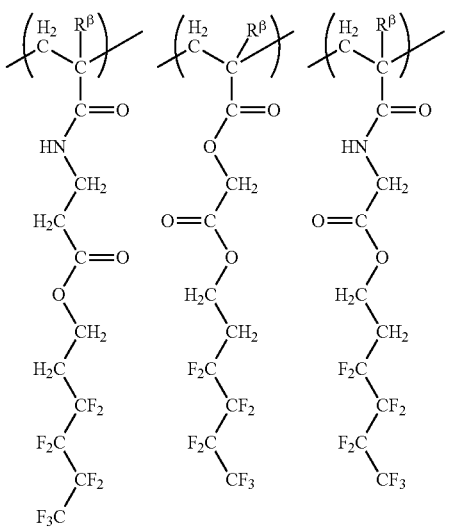
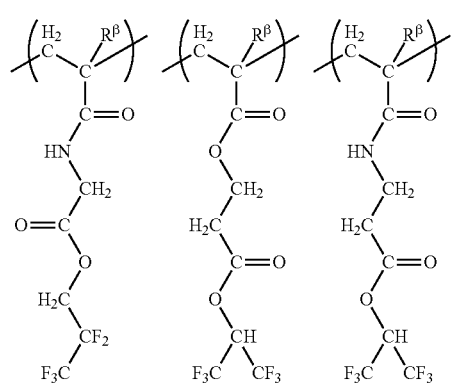
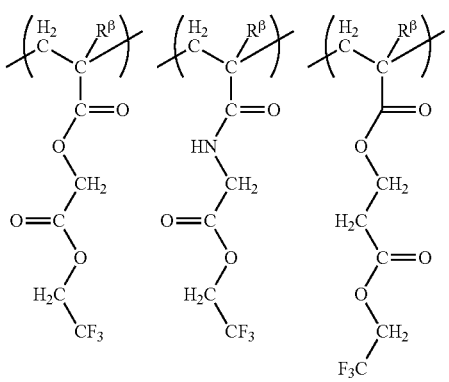
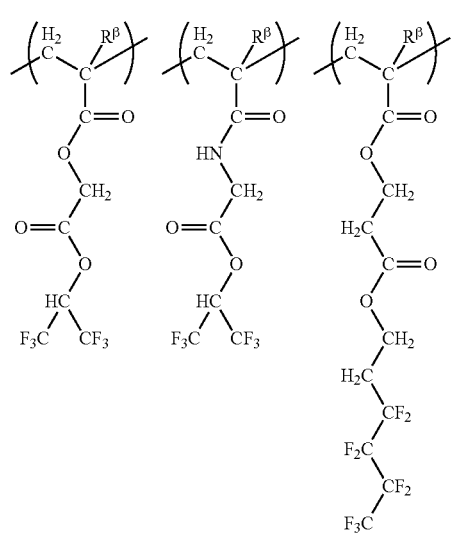
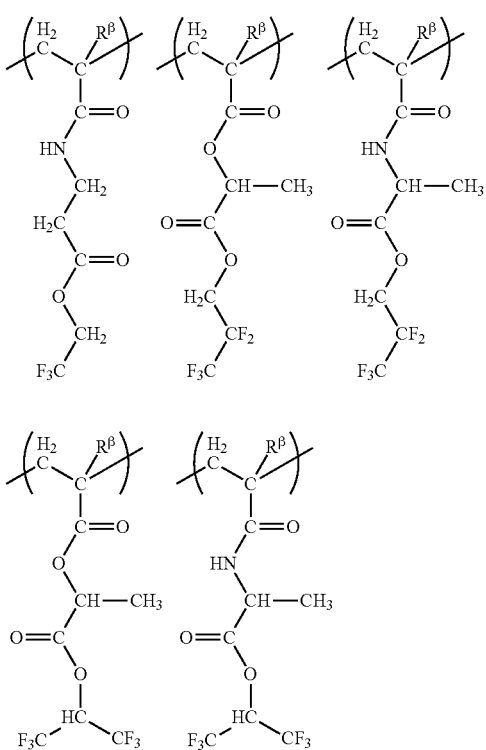

-continued
[Chemical Formula 89]
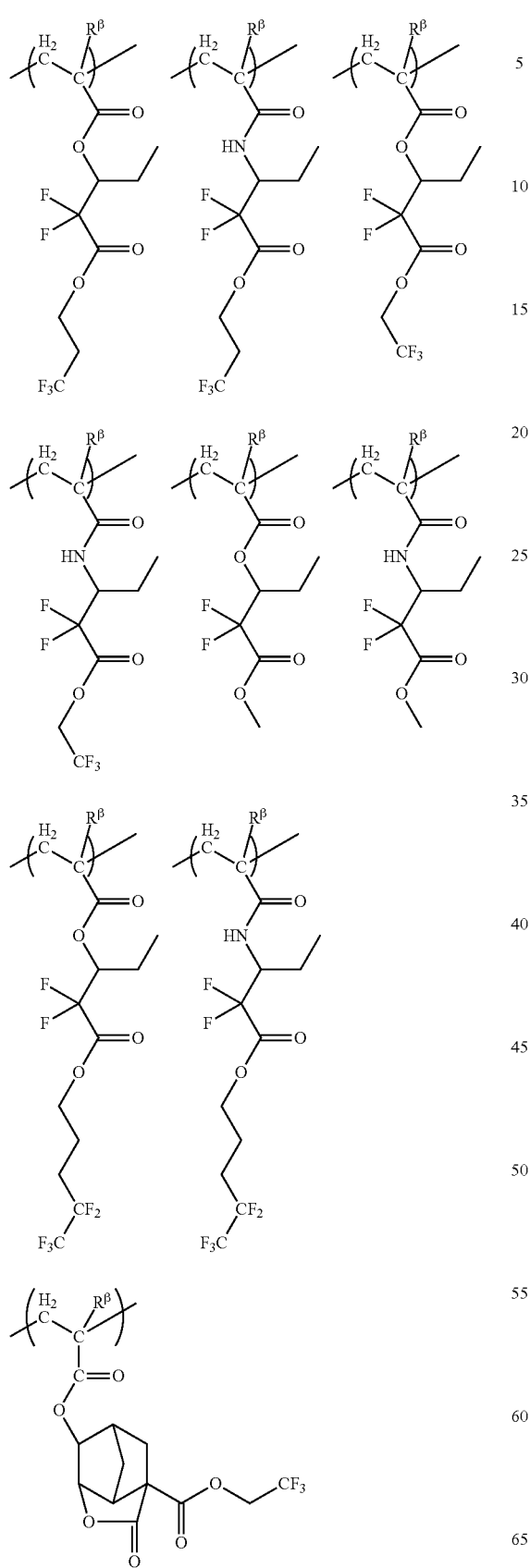
-continued
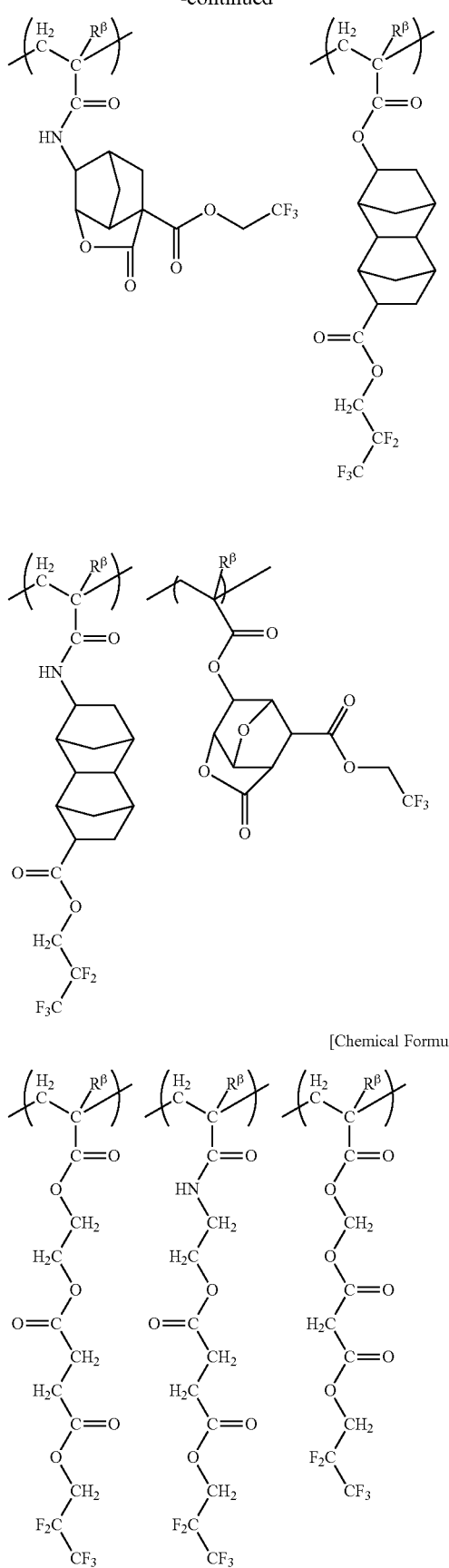
[Chemical Formula 90]

-continued
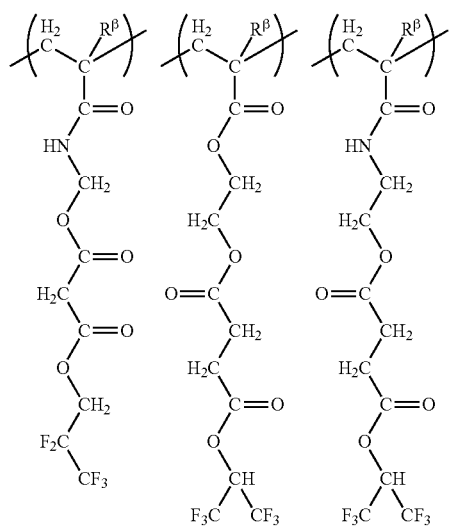
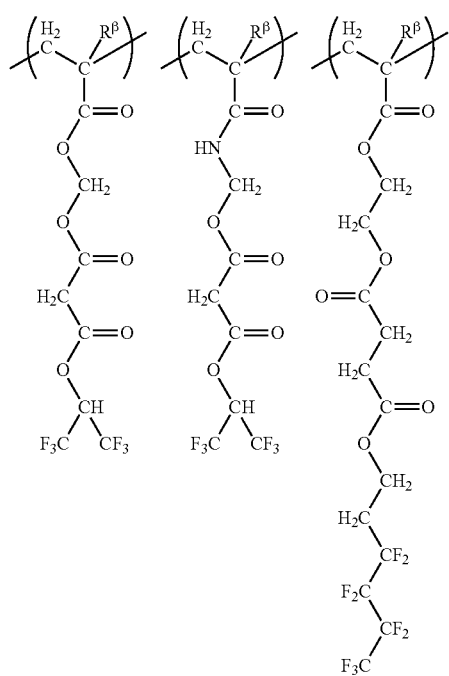
-continued
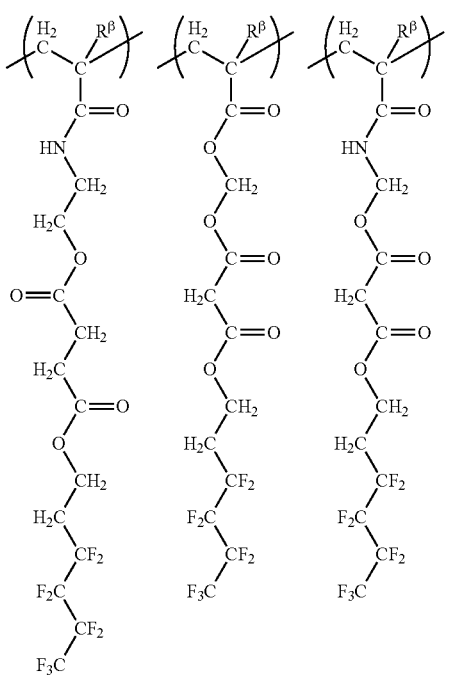
[Chemical Formula 91]
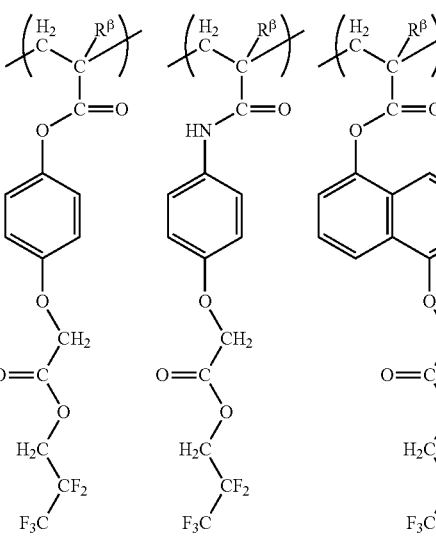

165
-continued
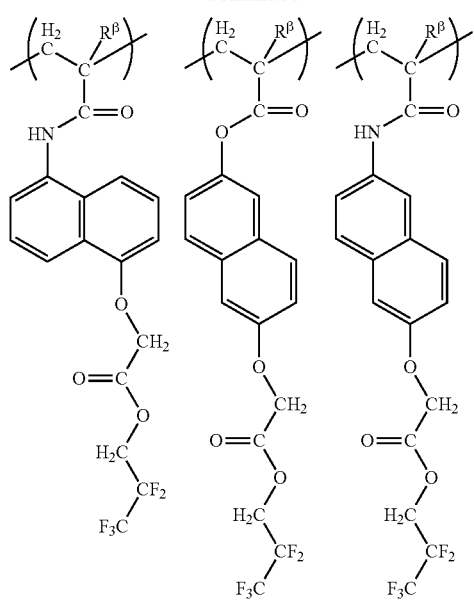
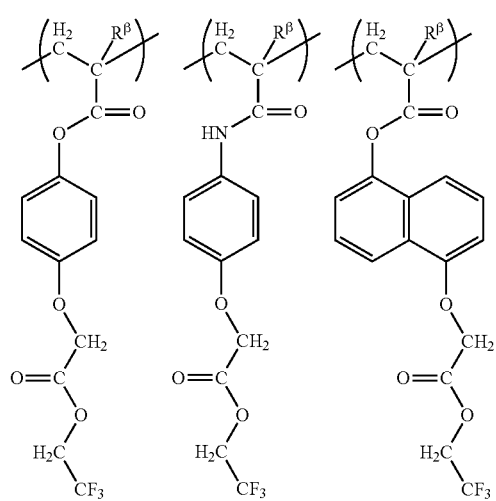
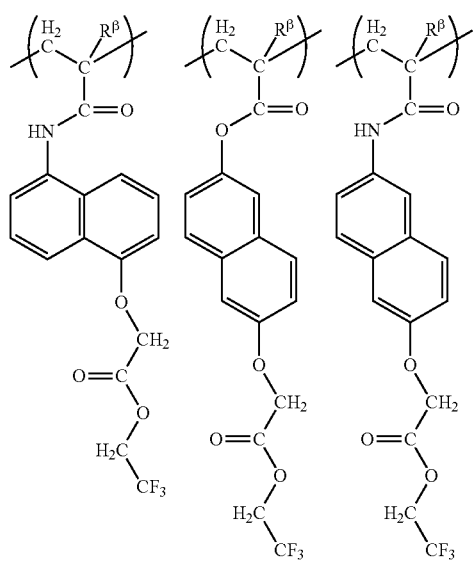
166
-continued
[Chemical Formula 92]
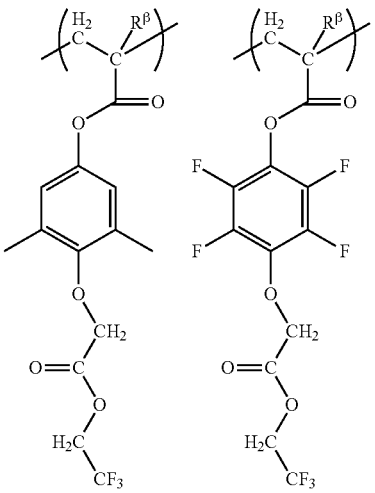
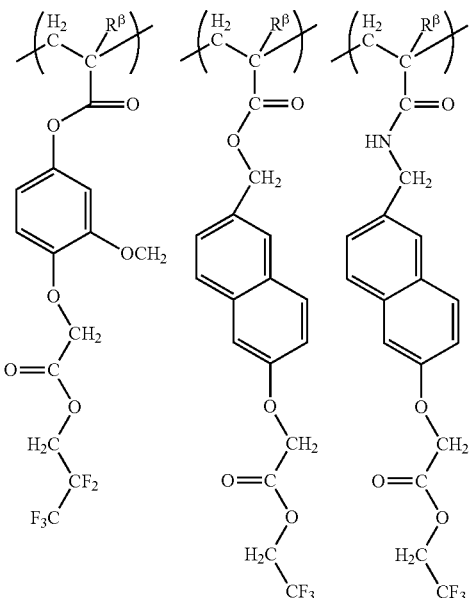

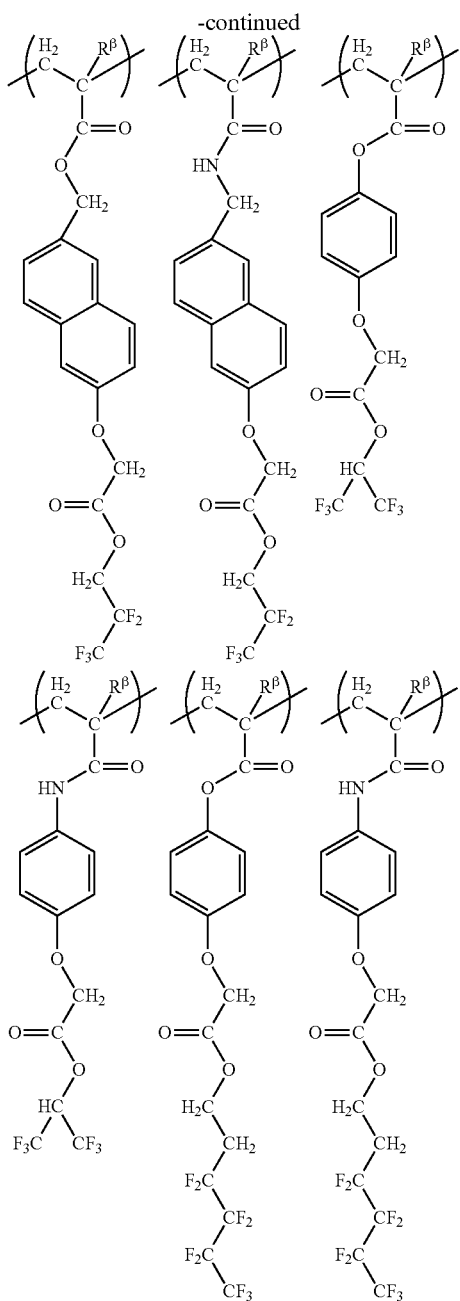

The structural unit (f1) containing a fluorine atom is preferably at least one selected from the group consisting of a structural unit represented by any one of formulas (f1-11) to (f1-15).

Of these, since an enhanced water repellency effect on the surface of a resist film can be achieved, a structural unit represented by formula (f1-13) or (f1-15) is more preferable, and most preferably a structural unit represented by formula (f1-15).

Among the structural unit (f1) represented by formula (f1-1), specific examples of preferred the structural unit (f1) contains a silicon atom include a silicon-containing structural unit in which $R_0$ in the aforementioned formula (f1-1) is an organic group containing a trialkylsilyl group or a siloxane bond. Here, the silicon-containing structural unit includes no acid decomposable group which exhibit increased polarity by the action of an acid.

As an example of the trialkylsilyl group, a group represented by formula —Si($R^{74}$)($R^{75}$)($R^{76}$) can be mentioned. In the formula, $R^{74}$ to $R^{76}$ each independently represent a linear or branched alkyl group. The alkyl group preferably has 1 to 10 carbon atoms, more preferably 1 to 8 carbon atoms, and still more preferably 1 to 5 carbon atoms. The alkyl group is preferably a methyl group, an ethyl group, an isopropyl group, a t-butyl group and the like, and a methyl group is particularly desirable.

Specific examples of the trialkylsilyl group include a trimethylsilyl group, a triethylsilyl group, a triisopropylsilyl group, and a t-butyldimethylsilyl group.

The organic group containing the trialkylsilyl group may be constituted of only a trialkylsilyl group, or may be a group in which n (n represents an integer of 1 or more) trialkylsilyl groups are bonded to a (n+1)-valent linking group. Among (n+1)-valent linking groups, examples of a linking group wherein n is 1, that is, a divalent linking group, include a divalent hydrocarbon group which may have a substituent and a divalent linking group containing a hetero atom, and the same divalent hydrocarbon groups which may have a substituent and divalent linking groups containing a hetero atom as those defined above for $Y^2$ in general formula (a1-0-2) can be used, provided that the divalent linking group for $X_0$ includes no acid decomposable group in the structure thereof. Such a divalent linking group is preferably a linear or branched alkylene group in which an ether bond or an ester bond may be inserted. As examples of a linking group wherein n represents 2 or more, a group in which (n-1) additional hydrogen atoms have been removed from the linking group within the divalent linking group can be mentioned.

Examples of the organic group containing a siloxane bond (Si—O—Si) include a cyclic siloxane in which a hydrocarbon group is bonded to a silicon atom, a polyhedral oligomeric silsesquioxane in which a hydrocarbon group is bonded to a silicon atom, and a group in which part of a carbon chain within a chain-like or cyclic alkyl group is substituted with —Si—O—Si—. The hydrocarbon group bonded to a silicon atom within the cyclic siloxane or the polyhedral oligomeric silsesquioxane may be an aliphatic hydrocarbon group or an aromatic group. The hydrocarbon group is preferably an aliphatic group, and more preferably an alkyl group of 1 to 5 carbon atoms.

As the structural unit (f1) containing a silicon atom, it is preferable that v is 1 and $X_0$ is a divalent linking group in formula (f1-1), or v is 0 and $X_0$ is a single bond in formula (f1-1).

In the polymer (F1), as the structural unit (f1), one type may be used alone, or two or more types may be used in combination.

In the polymer (F1), the amount of the structural unit (f1) based on the combined total amount of all structural units constituting the polymer (F1) is preferably 10 mol % or more, more preferably 30 mol % or more, still more preferably 50 mol % or more, and may even be 100 mol % (i.e., homopolymer). When the amount of the structural unit (f1) is at least as large as the lower limit of the above-mentioned range, in formation of a resist pattern, it is possible that surface of a resist film satisfactorily becomes water repellency and excellent resist patterns are formed in the immersion exposure.

When the polymer (F1) includes a structural unit other than the structural unit (f1), the amount of the structural unit (f1) is preferably 95 mol % or less, and more preferably 85 mol % or less.

[Other Structural Units]

The polymer (F1) may also have a structural unit other than the structural unit (f1), depending on an application, as long as the effects of the present invention are not impaired.

As the other structural unit, any structural unit which is copolymerizable with the structural unit (f1) can be used without any particular limitation, and any of the multitude of conventional structural units used within resist resins for ArF excimer lasers, KrF excimer lasers, EB or EUV can be used. Examples of the other structural unit include the same as those of the structural units (a0), (a2) to (a6) in the aforementioned component (A). Among these, a structural unit which does not contain a fluorine atom, a silicon atom or an acid decomposable group may be appropriately selected for use.

Among the aforementioned examples, the component (F1) is preferably a polymer including the structural unit (f1), more preferably a homopolymer composed of the repeated structure of the structural unit (f1), and most preferably a homopolymer composed of the repeated structure of the structural unit (f1) containing a fluorine atom. In such a case, the homopolymer may be composed of the repeated structure of the single structural unit (f1), or may be composed of the repeated structure of two or more types. The homopolymer is preferably composed of the repeated structure of the single structural unit (f1).

As another aspect of the component (F), for example, a fluorine-containing polymeric compound described in Japanese Unexamined Patent Application, First Publication No. 2010-002870 can be used.

As specific examples of another aspect of the component (F), a polymer having a structural unit (f1-1B) represented by general formula (f1-1B) shown below can be used. The polymer is preferably a polymer (homopolymer) consisting of a structural unit (f1-1B) shown below; a copolymer of a structural unit represented by formula (f1-1B) shown below and the aforementioned structural unit (a1); or a copolymer of a structural unit represented by formula (f1-1B) shown below, a structural unit derived from acrylic acid or methacrylic acid and the aforementioned structural unit (a1). As the structural unit (a1) to be copolymerized with a structural unit represented by the formula (f1-1B) shown below, a structural unit represented by the formulas (a1-0-11) to (a1-0-13) is preferable, and a structural unit represented by the formula (a1-1-32) is particularly desirable.

[Chemical Formula 93]

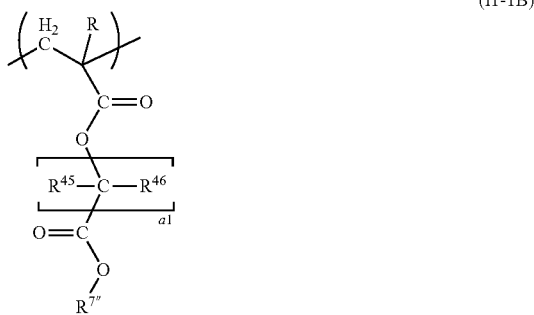

(f1-1B)

In the formula, R is the same as defined above; each of $R^{45}$ and $R^{46}$ independently represents a hydrogen atom, a halogen atom, an alkyl group of 1 to 5 carbon atoms or a halogenated alkyl group of 1 to 5 carbon atoms, provided that the plurality of $R^{45}$ to $R^{46}$ may be the same or different from each other; a1 represents an integer of 1 to 5; and $R^{7''}$ represents an organic group containing a fluorine atom.

In the formula (f1-1B), R is the same as defined above, and is preferably a hydrogen atom or a methyl group.

Examples of the halogen atom for $R^{45}$ and $R^{46}$ in the formula (f1-1B) include a fluorine atom, a chlorine atom, a bromine atom and an iodine atom, and a fluorine atom is particularly desirable. Examples of the alkyl group of 1 to 5 carbon atoms for $R^{45}$ and $R^{46}$ include the same alkyl group of 1 to 5 carbon atoms as those defined above for the aforementioned R, and a methyl group or an ethyl group is preferable. Specific examples of the halogenated alkyl group of 1 to 5 carbon atoms for $R^{45}$ or $R^{46}$ include groups in which part or all of the hydrogen atoms of the aforementioned alkyl groups of 1 to 5 carbon atoms have been substituted with halogen atoms. Examples of the halogen atom include a fluorine atom, chlorine atom, bromine atom and iodine atom, and a fluorine atom is particularly desirable. Among these, $R^{45}$ and $R^{46}$ are preferably a hydrogen atom, a fluorine atom or an alkyl group of 1 to 5 carbon atoms, and more preferably a hydrogen atom, a fluorine atom, a methyl group or an ethyl group.

In formula (f1-1B), a1 represents an integer of 1 to 5, preferably an integer of 1 to 3, and more preferably 1 or 2.

In formula (f1-1B), $R^{7''}$ represents an organic group containing a fluorine atom, and is preferably a hydrocarbon group containing a fluorine atom.

The hydrocarbon group containing a fluorine atom may be linear, branched or cyclic, and preferably has 1 to 20 carbon atoms, more preferably 1 to 15 carbon atoms, and particularly preferably 1 to 10 carbon atoms.

The hydrocarbon group having a fluorine atom preferably has 25% or more of the hydrogen atoms within the hydrocarbon group fluorinated, more preferably 50% or more, and most preferably 60% or more, as the hydrophobicity of the resist film during immersion exposure is enhanced.

As $R^{7''}$, a fluorinated hydrocarbon group of 1 to 5 carbon atoms is particularly preferable, and most preferably methyl group, $-CH_2-CF_3$, $-CH_2-CF_2-CF_3$, $-CH(CF_3)_2$, $-CH_2-CH_2-CF_3$ and $-CH_2-CH_2-CF_2-CF_2-CF_2-CF_3$.

The weight average molecular weight (Mw) (the polystyrene equivalent value determined by gel permeation chromatography (GPC)) of the component (F1) is not particularly limited, but is preferably 1,000 to 80,000, more preferably 5,000 to 60,000, and most preferably 10,000 to 50,000. Further, the weight average molecular weight (Mw) of the component (F) is preferably 1,000 to 50,000, more preferably 5,000 to 40,000, and most preferably 10,000 to 30,000. When the weight average molecular weight is not more than the upper limit of the above range, the component (F) exhibits satisfactory solubility in a resist solvent when used in a resist composition. On the other hand, when the weight average molecular weight is at least as large as the lower limit of the above range, the dry etching resistance and the cross-sectional shape of the resist pattern are improved.

The dispersity (Mw/Mn) of the component (F1) is not particularly limited, but is preferably 1.0 to 5.0, more preferably 1.0 to 3.0, and most preferably 1.0 to 2.5. Further, the dispersity (Mw/Mn) of the component (F) is preferably 1.0 to 5.0, more preferably 1.0 to 3.0, and most preferably 1.2 to 2.5. Here, Mn represents the number-average molecular weight.

The component (F1) can be obtained, for example, by a conventional radical polymerization or the like of the monomers corresponding to the structural units contained therein, using a radical polymerization initiator such as azobisisobutyronitrile (AIBN).

Furthermore, in the component (F1), by using a chain transfer agent such as HS—CH$_2$—CH$_2$—CH$_2$—C(CF$_3$)$_2$—OH, a —C(CF$_3$)$_2$—OH group can be introduced at the terminals of the component (F1). This type of copolymer having an introduced hydroxyalkyl group in which part of the hydrogen atoms of the alkyl group have been substituted with fluorine atoms is effective in reducing developing defects and line edge roughness (LER: unevenness in the side walls of a line pattern).

Compound (F11)

The component (F11) is a compound (provided that a compound which does not contain an acid decomposable group which exhibits increased polarity by the action of acid) represented by general formula (f11-1) shown below.

[Chemical Formula 94]

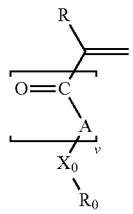

(f11-1)

In the formula, R represents a hydrogen atom, an alkyl group of 1 to 5 carbon atoms or a halogenated alkyl group of 1 to 5 carbon atoms; A represents —O— or —NH—; X$_0$ represents a single bond or a divalent linking group; R$_0$ represents an organic group; at least one of X$_0$ and R$_0$ contains a fluorine atom or a silicon atom; and v is 0 or 1.

In general formula (f11-1), R, A, R$_0$, X$_0$ and v is the same as R, A, R$_0$, X$_0$ and v described above in the aforementioned general formula (f1-1), respectively.

Specific examples of the compound represented by general formula (f11-1) and containing a fluorine atom include monomers providing structural units represented by the aforementioned general formulas (f1-11) to (f1-15).

Of these, since the enhanced water repellency effect on the surface of a resist film can be achieved, a monomer providing structural units represented by formula (f1-13) or (f1-15) is preferable.

Examples thereof include a monomer providing specific examples of the structural units represented by formulas (f1-11) to (f1-15) described above.

Specific examples of the compound represented by general formula (f11-1) and containing a silicon atom include a silicon-containing compound including an organic group containing a trialkylsilyl group or a siloxane bond.

Of these, a monomer providing a silicon-containing structural unit in which R$_0$ in the aforementioned formula (f1-1) is an organic group containing a trialkylsilyl group or a siloxane bond is preferable.

As the component (F), one type of organic compound may be used alone, or two or more types of organic compounds may be used in combination.

Among these, since an enhanced water repellency effect on the surface of a resist film, reduced defects, and excellent shape of the resist pattern can be achieved, it is preferable that the component (F) include the polymer having a structural unit represented by the aforementioned general formula (f1-1), or the compound represented by general formula (f11-1).

In the resist composition, the amount of the component (F), relative to 100 parts by weight of the component (A) is preferably from 0.1 to 20 parts by weight, more preferably from 0.5 to 10 parts by weight, and most preferably from 1 to 5 parts by weight.

When the amount of the component (F) is at least as large as the lower limit of the above-mentioned range, the surface of a resist film exhibits excellent water repellency, and effect of improving properties of resist patterns formed in the resolution limit becomes excellent. On the other hand, when the amount of the component (F) is no more than the upper limit of the above-mentioned range, shape of the resist pattern and lithography properties become excellent.

Amine; Component (D)

In the resist composition of an aspect according to the present invention, an amine (D) (hereafter referred to as "component (D)") may be added to the resist composition.

When the resist composition contains the component (G) as an acid supply component, in the resist composition liquid, the solubility of the component (A) in the alkali developing solution is likely to be increased by the action of the component (G). The occurrence of this phenomenon can be suppressed by controlling the acidity of the component (G) at an appropriate level, and also can be suppressed by adding the component (D) to reduce the acidity of the component (G) in the resist composition liquid. When the component (D) is used, it is preferable that raw materials such as the component (G) can be freely selected.

In addition, during storage of the resist composition, by virtue of the component (D), the storage stability after preparation of the resist composition liquid can be enhanced. Furthermore, by removing the component (D) from the resist film before neutralization in the step (3), lithography properties and pattern shape become particularly excellent, because the neutralization of base generated from the component (C) with the acid derived from the component (Z) in the step (3) is not suppressed by the component (D).

A multitude of these components (D) have already been proposed, and any of these known compounds may be used. It is particularly desirable that the pKa of the component (D) is equal to or less than the pKa of the cation moiety of the aforementioned component (G1). That is, the pKa of the component (D) is preferably 7 or less, and more preferably 6 or less.

When the resist composition contains the component (G1), it is more preferable that the pKa of the component (D) is less than or equal to the pKa of the cation moiety of the component (G1) so as to prevent a cation of the component (G1) from being exchanged with the component (D).

When the resist composition contains the component (G2), it is desirable that the basicity of the component (D) is low enough to suppress the extreme acidity deterioration of the component (G2), and the pKa of the component (D) is preferably 7 or less, and more preferably 6 or less.

As the component (D) which satisfies the above pKa, an amine in which one of "H$^+$" bonded to an nitrogen atom (N) has been removed from an amine represented by the formula (G1c-1) described in relation to the component (G1) can be mentioned. Specifically, a compound in which "NH$_3^+$" at the terminal of the specific examples of the compounds represented by the formulas (G1c-11) and (G1c-13) has been replaced by "NH$_2$"; and a compound in which "NH$^+$" within the ring in the specific examples of the compounds represented by the formula (G1c-12) has been replaced by "N" are preferable.

In addition, it is desirable that the component (D) is an amine having a relatively low boiling point. By virtue of the amines having a relatively low boiling point, when coating and forming a resist film in the step (1), when conducting a baking (PEB) before neutralization in the step (3), or when conducting a prebake (PAB) which can be arbitrarily conducted after the step (1) and before the exposure in the step (2), the component (D) can be removed from the resist film. The component (D) exists while the resist composition is stored, and the component (D) can be removed from the resist film before neutralization in the step (3). Accordingly, while enhancing the storage stability of the resist composition after preparation of the resist composition liquid, neutralizing the base generated from the component (C) in the step (3) and the component (G) is never prevented by the component (D). Therefore, particularly excellent lithography properties and shape of the resist pattern can be obtained.

As the component (D) which satisfies the above boiling point, an amine having a boiling point of 130° C. or lower is preferable, and an amine having a boiling point of 100° C. or lower is more preferable, and an amine having a boiling point of 90° C. or lower is particularly preferable.

Specific examples of the component (D) which satisfies the above pKa and boiling point, aliphatic amine compounds having a fluorinated alkyl group such as trifluoroethylamine (2,2,2-trifluoroethylamine), pentafluoropropylamine (2,2,3,3,3-pentafluoropropylamine), heptafluorobutylamine (1H,1H-heptafluorobutylamine), nonafluoropentylamine (1H,1H-nonafluoropentylamine), undecafluorohexylamine (1H,1H-undecafluorohexylamine), bis(2,2,2-trifluoroethyl)amine, bis(2,2,3,3,3-pentafluoropropyl)amine, and 1-(2,2,2-trifluoroethyl)pyrrolidine; pyridine-based compound such as pyridine and pentafluoropyridine; and oxazole-based compound such as oxazole and isoxazole.

The resist composition according to the third aspect of the present invention includes an amine as the component (D), and the amount of the amine is 1 mol or more, per 1 mol of the component (G).

The resist composition of the present invention includes the component (G) which exhibits acidity by itself as an essential component. Hence, a problem arises in that if the resist composition is stored after preparation thereof, the solubility of the component (A) in the alkali developing solution is increased by the action of the component (G) within the resist composition before forming a resist pattern. In the resist composition according to the third aspect of the present invention, since one mol or more of the component (D) is used per 1 mol of the component (G), it is possible that the acidity of the component (G) is reduced in the resist composition to enhance the storage stability of the resist composition.

A multitude of these components (D) have already been proposed, and any of these known compounds may be used.

As such an amine, an amine represented by general formula (D-1) shown below can be given.

[Chemical Formula 95]

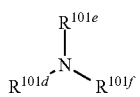
(D-1)

In the formula, $R^{101d}$, $R^{101e}$ and $R^{101f}$ are the same as $R^{101d}$, $R^{101e}$ and $R^{101f}$ in the aforementioned general formula (G1c-1).

In the formula (D-1), the alkyl group for $R^{101d}$ to $R^{101f}$ includes the same alkyl groups as those described in the aforementioned general formula (G1c-1). The alkyl group for $R^{101d}$ to $R^{101f}$ preferably has 1 to 10 carbon atoms, and more preferably 2 to 6 carbon atoms.

An alkenyl group, an oxoalkyl group, an oxoalkenyl group, an aryl group, an arylalkyl group, an aralkyl group and an aryloxoalkyl group for $R^{101d}$ to $R^{101f}$ is the same as defined above in the aforementioned general formula (G1c-1).

The hydrogen atoms within the alkyl group, the alkenyl group, the oxoalkyl group, the oxoalkenyl group, the aryl group, the arylalkyl group, the aralkyl group and the aryloxoalkyl group for $R^{101d}$ to $R^{101f}$ may or may not be substituted with a halogen atom such as a fluorine atom, an alkoxy group or a sulfur atom.

As an example in the case that $R^{101d}$ to $R^{101f}$ has the substituent, primary, secondary and tertiary amines can be used.

The primary amine or the secondary amine is preferable in terms of their weak basicity.

Monoalkylamines such as ethylamine (17° C.), propylamine (48° C.), butylamine (78° C.), n-pentylamine (104° C.), n-hexylamine (130° C.) and n-heptylamine (155° C.), or mono(fluorinated)alkylamines in which part of the hydrogen atoms bonded to the second or later position of carbon atoms in the alkyl groups are fluorinated such as trifluoroethylamine (36° C.), pentafluoropropylamine (50° C.), heptafluorobutylamine (70° C.), nonafluoropentylamine (87° C.) and undecafluorohexylamine (107° C.);

dialkylamines such as diethylamine (55° C.), di-n-propylamine (110° C.), di-n-heptylamine (148° C.) and dicyclohexylamine (134° C.), or di(fluorinated)alkylamines in which part of the hydrogen atoms bonded to the second or later position of carbon atoms in the alkyl groups is fluorinated such as bis(trifluoroethyl)amine (81° C.) and bis(pentafluoropropyl)amine (103° C.);

primary or secondary (substituted) aromatic amines such as aniline (184° C.), methylphenylamine (195° C.), 2-methoxy-N-methylaniline (115° C.), m-methoxyaniline (80° C.) and methylaniline (199 to 203° C.) are more preferable.

Further, $R^{101d}$ and $R^{101e}$, or $R^{101d}$, $R^{101e}$ and $R^{101f}$ may be mutually bonded to form a ring with the nitrogen atom. Examples of the formed ring include a pyrrolidine ring, a piperidine ring, a hexamethylene imine ring, an azole ring, a pyridine ring, a pyrimidine ring, an azepine ring, a pyrazine ring, a quinoline ring and a benzoquinoline ring.

Further, the ring may contain an oxygen atom in the ring skeleton thereof, and specific examples of preferable rings which contain an oxygen atom include an oxazole ring and an isooxazole ring.

When $R^{101d}$ to $R^{101f}$ form a cyclic amine, specific examples include:

aliphatic monocyclic amines such as piperidine, piperazine, pyrrolidine and 1-(2,2,2-trifluoroethyl)pyrrolidine;

aliphatic polycyclic amines such as 1,5-diazabicyclo[4.3.0]-5-nonene, 1,8-diazabicyclo[5.4.0]-7-undecene, hexamethylenetetramine and 1,4-diazabicyclo[2.2.2]octane;

hetero condensed ring-based cyclic amines such as pyridine, pentafluoropyridine, pyridazine, pyrimidine, pyrazine, oxazole and isooxazole.

The hetero condensed ring-based cyclic amine is preferable, in terms of their weak basicity.

Of these, the component (D) is preferably an amine having a relatively low boiling point, because excellent lithography properties can further be obtained in addition of the effects of the present invention.

By virtue of the amines having a relatively low boiling point, when coating and forming a resist film in the step (1), when conducting a baking (PEB) before neutralization in the step (3), or when conducting a prebake (PAB) which can be arbitrarily conducted after the step (1) and before the exposure in the step (2), the component (D) can be removed from the resist film. The component (D) exists while the resist composition is stored, and the component (D) can be removed from the resist film before neutralization in the step (3). Accordingly, while enhancing the storage stability of the resist composition after preparation of the resist composition liquid, neutralizing the base generated from the component (C) in the step (3) and the component (G) is never prevented by the component (D). Therefore, particularly excellent lithography properties and shape of the resist pattern can be obtained.

Specifically, an amine having a boiling point of 130° C. or lower is preferable, and an amine having a boiling point of 100° C. or lower is more preferable, and an amine having a boiling point of 90° C. or lower is particularly preferable.

Further, as the component (D) in the third aspect of the present invention, an amine having relatively weak basicity is preferable. Specifically, an amine having a pKa of −2 to 7 is preferable, more preferably a pKa of −1 to 6, and still more preferably a pKa of 0 to 6.

When the pKa of the component (D) is at least as large as the lower limit of the above-mentioned range, deterioration of the storage stability caused by the resist liquid being excessively acidic due to the component (G1) or the component (G2) can be prevented.

On the other hand, when the pKa of the component (D) is no more than the upper limit of the above-mentioned range, the resist composition exhibits weak basicity. Accordingly, deactivation of an acid at an unexposed portion can be prevented. Further, in the case where the component (G) includes the component (G1), the cation of the component (G1) and the component (D) can be prevented from being exchanged.

Preferable examples thereof include:

(1) an amine in which at least one of $R^{101d}$ to $R^{101f}$ is an alkenyl group, an oxoalkyl group, an oxoalkenyl group, an aryl group, an aralkyl group and an aryloxoalkyl group in the aforementioned formula (D-1);

(2) an amine in which at least one of $R^{101d}$ to $R^{101f}$ is an alkyl group wherein the hydrogen atoms of the alkyl group is substituted with a halogen atom such as a fluorine atom, an alkoxy group or a sulfur atom in the aforementioned formula (D-1);

(3) a cyclic amine in which $R^{101d}$ to $R^{101f}$ form a condensed ring with the nitrogen atom, or which contains an oxygen atom in the ring skeleton of the condensed ring.

In the case of (1) or (2), a primary or a secondary amine is more preferable, and still more preferably an amine compound in which a hydrogen atom has been removed from an ammonium cation in the aforementioned formula (G1c-11) or (G1c-11).

Specific examples of particularly preferable component (D) include:

aliphatic amine compounds having a fluorinated alkyl group such as trifluoroethylamine (2,2,2-trifluoroethylamine), pentafluoropropylamine (2,2,3,3,3-pentafluoropropylamine), heptafluorobutylamine (1H,1H-heptafluorobutylamine), nonafluoropentylamine (1H,1H-nonafluoropentylamine), undecafluorohexylamine (1H,1H-undecafluorohexylamine), bis uoroethyl)amine, bis(2,2,3,3,3-pentafluoropropyl)amine, and 1-(2,2,2-trifluoroethyl)pyrrolidine;

pyridine-based compounds such as pyridine and pentafluoropyridine; and oxazole-based compounds such as oxazole and isoxazole.

As the component (D), one type of compound may be used alone, or two or more types of compounds may be used in combination.

In the resist composition according to the third aspect of the present invention, the amount of the component (D) is 1 mol or more, per 1 mol of the component (G), preferably 1 to 10 mol per 1 mol of the component (G), more preferably 1 to S mol per 1 mol of the component (G), and still more preferably 1 to 5 per 1 mol of the component (G). When the amount of the component (D) is 1 mol or more, per 1 mol of the component (G), it is possible that acidity is reduced within the resist liquid to enhance the storage stability of the resist composition. On the other hand, when the amount of the component (D) is 10 mol or less, per 1 mol of the component (G), increasing the solubility of the component (A) at unexposed portions in the alkali developing solution by the component (G) excellently proceeds. Therefore, lithography properties become particularly excellent.

When an aspect of the resist composition according to the present invention contains the component (D), the amount of the component (D) relative to 100 parts by weight of the component (A) is preferably within a range from 0.01 to 20.0 parts by weight, more preferably from 1 to 15 parts by weight, and particularly preferably from 2 to 10 parts by weight. Further, in the resist composition according to the third aspect of the present invention, the amount of the component (D) relative to 100 parts by weight of the component (A) is preferably within a range from 0.5 to 30 parts by weight, more preferably from 1 to 25 parts by weight, still more preferably from 1.5 to 20 parts by weight, and particularly preferably from 2 to 15 parts by weight. By ensuring the above-mentioned range, the storage stability is improved, and lithography properties and resist pattern shape are also improved.

Other Components

The resist composition of the present invention may include a component other than the component described above, for example, an acid amplifier component or the like.

Acid Amplifier Component; Component (H)

The resist composition of the present invention may further contain an acid amplifier component (H) (hereafter, referred to as "component (H)") as optional components. In the present invention, the component (H) is decomposed by an acid to generate a free acid, and the free acid further decomposes the component (H) to further generate free acid. In this manner, by the action of acid, the component (H) is serially decomposed, and generates many free acid molecules.

The component (H) is not particularly limited, as long as it is decomposable by the action of an acid, and is capable of further generating acid to self-catalytically amplify acid. Preferable examples of the component (H) include compounds having a bridged-carbon ring skeleton structure.

Here, the term "compound having a bridged-carbon ring skeleton structure" refers to a compound which has a structure of a bridging bond formed by a plurality of carbon rings in a molecule thereof.

By virtue of the compound having a bridged-carbon ring skeleton structure having a bridging bond, the molecule becomes rigid, and the thermal stability of the compound is improved.

The number of carbon rings is preferably from 2 to 6, and more preferably 2 or 3.

The bridged carbon ring may have part or all of the hydrogen atoms substituted with an alkyl group, an alkoxy group or the like. The alkyl group preferably has 1 to 6 carbon atoms, more preferably 1 to 3, and specific examples of the alkyl group include a methyl group, an ethyl group and a propyl group. The alkoxy group preferably has 1 to 6 carbon atoms, more preferably 1 to 3, and specific examples of the alkoxy group include a methoxy group and an ethoxy group. The bridged carbon ring may have an unsaturated bond such as a double bond.

In the present invention, it is most preferable that the bridged carbon has, on the ring thereof, a hydroxy group and a sulfonate group represented by general formula (Hs) shown below bonded to the carbon atom adjacent to the carbon atom having the hydroxy group bonded thereto.

[Chemical Formula 96]

$$—OSO_2—R^0 \quad (Hs)$$

In the formula, $R^0$ represents an aliphatic group, an aromatic group or a heterocyclic group.

In the aforementioned formula (Hs), $R^0$ represents an aliphatic group, an aromatic group or a heterocyclic group.

Examples of the aliphatic group for $R^0$ include a chain-like or cyclic alkyl group or an alkenyl group, and preferably has 1 to 12 carbon atoms, more preferably 1 to 10 carbon atoms.

The aromatic group may be either a monocyclic group or a polycyclic group, and specific examples thereof include aryl groups.

The heterocyclic group may be a monocyclic group or a polycyclic group, and specific examples thereof include groups which are derived from various conventional heterocyclic compounds.

The aforementioned aliphatic group, aromatic group and heterocyclic group may have a substituent, and examples of the substituent include a halogen atom, an alkyl group, an alkoxy group, an amino group, a substituted amino group and an oxygen atom (=O).

Specific examples of the aforementioned aliphatic group and the aromatic group include a methyl group, an ethyl group, a propyl group, a butyl group, an acyl group, a hexyl group, a vinyl group, a propylene group, an allyl group, a cyclohexyl group, a cyclooctyl group, a bicyclohydrocarbon group, a tricyclohydrocarbon group, a phenyl group, a tolyl group, a benzyl group, a phenethyl group, a naphthyl group, a naphthylmethyl group, and substitution products thereof.

Examples of the heterocyclic group include groups derived from various heterocyclic groups, such as a 5-membered ring compound containing one hetero atom or a condensed ring compound thereof (e.g., furan, thiophene, pyrrole, benzofuran, thionaphthene, indole or carbazole); a 5-membered ring compound containing two hetero atoms or a condensed ring compound thereof (e.g., oxazole, thiazole or pyrazole); a 6-membered ring compound containing one hetero atom or a condensed ring compound thereof (e.g., pyran, pyrone, coumarin, pyridine, quinoline, isoquinoline or acridine); and a 6-membered ring compound containing two hetero atoms or a condensed ring compound thereof (e.g., pyridazine, pyrimidine, pyrazine or phthalazine).

In the present invention, when the component (H) has, on the bridged carbon ring, a hydroxy group and a sulfonate group represented by the aforementioned general formula (Hs), such a component (H) is decomposed by the action of an acid to generate a new acid ($R^0SO_3H$).

In this manner, one acid increases in one reaction, and the reaction is accelerated as the reaction proceeds, thereby serially decomposing the component (H).

In such a case, the strength of the generated acid in terms of the acid dissociation constant (pKa) is preferably 3 or less, and most preferably 2 or less. When the pKa is 3 or less, the generated acid itself is likely to induce the self-decomposition. On the other hand, when the generated acid has a weaker strength, it becomes difficult to induce the self-decomposition.

Examples of the free acid ($R^0SO_3H$) generated by the above reaction include methanesulfonic acid, ethanesulfonic acid, propanesulfonic acid, butanesulfonic acid, pentanesulfonic acid, hexanesulfonic acid, heptanesulfonic acid, octanesulfonic acid, cyclohexanesulfonic acid, camphorsulfonic acid, trifluoromethanesulfonic acid, 2,2,2-trifluoroethanesulfonic acid, benzenesulfonic acid, p-toluenesulfonic acid, p-bromobenzenesulfonic acid, p-nitrobenzenesulfonic acid, 2-thiophenesulfonic acid, 1-naphthalenesulfonic acid and 2-naphthalenesulfonic acid.

Specific examples of the component (H)) include compounds represented by general formulae (H1) to (H4) shown below (hereafter, the compounds corresponding to general formulae are respectively referred to as "compounds (H1) to (H4)").

[Chemical Formula 97]

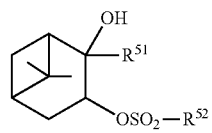
(H1)

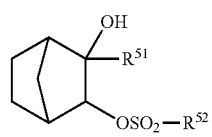
(H2)

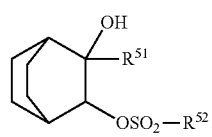
(H3)

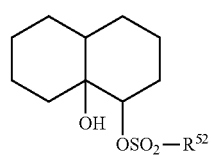
(H4)

In the formulae, $R^{51}$ represents a hydrogen atom, an aliphatic group or an aromatic group; and $R^{52}$ represents an aliphatic group, an aromatic group or a heterocyclic group.

In the aforementioned general formulae (H1) to (H3), $R^{51}$ represents a hydrogen atom, an aliphatic group or an aromatic group. The aliphatic group and the aromatic group for $R^{51}$ is the same as defined for the aliphatic group and the aromatic group for the aforementioned $R^0$. As $R^{51}$, an aliphatic group or an aromatic group is preferable, an aliphatic group is more preferable, a lower (1 to 5 carbon atoms) alkyl group is still more preferable, and a methyl group is most preferable.

In the aforementioned general formulae (H1) to (H4), $R^{52}$ represents an aliphatic group, an aromatic group or a heterocyclic group, and is the same as defined for $R^0$. As $R^{52}$, an aliphatic group or an aromatic group is preferable, and an aliphatic group is more preferable.

With respect to the compounds (H1) to (H4), the compound (H1) has a bridge bond on the 1st and 3rd positions of the bicyclo compound, the compounds (H2) and (H3) has a bridge bond on the 1st and 4th positions of the bicyclo compound, and the compound (H4) has a bridge bond on the 1st and 6th positions of the bicyclo compound (decarine).

Therefore, in the compounds (H1) to (H4), the conformation change of the cyclohexane ring is greatly suppressed, and hence, the ring structure exhibits rigidity.

As the component (H), for example, a compound in which the bridged carbon has, on the ring thereof, a hydroxy group and a sulfonate group represented by general formula (Hs) bonded to the carbon atom adjacent to the carbon atom having the hydroxy group bonded thereto (such as the compounds (H1) to (H4)) can be readily synthesized by recting a diol compound with a halide of the sulfonic acid. The diol compound has two isomers, namely, cis-isomer and trans-isomer, but the cis-isomer is thermally stable, and is therefore preferably used. Further, such a compound can be stably stored as long as an acid does not coexist.

Specific examples of preferable component (H) are shown below.

[Chemical Formula 98]

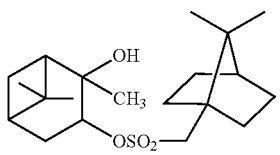
(H1-1)

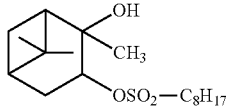
(H1-2)

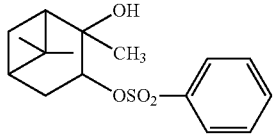
(H1-3)

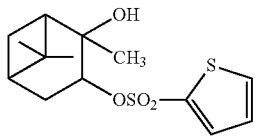
(H1-4)

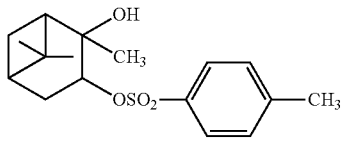
(H1-5)

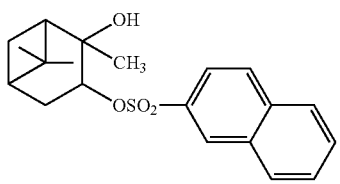
(H1-6)

[Chemical Formula 99]

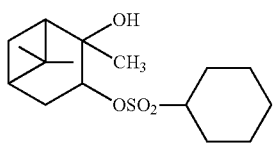
(H1-7)

-continued

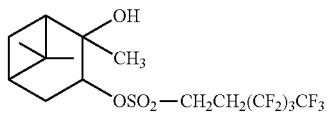
(H1-8)

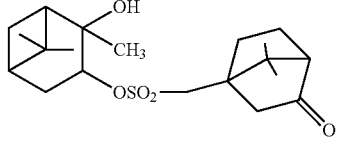
(H1-9)

[Chemical Formula 100]

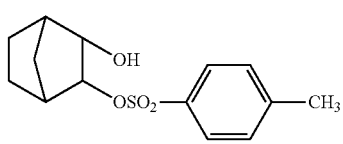
(H2-1)

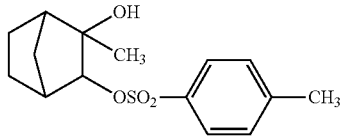
(H2-2)

Among these, as the component (H), in terms of effect of the present invention (resolution) and excellent lithography properties, the compounds (H1) and (H2) are preferable, and the compound (H1) is particularly preferred. More specifically, it is preferable to use at least one member selected from the group consisting of compounds represented by chemical formulae (H1-1) to (H1-9), and it is most preferable to use a compound represented by chemical formula (H1-9).

As the component (H), one type of compound may be used, or two or more types of compounds may be used in combination.

When the resist composition of the present invention contains the component (H), the amount of the component (H) relative to 100 parts by weight of the component (A) is preferably 0.1 to 30 parts by weight, and more preferably 1 to 20 parts by weight. When the amount of the component (H) is at least as large as the lower limit of the above-mentioned range, the resolution is improved. On the other hand, when the amount of the component (H) is no more than the upper limit of the above-mentioned range, the sensitivity is improved.

When the component (H) is used in combination with the component (G), the mixing ratio of the component (H) to the component (G) ((H)/(G)) in terms of molar ratio is preferably in the range of 9:1 to 1:9, more preferably in the range of 9:1 to 5:5, and particularly preferably 9:1 to 6:4. When the amount of the component (H) is at least as large as the lower limit of the above-mentioned range, the resolution can be enhanced. On the other hand, when the amount of the component (H) is no more than the upper limit of the above-mentioned range, the sensitivity becomes excellent.

In addition, when the component (H) is used in combination with the component (B), the mixing ratio of the component (H) to the component (B) ((H)/(B)) in terms of molar ratio is preferably in the range of 9:1 to 1:9, more preferably in the range of 9:1 to 5:5, and particularly preferably 9:1 to 6:4. When the amount of the component (H) is at least as large as the lower limit of the above-mentioned range, the resolution can be enhanced. On the other hand, when the amount of the component (H) is no more than the upper limit of the above-mentioned range, the sensitivity becomes excellent.

If desired, other miscible additives can also be added to the resist composition of the present invention. Examples of such miscible additives include additive resins for improving the performance of the resist film, surfactants for improving the applicability, dissolution inhibitors, plasticizers, stabilizers, colorants, halation prevention agents, dyes, sensitizers, and base amplifiers.

As the sensitizers, conventional sensitizers can be given. Specific examples of the conventional sensitizers include benzophenone-type sensitizers, such as benzophenone and p,p'-tetramethyldiaminobenzophenone; carbazole-type sensitizers; acetophen-type sensitizers; naphthalene-type sensitizers; phenol-type sensitizers; anthracene-type sensitizers, such as 9-ethoxyanthracene; biacetyl; eosin; rose bengal; pyrene; phenothiazine; and anthrone. In the resist composition, the amount of the sensitizer, relative to 100 parts by weight of the component (A) is preferably from 0.5 to 20 parts by weight.

A base amplifier is decomposed by the action of a base in a chain reaction, and is capable of generating a large amount of base using a small amount of base. Therefore, by blending a base amplifier, the sensitivity of the resist composition can be improved. As the base amplifier, for example, those described in Japanese Unexamined Patent Application, First Publication No. 2000-330270 and Japanese Unexamined Patent Application, First Publication No. 2008-174515 can be used.

Organic Solvent Component; Component (S)

In the present invention, the resist composition can be prepared by dissolving the materials for the resist composition in an organic solvent (hereafter, referred to as "component (S)").

The component (S) may be any organic solvent which can dissolve the respective components to give a uniform solution, and one or more kinds of any organic solvent can be appropriately selected from those which have been conventionally known as solvents for a chemically amplified resist.

Examples thereof include lactones such as γ-butyrolactone; ketones such as acetone, methylethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene.

These solvents can be used individually, or in combination as a mixed solvent.

Among these, PGMEA, PGME, cyclohexanone and EL are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2. For example, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably 3:7 to 7:3. Alternatively, when PGME and cyclohexanone is mixed as the polar solvent, the PGMEA:(PGME+cyclohexanone) weight ratio is preferably from 1:9 to 9:1, more preferably from 2:8 to 8:2, and still more preferably 3:7 to 7:3.

Further, as the component (S), a mixed solvent of γ-butyrolactone with PGMEA, EL or the aforementioned mixed solvent of PGMEA with a polar solvent, is also preferable. The mixing ratio (former:latter) of such a mixed solvent is preferably from 70:30 to 95:5.

The amount of the component (S) is not particularly limited, and is appropriately adjusted to a concentration which enables coating of a coating solution to a substrate, depending on the thickness of the coating film. In general, the organic solvent is used in an amount such that the solid content of the resist composition becomes within the range from 1 to 20% by weight, and preferably from 2 to 15% by weight.

The resist composition according to the first aspect of the present invention described above can satisfactorily be used for formation of the negative pattern in an alkali developing process and has excellent storage stability.

The resist composition includes a base component that exhibits increased solubility in an alkali developing solution under the action of acid, a photo-base generator component that generates a base upon exposure, an acid supply component and a compound (F) containing at least one selected from the group consisting of a fluorine atom and a silicon atom and containing no acid decomposable group which exhibits increased polarity by the action of acid.

The component (F) is readily segregated at the surface of the resist film in formation of a resist film. Therefore, usage of the component (F) can impart water repellency to the resist film formed.

Further, when the component (F) is used, with an object that an exposed portion is immediately dissolved and removed by a developing solution after development, a compound (F) into which is introduced an acid decomposable group is preferably used in an alkali developing process. In intensive studies by the present inventors, if an acid supply component is included in the resist composition containing a compound (F) into which is introduced an acid decomposable group, the solubility of the component (F) in an alkali developing solution is increased due to action of the acid supply component during the storage of the resist liquid after preparation of the resist composition. Accordingly, another problem arises in that the resist film is difficult to be imparted water repellency. Even though a resist pattern is formed using the resist composition deteriorated as described above, patterns having targeted dimensions can not be obtained or no pattern is obtained.

In the first aspect of the present invention, when the resist composition including a component (F) containing no acid decomposable group is used, the component (F) is not subjected to influence of the acid supply component during the storage of the resist liquid. Accordingly, patterns having targeted dimensions are stably formed, even after the resist composition is aged in the storage.

The resist composition of the present invention is suitable for a resist composition used in the step (1) of the method of forming a resist pattern including the steps (1) to (4) described later.

In addition, the resist film formed using the resist composition of the present invention including the compound (F) exhibit enhanced water repellency as compared to a resist film formed using a resist composition which does not include the component (F).

Particularly in the immersion exposure process, the resist film is not subjected to influence of an immersion medium such as water, it is preferable that the resist film have enhanced hydrophobicity. Further, since the resist film formed using the resist composition of the present invention exhibits enhanced hydrophobicity during the immersion exposure as compared with a conventional resist composition, for example, in the immersion exposure, the resist film exhibits extremely excellent water tracking ability required in the case of conducting immersion exposure using scanning type of exposure apparatus for the immersion exposure. Therefore, speed-up of the scanning can be achieved.

By virtue of using the component (F) described above, the resist film formed using the resist composition of the present invention exhibits enhanced hydrophobicity as compared with the resist film formed using a conventional resist composition. Therefore, the contact angles relative to water, such as the static contact angle (the contact angle between the surface of a water droplet on the resist film in a horizontal state and the resist film surface), and the dynamic contact angles (including the contact angle at which a water droplet starts to slide when the resist film is inclined, the contact angle at the front-end point of the water droplet in the sliding direction (the advancing angle), and the contact angle at the rear-end point of the water droplet in the sliding direction (the receding angle)), and the sliding angle (the inclination angle of the resist film at which a water droplet starts to slide when the resist film is inclined) are changed. The higher the hydrophobicity of the resist film, the larger the static contact angle and the dynamic contact angles, and the smaller the sliding angle.

FIG. 1 is a diagram showing an advancing angle ($\theta_1$), a receding angle ($\theta_2$) and a sliding angle ($\theta_3$).

As shown in FIG. 1, the advancing angle is an angle $\theta_1$ between surface of a liquid droplet 11 in a lower end 1a thereof and a plane surface 12 where the liquid droplet 11 starts to move (slide) on the plane surface 12 when the plane surface 12 on which the liquid droplet 11 is disposed is gradually inclined.

Further, in the case where the liquid droplet 11 starts to move (slide) on the plane surface 12, the receding angle is an angle $\theta_2$ between surface of a liquid droplet 11 in a upper end 1b thereof and the plane surface 12, and the sliding angle is an inclination angle $\theta_3$ of the plane surface 12.

In the present invention, the static contact angle, the dynamic contact angles and the sliding angle indicate, for example, values measured shown below.

First, a resist composition liquid solution is spin-coated on a silicon substrate, subsequently, heated at prescribed condition, for example, at temperature condition of 110 to 115° C. for 60 seconds, thereby forming a resist film.

Next, the angles for the above resist film can be measured using commercially available measurement apparatuses such as DROP MASTER-700 (product name; manufactured by Kyowa Interface Science Co., Ltd.), AUTO SLIDING ANGLE: SA-30 DM (product name; manufactured by Kyowa Interface Science Co., Ltd.), and AUTO DISPENSER: AD-31 (product name; manufactured by Kyowa Interface Science Co., Ltd.).

Particularly in the resist composition of the present invention, a measured value of the receding angle in the resist film obtained using the resist composition before exposure or development is preferably 65° or more, more preferably 70° or more, and still more preferably 73° or more. Preferable value of the upper limit of the receding angle is not particularly limited, and is, for example, 95° or less.

Values of the angles (the static contact angle, the dynamic contact angles and the sliding angle) in various contact angles described above can be controlled by appropriately selecting or adjusting a composition according to the resist composition, for example, the type of the component (F), the amount of the component (F) or the type of the component (A1). For example, the more the amount of the component (F), the resist film formed exhibit more enhanced hydrophobicity. Hence, the resist film has large static contact angle and sliding angle, and the sliding angle thereof is particularly large. Further, when the amount of the component (F) or the amount of a fluorine atom within the structural units is adjusted, the advancing angle can particularly be controlled (if the amount of a fluorine atom is lower, the resist film has smaller advancing angle).

In addition, by virtue of using the resist composition of the present invention, substance elution from the resist film can be suppressed during immersion exposure.

That is, the immersion lithography is a method including a step in which exposure (immersion exposure) is conducted in a state where the region between the lens and the resist film formed on the wafer (which was conventionally filled with air or an inert gas such as nitrogen) is filled with a solvent (a immersion medium) that has a larger refractive index than the refractive index of air. In immersion exposure, when the resist film is in contact with immersion medium, substances (the component (C), the component (Z) or the like) within the resist film are eluted (substance elution) into immersion medium. The substance elution causes the phenomenon such as modification of resist layer and change of the refractive index of the immersion medium. Accordingly, lithography properties are deteriorated.

The amount of the substance elution is influenced by property (for example, hydrophilicity, hydrophobicity or the like) of the surface of the resist film. Hence, it is presumed that for example, by enhancing hydrophobicity in surface of the resist film, the substance elution is reduced.

When the substance elution is suppressed, modification of resist layer and change of the refractive index of the immersion medium can be suppressed in immersion exposure. Since variation of the refractive index of the immersion medium is suppressed, the resist pattern having excellent shape or the like can be formed. Further, it is possible to reduce contamination of the lens in the exposure apparatus. Therefore, protective measures therefor are not necessary, and it can contribute to simplifying the process and the exposure apparatus.

Further, according to the resist composition of the third aspect or the fifth aspect, there are provided a resist composition which can be satisfactorily used for formation of the negative pattern by using a resist composition including a base component that exhibits increased solubility in an alkali developing solution under the action of acid in an alkali developing process and which has an excellent storage stability. Although the reasons that this effect is obtained are not entirely clear, they are thought to include the following.

In a method of forming the negative pattern using a base component that exhibits increased solubility in an alkali developing solution under the action of acid, that is, a base component known for a conventional positive resist composition in an alkali developing process, it is necessary that an acidic compound component provided to the resist film in advance and a base generated at an exposed portion upon the exposure are neutralized.

In the case, if a compound that exhibits acidity by itself is used as an acidic compound component (G) instead of an acid generator (B) which generates an acid by heating or upon exposure, material which is generated by the action of exposure or heating is only the base. Therefore, the process is simplified. In addition, neutralization efficiency is independent from acid generation efficiency. Accordingly, neutralization reaction and formation of pattern is satisfactorily performed.

On the other hand, when the component (G) that exhibits acidity by itself and has proton donating ability is used, another problem arises in that the solubility of the component (A) in an alkali developing solution is increased due to the component (G) having acidity during the storage of the resist liquid after preparation of the resist composition including the component (A) and the component (G) before forming a resist pattern.

In the resist composition according to the third aspect of the present invention, after the novel process is optimized by using a compound that exhibits acidity by itself and has proton donating ability as the component (G), one mol or more of the component (D) is used per 1 mol of the component (G) in addition of the component (G). It is presumed that in this manner, the acidity is appropriately controlled in the resist liquid, and both of the storage stability and the resolution can be achieved.

Further, in the resist composition according to the fifth aspect of the present invention, after the novel process is optimized by using a compound that exhibits acidity by itself and has proton donating ability as the acidic compound component, a salt containing a cation having the specific pKa value is used as the acidic compound component. It is presumed that in this manner, the acidity of the acidic compound component is appropriately controlled, and both of the storage stability and the resolution can be achieved.

Furthermore, when the component (F) is included, or when the component (F) includes the structural unit (f1), the problem often arises similarly to the component (A) described above due to action of the component (G). Even in this case, the present invention can achieve both of the storage stability and the resolution, and is particularly useful in formation of patterns using immersion exposure. Moreover, when the component (F) includes the structural unit (f1), by further including the amine having relatively weak basicity, the storage stability can further be improved.

<<Method of Forming Resist Pattern>>

The method of forming a resist pattern of the second aspect of the present invention includes the step (1) in which a resist film is formed by coating a resist composition which includes a base component that exhibits increased solubility in an alkali developing solution under the action of acid, a photo-base generator component that generates a base upon exposure, an acid supply component and a compound (F) containing at least one selected from the group consisting of a fluorine atom and a silicon atom and containing no acid decomposable group which exhibits increased polarity by the action of acid, on a substrate; a step (2) in which the resist film is subjected to exposure; a step (3) in which baking is conducted after the step (2), such that, at an exposed portion of the resist film, the base generated from the photo-base generator component upon the exposure and an acid derived from the acid supply component are neutralized, and at an unexposed portion of the resist film, the solubility of the base component in an alkali developing solution is increased by the action of the acid derived from the acid supply component; and a step (4) in which the resist film is subjected to an alkali development, thereby forming a negative-tone resist pattern in which the unexposed portion of the resist film has been dissolved and removed.

As a resist composition used in the step (1) of the method of forming a resist pattern of the second aspect of the present invention, the same as those described above in the resist composition of the first aspect of the present invention can be used.

The method of forming a resist pattern of the fourth aspect of the present invention includes a step (1) in which a resist film is formed by coating a resist composition which includes a base component (A) that exhibits increased solubility in an alkali developing solution under the action of acid, a photo-base generator component (C) that generates a base upon exposure, an acidic compound component (G) and an amine (D), the amount of which is 1 mol or more, per 1 mol of the acidic compound component (G), on a substrate; a step (2) in which the resist film is subjected to exposure; a step (3) in which baking is conducted after the step (2), such that, at an exposed portion of the resist film, the base generated from the photo-base generator component (C) upon the exposure and the acidic compound component (G) are neutralized, and at an unexposed portion of the resist film, the solubility of the base component (A) in an alkali developing solution is increased by the action of the acidic compound component (G); and a step (4) in which the resist film is subjected to an alkali development, thereby forming a negative-tone resist pattern in which the unexposed portion of the resist film has been dissolved and removed. That is, in the method of forming a resist pattern of the fourth aspect of the present invention, the resist composition of the third aspect of the present invention described above in the step (1) is used.

The method of forming a resist pattern of the sixth aspect of the present invention includes a step (1) in which a resist film is formed by coating a resist composition which includes a base component (A) that exhibits increased solubility in an alkali developing solution under the action of acid, a photo-base generator component (C) that generates a base upon exposure, and an acidic compound component (G) including a compound (G1C) composed of a nitrogen-containing cation having a pKa value of 7 or less and a counteranion, on a substrate; a step (2) in which the resist film is subjected to exposure; a step (3) in which baking is conducted after the step (2), such that, at an exposed portion of the resist film, the base generated from the photo-base generator component (C) upon the exposure and the acidic compound component (G) are neutralized, and at an unexposed portion of the resist film, the solubility of the base component (A) in an alkali developing solution is increased by the action of the acidic compound component (G); and a step (4) in which the resist film is subjected to an alkali development, thereby forming a negative-tone resist pattern in which the unexposed portion of the resist film has been dissolved and removed. That is, in the method of forming a resist pattern of the sixth aspect of the present invention, the resist composition of the fifth aspect of the present invention described above in the step (1) is used.

In the present invention, the term "prebake" refers to a heating treatment of 70° C. or more by a hotplate and the like which is conducted between coating a resist composition on a substrate and exposing it.

A "negative-tone resist pattern" refers to a resist pattern in which an unexposed portion of the resist film is dissolved and removed by an alkali developing solution, and an exposed portion remains as a pattern.

Hereinbelow, the method of forming a resist pattern according to the present invention will be described, with reference to the drawings. However, the present invention is not limited to these embodiments.

FIG. 2A to FIG. 2D show an example of the second, the fourth and the sixth embodiments of the method of forming a resist pattern according to the present invention. The second, the fourth and the sixth embodiments are collectively referred to as "present embodiment".

In the second embodiment, a resist composition including a base component (component (A)) that exhibits increased solubility in an alkali developing solution under the action of acid, a photo-base generator component (component (C)) that generates a base upon exposure, an acidic compound (component (G)) as an acid supply (component (Z)) and a compound (F) containing at least one selected from the group consisting of a fluorine atom and a silicon atom, and containing no acid decomposable group which exhibits increased polarity by the action of acid is used.

Further, in the fourth embodiment, a resist composition including a base component (A) that exhibits increased solubility in an alkali developing solution under the action of acid, a photo-base generator component (C) that generates a base upon exposure, an acidic compound component (G) and an amine (D) is used.

Furthermore, in the sixth embodiment, a resist composition including a base component (A) that exhibits increased solubility in an alkali developing solution under the action of acid, a photo-base generator component (C) that generates a base upon exposure, and an acidic compound component (G) is used.

Figure 2A:
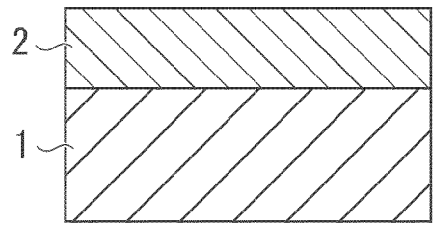
FIG. 2A to FIG. 2D are schematic diagrams showing an example of one embodiment of the method of forming a resist pattern according to the present invention.

Firstly, as shown in FIG. 2A, the resist composition is applied to a substrate 1 to form a resist film 2 (step (1); FIG. 2A).

Figure 2B:
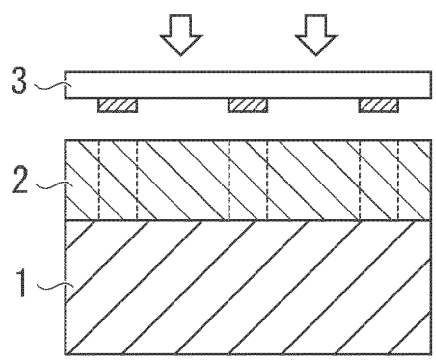

Next, as shown in FIG. 2B, the resist film 2 formed above is subjected to exposure through a photomask 3 having a predetermined pattern formed thereon. As a result, in the exposed region (exposed portions) of the resist film 2, a base is generated from the photo-base generator component upon exposure (step (2); FIG. 2B).

Figure 2C:
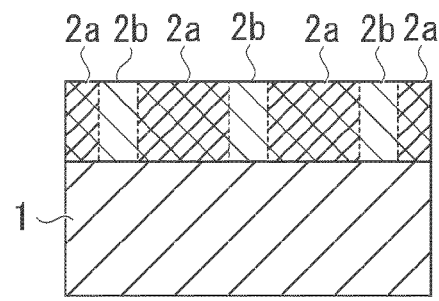

After exposure, baking (post exposure bake (PEB)) is conducted. By this baking, at the unexposed portions 2b of the resist film 2, the solubility of the base component in an alkali developing solution can be increased by the action of the acid (acidic compound) provided to the resist film 2 by adding the acidic compound to the resist composition. On the other hand, at exposed portions 2a, a neutralization reaction between the base generated from the photo-base generator component upon exposure and the acid provided to the resist film 2 proceeds, so that the solubility of the base component in an alkali developing is either unchanged or only slightly changed. As a result, a difference in the dissolution rate in an alkali developing solution (dissolution contrast) occurs between the exposed portions 2a and the unexposed portions 2b (step (3); FIG. 2C).

Figure 2D:
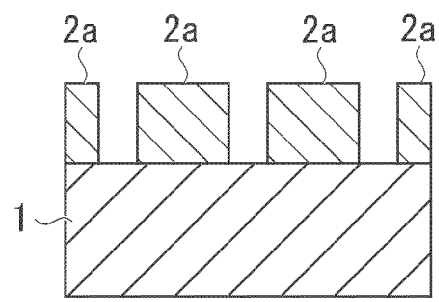

Thereafter, developing is conducted using an alkali developing solution. By conducting development, the exposed portions 2a of the resist film 2 remain, and the unexposed portions 2b of the resist film 2 are dissolved and removed. As a result, as shown in FIG. 2D, a resist pattern including a plurality of resist patterns 2a arranged at intervals is formed on the substrate 1 (step (4); FIG. 2D).

[Step (1)]

In the second embodiment, a resist composition including a base component that exhibits increased solubility in an alkali developing solution under the action of acid, a photo-base generator component that generates a base upon exposure, an acidic compound as an acid supply component and a compound (F) containing at least one selected from the group consisting of a fluorine atom and a silicon atom, and containing no acid decomposable group which exhibits increased polarity by the action of acid is applied to a substrate 1 to form a resist film 2.

In the fourth embodiment, a resist composition including a base component (A) that exhibits increased solubility in an alkali developing solution under the action of acid, a photo-base generator component (C) that generates a base upon exposure, an acidic compound component (G) containing the component (G1) and an amine (D) is applied to a substrate 1 to form a resist film 2.

In the sixth embodiment, a resist composition including a base component (A) that exhibits increased solubility in an alkali developing solution under the action of acid, a photo-base generator component (C) that generates a base upon exposure, and an acidic compound component (G) containing the component (G1C) is applied to a substrate 1 to form a resist film 2.

The substrate 1 is not specifically limited and a conventionally known substrate can be used. For example, substrates for electronic components, and such substrates having wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the substrate 1, any one of the above-mentioned substrates provided with an inorganic and/or organic film on the surface thereof may be used. The substrates provided with the organic film on the surface thereof are preferable. As the inorganic film, an inorganic antireflection film (inorganic BARC) can be used. As the organic film, an organic antireflection film (organic BARC) and an organic film such as a lower-layer organic film used in a multilayer resist method can be used. When the organic film is particularly provided, a pattern can readily be formed on the substrate with a high aspect ratio. Accordingly, the organic film is useful in the production of semiconductors.

Here, a "multilayer resist method" is method in which at least one layer of an organic film (lower-layer film) and at least one layer of a resist film are provided on a substrate, and a resist pattern formed on the upper resist film is used as a mask to conduct patterning of the lower-layer film. This method is considered as being capable of forming a pattern with a high aspect ratio. The multilayer resist method is broadly classified into a method in which a double-layer structure consisting of an upper-layer resist film and a lower-layer film is formed, and a method in which a multilayer structure having at least three layers composed of an upper-layer resist film, a lower-layer film and at least one intermediate layer (thin metal film or the like) provided between the upper-layer resist film and the lower-layer film. In the multi-layer resist method, a desired thickness can be ensured by the lower-layer film, and as a result, the thickness of the resist film can be reduced, and an extremely fine pattern with a high aspect ratio can be formed.

An inorganic film can be formed, for example, by coating an inorganic anti-reflection film composition such as a silicon-based material on a substrate, followed by baking.

An organic film can be formed, for example, by dissolving a resin component and the like for forming the film in an organic solvent to obtain an organic film-forming material, coating the organic film-forming material on a substrate using a spinner or the like, and baking under heating conditions preferably in the range of 200 to 300° C. for 30 to 300 seconds, more preferably for 60 to 180 seconds. The organic film-forming material does not need to have susceptibility to light or electron beam like a resist film, and the organic film-forming material may or may not have such susceptibility. More specifically, a resist or a resin generally used in the production of a semiconductor device or a liquid crystal display device can be used.

Further, it is preferable that the organic film-forming material can be subjected to etching, particularly dry etching, so that, by etching the organic film using a resist pattern, the resist pattern can be transferred to the organic film, and an organic film pattern can be formed. It is particularly desirable to use an organic film-forming material which can be subjected to oxygen plasma etching or the like. As such an organic film-forming material, a material conventionally used for forming an organic film such as an organic BARC can be used. Examples of such an organic film-forming material include the ARC series manufactured by Brewer Science Ltd., the AR series manufactured by Rohm and Haas Company, and the SWK series manufactured by Tokyo Ohka Kogyo Co., Ltd.

In the first embodiment, a resist composition includes a base component that exhibits increased solubility in an alkali developing solution under the action of acid, a photo-base generator component that generates a base upon exposure, an acidic compound as an acid supply component and a compound (F) containing at least one selected from the group consisting of a fluorine atom and a silicon atom, and containing no acid decomposable group which exhibits increased polarity by the action of acid.

The acidic compound acts as an acid by baking (PEB) in the step (3) described later. The acid (acidic compound) causes neutralization with the base generated from the photo-base generator component upon exposure at exposed portions 2a of the resist film 2. The acid (acidic compound) acts on the base component at unexposed portions 2b of the resist film 2, thereby increasing the solubility of the base component in an alkali developing solution.

For details, the resist composition is the same as the resist composition according to the first aspect of the present invention described above.

Further, the resist composition used in the step (1) according to the fourth aspect of the present invention is the resist composition of the third aspect described above.

Furthermore, the resist composition used in the step (1) according to the sixth aspect of the present invention is the resist composition of the fifth aspect described above.

The method of applying the resist composition to the substrate 1 to form a resist film 2 is not particularly limited, and the resist film 2 can be formed by a conventional method.

For example, the resist composition can be applied to the substrate 1 by a conventional method such as spincoat method using a spin coater or barcoat method using a barcoater, followed by drying on a cooling plate at room temperature or conducting prebake (PAB), thereby forming a resist film 2.

When a prebake treatment is conducted, the temperature condition is preferably from 80 to 150° C., and the bake treatment time is preferably from 40 to 120 seconds, more preferably from 60 to 90 seconds. When conducting prebake, even if the thickness of the resist film is thick, the organic solvent is easily vaporized.

By drying the resist composition at a room temperature and not conducting prebake, it is possible to reduce the number of steps for forming a resist pattern and to enhance the resolution of obtained resist pattern.

The presence or absence of the prebake can be appropriately determined in view of the aforementioned advantages, depending on the raw materials of the resist composition to be used, or depending on the target of the pattern to be formed.

The thickness of the resist film 2 formed in the step (1) is preferably 50 to 500 nm, and more preferably 50 to 450 nm. By ensuring that the thickness of the resist film satisfies the above-mentioned range, a resist pattern with a high level of resolution can be formed, and a satisfactory level of etching resistance can be achieved.

In addition, when not conducting prebake, the thickness of the resist film 2 formed in the step (1) is preferably 300 nm or less, more preferably 200 nm or less, and particularly preferably 50 to 150 nm. When the thickness of the resist film 2 is no more than the upper limit of the above-mentioned range, even if prebake is not conducted, an organic solvent is less likely to be remained and likely to be vaporized by an application such as spin-coating at a room temperature, and hence, in-plane uniformity of the resist film 2 on the substrate 1 is enhanced. The effect obtained by not conducting prebake can be prominently obtained especially in the case of thin resist film.

[Step (2)]

In the present embodiment, the resist film 2 formed in the step (1) is selectively exposed through a photomask 3. As a result, at exposed portions 2a, a base is generated from the photo-base generator component upon exposure.

With respect to the exposure dose, an amount capable of generating a base from the photo-base generator component in an amount necessary to neutralize the acid present in the exposed portions 2a is sufficient.

The wavelength to be used for exposure is not particularly limited and the exposure can be conducted using radiation such as KrF excimer laser, ArF excimer laser, $F_2$ excimer laser, extreme ultraviolet rays (EUV), vacuum ultraviolet rays (VUV), electron beam (EB), X-rays, and soft X-rays. In terms of forming a fine resist pattern, ArF excimer laser, EUV or EB is preferable, and ArF excimer laser is particularly desirable.

The photomask 3 is not particularly limited, and a conventional mask can be used. For example, a binary mask in which the transmittance of the light shielding portion is 0% or a halftone-phase shift mask (HT-mask) in which the transmittance of the light shielding portion is 6% can be used. The unexposed portions can be selectively formed by using a halftone-phase shift mask.

As a binary mask, those in which a chromium film, a chromium oxide film, or the like is formed as a light shielding portion on a quartz glass substrate are generally used.

A phase shift mask is a photomask provided with a portion (shifter) which changes the phase of light. Thus, by using a phase shift mask, incidence of light to unexposed portions can be suppressed, and the dissolution contrast to an alkali developing solution can be improved between unexposed portions and exposed portions. As a phase shift mask other than a halftone-phase shift mask, a Levenson-phase shift mask can be mentioned. As any of these phase shift masks, commercially available masks can be used.

Specific examples of the half-tone type phase shift masks include those in which an MoSi (molybdenum silicide) film, a chromium film, a chromium oxide film, an silicon oxynitride film, or the like is formed as a light shielding portion (shifter) exhibiting a transmittance of about several 10% (generally 6%) on a substrate generally made of quartz glass.

In the present embodiment, exposure is conducted through a photomask 3, but the present invention is not limited to this embodiment. For example, the exposure may be conducted without using a mask, e.g., selective exposure by drawing with electron beam (EB) or the like.

Further, when the resist composition according to the third aspect or the fifth aspect of the present invention includes a photo-acid generator as the component (B) in addition of the component (G), an acid is generated from the photo-acid generator in the step (2). Specifically, a base from the photo-base generator component and the acid from the photo-acid generator are generated at exposed portions 2a upon exposure in the step (2). By baking in a step (3) described later, at the unexposed portions 2b, a protecting group in the base component is dissociated (deprotection reaction proceeds) under the action of the acid generated at the exposed portions 2a and diffused to the unexposed portions 2b, thereby increasing the solubility of the base component in an alkali developing solution. On the other hand, at exposed portions 2a, a neutralization reaction proceeds between the base generated in the step (2) and the acid. As a result, the solubility of the base component in an alkali developing is either unchanged or only slightly changed. As such, a difference in the dissolution rate in an alkali developing solution (dissolution contrast) occurs between the exposed portions 2a and the unexposed portions 2b.

The exposure of the resist film 2 can be either a general exposure (dry exposure) conducted in air or an inert gas such as nitrogen, or immersion exposure (immersion lithography) through an immersion medium. In step (2), in terms of forming a resist pattern with a high resolution, it is preferable to conduct immersion exposure through an immersion medium.

In immersion lithography, exposure (immersion exposure) is conducted in a state where the region between the lens and the resist film 2 formed on the substrate 1 (which was conventionally filled with air or an inert gas such as nitrogen) is filled with a solvent (a immersion medium) that has a larger refractive index than the refractive index of air.

More specifically, in immersion lithography, the region between the resist film 2 formed in the above-described manner and lens at the lowermost portion of the exposure apparatus is filled with a solvent (an immersion medium) that has a larger refractive index than the refractive index of air, and in this state, the resist film 2 is subjected to exposure (immersion exposure) through a predetermined photomask 3.

The immersion medium preferably exhibits a refractive index larger than the refractive index of air but smaller than the refractive index of the resist film 2 to be subjected to immersion exposure. The refractive index of the immersion medium is not particularly limited as long at it satisfies the above-mentioned requirements.

Examples of this immersion medium which exhibits a refractive index that is larger than the refractive index of air but smaller than the refractive index of the resist film 2 include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the immersion medium after the exposure can be removed by a simple method.

As a fluorine-based inert liquid, a perfluoroalkyl compound in which all of the hydrogen atoms of the alkyl group are substituted with fluorine atoms is particularly desirable.

Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

[Step (3)]

In the present embodiment, after the step (2), baking (post exposure bake (PEB)) is conducted.

In the baking, the temperature conditions is preferably from 50 to 200° C., more preferably from 80 to 150° C., and still more preferably from 90 to 130° C. The baking time is preferably from 10 to 300 seconds, more preferably from 40 to 120 seconds, and still more preferably from 60 to 90 seconds.

In this manner, by conducting baking of the resist film 2 after exposure, in the entire resist film 2, the acidic compound blended in the resist composition acts as an acid. The solubility of the base component in an alkali developing solution can be increased by the action of the acid (acidic compound) at the unexposed portions 2b of the resist film 2. On the other hand, at exposed portions 2a of the resist film 2, a neutralization reaction between the base generated from the photo-base generator component upon exposure and the acid (acidic compound) proceeds, so that the amount of acid which would act on the base component decreases. As a result, the solubility of the base component in an alkali developing is either unchanged or only slightly changed. As such, a difference in the dissolution rate in an alkali developing solution (dissolution contrast) occurs between the exposed portions 2a and the unexposed portions 2b.

In addition, when the resist composition according to the third aspect or the fifth aspect of the present invention includes a thermal-acid generator as the component (B) in addition of the component (G), an acid is generated from the thermal-acid generator in the baking step.

The baking in this step (3) does not necessarily control the start of the neutralization reaction.

[Step (4)]

In the present embodiment, after the step (3), by conducting alkali developing, the unexposed portions 2b of the resist film 2 are dissolved and removed, and the exposed portions 2a are retained, thereby forming a negative resist pattern.

Specific examples of the alkali developing solution include inorganic alkalis, such as sodium hydroxide, potassium hydroxide, sodium carbonate, sodium silicate, sodium metasilicate and aqueous ammonia; primary amines, such as ethylamine and n-propyl amine; secondary amines, such as diethylamine and di-n-butylamine; tertiary amines, such as triethylamine and methyldiethylamine; alcoholamines, such as dimethylethanolamine and triethanolamine; quaternary ammonium salts, such as tetramethylammonium hydroxide and tetraethylammonium hydroxide; and cyclic amines, such as pyrrole and piperidine.

Among these examples, as the alkali developing solution, an aqueous alkali solution containing at least one member selected from the group consisting of primary amines, secondary amines, tertiary amines and quaternary ammonium salts is preferable, and an aqueous solution of tetramethylammonium hydroxide (TMAH) is particularly desirable.

Further, the aforementioned aqueous alkali solution having alcohols, surfactants added thereto in an appropriate amount may be used.

In general, the alkali concentration within the alkali developing solution (i.e., concentration of inorganic alkalis, quaternary ammonium salts or amine compounds, based on the total weight of the alkali developing solution) is from 0.01 to 20% by weight.

The alkali developing treatment can be performed by a conventional method.

After the alkali development, a rinse treatment using pure water or the like may be conducted.

In addition, after the alkali development, a further baking (post bake) may be conducted. Post bake (which is performed in order to remove water content after the alkali developing and rinsing) is generally conducted at about 100° C. preferably for 30 to 90 seconds.

In the present embodiment described above, a resist composition containing an acidic compound as an acid supply component is used, and a resist composition containing an acid generator component (thermal-acid generator or photo-acid generator) instead of the acidic compound or together with the acidic compound may be used. In addition, an acid amplifier component (H) may be used together with at least one of the acidic compound and the acid generator component, since the concentration of acid when conducting a baking treatment such as PEB is enhanced.

As the acid generator component, either or both a component which generates an acid by heating (thermal-acid generator) and a component which generates an acid upon exposure (photo-acid generator) can be used.

In the case where a resist composition including the thermal-acid generator as the acid generator component is used, an acid is generated from the thermal-acid generator in the entire resist film 2 by baking (PEB) in the step (3). At unexposed portions 2b in the resist film 2, the solubility of the base component in an alkali developing solution can be increased by the action of acid generated from the thermal-acid generator by baking (PEB). On the other hand, at exposed portions 2a in the resist film 2a, a neutralization reaction between the acid generated from the thermal-acid generator by baking (PEB) and the base generated from the photo-base generator component upon exposure in the aforementioned step (2) proceeds, and the solubility of the base component in an alkali developing solution is either unchanged or only slightly changed. As such, a difference in the dissolution rate in an alkali developing solution (dissolution contrast) occurs between the exposed portions 2a and the unexposed portions 2b.

When a resist composition containing a thermal-acid generator is used, it is preferable that the aforementioned prebake be not performed. By not conducting a prebake treatment, an acid derived from the thermal-acid generator does not act on the base component after applying the resist composition on a substrate and before conducting exposure. As a result, the contrast between exposed portions 2a and unexposed portions 2b in the resist film 2 is increased, and hence, a negative pattern having a high resolution is easily formed.

In addition, when the type of photomask, base component, photo-base generator component and the like are appropriately selected, a photo-acid generator can be used as the acid generator component. For example, an embodiment in which a resist composition containing a photo-acid generator having a relatively long diffusion length and a photo-base generator having a relatively short diffusion length is used, and a photomask having a transparency (halftone-phase shift mask) is used as a photomask can be mentioned. The diffusion length of the acid can be adjusted by controlling the skeleton or polarity of an anion moiety of a photo-acid generator, whereas the diffusion length of base can be adjusted by controlling the molecular weight or skeleton of the base generated from the photo-base generator component after a photodegradation.

In the embodiment, at exposed portions 2a, a base is generated from the photo-base generator component and an acid is generated from a photo-acid generator upon exposure in the step (2). At the unexposed portions 2b, the protecting group within the base component is dissociated (deprotection reaction proceeds) by the action of acid which is generated at the exposed portions 2a and diffused to the unexposed portions 2b by baking in the step (3), thereby increasing the solubility of the base component in an alkali developing solution. On the other hand, at exposed portions 2a, a neutralization reaction between the base and the acid generated in the step (2) proceeds, and the solubility of the base component in an alkali developing solution is either unchanged or only slightly changed. As such, a difference in the dissolution rate in an alkali developing solution (dissolution contrast) occurs between the exposed portions 2a and the unexposed portions 2b.

In addition, the method of forming a resist pattern according to the present invention may include a step (5) in which a composition for formation of an organic film including an acid supply component is applied to the resist film to form an organic film between the step (2) and the step (3). After exposure, applying the composition for formation of an organic film to the resist film, subsequently baking (PEB) is conducted. As a result, the organic film is formed on the resist film, and an acid derived from the acid supply component contained in the organic film is diffused from the organic film to the resist film to provide an additional acid to the resist film. Thereafter, developing is conducted using an alkali developing solution, thereby forming a negative pattern having a high resolution.

Further, alternatively to use the composition for formation of an organic film, an embodiment in which an acidic active rinse is only applied to the resist film may be used. As the acidic active rinse, the aforementioned aqueous solution containing the component (G2) can be used.

As examples of the composition for formation of an organic film, in addition of the acid supply component, a composition including a resin, an organic solvent or the like can be given. The resin is not particularly limited, and it is preferable to use an alkali-soluble resin because in step (4), the formed organic film can be removed during the formation of a resist pattern by alkali developing. As the alkali-soluble resin, any resin having an alkali-soluble group may be used, and examples thereof include conventional resins such as novolak resins, hydroxystyrene resins, acrylic resins and polycycloolefin resins. As the organic solvent, the same as the organic solvent blended in the resist composition described above such as an alcohol organic solvent, a fluorine organic solvent or an ether organic solvent having no hydroxyl group can be used. As the acid supply component, the same as the acid supply component blended in the resist composition described above can be given. When a photo-acid generator is used as the acid supply component, the step (5) may be conducted between the step (1) and the step (2).

In the method of forming a resist pattern according to the present invention, after forming a negative resist pattern in the manner as described above, etching of the substrate 1 may be conducted using the negative resist pattern as a mask. By conducting such etching to transfer the resist pattern to the substrate 1, a semiconductor device or the like can be produced.

The etching can be conducted by a conventional method. For example, when the substrate 1 has an organic film formed thereon, the etching of the organic film is preferably conducted by dry etching. Among dry etching, especially in terms of production efficiency, oxygen-plasma etching or etching using a $CF_4$ gas or a $CHF_3$ gas is preferable, and oxygen-plasma etching is particularly desirable.

Etching of the substrate is preferably performed using a halogen gas, more preferably using a fluorinated carbon-based gas, and most preferably using a $CF_4$ gas or a $CHF_3$ gas.

According to the method of forming a resist pattern of the second aspect, the fourth aspect and the sixth aspect of the present invention, by use of the developing process combined with an alkali developing solution and a chemically amplified resist composition which had been used as a positive resist composition, a negative resist pattern having a high resolution can be formed.

Further, in the method of forming a resist pattern of the second aspect of the present invention, when the resist composition according to the present invention described above is used in the step (1), a resist pattern improving both of the storage stability and the resolution can be formed. That is, according to the method of forming a resist pattern, fine patterns can be formed with excellent precision without influence of aging.

Furthermore, by the method of forming a resist pattern according to the present invention, the resolution becomes excellent in a resist pattern (such as an isolated trench pattern, an extremely small, dense contact hole pattern, or the like) having a region where the optical strength becomes weak (region where irradiation by exposure is not satisfactorily reached) is likely to be generated.

Moreover, by the method of forming a resist pattern according to the present invention, it is possible to form a highly densed resist pattern. For example, it becomes possible to form a contact hole pattern having an excellent shape, in which each of the holes are close to each other, e.g., the distance between the holes is about 30 to 50 nm.

In addition, the method of forming a resist pattern according to the present invention can be performed by existing exposure apparatuses and existing equipments.

By using a double exposure method in the method of forming a resist pattern according to the present invention, the number of steps can be reduced as compared to a double patterning in which each of a lithography step and a patterning step are performed at least twice.

Further, in the method of forming a resist pattern of the fourth aspect of the present invention, when the resist composition according to the third aspect of the present invention is used in the step (1), the effects according to the third aspect described above can be obtained, that is, a resist pattern improving both of the storage stability and the resolution can be formed.

In the method of forming a resist pattern of the sixth aspect of the present invention, when the resist composition according to the fifth aspect of the present invention is used in the step (1), the effects according to the fifth aspect described above can be obtained, that is, a resist pattern improving both of the storage stability and the resolution can be formed.

EXAMPLES

As follows is a description of examples of the present invention, although the scope of the present invention is by no way limited by these examples.
<Preparation of Resist Compositions>

Examples A1 to A12, Comparative Examples A1 to A3

The components shown in Table 1 were mixed together and dissolved to obtain a resist composition.

TABLE 1

| Resist composition | Component (A) | Component (C) | Component (Z) | Component (F) | Component (S) |
| --- | --- | --- | --- | --- | --- |
| Example A1 | (A)-1A | (C)-1A | (G)-1A | (F)-1A | (S)-1 |
| | [100] | [10.0] | [8.0] | [3.0] | [3500] |
| Example A2 | (A)-1A | (C)-1A | (G)-1A | (F)-2A | (S)-1 |
| | [100] | [10.0] | [8.0] | [3.0] | [3500] |
| Comparative Example A1 | (A)-1A | (C)-1A | (G)-1A | (F)-3A | (S)-1 |
| | [100] | [10.0] | [8.0] | [3.0] | [3500] |
| Comparative Example A2 | (A)-1A | (C)-1A | (G)-1A | (F)-4A | (S)-1 |
| | [100] | [10.0] | [8.0] | [3.0] | [3500] |
| Example A3 | (A)-1A | (C)-1A | (G)-1A | (F)-5A | (S)-1 |
| | [100] | [10.0] | [8.0] | [3.0] | [3500] |
| Example A4 | (A)-1A | (C)-1A | (G)-1A | (F)-6A | (S)-1 |
| | [100] | [10.0] | [8.0] | [3.0] | [3500] |
| Example A5 | (A)-1A | (C)-1A | (G)-1A | (F)-7A | (S)-1 |
| | [100] | [10.0] | [8.0] | [3.0] | [3500] |
| Example A6 | (A)-1A | (C)-1A | (G)-1A | (F)-8A | (S)-1 |
| | [100] | [10.0] | [8.0] | [3.0] | [3500] |
| Example A7 | (A)-1A | (C)-1A | (G)-1A | (F)-9A | (S)-1 |
| | [100] | [10.0] | [8.0] | [3.0] | [3500] |
| Example A8 | (A)-1A | (C)-1A | (G)-1A | (F)-10A | (S)-1 |
| | [100] | [10.0] | [8.0] | [3.0] | [3500] |
| Example A9 | (A)-1A | (C)-1A | (G)-1A | (F)-11A | (S)-1 |
| | [100] | [10.0] | [8.0] | [3.0] | [3500] |
| Example A10 | (A)-1A | (C)-1A | (G)-1A | (F)-12A | (S)-1 |
| | [100] | [10.0] | [8.0] | [3.0] | [3500] |
| Example A11 | (A)-1A | (C)-1A | (G)-1A | (F)-13A | (S)-1 |
| | [100] | [10.0] | [8.0] | [3.0] | [3500] |
| Example A12 | (A)-1A | (C)-1A | (G)-1A | (F)-14A | (S)-1 |
| | [100] | [10.0] | [8.0] | [3.0] | [3500] |
| Comparative Example A3 | (A)-1A | (C)-1A | (G)-1A | (F)-15A | (S)-1 |
| | [100] | [10.0] | [8.0] | [3.0] | [3500] |

In Table 1, the values in brackets [ ] indicate the amount (in terms of parts by weight) of the component added, and the reference characters indicate the following.

(A)-1A: a copolymer represented by chemical formula (A1-1) shown below. Mw: 7,000, Mw/Mn: 1.56. In the chemical formula, the subscript numerals shown on the bottom right of the parentheses ( ) indicate the percentage (mol %) of the respective structural units.

(C)-1A: a compound represented by chemical formula (C)-1A shown below.

(G)-1A: a compound represented by chemical formula (G)-1A shown below.

[Chemical Formula 101]

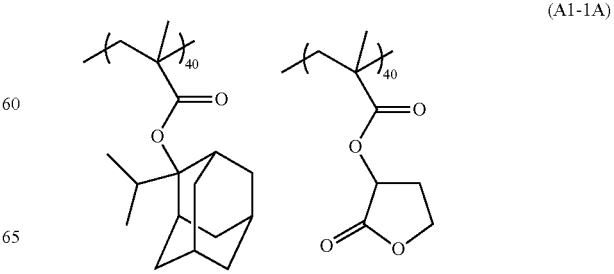

(A1-1A)

-continued

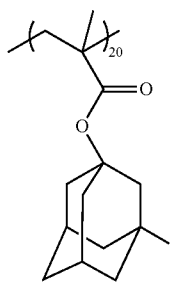

(C)-1A

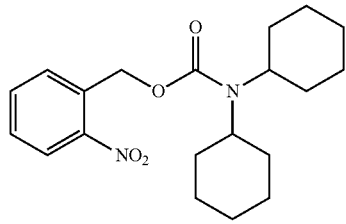

(G)-1A

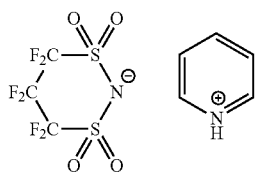

(F)-1A to (F)-15A: polymers represented by chemical formulas (F)-1A to (F)-15A, respectively. In the chemical formula, the subscript numerals shown on the bottom right of the parentheses ( ) indicate the percentage (mol %) of the respective structural units. The weight average molecular weight (Mw) and the dispersity (Mw/Mn) in each of the polymers were shown in Table 2.

(S)-1: a mixed solvent of propylene glycol monomethyl ether acetate/propylene glycol monomethyl ether (PGMEA/PGME)=6/4 (weight ratio).

[Chemical Formula 102]

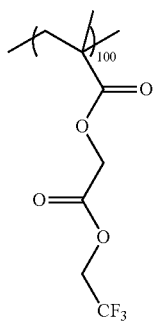

(F)-1A

-continued

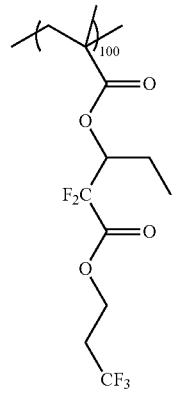

(F)-2A

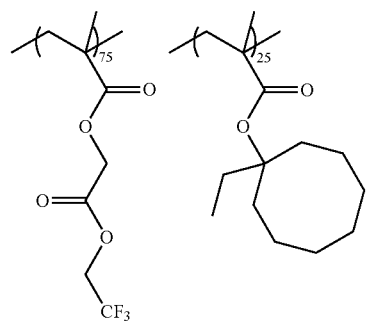

(F)-3A

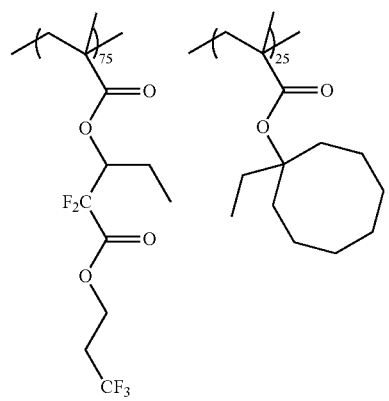

(F)-4A

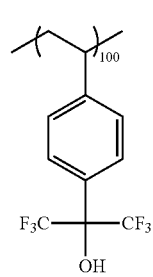

(F)-5A

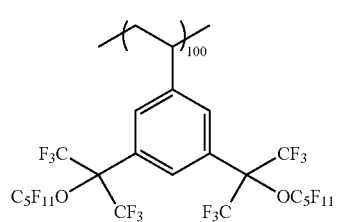

(F)-6A

-continued (F)-7A 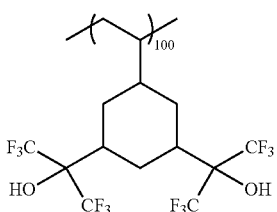

(F)-8A 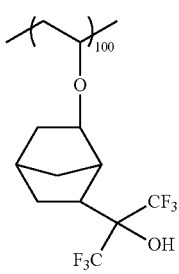

(F)-9A

[Chemical Formula 103]

(F)-10A 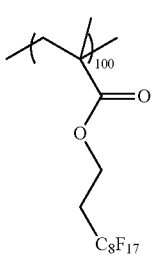

(F)-11A 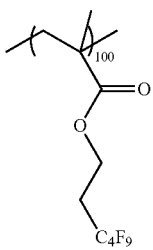

(F)-12A 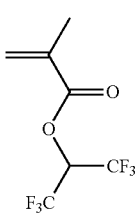

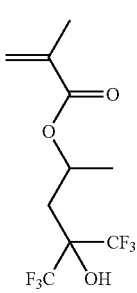

-continued (F)-13A 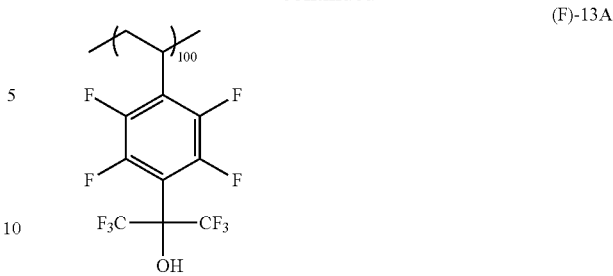

(F)-14A 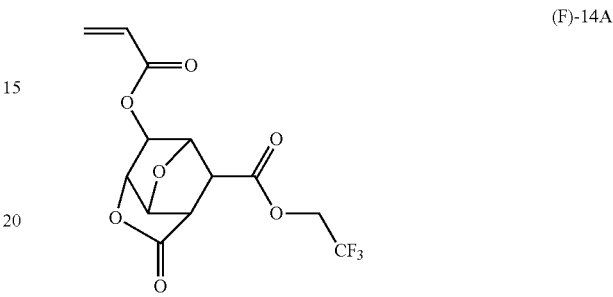

(F)-15A 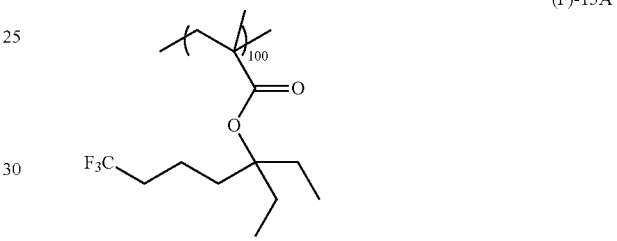

<Formation of Resist Pattern>

Step (1)

An organic antireflection film composition (product name: ARC29, manufactured by Brewer Science Ltd.) was applied to an 8-inch silicon wafer using a spinner, and the composition was then baked and dried on a hotplate at 205° C. for 60 seconds, thereby forming an organic antireflection film having a thickness of 90 nm.

Next, each of the resist compositions was spin-coated on the organic antireflection film, thereby forming a resist film having a thickness of 100 nm.

Step (2)

The resist films formed above were not subjected to a prebake (PAB). Then, the resist films were placed on a cooling plate at 23° C. for 60 seconds. The resist film was irradiated with an ArF excimer laser (193 nm) through a photomask (6% halftone) targeting a LS pattern with a line width of 65 nm (a pitch of 130 nm), using an ArF exposure apparatus NSR—S308 (manufactured by Nikon Corporation; NA (numerical aperture)=0.92; dipole).

Step (3)

Then, a bake treatment (post exposure bake; PEB) was conducted at 95° C. for 60 seconds.

Step (4)

Thereafter, alkali developing was conducted for 30 seconds at 23° C. in a 2.38% by weight aqueous solution of tetramethylammonium hydroxide (TMAH) (product name: NMD-3; manufactured by Tokyo Ohka Kogyo Co., Ltd.).

[Evaluation of Resolution]

In the formation of the resist pattern having a LS pattern with a line width of 65 nm (a pitch of 130 nm) as the target size, resolution was evaluated using the evaluation criteria shown below. The results are shown in Table 2.

(Evaluation Criteria)

A: LS pattern formed with high resolution such that an unexposed portion of the resist film was dissolved and removed, and an image with high contrast was obtained B: resist pattern formed with low resolution C: no image

[Evaluation of Storage Stability]

Each of the resist compositions was stored for one month under room temperature.

Then, similarly to the aforementioned <Formation of resist pattern>, the resist pattern targeting a substantially 1:1 line and space (LS) pattern with a line width of 65 nm and a pitch of 130 nm is formed. The storage stability of the resist composition was evaluated using the evaluation criteria shown below. The results are shown in Table 2.

(Evaluation Criteria)

A: LS pattern substantially formed having the targeted size

B: no image

[Measurement of Receding Angle]

An organic antireflection film composition (product name: ARC29, manufactured by Brewer Science Ltd.) was applied to an 8-inch silicon wafer using a spinner, and the composition was then baked and dried on a hotplate at 205° C. for 60 seconds, thereby forming an organic antireflection film having a thickness of 82 nm.

Next, each of the resist compositions was spin-coated on the organic antireflection film, thereby forming a resist film having a thickness of 100 nm.

Then, one drop of pure water (50 μL) was put on the surface of the resist film, and the receding angle was measured (the receding angle prior to exposure) using DROP MASTER-700 (product name; manufactured by Kyowa Interface Science Co., Ltd.). The results are shown in Table 2.

TABLE 2

| | Component (F) | | | 65 nmLS Resolution | 1M stability | Receding angle (°) |
|---|---|---|---|---|---|---|
| | Chemical formula | Mw | Mw/Mn | | | |
| Example A1 | (F)-1A | 25000 | 1.9 | A | A | 68 |
| Example A2 | (F)-2A | 20000 | 1.8 | A | A | 74 |
| Comparative Example A1 | (F)-3A | 20000 | 1.9 | B | B | 69 |
| Comparative Example A2 | (F)-4A | 22000 | 1.8 | C | B | 74 |
| Example A3 | (F)-5A | 18000 | 1.8 | A | A | 68 |
| Example A4 | (F)-6A | 18000 | 1.9 | A | A | 73 |
| Example A5 | (F)-7A | 15000 | 1.8 | A | A | 67 |
| Example A6 | (F)-8A | 15000 | 1.7 | A | A | 67 |
| Example A7 | (F)-9A | 20000 | 1.8 | A | A | 74 |
| Example A8 | (F)-10A | 22000 | 2.0 | A | A | 73 |
| Example A9 | (F)-11A | 22000 | 2.1 | A | A | 75 |
| Example A10 | (F)-12A | 25000 | 2.2 | A | A | 73 |
| Example A11 | (F)-13A | 21000 | 2.1 | A | A | 70 |
| Example A12 | (F)-14A | 22000 | 1.9 | A | A | 74 |
| Comparative Example A3 | (F)-15A | 14000 | 1.8 | C | B | 76 |

From the results shown in Table 2, it was confirmed that each of the resist compositions according to Examples A1 to A12 exhibited excellent storage stability, and the methods of forming a resist pattern using the resist compositions according to Examples A1 to A12 enabled formation of a negative pattern having a high resolution.

Examples B1 to B15, Comparative Examples B1 to B4

The components shown in Table 3 were mixed together and dissolved to obtain a resist composition.

TABLE 3

| | PEB (° C.) | Component (A) | Component (C) | Component (G) | Component (D) | Component (F) | Component (S) |
|---|---|---|---|---|---|---|---|
| Example B1 | 90 | (A)-1B [100] | (C)-1B [10] | (G)-1B [5.95] | (D)-1B [4.05] | (F)-1B [3] | (S)-1 [3300] |
| Example B2 | 90 | (A)-1B [100] | (C)-1B [10] | (G)-1B [7.87] | (D)-2B [2.13] | (F)-1B [3] | (S)-1 [3300] |
| Example B3 | 90 | (A)-1B [100] | (C)-1B [10] | (G)-1B [11.37] | (D)-3B [3.63] | (F)-1B [3] | (S)-1 [3300] |
| Example B4 | 90 | (A)-1B [100] | (C)-1B [3] | (G)-2B [12.45] | (D)-2B [2.55] | (F)-1B [3] | (S)-1 [3300] |
| Example B5 | 90 | (A)-2B [100] | (C)-2B [10] | (G)-1B [5.95] | (D)-1B [4.05] | (F)-1B [3] | (S)-1 [3300] |
| Example B6 | 90 | (A)-2B [100] | (C)-2B [10] | (G)-1B [7.87] | (D)-2B [2.13] | (F)-1B [3] | (S)-1 [3300] |
| Example B7 | 90 | (A)-2B [100] | (C)-2B [10] | (G)-1B [11.37] | (D)-3B [3.63] | (F)-1B [3] | (S)-1 [3300] |
| Example B8 | 90 | (A)-2B [100] | (C)-2B [10] | (G)-2B [12.45] | (D)-2B [2.55] | (F)-1B [3] | (S)-1 [3300] |
| Example B9 | 110 | (A)-3B [100] | (C)-1B [10] | (G)-1B [7.87] | (D)-2B [2.13] | (F)-1B [3] | (S)-1 [3300] |
| Example B10 | 110 | (A)-3B [100] | (C)-1B [3] | (G)-2B [12.45] | (D)-2B [2.55] | (F)-1B [3] | (S)-1 [3300] |
| Comparative Example B1 | 90 | (A)-2B [100] | (C)-1B [3] | (G)-1B [4.00] | — | (F)-1B [3] | (S)-1 [3300] |
| Comparative Example B2 | 90 | (A)-2B [100] | (C)-1B [3] | (G)-3B [4.00] | — | (F)-1B [3] | (S)-1 [3300] |
| Comparative Example B3 | 90 | (A)-2B [100] | (C)-2B [10] | (G)-1B [4.00] | (D)-1B [1.36] | (F)-1B [3] | (S)-1 [3300] |
| Comparative Example B4 | 90 | (A)-2B [100] | (C)-2B [10] | (G)-1B [4.00] | (D)-1B [2.18] | (F)-1B [3] | (S)-1 [3300] |
| Example B11 | 90 | (A)-2B [100] | (C)-2B [10] | (G)-1B [4.00] | (D)-1B [5.45] | (F)-1B [3] | (S)-1 [3300] |
| Example B12 | 90 | (A)-2B [100] | (C)-1B [3] | (G)-3B [4.00] | (D)-4B [0.92] | (F)-1B [3] | (S)-1 [3300] |
| Example B13 | 90 | (A)-2B [100] | (C)-1B [3] | (G)-3B [4.00] | (D)-4B [1.84] | (F)-1B [3] | (S)-1 [3300] |

TABLE 3-continued

|  | PEB (° C.) | Component (A) | Component (C) | Component (G) | Component (D) | Component (F) | Component (S) |
|---|---|---|---|---|---|---|---|
| Example B14 | 90 | (A)-2B [100] | (C)-1B [3] | (G)-3B [4.00] | (D)-4B [4.6] | (F)-1B [3] | (S)-1 [3300] |
| Example B15 | 90 | (A)-2B [100] | (C)-1B [3] | (G)-4B [10.0] | (D)-1B [4.27] | (F)-1B [3] | (S)-1 [3300] |

In Table 3, the values in brackets [ ] indicate the amount (in terms of parts by weight) of the component added, (S)-1 is the same as defined above, and the reference characters other than (S)-1 indicate the following. In addition, a molar ratio of the component (G) and the component (D) used in each Example is shown in Table 4.

(A)-1B: a copolymer represented by chemical formula (A)-1B shown below [Mw=7,000, Mw/Mn=1.57. l/m/n=40/40/20 (the composition of the copolymer (molar ratio))].

(A)-2B: a copolymer represented by chemical formula (A)-2B shown below [Mw=7,000, Mw/Mn=1.7. l/m/n/o/p=15/17/34/21/13 (the composition of the copolymer (molar ratio))].

(A)-3B: a copolymer represented by chemical formula (A)-3B shown below [Mw=7,000, Mw/Mn=1.57. l/m/n=45/35/20 (the composition of the copolymer (molar ratio))].

(C)-1B: a compound represented by the aforementioned chemical formula (C)-1A.

(C)-2B: a compound represented by chemical formula (C)-2B shown below.

(G)-1B: a compound represented by chemical formula (G)-1B shown below [pKa=−11.55].

(G)-2B: a compound represented by chemical formula (G)-2B shown below [pKa=−3.36].

(G)-3B: a compound represented by chemical formula (G)-3B shown below [pKa=−3.57].

(G)-4B: a compound represented by chemical formula (G)-4B shown below [pKa of anion=−3.36; pKa of cation=5.7].

(D)-1B: a heptafluorobutylamine [pKa=5.6, boiling point=69° C.].

(D)-2B: a pyridine [pKa=5.7, boiling point=115.2° C.].

(D)-3B: an aniline [pKa=4.87, boiling point=184° C.].

(D)-4B: an oxazole [pKa=0.8, boiling point=70° C.].

(F)-1B: a compound represented by chemical formula (F)-1B shown below [Mw=24,000, Mw/Mn=1.38. l=100 (the composition of the polymer (molar ratio))].

[Chemical Formula 104]

(A)-1B

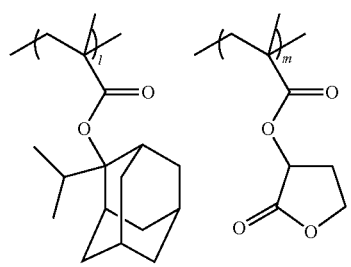

-continued

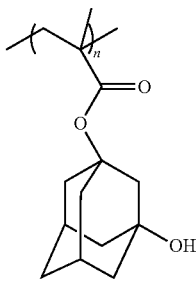

(A)-2B

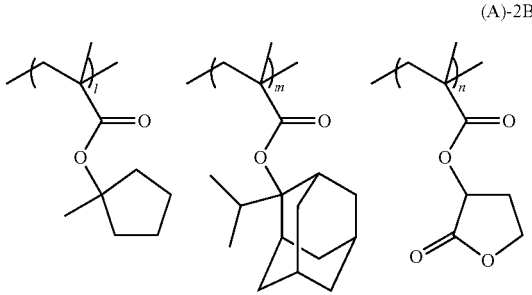

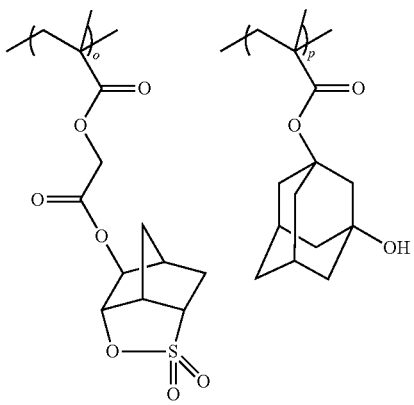

(A)-3B

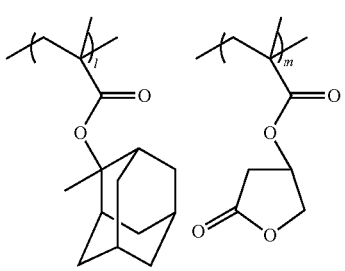

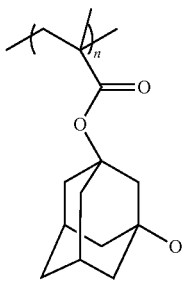

[Chemical Formula 105]

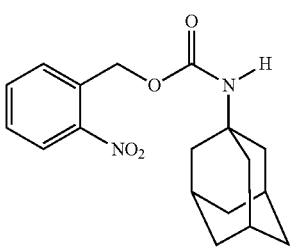

[Chemical Formula 106]

(C)-2B

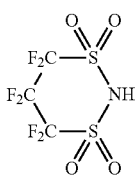

(G)-1B

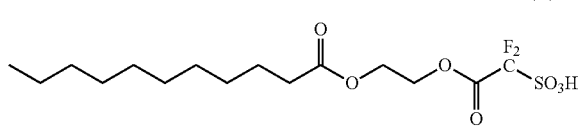

(G)-2B $C_4F_9SO_3H$ (G)-3B

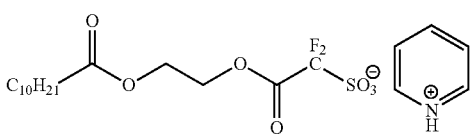

(G)-4B

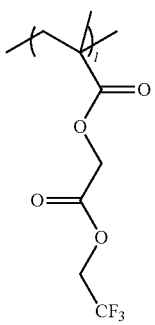

(F)-1B

<Formation of Resist Patterns>

(Step (1))

An organic antireflection film composition (product name: ARC29, manufactured by Brewer Science Ltd.) was applied to an 8-inch silicon wafer using a spinner, and the composition was then baked and dried on a hotplate at 205° C. for 60 seconds, thereby forming an organic antireflection film having a thickness of 82 nm.

Then, each resist composition immediately after preparation thereof was applied using a spinner, the resist films were placed on a cooling plate for 60 seconds, thereby forming a resist film having a thickness of 100 nm.

(Step (2))

Subsequently, the resist film was irradiated with an ArF excimer laser (193 nm) through a photomask (halftone) targeting a SL pattern with a space width of 140 nm and a pitch of 280 nm, using an ArF exposure apparatus NSR-S302 (manufactured by Nikon Corporation; NA (numerical aperture)=0.60, 2/3 annular).

(Step (3))

Then, a post exposure bake (PEB) treatment was conducted at a temperature described in Table 3 for 60 seconds.

(Step (4))

Thereafter, alkali developing was conducted for 30 seconds at 23° C. in a 2.38% by weight aqueous solution of tetramethylammonium hydroxide (TMAH) (product name: NMD-3; manufactured by Tokyo Ohka Kogyo Co., Ltd.).

As a result, in all of the examples, patterns having contrast in the resist film were obtained so that unexposed portions of the resist film were dissolved.

Further, in Examples B1 to B13, and B15, 1:1 SL patterns with a space width of 140 nm were resolved.

<Evaluation of Receding Angle>

An organic antireflection film composition (product name: ARC29, manufactured by Brewer Science Ltd.) was applied to an 8-inch silicon wafer using a spinner, and the composition was then baked and dried on a hotplate at 205° C. for 60 seconds, thereby forming an organic antireflection film having a thickness of 82 nm.

Then, each resist composition immediately after preparation thereof was applied using a spinner, the resist films were placed on a cooling plate for 60 seconds, thereby forming a resist film having a thickness of 100 nm.

A water droplet was dripped onto the surface of each resist film (the resist film prior to exposure), and a DROP MASTER-700 apparatus (a product name, manufactured by Kyowa Interface Science Co., Ltd.) was used to measure the receding angle (receding angle measurement: water 50 μL). The result of this measurement was referred to as the "initial receding angle (°)", and is shown in Table 4.

<Evaluation of Storage Stability>

The resist compositions according to Examples B1 to B11 and Comparative Examples B1 to B4 prepared in the above-described manner were stored for two weeks under room temperature. Then, the receding angles were measured in the same manner as described above in the evaluation of the receding angle. The result thereof was referred to as the "2w later receding angle (°)", and is shown in Table 4.

TABLE 4

| | Component (G):Component (D) | Initial receding angle (°) | 2w layer rectangle angle (°) |
|---|---|---|---|
| Example B1 | 1:1 | 67.0 | 67.2 |
| Example B2 | 1:1 | 67.3 | 67.1 |
| Example B3 | 1:1 | 66.9 | 66.8 |
| Example B4 | 1:1 | 66.6 | 67.1 |
| Example B5 | 1:1 | 66.9 | 65.9 |
| Example B6 | 1:1 | 65.9 | 66.3 |
| Example B7 | 1:1 | 66.8 | 66.1 |

TABLE 4-continued

|  | Component (G):Component (D) | Initial receding angle (°) | 2w layer rectangle angle (°) |
|---|---|---|---|
| Example B8 | 1:1 | 65.7 | 65.9 |
| Example B9 | 1:1 | 68.3 | 68.0 |
| Example B10 | 1:1 | 68.6 | 67.8 |
| Comparative Example B1 | 1:0 | 68.0 | 64.2 |
| Comparative Example B2 | 1:0 | 67.3 | 63.8 |
| Comparative Example B3 | 1:0.5 | 67.6 | 64.2 |
| Comparative Example B4 | 1:0.8 | 67.7 | 64.6 |
| Example B11 | 1:2 | 66.7 | 66.1 |
| Example B12 | 1:1 | 66.5 | 66.8 |
| Example B13 | 1:2 | 67.1 | 66.8 |
| Example B14 | 1:5 | 67.6 | 67.2 |
| Example B15 | 1:1 | 66.4 | 66.5 |

From the results described above, it was confirmed that the resist composition of Examples B1 to B15 according to the present invention reduced decrease of receding angle in the resist composition stored under room temperature and exhibited excellent storage stability as compared to the resist composition of Comparative Examples B1 to B2 containing no amine and to the resist composition of Comparative Examples B3 to B4 containing less amine than the acidic compound.

Examples C1 to C10, Comparative Examples C1 to C4

The components shown in Table 5 were mixed together and dissolved to obtain a resist composition.

TABLE 5

|  | Component (A) | Component (C) | Component (G1C) | Component (F) | Component (S) |
|---|---|---|---|---|---|
| Example C1 | (A)-1C [100] | (C)-1C [10] | (G)-1C [10] | (F)-1C [3] | (S)-1 [3300] |
| Example C2 | (A)-1C [100] | (C)-1C [10] | (G)-2C [10] | (F)-1C [3] | (S)-1 [3300] |
| Example C3 | (A)-1C [100] | (C)-1C [10] | (G)-3C [10] | (F)-1C [3] | (S)-1 [3300] |
| Example C4 | (A)-1C [100] | (C)-1C [3] | (G)-4C [15] | (F)-1C [3] | (S)-1 [3300] |
| Example C5 | (A)-2C [100] | (C)-2C [10] | (G)-1C [10] | (F)-1C [3] | (S)-1 [3300] |
| Example C6 | (A)-2C [100] | (C)-2C [10] | (G)-2C [10] | (F)-1C [3] | (S)-1 [3300] |
| Example C7 | (A)-2C [100] | (C)-2C [10] | (G)-3C [10] | (F)-1C [3] | (S)-1 [3300] |
| Example C8 | (A)-2C [100] | (C)-2C [3] | (G)-4C [15] | (F)-1C [3] | (S)-1 [3300] |
| Example C9 | (A)-3C [100] | (C)-1C [10] | (G)-2C [10] | (F)-1C [3] | (S)-1 [3300] |
| Example C10 | (A)-3C [100] | (C)-1C [3] | (G)-4C [15] | (F)-1C [3] | (S)-1 [3300] |
| Comparative Example C1 | (A)-3C [100] | (C)-1C [3] | (G)-AC [4] | (F)-1C [3] | (S)-1 [3300] |
| Comparative Example C2 | (A)-3C [100] | (C)-1C [3] | (G)-BC [4] | (F)-1C [3] | (S)-1 [3300] |
| Comparative Example C3 | (A)-2C [100] | (C)-2C [10] | (G)-CC [10] | (F)-1C [3] | (S)-1 [3300] |
| Comparative Example C4 | (A)-2C [100] | (C)-2C [10] | (G)-DC [10] | (F)-1C [3] | (S)-1 [3300] |

In Table 5, the values in brackets [ ] indicate the amount (in terms of parts by weight) of the component added, (S)-1 is the same as defined above, and the reference characters other than (S)-1 indicate the following.

(A)-1C: the same copolymer as (A)-1B described above.

(A)-2C: the same copolymer as (A)-2B described above.

(A)-3C: the same copolymer as (A)-3B described above.

(C)-1C: a compound represented by the aforementioned chemical formula (C)-1A.

(C)-2C: a compound represented by the aforementioned chemical formula (C)-2B.

(G)-1C: a compound represented by chemical formula (G)-1C shown below [pKa of cation=5.6, pKa of anion=−11.55].

(G)-2C: a compound represented by the aforementioned chemical formula (G)-1A [pKa of cation=5.7, pKa of anion=−11.55].

(G)-3C: a compound represented by chemical formula (G)-3C shown below [pKa of cation=4.87, pKa of anion=−11.55].

(G)-4C: a compound represented by chemical formula (G)-4C shown below [pKa of cation=5.7, pKa of anion=−3.36].

(G)-AC: the same compound as (G)-1B described above [pKa=−11.55].

(G)-BC: the same compound as (G)-3B described above [pKa=−3.57].

(G)-CC: a compound represented by chemical formula (G)-CC shown below [pKa of cation=10.7, pKa of anion=−11.55].

(G)-DC: a compound represented by chemical formula (G)-DC shown below [pKa of cation=7.77, pKa of anion=−11.55].

(F)-1C: the same compound as (F)-1B described above.

[Chemical Formula 107]

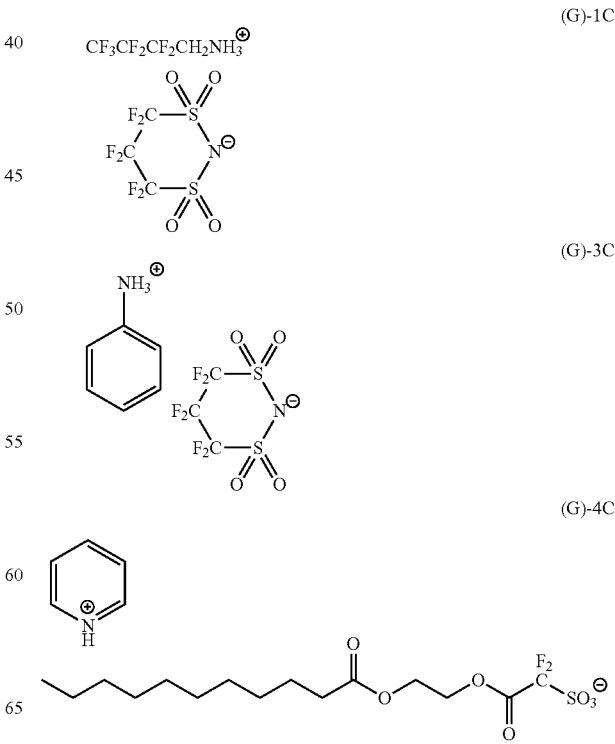

-continued

[Chemical Formula 108]

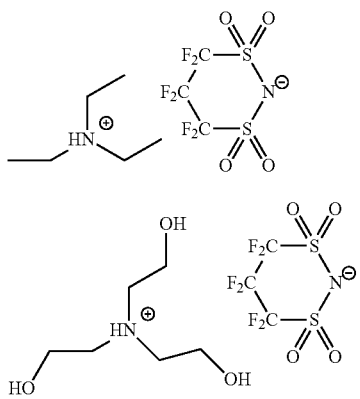

<Formation of Resist Patterns 1>

(Step (1))

An organic antireflection film composition (product name: ARC29, manufactured by Brewer Science Ltd.) was applied to an 8-inch silicon wafer using a spinner, and the composition was then baked and dried on a hotplate at 205° C. for 60 seconds, thereby forming an organic antireflection film having a thickness of 82 nm.

Then, each resist composition immediately after preparation thereof was applied using a spinner, the resist films were dried such that the resist compositions of Examples C9 to C10 and Comparative Examples C1 to C2 were prebaked (PAB) at 80° C. for 60 seconds, or such that the other resist compositions were placed on a cooling plate at 23° C. for 60 seconds, thereby forming a resist film having a thickness of 100 nm.

(Step (2))

Subsequently, the resist film was irradiated with an ArF excimer laser (193 nm) through a photomask (halftone) targeting a SL pattern with a space width of 130 nm and a pitch of 260 nm, using an ArF exposure apparatus NSR—S302 (manufactured by Nikon Corporation; NA (numerical aperture)=0.60, 2/3 annular).

(Step (3))

Then, a post exposure bake (PEB) treatment was conducted at a temperature indicated in Table 6 for 60 seconds.

(Step (4))

Thereafter, alkali developing was conducted for 30 seconds at 23° C. in a 2.38% by weight aqueous solution of tetramethylammonium hydroxide (TMAH) (product name: NMD-3; manufactured by Tokyo Ohka Kogyo Co., Ltd.).

As a result, in the examples except Comparative Examples C3 to C4, 1:1 SL patterns with a space width of 130 were formed in the resist films. The optimum exposure dose Eop (mJ/cm$^2$; sensitivity) with which the SL pattern was formed was determined. The result thereof was referred to as the "initial sensitivity", and is shown in Table 6.

<Evaluation of Receding Angle 1>

Next, similarly to the formation of resist pattern 1 described above, the resist films were formed using the resist compositions of Examples C1 to C10 and Comparative Examples C1 to C4.

A water droplet was dripped onto the surface of each resist film (the resist film prior to exposure), and a DROP MASTER-700 apparatus (a product name, manufactured by Kyowa Interface Science Co., Ltd.) was used to measure the receding angle (receding angle measurement: water 50 μL).

The result of this measurement was referred to as the "initial receding angle (°)", and is shown in Table 6.

<Evaluation of Storage Stability 1>

The resist compositions according to Examples C1 to C10 and Comparative Examples C1 to C4 prepared in the above-described manner were stored for two weeks under room temperature. Then, the receding angles were measured in the same manner as described above in the evaluation of the receding angle 1. The result thereof was referred to as the "2w later receding angle (°)", and is shown in Table 6.

Further, the resist compositions according to Examples C1 to C10 and Comparative Examples C1 to C4 prepared in the above-described manner were stored for two weeks under room temperature. Then, similarly to the formation of resist pattern 1 described above, the resist patterns were formed, and the optimum exposure dose was determined. The result thereof was referred to as the "2w later sensitivity", and is shown in Table 6. Here, in Comparative Examples C3 to C4, since 1:1 SL patterns with a space width of 130 were not resolved, patters were not formed similarly to the results described above.

TABLE 6

| | PEB (°C.) | Initial receding angle (°) | 2w later receding angle (°) | Initial sensitivity (mJ/cm$^2$) | 2w later sensitivity (mJ/cm$^2$) |
|---|---|---|---|---|---|
| Example C1 | 90 | 67.0 | 67.2 | 17 | 19 |
| Example C2 | 90 | 67.3 | 67.1 | 20 | 22 |
| Example C3 | 90 | 66.9 | 66.8 | 21 | 23 |
| Example C4 | 90 | 66.6 | 67.1 | 34 | 35 |
| Example C5 | 90 | 66.9 | 65.9 | 19 | 21 |
| Example C6 | 90 | 65.9 | 66.3 | 22 | 23 |
| Example C7 | 90 | 66.8 | 66.1 | 23 | 24 |
| Example C8 | 90 | 65.7 | 65.9 | 37 | 39 |
| Example C9 | 110 | 68.3 | 68.0 | 72 | 74 |
| Example C10 | 110 | 68.6 | 67.8 | 75 | 77 |
| Comparative Example C1 | 110 | 68.0 | 64.2 | 86 | >100 |
| Comparative Example C2 | 110 | 67.3 | 63.8 | 90 | >100 |
| Comparative Example C3 | 90 | 67.6 | 66.5 | No image | |
| Comparative Example C4 | 90 | 66.7 | 66.1 | No image | |

From the results described above, it was confirmed that the resist composition of Examples C1 to C10 according to the present invention exhibited excellent resolution as compared to the resist composition of Comparative Examples C3 to C4 including an acidic compound containing a cation having a pKa value more than 7.

In addition, it was confirmed that the resist composition of Examples C1 to C10 according to the present invention exhibited excellent storage stability so that decrease of receding angle and slowdown of sensitivity were reduced after storage as compared to the resist composition of Comparative Examples C1 to C2 including an acidic compound which does not form a salt.

Examples C11 to C20

The components shown in Table 7 were mixed together and dissolved to obtain a resist composition.

TABLE 7

| | Component (A) | Component (C) | Component (G1) | Component (D) | Component (F) | Component (S) |
|---|---|---|---|---|---|---|
| Example C11 | (A)-1C [100] | (C)-1C [3] | (G)-4C [10] | (D)-1C [5] | (F)-1C [3] | (S)-1 [3300] |
| Example C12 | (A)-1C [100] | (C)-1C [3] | (G)-4C [10] | (D)-1C [15] | (F)-1C [3] | (S)-1 [3300] |
| Example C13 | (A)-1C [100] | (C)-1C [10] | (G)-1C [10] | (D)-1C [5] | (F)-1C [3] | (S)-1 [3300] |
| Example C14 | (A)-1C [100] | (C)-1C [10] | (G)-1C [10] | (D)-1C [15] | (F)-1C [3] | (S)-1 [3300] |
| Example C15 | (A)-1C [100] | (C)-1C [10] | (G)-1C [10] | (D)-2C [5] | (F)-1C [3] | (S)-1 [3300] |
| Example C16 | (A)-1C [100] | (C)-1C [10] | (G)-1C [10] | (D)-2C [15] | (F)-1C [3] | (S)-1 [3300] |
| Example C17 | (A)-2C [100] | (C)-1C [3] | (G)-4C [10] | (D)-1C [5] | (F)-1C [3] | (S)-1 [3300] |
| Example C18 | (A)-2C [100] | (C)-1C [3] | (G)-4C [10] | (D)-1C [15] | (F)-1C [3] | (S)-1 [3300] |
| Example C19 | (A)-3C [100] | (C)-1C [10] | (G)-1C [10] | (D)-2C [5] | (F)-1C [3] | (S)-1 [3300] |
| Example C20 | (A)-3C [100] | (C)-1C [10] | (G)-1C [10] | (D)-2C [15] | (F)-1C [3] | (S)-1 [3300] |

In Table 7, the values in brackets [ ] indicate the amount (in terms of parts by weight) of the component added, (A)-1C to 3C, (C)-1C, (G)-1C, (G)-4C, (F)-1C and (S)-1 are the same as defined above, and the reference characters other than these indicate the following.

(D)-1C: the same as (D)-1B described above, a heptafluorobutylamine [pKa=5.6, boiling point=69° C.].

(D)-2C: a trifluoroethylamine [pKa=5.7, boiling point=37° C.].

<Formation of Resist Patterns 2>

In the same manner as the formation of resist pattern 1 described above (provided that, in film formation, all of the examples were not subjected to a prebake treatment, and were placed on a cooling plate at 23° C. for 60 seconds), 1:1 SL patterns with a space width of 130 nm and a pitch of 260 nm were formed. As a result, in all of the examples, SL patterns were formed. The optimum exposure dose Eop (mJ/cm$^2$; sensitivity) with which the SL pattern was formed was determined. The result thereof was referred to as the "initial sensitivity", and is shown in Table 8.

<Evaluation of Receding Angle 2><Evaluation of Storage Stability 2>

In the same manner as the evaluation of receding angle 1 and the evaluation of storage stability 1 described above, the initial receding angle, and two weeks later receding angle and sensitivity were obtained. The results are shown in Table 8.

TABLE 8

| | PEB (° C.) | Initial receding angle (°) | 2w later receding angle (°) | Initial senstivity (mJ/cm$^2$) | 2w later senstivity (mJ/cm$^2$) |
|---|---|---|---|---|---|
| Example C11 | 90 | 67.1 | 67.3 | 32 | 31 |
| Example C12 | 90 | 66.7 | 66.5 | 28 | 28 |
| Example C13 | 90 | 67.4 | 67.3 | 17 | 16 |
| Example C14 | 90 | 66.2 | 66.3 | 15 | 15 |
| Example C15 | 90 | 67.6 | 67.0 | 16 | 15 |
| Example C16 | 90 | 66.9 | 66.9 | 14 | 14 |
| Example C17 | 90 | 66.5 | 66.0 | 35 | 34 |
| Example C18 | 90 | 66.0 | 66.2 | 32 | 32 |
| Example C19 | 110 | 67.1 | 67.0 | 66 | 64 |
| Example C20 | 110 | 67.3 | 67.0 | 63 | 63 |

From the results described above, it was confirmed that the resist composition of Examples C11 to C20 according to the present invention exhibited excellent storage stability without decrease of receding angle and slowdown of sensitivity after storage.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A resist composition comprising a base component (A) that exhibits increased solubility in an alkali developing solution under the action of acid, a photo-base generator component (C) that generates a base upon exposure, an acid component component (G) and a compound (F) containing at least one selected from the group consisting of a fluorine atom and a silicon atom, and the resist composition used in a method of forming a resist pattern which includes:
a step (1) in which a resist film is formed by coating the resist composition on a substrate;
a step (2) in which the resist film is subjected to exposure;
a step (3) in which baking is conducted after the step (2), such that, at an exposed portion of the resist film, the base generated from the photo-base generator component (C) upon the exposure and the acidic compound component (G) are neutralized, and at an unexposed portion of the resist film, the solubility of the base component (A) in an alkali developing solution is increased by the action of the acidic compound component (G); and
a step (4) in which the resist film is subjected to an alkali development, thereby forming a negative-tone resist pattern in which the unexposed portion of the resist film has been dissolved and removed, wherein the resist composition is used in the step (1) of the method of forming a resist pattern, wherein the compound (F) does not contain an acid decomposable group which exhibits increased polarity by the action of acid, and wherein the acidic compound component (G) comprises an acid salt component (G1) comprising a cation moiety represented by general formula (G1c-13) shown below, an anion moiety represented by general formula (G1c-3) or (G1c-5):

(G1c-13)

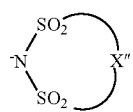

(G1a-3)

$X^3—Q'—Y^3—SO_3^-$ (G1a-5)

wherein $Rn^{g4}$ and $Rn^{g5}$ each independently represenets an alkyl group of 1 to 5 carbon atoms or an aromatic hydrocarbon group; $R^{g2}$ represents a hydrocarbon group; n16 represents an integer of 0 to 4, provided that, when n16 is 2 or more, the plurality of $R^{g2}$ which substitutes the hydrogen atoms of the adjacent carbon atom may be bonded to form a ring, X" represents an alkylene group of 2 to 6 carbon atoms in which at least one hydrogen atom has been substituted with a fluorine atom; $X^3$ represents a hydrocarbon group of 3 to 30 carbon atoms which may have a substituent; Q' represents —$R^{91}$—O—, —C(=O)—O—$R^{93}$—O—C(=O)—, —$SO_2$—O—$R^{94}$—O—C(=O)—, or -$R^{95}$—$SO_2$—O—$R^{94}$—O—C(=O)—, wherein $R^{91}$ to $R^{95}$ each independently represents an alkylene group; and $Y^3$ represents a fluorinated alkylene group of 1 to 4 carbon atoms, wherein all hydrogen atoms are substituted with fluorine atoms.

2. The resist composition according to claim 1, wherein the compound (F) contains a polymer having a structural unit represented by general formula (f1-1) shown below, or a compound represented by general formula (f11-1) shown below:

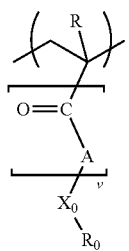

(f1-1)

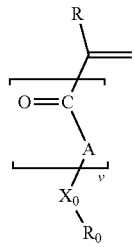

(f11-1)

wherein R represents a hydrogen atom, an alkyl group of 1 to 5 carbon atoms or a halogenated alkyl group of 1 to 5 carbon atoms; A represents —O— or —NH—; $X_0$ represents a single bond or a divalent linking group; $R_0$ represents an organic group; at least one of $X_0$ and $R_0$ contains a fluorine atom or a silicon atom; and v is 0 or 1.

3. The resist composition according to claim 1, further comprises an amine (D).

4. A resist composition comprising a base component (A) that exhibits increased solubility in an alkali developing solution under the action of acid, a photo-base generator component (C) that generates a base upon exposure, an acidic compound component (G) and an amine (D), wherein the resist composition used in a method of forming a resist pattern which includes:

a step (1) in which a resist film is formed by coating the resist composition on a substrate;

a step (2) in which the resist film is subjected to exposure;

a step (3) in which baking is conducted after the step (2), such that, at an exposed portion of the resist film, the base generated from the photo-base generator component (C) upon the exposure and the acidic compound component (G) are neutralized, and at an unexposed portion of the resist film, the solubility of the base component (A) in an alkali developing solution is increased by the action of the acidic compound component (G); and a step (4) in which the resist film is subjected to an alkali development, thereby forming a negative-tone resist pattern in which the unexposed portion of the resist film has been dissolved and removed, wherein the resist composition is used in the step (1) of the method of forming a resist pattern, wherein the amount of the amine (D) is 1 mol or more, per 1 mol of the acidic compound component (G), and the acidic compound component (G) comprises an acid salt component (G1) comprising a cation moiety represented by general formula (G1c-13) shown below, an anion moiety represented by genera formula (G1a-3) or (G1a-5):

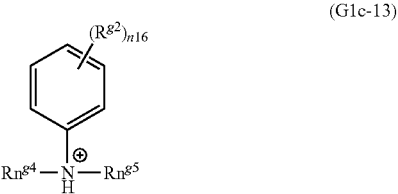

(G1c-13)

-continued

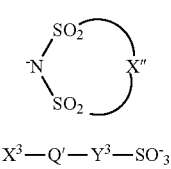
(G1a-3)

$$X^3—Q'—Y^3—SO_3^-$$
(G1a-5)

wherein $Rn^{g4}$ and $Rn^{g5}$ each independently represents an alkyl group of 1 to 5 carbon atoms or an aromatic hydrocarbon group; $R^{g2}$ represents a hydrocarbon group; n16 represents an integer of 0 to 4, provided that, when ni 16 is 2 or more, the plurality of $R^{g2}$ which substitute the hydrogen atoms of the adjacent carbon atom may be bonded to form a ring, X" represents an alkylene group of 2 to 6 carbon atoms in which at least one hydrogen atom has been substituted with a fluorine atom; $X^3$ represents a hydrocarbon group of 3 to 30 carbon atoms which may have a substituent; Q' represents —$R^{91}$—O—, —C(=O)—O—$R^{93}$—O—C(=O)—, —$SO_2$—O—$R^{94}$—O—C(=O)—, or —$R^{95}$—$SO_2$—O—$R^{94}$—O—C(=O)—, wherein $R^{91}$ to $R^{95}$ each independently represents an alkylene group; and $Y^3$ represents a fluorinated alkylene group of 1 to 4 carbon atoms, wherein all hydrogen atoms are substituted with fluorine atoms.

5. The resist composition according to claim 4, wherein the amount of the amine (D) is 1 to 10 mol, per 1 mol of the acidic compound component (G).

6. A resist composition comprising a base component (A) that exhibits increased solubility in an alkali developing solution under the action of acid, a photo-base generator component (C) that generates a base upon exposure, and an acidic compound component (G), wherein the resist composition used in a method of forming a resist pattern which includes:

a step (1) in which a resist film is formed by coating the resist composition on a substrate;

a step (2) in which the resist film is subjected to exposure;

a step (3) in which baking is conducted after the step (2), such that, at an exposed portion of the resist film, the base generated from the photo-base generator component (C) upon the exposure and the acidic compound component (G) are neutralized, and at an unexposed portion of the resist film, the solubility of the base component (A) in an alkali developing solution is increased by the action of the acidic compound component (G); and a step (4) in which the resist film is subjected to an alkali development, thereby forming a negative-tone resist pattern in which the unexposed portion of the resist film has been dissolved and removed, wherein the resist composition is used in the step (1) of the method of forming a resist pattern, wherein the acidic compound component (G) comprises a compound (G1C) composed of a nitrogen-containing cation having a pKa value of 7 or less, and an anion moiety represented by general formula (G1a-3) or (G1a-5), and wherein the nitrogen-containing cation is represented by general formula (G1c -13) shown below:

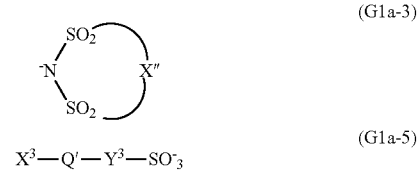
(G1c-13)

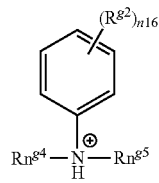
(G1a-3)

$$X^3—Q'—Y^3—SO_3^-$$
(G1a-5)

wherein $Rn^{g4}$ and $Rn^{g5}$ each independently represents an alkyl group of 1 to 5 carbon atoms or an aromatic hydrocarbon group; $R^{g2}$ represents a hydrocarbon group; and n16 represents an integer of 0 to 4, provide that, when n16 is 2 or more, the plurality of $R^{g2}$ which substitute the hydrogen atoms of the adjacent carbon atom may be bonded to form a ring, X" represents an alkylene group of 2 to 6 carbon atoms in which at least one hydrogen atoms has been substituted with a fluorine atom; $X^3$ represents a hydrocarbon group of 3 to 30 carbon atoms which may have a substituent; Q' represents —$R^{91}$—O—, —C(=O)—O—$R^{93}$—O—C(=O)—, —$SO_2$—O—$R^{94}$—O—C(=O)—, or —$R^{95}$—$SO_2$—O—$R^{94}$—O—C (=O)—, wherein $R^{91}$ to $R^{95}$ each independently represents an alkylene; and $Y^3$ represents a fluorinated alkylene group of 1 to 4 carbon atoms, wherein all hydrogen atoms are substituted with fluorine atoms.

7. The resist composition according to claim 6, further comprises an amine (D).

8. A method of forming a resist pattern, comprising, a step (1) in which a resist film is formed by coating the resist composition on a substrate, said resist composition a base component (A) that exhibits increased solubility in an alkali developing solution under the action of acid, a photo-base generator component (C) that generates a base upon exposure, an acidic compound component (G) and a compound (F) containing at least one selected from the group consisting of a fluorine atom and a silicon atom;

a step (2) in which the resist film is subjected to exposure;

a step (3) in which baking is conducted after the step (2), such that, at an exposed portion of the resist film, the base generated from the photo-base generator component (C) upon the exposure and the acidic compound component (G) are neutralized, and at an unexposed portion of the resist film, the solubility of the base component (A) in an alkali developing solution is increased by the action of the acidic compound component (G); and a step (4) in which the resist film is subjected to an alkali development, thereby forming a negative-tone resist pattern in which the unexposed portion of the resist film has been dissolved and removed, wherein the resist composition is used in the step (1) of the method of forming a resist pattern, wherein the compound (F) does not contain an acid decomposable group which exhibits increased polarity by the action of acid, and wherein the acidic compound component (G) comprises an acid salt component (G1) comprising a cation moiety represented be general formula (G1c-13) shown below, an anion moiety represented by general formula (G1c-3) or (G1c-5):

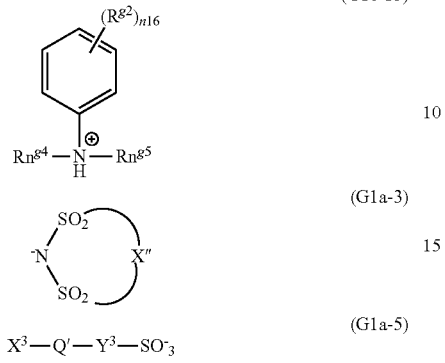

(G1c-13)

(G1a-3)

$X^3-Q'-Y^3-SO_3^-$ (G1a-5)

wherein $Rn^{g4}$ and $Rn^{g5}$ each independently represents an alkyl group of 1 to 5 carbon atoms or an aromatic hydrocarbon group; $R^{g2}$ represents a hydrocarbon group; n16 represents an integer of 0 to 4, provided that, when n16 is 2 or more, the plurality of $R^{g2}$ which substitute the hydrogen atoms of the adjacent carbon atom may be bonded to form a ring, X" represents an alkylene group of 2 to 6 carbon atoms in which at least one hydrogen atom has been substituted with a fluorine atom; $X^3$ represents a hydrocarbon group of 3 to 30 carbon atoms which may have a substituent; Q' represents —$R^{91}$—O—, —C(=O)—O—$R^{93}$—O—C(=O)—, —$SO_2$—O—$R^{94}$—O—C(=O)—, or —$R^{95}$—$SO_2$—O—$R^{94}$—O—C(=O)—, wherein $R^{91}$ to $R^{95}$ each independently represents an alkylene group; and $Y^3$ represents a fluorinated alkylene group of 1 to 4 carbon atoms, wherein all hydrogen atoms are substituted with fluorine atoms.

\* \* \* \* \*